(12) United States Patent
Click et al.

(10) Patent No.: US 12,071,364 B2
(45) Date of Patent: Aug. 27, 2024

(54) GLASS CERAMIC ARTICLES HAVING IMPROVED PROPERTIES AND METHODS FOR MAKING THE SAME

(71) Applicant: CORNING INCORPORATED, Corning, NY (US)

(72) Inventors: Carol Ann Click, Corning, NY (US); James Howard Edmonston, Durham, NC (US); Qiang Fu, Painted Post, NY (US); Jill Marie Hall, Elmira, NY (US); Mathieu Gerard Jacques Hubert, Corning, NY (US); Dhananjay Joshi, Painted Post, NY (US); Andrew Peter Kittleson, Honeoye Falls, NY (US); Katherine Weber Kroemer, Horseheads, NY (US); Galan Gregory Moore, Henrietta, NY (US); Rohit Rai, Painted Post, NY (US); John Richard Ridge, Hammondsport, NY (US); John Robert Saltzer, Jr., Beaver Dams, NY (US); Charlene Marie Smith, Corning, NY (US); Erika Lynn Stapleton, Lindley, NY (US); Matthew Daniel Trosa, Horseheads, NY (US); Ljerka Ukrainczyk, Ithaca, NY (US); Shelby Kerin Wilson, Corning, NY (US); Bin Yang, Dublin, OH (US); Zheming Zheng, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 18/133,106

(22) Filed: Apr. 11, 2023

(65) Prior Publication Data
US 2023/0242438 A1 Aug. 3, 2023

Related U.S. Application Data

(63) Continuation of application No. 17/237,272, filed on Apr. 22, 2021, now Pat. No. 11,649,187, which is a
(Continued)

(51) Int. Cl.
*C03C 4/18* (2006.01)
*C03C 10/00* (2006.01)
(Continued)

(52) U.S. Cl.
CPC ............ *C03C 10/0027* (2013.01); *C03C 4/18* (2013.01); *H05K 5/03* (2013.01); *C03C 2204/00* (2013.01); *H05K 5/0017* (2013.01)

(58) Field of Classification Search
CPC ............. B32B 17/06; B32B 2307/412; B32B 2457/00; C03C 10/0009; C03C 10/0018;
(Continued)

(56) References Cited

U.S. PATENT DOCUMENTS

| 2,920,971 | A | 1/1960 | Stookey |
| 3,129,087 | A | 4/1964 | Hagy |

(Continued)

FOREIGN PATENT DOCUMENTS

| CN | 1367149 A | 9/2002 |
| CN | 1575265 A | 2/2005 |

(Continued)

OTHER PUBLICATIONS

Beall et al; "High Strength Glass-Ceramics Having Petalite and Lithium Silicate Structures"; Filed as U.S. Appl. No. 62/205,120 on Aug. 14, 2015; 69 pages.
(Continued)

*Primary Examiner* — Lawrence D Ferguson

(57) ABSTRACT

A glass ceramic article including a lithium disilicate crystalline phase, a petalite crystalline phased, and a residual
(Continued)

glass phase. The glass ceramic article has a warp (μm)< $(3.65 \times 10^{-9}/\mu m \times diagonal^2)$ where diagonal is a diagonal measurement of the glass ceramic article in μm, a stress of less than 30 nm of retardation per mm of glass ceramic article thickness, a haze (%)<0.0994t+0.12 where t is the thickness of the glass ceramic article in mm, and an optical transmission (%)>$0.91 \times 10^{(2-0.03t)}$ of electromagnetic radiation wavelengths from 450 nm to 800 nm, where t is the thickness of the glass ceramic article in mm.

14 Claims, 80 Drawing Sheets

Related U.S. Application Data continuation of application No. 16/510,850, filed on Jul. 12, 2019, now Pat. No. 11,014,848.

(60) Provisional application No. 62/769,253, filed on Nov. 19, 2018, provisional application No. 62/749,815, filed on Oct. 24, 2018, provisional application No. 62/749,800, filed on Oct. 24, 2018, provisional application No. 62/749,808, filed on Oct. 24, 2018, provisional application No. 62/736,682, filed on Sep. 26, 2018, provisional application No. 62/698,582, filed on Jul. 16, 2018, provisional application No. 62/698,532, filed on Jul. 16, 2018, provisional application No. 62/698,563, filed on Jul. 16, 2018, provisional application No. 62/698,595, filed on Jul. 16, 2018, provisional application No. 62/698,623, filed on Jul. 16, 2018.

(51) Int. Cl.
*H05K 5/03* (2006.01)
*H05K 5/00* (2006.01)

(58) Field of Classification Search
CPC ............ C03C 10/0027; C03C 10/0054; C03C 21/002; C03C 2204/00; C03C 3/097; C03C 4/0092; C03C 4/18; H05K 5/0017; H05K 5/03
See application file for complete search history.

(56) References Cited

U.S. PATENT DOCUMENTS

| | | |
|---|---|---|
| 3,617,317 A | 11/1971 | Sack et al. |
| 3,809,543 A | 5/1974 | Gaskell et al. |
| 3,809,599 A | 5/1974 | Peiy |
| 3,817,732 A | 6/1974 | Pei |
| 3,931,438 A | 1/1976 | Beall et al. |
| 3,972,704 A | 8/1976 | Loxley et al. |
| 4,042,362 A | 8/1977 | MacDowell et al. |
| 4,191,583 A | 3/1980 | Armistead et al. |
| 4,219,344 A | 8/1980 | Armistead et al. |
| 4,222,760 A | 9/1980 | Chyung et al. |
| 4,248,925 A | 2/1981 | Ambrogi |
| 4,274,857 A | 6/1981 | Wolfe |
| 4,340,436 A | 7/1982 | Dubetsky et al. |
| 4,391,914 A | 7/1983 | Beall |
| 4,786,305 A | 11/1988 | Ball et al. |
| 4,910,638 A | 3/1990 | Berghout et al. |
| 4,940,674 A | 7/1990 | Beall et al. |
| 5,030,433 A | 7/1991 | Mehrotra |
| 5,073,181 A | 12/1991 | Foster et al. |
| 5,082,710 A | 1/1992 | Wright |
| 5,147,436 A | 9/1992 | Blakeslee et al. |
| 5,168,193 A | 12/1992 | Hoegler |
| 5,296,294 A | 3/1994 | Suzuki et al. |
| 5,389,582 A | 2/1995 | Loxley et al. |
| 5,588,979 A | 12/1996 | Miyazaki et al. |
| 5,603,147 A | 2/1997 | Bischoff et al. |
| 5,680,685 A | 10/1997 | Bischoff |
| 5,814,262 A | 9/1998 | Ketcham et al. |
| 5,836,760 A | 11/1998 | Turner et al. |
| 5,840,221 A | 11/1998 | Lau et al. |
| 5,872,069 A | 2/1999 | Abe |
| 6,055,151 A | 4/2000 | Tormey et al. |
| 6,374,640 B1 | 4/2002 | Fotheringham et al. |
| 6,408,813 B1 | 6/2002 | Wilksch et al. |
| 6,409,813 B1 | 6/2002 | Beesabathina et al. |
| 6,410,892 B1 | 6/2002 | Perschl et al. |
| 6,852,569 B2 | 2/2005 | Nakano et al. |
| 7,054,136 B2 | 5/2006 | Ritter et al. |
| 7,125,320 B1 | 10/2006 | Brown et al. |
| 7,312,154 B2 | 12/2007 | Cites et al. |
| 7,410,716 B2 | 8/2008 | Garner et al. |
| 7,589,038 B2 | 9/2009 | Goto et al. |
| 7,618,843 B2 | 11/2009 | Nakano et al. |
| 8,854,623 B2 | 10/2014 | Fontaine et al. |
| 9,126,859 B2 | 9/2015 | Nakane et al. |
| 9,156,726 B2 | 10/2015 | Katayama et al. |
| 9,260,337 B2 | 2/2016 | Abramov et al. |
| 9,260,342 B2 | 2/2016 | Borczuch-Laczka et al. |
| 9,382,603 B2 | 7/2016 | Kimura et al. |
| 9,604,871 B2 | 3/2017 | Amin et al. |
| 9,701,569 B2 | 7/2017 | Demartino et al. |
| 9,809,488 B2 | 11/2017 | Beall et al. |
| 9,862,633 B2 | 1/2018 | Gabel et al. |
| 10,046,542 B2 | 8/2018 | Adib et al. |
| 2001/0022705 A1 | 9/2001 | Mori et al. |
| 2003/0100146 A1 | 5/2003 | Nakano et al. |
| 2003/0126802 A1 | 7/2003 | Rosenflanz |
| 2004/0053039 A1 | 3/2004 | Ekstrom et al. |
| 2004/0149368 A1 | 8/2004 | Wang et al. |
| 2005/0016214 A1 | 1/2005 | Hsu et al. |
| 2005/0095404 A1 | 5/2005 | Schillert et al. |
| 2005/0199331 A1 | 9/2005 | Nakano et al. |
| 2006/0026994 A1 | 2/2006 | Yoshizawa |
| 2006/0068112 A1 | 3/2006 | Chapman et al. |
| 2006/0093884 A1 | 5/2006 | Seabaugh et al. |
| 2006/0185335 A1 | 8/2006 | Ichikawa |
| 2006/0199013 A1 | 9/2006 | Malshe et al. |
| 2007/0051301 A1 | 3/2007 | Hirooka |
| 2007/0154666 A1 | 7/2007 | Coonan et al. |
| 2007/0199348 A1 | 8/2007 | Gudgel et al. |
| 2008/0041107 A1 | 2/2008 | Hsu et al. |
| 2008/0248316 A1 | 10/2008 | Goto et al. |
| 2009/0162608 A1 | 6/2009 | Yagi et al. |
| 2009/0186489 A1 | 7/2009 | Nakamura et al. |
| 2009/0323157 A1 | 12/2009 | Valentin et al. |
| 2010/0011814 A1 | 1/2010 | Zou et al. |
| 2010/0069218 A1 | 3/2010 | Baldi et al. |
| 2010/0116413 A1 | 5/2010 | Tanaka et al. |
| 2010/0304953 A1 | 12/2010 | Liu et al. |
| 2011/0009254 A1 | 1/2011 | Schweiger et al. |
| 2011/0092353 A1 | 4/2011 | Amin et al. |
| 2011/0135964 A1 | 6/2011 | Yagi et al. |
| 2011/0176277 A1 | 7/2011 | Kaga et al. |
| 2011/0186431 A1 | 8/2011 | Horisaka et al. |
| 2011/0189440 A1 | 8/2011 | Appleby et al. |
| 2011/0198785 A1 | 8/2011 | Kester et al. |
| 2012/0094079 A1 | 4/2012 | Gabel et al. |
| 2012/0196735 A1 | 8/2012 | Bogaerts et al. |
| 2012/0291493 A1 | 11/2012 | Hsu et al. |
| 2013/0164509 A1 | 6/2013 | Siebers et al. |
| 2013/0224493 A1 | 8/2013 | Gabel et al. |
| 2013/0277613 A1 | 10/2013 | Miyagawa et al. |
| 2013/0338267 A1 | 12/2013 | Appleby et al. |
| 2014/0050659 A1 | 2/2014 | Rimer et al. |
| 2014/0066285 A1 | 3/2014 | Beall et al. |
| 2014/0124777 A1 | 5/2014 | Nakatani et al. |
| 2014/0134397 A1 | 5/2014 | Amin et al. |
| 2014/0141285 A1 | 5/2014 | Momono et al. |
| 2014/0141960 A1 | 5/2014 | Borczuch-Laczka et al. |
| 2014/0309793 A1 | 10/2014 | Cheng et al. |
| 2014/0345328 A1 | 11/2014 | Folgar |
| 2015/0064474 A1 | 3/2015 | Dejneka et al. |
| 2015/0086794 A1 | 3/2015 | Akita et al. |

(56) References Cited

U.S. PATENT DOCUMENTS

| | | |
|---|---|---|
| 2015/0099124 A1 | 4/2015 | Beunet et al. |
| 2015/0113801 A1 | 4/2015 | Cao et al. |
| 2015/0140274 A1 | 5/2015 | Burke et al. |
| 2015/0140513 A1 | 5/2015 | Burke et al. |
| 2015/0210029 A1 | 7/2015 | Makino et al. |
| 2015/0239772 A1 | 8/2015 | Baker et al. |
| 2015/0265975 A1 | 9/2015 | Liu et al. |
| 2015/0274581 A1 | 10/2015 | Beall et al. |
| 2015/0274602 A1 | 10/2015 | Ishii et al. |
| 2015/0291468 A1 | 10/2015 | Boek et al. |
| 2015/0329413 A1 | 11/2015 | Beall et al. |
| 2015/0376055 A1 | 12/2015 | Fu et al. |
| 2016/0002092 A1 | 1/2016 | Kuehn |
| 2016/0031736 A1 | 2/2016 | Muehlke et al. |
| 2016/0046520 A1 | 2/2016 | Chenu et al. |
| 2016/0102010 A1 | 4/2016 | Beall et al. |
| 2016/0102014 A1 | 4/2016 | Hu et al. |
| 2016/0130175 A1 | 5/2016 | Siebers et al. |
| 2016/0159682 A1 | 6/2016 | Borczuch-Laczka et al. |
| 2016/0176752 A1 | 6/2016 | Gabel et al. |
| 2016/0194235 A1 | 7/2016 | Hart et al. |
| 2016/0280589 A1 | 9/2016 | Beall et al. |
| 2017/0022093 A1 | 1/2017 | Demartino et al. |
| 2017/0144921 A1 | 5/2017 | Beall et al. |
| 2017/0340420 A1 | 11/2017 | Burke et al. |
| 2018/0002227 A1 | 1/2018 | Dai et al. |
| 2018/0097142 A1 | 4/2018 | Moriyama et al. |
| 2018/0155235 A1 | 6/2018 | Beall et al. |
| 2018/0169826 A1 | 6/2018 | Bankaitis et al. |
| 2018/0182549 A1 | 6/2018 | Koide et al. |
| 2018/0210118 A1 | 7/2018 | Gollier et al. |
| 2018/0272783 A1 | 9/2018 | Ishihara |
| 2018/0362390 A1 | 12/2018 | Claireaux et al. |
| 2018/0370194 A1 | 12/2018 | Claireaux et al. |
| 2018/0370846 A1 | 12/2018 | Harrison et al. |
| 2019/0169060 A1 | 6/2019 | Jones et al. |
| 2019/0169061 A1 | 6/2019 | Jones et al. |
| 2019/0194062 A1 | 6/2019 | Wlfinger et al. |
| 2019/0300426 A1 | 10/2019 | Fu et al. |
| 2020/0017398 A1 | 1/2020 | Click et al. |
| 2020/0017399 A1 | 1/2020 | Click et al. |
| 2020/0156994 A1 | 5/2020 | Li et al. |
| 2020/0263317 A1 | 8/2020 | Mori et al. |
| 2022/0267205 A1 | 8/2022 | Chien et al. |

FOREIGN PATENT DOCUMENTS

| | | |
|---|---|---|
| CN | 101714504 A | 5/2010 |
| CN | 101962295 A | 2/2011 |
| CN | 102384654 A | 3/2012 |
| CN | 103003212 A | 3/2013 |
| CN | 105731808 A | 7/2016 |
| CN | 105753314 A | 7/2016 |
| CN | 105884184 A | 8/2016 |
| CN | 105899469 A | 8/2016 |
| CN | 106660861 A | 5/2017 |
| CN | 107001120 A | 8/2017 |
| CN | 107265845 A | 10/2017 |
| CN | 206580739 U | 10/2017 |
| CN | 206683413 U | 11/2017 |
| CN | 107619193 A | 1/2018 |
| CN | 107902909 A | 4/2018 |
| CN | 109071316 A | 12/2018 |
| CN | 111954646 A | 11/2020 |
| CN | 113896410 A | 1/2022 |
| DE | 102010027461 A1 | 1/2012 |
| DE | 102016111438 A1 | 12/2017 |
| DE | 202018102534 U1 | 5/2018 |
| EP | 0508131 A2 | 10/1992 |
| EP | 2323955 A1 | 5/2011 |
| EP | 2905113 A1 | 8/2015 |
| EP | 3293157 A1 | 3/2018 |
| JP | 62-070239 A | 3/1987 |
| JP | 02-116639 A | 5/1990 |
| JP | 05-043263 A | 2/1993 |
| JP | 05-032334 | 5/1993 |
| JP | 2000-072489 A | 3/2000 |
| JP | 2001-097740 A | 4/2001 |
| JP | 2002-087835 A | 3/2002 |
| JP | 2006-232661 A | 9/2006 |
| JP | 2008-303073 A | 12/2008 |
| JP | 4305602 B2 | 7/2009 |
| JP | 2014-012617 A | 1/2014 |
| JP | 2014-515722 A | 7/2014 |
| JP | 2015-069669 A | 4/2015 |
| JP | 2016-108218 A | 6/2016 |
| JP | 2017-530933 A | 10/2017 |
| JP | 2018-513091 A | 5/2018 |
| TW | 201623179 A | 7/2016 |
| TW | 201731783 A | 9/2017 |
| WO | 2010/002477 A1 | 1/2010 |
| WO | 2012/121116 A1 | 9/2012 |
| WO | 2016/057748 A1 | 4/2016 |
| WO | 2016/154235 A1 | 9/2016 |
| WO | 2017/030736 A1 | 2/2017 |
| WO | 2017/104513 A1 | 6/2017 |
| WO | 2019/022033 A1 | 1/2019 |
| WO | 2019/191358 A1 | 10/2019 |

OTHER PUBLICATIONS

Bubsey et al; "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (Oct. 1992).

CeraGlide Boron Nitride coatings as provided by https://www.bn.saint-gobain.com/products/coatings DATAsheet (Year: 2019), 6 pages.

Chinese Patent Application No. 201980058951.5, Office Action, dated Apr. 15, 2023, 11 pages (2 pages of English Translation and 9 pages of Original Copy), Chinese Patent Office.

Eppler, "Glass formation and recrystallization in the lithium metasilicate region of the system Li2O-Al2O3-SiO2," Journal of the American Ceramic Society 46(2) 1963, pp. 97-101.

International Search Report and Written Opinion of the International Searching Authority; PCT/US2019/041737; Mailed Oct. 30, 2019; 9 Pages; European Patent Office.

Japanese Patent Application No. 2021-502861, Decision to grant, dated Jun. 29, 2022, 5 pages (2 pages of English Translation and 3 pages of Original Copy); Japanese Patent Office.

Reddy et al; "Fracture Toughness Measurement of Glass and Ceramic Materials Using Chevron-Notched Specimens," J. Am. Ceram. Soc., 71 [6], C-310-C-313 (1988).

Tang et al; "Automated Apparatus for Measuring the Frangibility and Fragmentation of Strengthened Glass"; Experimental Mechanics (2014) 54: 903-912.

ZYP Coatings, "Boron Nitride Lubricoat Boron Nitride Lubricoat-Blue" (Year: 2015), 2 Pages.

PART ID Scale 10nm
WITH BEAD

PART ID Scale 10nm
WITH BEAD

GLASS CERAMIC ARTICLES HAVING IMPROVED PROPERTIES AND METHODS FOR MAKING THE SAME

CROSS-REFERENCE TO RELATED APPLICATIONS

This application is a continuation of U.S. patent application Ser. No. 17/237,272, filed on Apr. 22, 2021; which is a continuation of U.S. patent application Ser. No. 16/510,850, filed on Jul. 12, 2019; which claims priority to U.S. Provisional Application No. 62/698,532, filed on Jul. 16, 2018; U.S. Provisional Application No. 62/736,682, filed on Sep. 26, 2018; U.S. Provisional Application No. 62/698,563, filed on Jul. 16, 2018; U.S. Provisional Application No. 62/749,815, filed on Oct. 24, 2018; U.S. Provisional Application No. 62/698,582, filed on Jul. 16, 2018; U.S. Provisional Application No. 62/749,808, filed on Oct. 24, 2018; U.S. Provisional Application No. 62/698,595, filed on Jul. 16, 2018; U.S. Provisional Application No. 62/749,800, filed on Oct. 24, 2018; U.S. Provisional Application No. 62/698,623, filed on Jul. 16, 2018; and U.S. Provisional Application No. 62/769,253, filed on Nov. 19, 2018. The entirety of each of these applications is incorporated herein by reference.

BACKGROUND

Field

The present specification generally relates to glass ceramic articles, and particularly relates to glass ceramic articles having improved properties, such as low warp, low stress, low have, high transparency, high fracture toughness, and high hardness.

Technical Background

There is a demand for high strength glass for portable electronic devices. Several materials are currently being utilized on the market such as glass, zirconia, plastic, metal, and glass ceramics.

Glass ceramics have certain advantages over other materials, but it can be difficult to form a glass ceramic having the properties required for a high strength portable device. Accordingly, a need exists for glass ceramic articles have improved properties and methods for making the glass ceramic articles.

SUMMARY

A first aspect includes glass ceramic article comprising: a lithium disilicate crystalline phase; a petalite crystalline phased; and a residual glass phase, wherein the glass ceramic article comprises: a warp ($\mu m$)<($3.65 \times 10^{-9}/\mu m \times$ diagonal$^2$) where diagonal is a diagonal measurement of the glass ceramic article in $\mu m$; a stress of less than 30 nm of retardation per mm of glass ceramic article thickness; a haze (%)<0.0994t+0.12 where t is the thickness of the glass ceramic article in mm; and an optical transmission (%)>0.91×10$^{(2-0.03t)}$ of electromagnetic radiation wavelengths from 450 nm to 800 nm, where t is the thickness of the glass ceramic article in mm.

A second aspect includes the glass ceramic article of the first aspect, wherein the glass ceramic article has a fracture toughness in a range from 1.0 MPa√m to 2.0 MPa√m.

A third aspect includes the glass ceramic article of any of the preceding aspects, wherein the glass ceramic article has a hardness measured by a Vickers indenter at a 200 gram load of greater than 680 kgf.

A fourth aspect includes the glass ceramic article of any of the preceding aspects, wherein the glass ceramic article is strengthened and has compressive stress greater than 175 MPa.

A fifth aspect includes the glass ceramic article of the fourth aspect, wherein the glass ceramic article has a central tension greater than or equal to 80 MPa.

A sixth aspect includes the glass ceramic article of the fourth or fifth aspect, wherein the glass ceramic article has a depth of compression of 0*t to 0.3*t, where t is thickness of the glass ceramic article.

A seventh aspect includes the glass ceramic article of any of the preceding aspects, wherein the glass ceramic article comprises greater than 20 wt % of the lithium disilicate crystalline phase.

An eighth aspect includes the glass ceramic article of any of the preceding aspects, wherein the glass ceramic article comprises greater than 20 wt % of the petalite crystalline phase.

A ninth aspect includes the glass ceramic article of any of the preceding aspects, wherein the glass ceramic article comprises from 5 wt % to 30 wt % of the residual glass phase.

A tenth aspect includes the glass ceramic article of any of the preceding aspects, wherein the glass ceramic article comprises a warp measured on 156 mm×76 mm glass articles of less than 100 $\mu m$.

An eleventh aspect includes the glass ceramic article of any of the preceding aspects, wherein the glass ceramic article comprises a stress of less than 25 nm of retardation per mm of glass ceramic article thickness.

A twelfth aspect includes the glass ceramic article of any of the preceding aspects, wherein the glass ceramic article comprises a haze measured at 0.8 mm thickness of less than 0.20.

A thirteenth aspect includes the glass ceramic article of any of the preceding aspects, wherein the glass ceramic article comprises an optical transmission of electromagnetic radiation wavelengths from 450 nm to 800 nm measured at 0.8 mm thickness of greater than 85%.

A fourteenth aspect includes the glass ceramic article of any of the preceding aspects, wherein the glass ceramic article has a thickness from 0.3 mm and 1.0 mm.

A fifteenth aspect includes the glass ceramic article of any of the preceding aspects, wherein the glass ceramic article comprises a lithium phosphate crystalline phase.

A sixteenth aspect includes an electronic device comprising a transparent surface, the transparent surface comprising a glass ceramic article having a thickness of from 0.3 mm to 1.0 mm, the glass ceramic article comprises: a lithium disilicate crystalline phase; a petalite crystalline phased; and a residual glass phase, wherein the glass ceramic article comprises: a warp ($\mu m$)<($3.65 \times 10^{-9}/\mu m \times$ diagonal$^2$) where diagonal is a diagonal measurement of the glass ceramic article in $\mu m$; a stress of less than 30 nm of retardation per mm of glass ceramic article thickness; a haze (%)<0.0994t+0.12 where t is the thickness of the glass ceramic article in mm; and an optical transmission (%)>0.91×10(2−0.03t) of electromagnetic radiation wavelengths from 450 nm to 800 nm, where t is the thickness of the glass ceramic article in mm.

A seventeenth aspect includes the electronic device of the sixteenth aspect, wherein the glass ceramic article has a fracture toughness in a range from 1.0 MPa√m to 2.0 MPa√m.

An eighteenth aspect includes the electronic device of any one of the sixteenth or seventeenth aspects, wherein the glass ceramic article has a hardness measured by a Vickers indenter at a 200 gram load of greater than 680 kgf.

A nineteenth aspect includes the electronic device of any one of the sixteenth to eighteenth aspects, wherein the glass ceramic article is strengthened and has compressive stress greater than 175 MPa.

A twentieth aspect includes the electronic device of the nineteenth aspect, wherein the glass ceramic article has a central tension greater than or equal to 80 MPa.

A twenty first aspect includes the electronic device of any one of the nineteenth or twentieth aspects, wherein the glass ceramic article has a depth of compression of 0*t to 0.3*t, where t is thickness of the glass ceramic article.

A twenty second aspect includes the electronic device of any one of the sixteenth to twenty first aspects, wherein the glass ceramic article comprises greater than 20 wt % of the lithium disilicate crystalline phase.

A twenty third aspect includes the electronic device of any one of the sixteenth to twenty second aspects, wherein the glass ceramic article comprises greater than 20 wt % of the petalite crystalline phase.

A twenty fourth aspect includes the electronic device of any one of the sixteenth to twenty third aspects, wherein the glass ceramic article comprises from 5 wt % to 30 wt % of the residual glass phase.

A twenty fifth aspect includes the electronic device of any one of the sixteenth to twenty fourth aspects, wherein the glass ceramic article comprises a warp measured on 156 mm×76 mm sheets of less than 100 μm.

A twenty sixth aspect includes the electronic device of any one of the sixteenth to twenty fifth aspects, wherein the glass ceramic article comprises a stress of less than 25 nm of retardation per mm of sheet thickness.

A twenty seventh aspect includes the electronic device of any one of the sixteenth to twenty sixth aspects, wherein the glass ceramic article comprises a haze measured at 0.8 mm thickness of less than 0.20.

A twenty eighth aspect includes the electronic device of any one of the sixteenth to twenty seventh aspects, wherein the glass ceramic article comprises an optical transmission of electromagnetic radiation wavelengths from 450 nm to 800 nm measured at 0.8 mm thickness of greater than 85%.

A twenty ninth aspect includes the electronic device of any one of the sixteenth to twenty eighth aspects, wherein the glass ceramic article has a thickness from 0.3 mm and 1.0 mm.

A thirtieth aspect includes a method for ceramming a glass article to a glass-ceramic comprising: placing a glass article into a heating apparatus; heating the glass article to a first hold temperature at a first predetermined heating rate; holding the glass article at the first hold temperature for a first predetermined duration, wherein viscosity of the glass article is maintained within log of viscosity±1.0 poise of a target viscosity during the first predetermined duration; heating the glass article from the first hold temperature to a second hold temperature at a second predetermined heating rate; holding the glass article at the second hold temperature for a second duration, wherein density of the glass article is monitored from the heating of the glass article from the first hold temperature through the second duration; and ending the second duration when an absolute value of a density rate of change of the glass article is less than or equal to 0.10 $(g/cm^3)$/min.

A thirty first aspect includes the method of the thirtieth aspect, wherein ending the second duration occurs when the absolute value of the density rate of change of the glass article is 0.00 $(g/cm^3)$/min.

A thirty second aspect includes the method of the thirty first aspect, wherein during the first predetermined duration, the viscosity of the glass article is maintained within log of viscosity±0.1 poise of the target viscosity.

A thirty third aspect includes the method of any one of the thirty first or thirty second aspects, wherein a viscosity of the glass article is maintained within log of viscosity±1.0 poise of the target viscosity during at least a portion of the heating the glass article from the first hold temperature to a second hold temperature.

A thirty fourth aspect includes the method of any one of the thirty first to thirty third aspects, wherein the viscosity of the glass article is maintained within log viscosity±1.0 poise of the target viscosity during the first predetermined duration using automatic viscosity control.

A thirty fifth aspect includes the method of any one of the thirty first to thirty fourth aspects, wherein the density of the glass article is monitored in-situ during the heating the glass article from the first hold temperature to a second hold temperature and the holding the glass article at the second hold temperature for a second duration.

A thirty sixth aspect includes the method of the thirty fourth aspects, wherein the density of the glass article is monitored in-situ of the heating the glass article from the first hold temperature to a second hold temperature at a second predetermined heating rate and the holding the glass article at the second hold temperature for a second duration with a dilatometer.

A thirty seventh aspect includes the method of any one of the thirty first to thirty sixth aspects, wherein the second duration is ended when the density of the glass article is constant for at least 50 minutes.

A thirty eighth aspect includes the method of any one of the thirty first to thirty seventh aspects, wherein the second duration is ended when the density of the glass article is constant for at least 100 minutes.

A thirty ninth aspect includes the method of any one of the thirty first to thirty eighth aspects, wherein the first predetermined heating rate is determined based at least in part on performance of an automatic viscosity control system.

A fortieth aspect includes the method of any one of the thirty first to thirty ninth aspects, wherein the second predetermined heating rate is determined based at least in part on performance of an automatic viscosity control system.

A forty first aspect includes the method of any one of the thirty first to fortieth aspects, further comprising applying a weight constraining force to the glass article.

A forty second aspect includes the method of any one of the thirty first to forty first aspects, wherein the glass article is part of a glass stack.

A forty third aspect includes the method of the forty second aspect, wherein the glass stack comprises: a first setter; a plurality of glass sheets placed on the first setter; and a second setter on the stack of glass sheets.

A forty fourth aspect includes the method of any one of the forty second to forty third aspects, wherein the plurality of glass sheets comprises at least 10 glass sheets.

A forty fifth aspect includes the method of any one of the forty second to forty fourth aspects, wherein the plurality of glass sheets comprises at least 20 glass sheets.

A forty sixth aspect includes the method of any one of the thirty first to forty fifth aspects, wherein a temperature differential of the glass article from a programmed temperature within the first predetermined duration is within ±8° C.

A forty seventh aspect includes the method of any one of the thirty first to forty sixth aspects, wherein a temperature differential of the glass article from a programmed temperature within the first predetermined duration is within ±5° C.

A forty eighth aspect includes the method of any one of the thirty first to forty seventh aspects, wherein a temperature differential of the glass article from a programmed temperature within the second duration is within ±8° C.

A forty ninth aspect includes the method of any one of the thirty first to forty eighth aspects, wherein a temperature differential of the glass article from a programmed temperature within the second duration is within ±5° C.

A fiftieth aspect includes the method of any one of the thirty first to forty ninth aspects, wherein heating the glass article to a first hold temperature at a first predetermined heating rate comprises multistage heating.

A fifty first aspect includes the method of any one of the thirty first to fiftieth aspects, wherein during the heating the glass article to a first hold temperature at a first predetermined heating rate, the viscosity of the glass article is maintained at greater than or equal to log viscosity 11.0 poise.

A fifty second aspect includes the method of any one of the thirty first to fifty first aspects, wherein during the first predetermined duration, the viscosity of the glass article is maintained at greater than or equal to log viscosity 11.0 poise.

A fifty third aspect includes the method of any one of the thirty first to fifty second aspects, wherein during the heating the glass article from the first hold temperature to the second hold temperature, the viscosity of the glass article is maintained at greater than or equal to log viscosity 11.0 poise.

A fifty fourth aspect includes the method of any one of the thirty first to fifty third aspects, wherein the viscosity of the glass article is maintained at greater than or equal to log viscosity 11.0 poise for the entire duration of the method.

A fifty fifth aspect includes the method of any one of the thirty first to fifty fourth aspects, wherein during the first predetermined duration, the viscosity of the glass article is maintained at less than log viscosity 11.0 poise.

A fifty sixth aspect includes a glass-ceramic article comprising: a first surface; a second surface opposing the first surface; one or more crystalline phases; a residual glass phase; a compressive stress layer extending from the first surface to a depth of compression (DOC); a maximum central tension greater than 90 MPa; a stored tensile energy greater than 22 J/m$^2$; a fracture toughness greater than 1.0 MPa$\sqrt{}$m; and a haze less than 0.2.

A fifty seventh aspect includes the glass ceramic article of the fifty sixth aspect further comprising a Young's modulus greater than 95 GPa.

A fifty eighth aspect includes the glass ceramic article of any one of the fifty sixth and fifty seventh aspects, wherein the fracture toughness is in a range from greater than 1.0 MPa$\sqrt{}$m to 2.0 MPa$\sqrt{}$m.

A fifty ninth aspect includes a glass-ceramic article comprising: a first surface; a second surface opposing the first surface; one or more crystalline phases; a residual glass phase; a compressive stress layer extending from the first surface to a depth of compression (DOC); a maximum central tension greater than 90 MPa; a stored tensile energy greater than 22 J/m$^2$; Young's modulus greater than 95 GPa; and a haze less than 0.2.

A sixtieth aspect includes the glass ceramic article of the fifty ninth aspect, wherein the Young's modulus is in a range from greater than 95 GPa to 110 GPa.

A sixty first aspect includes the glass ceramic article of any one of the fifty sixth to sixtieth aspects, wherein a ratio of Li$_2$O (mol %)/R$_2$O (mol %) is greater than 0.85, wherein R$_2$O is a sum of alkali metal oxides.

A sixty second aspect includes the glass ceramic article of any one of the fifty ninth to sixty first aspects, further comprising ZrO$_2$ in a range from 1.7 mol % to 4.5 mol %.

A sixty third aspect includes a glass-ceramic article comprising: a first surface; a second surface opposing the first surface; one or more crystalline phases; a residual glass phase; a compressive stress layer extending from the first surface to a depth of compression (DOC); a maximum central tension greater than 90 MPa; a stored tensile energy greater than 22 J/m$^2$; ZrO$_2$ in a range from 1.7 mol % to 4.5 mol %; and a ratio of LiO$_2$ (mol %)/R$_2$O (mol %) is greater than 0.85, wherein R$_2$O is a sum of alkali metal oxides.

A sixty fourth aspect includes a glass ceramic of any one of the fifty sixth to sixty third aspects, wherein the residual glass phase is less than or equal to 50 wt % of the glass-ceramic article.

A sixty fifth aspect includes a glass ceramic of any one of the fifty sixth to sixty fourth aspects, wherein the one or more crystalline phases comprises petalite.

A sixty sixth aspect includes a glass ceramic of any one of the fifty sixth to sixty fifth aspects, wherein the one or more crystalline phases comprises lithium disilicate.

A sixty seventh aspect includes a glass ceramic of any one of the fifty sixth to sixty sixth aspects, wherein a sum of crystalline phases other than lithium disilicate and petalite is less than 1 wt % of the glass-ceramic article.

A sixty eighth aspect includes a glass ceramic of any one of the fifty sixth to sixty seventh aspects, wherein the glass-ceramic article is transparent and has a transmittance of at least 85% for light in a wavelength range from 450 nm to 800 nm at a thickness of 1 mm.

A sixty ninth aspect includes a glass ceramic of any one of the fifty sixth to sixty eighth aspects, wherein the glass-ceramic article breaks into less than 5 fragments when subjected to the Fragment Test.

A seventieth aspect includes a glass ceramic of any one of the fifty sixth to sixty ninth aspects, wherein the maximum central tension is in a range from greater than 90 MPa to 180 MPa.

A seventy first aspect includes a glass ceramic of any one of the fifty sixth to seventieth aspects, wherein the stored tensile energy is in a range from greater than 22 J/m$^2$ to 60 J/m$^2$.

A seventy second aspect includes a glass ceramic of the fifty sixth aspect, further comprising grains having grains having a longest dimension of 150 nm or less.

A seventy third aspect includes a consumer electronic product, comprising a housing comprising a front surface, a back surface and side surfaces; electrical components at least partially within the housing, the electrical components comprising at least a controller, a memory, and a display, the display at or adjacent the front surface of the housing; and a cover substrate disposed over the display, wherein at least one of a portion of the housing or the cover substrate comprises the glass-ceramic article of any of the preceding claims.

A seventy fourth aspect includes a method of forming a glass-ceramic article, the method comprising: heating a glass composition to a nucleation temperature to create a nucleated crystallizable glass composition; heating the nucleated crystallizable glass composition to a crystallization temperature; and maintaining the crystallization temperature for a predetermined period of time to produce the glass-ceramic article, wherein the glass-ceramic article comprises: a fracture toughness greater than 1.0 MPa√m; and a haze less than 0.2.

A seventy fifth aspect includes the method of the seventy fourth aspect, further comprising: maintaining the nucleation temperature for a predetermined period of time to produce the nucleated crystallizable glass composition.

A seventy sixth aspect includes the method of the seventy fifth aspect, wherein the period of time for maintaining the nucleation temperature is in a range from 1 minute to 6 hours.

A seventy seventh aspect includes the method of any one of the seventy fourth to seventy sixth aspects, wherein the glass composition is not maintained at the nucleation temperature.

A seventy eighth aspect includes the method of any one of the seventy fourth to seventy seventh aspects, further comprising: heating the nucleated crystallizable glass composition to an intermediate temperature, wherein the intermediate temperature is greater than the nucleation temperature and less than the crystallization temperature; and heating the nucleated crystallizable glass composition from the intermediate temperature to the crystallization temperature.

A seventy ninth aspect includes the method of the seventy eighth aspect, further comprising: maintaining the intermediate temperature for a predetermined period of time.

An eightieth aspect includes the method of any one of the seventy eighth or seventy ninth aspects, wherein a heating rate for heating the nucleated crystallizable glass composition from the nucleation temperature to the intermediate temperature is different than the heating rate for heating the nucleated crystallizable glass composition from the intermediate temperature to the crystallization temperature.

An eighty first aspect includes the method of the eightieth aspect, wherein the nucleating crystallizable glass composition is not maintained at the intermediate temperature.

An eighty second aspect includes the method of any one of the seventy eighth to the eighty first aspects, further comprising: subjecting the glass-ceramic article to an ion-exchange treatment to create a compressive stress layer extending from a first surface of the glass-ceramic article to a depth of compression (DOC), wherein after the ion-exchange treatment the glass-ceramic article has a maximum central tension greater than 90 MPa and a stored tensile energy greater than 22 J/m$^2$.

An eighty third aspect includes the method of any one of the seventy eighth to eighty second aspects, wherein the nucleation temperature is in a range from 550° C. to 650° C.

An eighty fourth aspect includes the method of any one of the seventy eighth to eighty third aspects, wherein the heating to the nucleation temperature comprises heating from room temperature to the nucleation temperature at a heating rate in a range from 0.01° C./min to 50° C./min.

An eighty fifth aspect includes the method of any one of the seventy eighth to eighty fourth aspects, wherein the crystallization temperature is in a range from 680° C. to 800° C.

An eighty sixth aspect includes the method of any one of the seventy eighth to eighty fifth aspects, wherein the predetermined period of time for maintaining the crystallization temperature is in a range from 1 minute to 4 hours.

An eighty seventh aspect includes the method of any one of the seventy eighth to eighty sixth aspects, wherein the heating to the crystallization temperature comprises heating from the nucleation temperature to the crystallization temperature at a heating rate in a range from 0.01° C./min to 50° C./min.

An eighty sixth aspect includes the method of any one of the seventy eighth to eighty seventh aspects, further comprising: in a first cooling stage, cooling the glass-ceramic article from the crystallization temperature to a first temperature at a first cooling rate; and in a second cooling stage, cooling the glass-ceramic article from the first temperature to a second temperature at a second cooling rate, wherein the first cooling rate is slower than the second cooling rate.

An eighty seventh aspect includes the method of any one of the seventy eighth to eighty sixth aspects, further comprising: in a first cooling stage, cooling the glass-ceramic article from the crystallization temperature to a first temperature at a first cooling rate; in an intermediate cooling stage, cooling the glass-ceramic article from the first temperature to a second temperature at second cooling rate; in a second cooling stage, cooling the glass-ceramic article from the second temperature to a third temperature at a third cooling rate, wherein (i) the first cooling rate is slower than the second cooling rate and the third cooling rate and (ii) the second cooling rate is slower than the third cooling rate.

An eighty eighth aspect includes the method of any one of the seventy eighth to eighty seventh aspects, wherein the glass-ceramic has an optical retardance of less than 15 nm/mm of thickness.

An eighty ninth aspect includes a method of forming a glass-ceramic article, the method comprising: heating a glass composition to a nucleation temperature ($T_N$); maintaining the nucleation temperature for a first predetermined period of time ($t_N$) to produce a nucleated crystallizable glass composition; heating the nucleated crystallizable glass composition to a crystallization temperature ($T_C$); and maintaining the crystallization temperature for a second predetermined period of time ($t_C$) to produce the glass-ceramic article, wherein $(103-0.260T_N+0.000203(T_N)^2-7.96t_N+0.1532(t_N)^2-0.019T_C-0.000008(T_C)^2-10.03t_C+0.00597T_N*t_N+0.00463t_N*T_C+0.01342T_C*t_C)<0.2$.

A ninetieth aspect includes a method for controlling the haze of a glass-ceramic article, the method comprising: selecting a nucleation temperature ($T_N$), a first predetermined period of time ($t_N$), a crystallization temperature ($T_C$), and a second predetermined period of time ($t_C$) so that $(103-0.260T_N+0.000203(T_N)^2-7.96t_N+0.1532(t_N)^2-0.019T_C-0.000008(T_C)^2-10.03t_C+0.00597T_N*t_N+0.00463t_N*T_C+0.01342T_C*t_C)<0.2$.

An ninety first aspect includes the method of the ninetieth aspect, further comprising: heating a glass composition to the nucleation temperature ($T_N$); maintaining the nucleation temperature for the first predetermined period of time ($t_N$) to produce a nucleated crystallizable glass composition; heating the nucleated crystallizable glass composition to the crystallization temperature ($T_C$); and maintaining the crystallization temperature for the second predetermined period of time ($t_C$) to produce the glass-ceramic article.

A ninety second aspect includes a method of ceramming a plurality of glass sheets comprising: positioning a first portion of the plurality of glass sheets in a first stack between a first setter plate and a second setter plate and a second portion of the plurality of glass sheets in a second stack between the second setter plate and a third setter plate on top of the first stack in a glass stack configuration; and exposing the glass stack configuration to a ceramming cycle to ceram the plurality of glass sheets, wherein a ΔT of the first stack or the second stack is less than 10° C. when the glass sheets are heated to a nucleation temperature for a predetermined period of time during the ceramming cycle; or wherein a ΔT of the first stack or the second stack is less than 10° C. when the glass sheets are heated to a crystallization temperature for a predetermined period of time during the ceramming cycle.

A ninety third aspect includes the method of the ninety second aspect, wherein the plurality of glass sheets have a maximum thickness variation of 21 μm or less.

A ninety fourth aspect includes the method of any one of the ninety second or ninety third aspects, further comprising removing the edge beads on each of the plurality of glass sheets.

A ninety fifth aspect includes the method of any one of the ninety second to ninety fourth aspects, further comprising forming a parting agent layer between one of the plurality of glass sheets and adjacent one of the plurality of glass sheets from an aqueous dispersion of boron nitride and a colloidal inorganic binding agent.

A ninety sixth aspect includes the method of any one of the ninety second to ninety fifth aspects, further comprising forming a parting agent layer between one of the plurality of glass sheets and adjacent one of first setter plate, the second setter plate, or the third setter plate from an aqueous dispersion of boron nitride and a colloidal inorganic binding agent.

A ninety seventh aspect includes the method of any one of the ninety second to ninety sixth aspects, wherein during the predetermined period of time at which the glass sheets are maintained at the nucleation temperature, the glass stack configuration has a ΔT of 2.2° C. or less between a bottom of the first stack proximate the first setter plate and a top of the second stack proximate the third setter plate.

A ninety eighth aspect includes the method of any one of the ninety second to ninety seventh aspects, wherein the ceramming process includes a controlled cooling from a maximum temperature in the ceramming process to a temperature of about 450° C. at a rate of about 4° C./min followed by a quenching step to a temperature of approximately room temperature.

A ninety ninth aspect includes the method of any one of the ninety second to ninety eighth aspects, wherein each of the first setter plate, the second setter plate, and the third setter plate comprise reaction bonded silicon carbide.

A hundredth aspect includes the method of any one of the ninety second to ninety ninth aspects, wherein each of the first setter plate, the second setter plate, and the third setter plate have a maximum flatness of less than or equal to about 100 μm.

A hundred first aspect includes the method of any one of the ninety second to hundredth aspects, wherein each of the first setter plate, the second setter plate, and the third setter plate have a maximum flatness of less than or equal to about 25 μm.

A hundred second aspect includes the method of any one of the ninety second to hundred first aspects, wherein each of the first setter plate, the second setter plate, and the third setter plate has a thickness t of from about 6.5 mm to about 10 mm.

A hundred third aspect includes the method of any one of the ninety second to hundred second aspects, wherein the glass stack configuration is supported on a carrier plate comprising steel in an open grid configuration.

A hundred fourth aspect includes a method of ceramming a plurality of glass sheets comprising: reducing a thickness variation in the plurality of glass sheets; positioning the plurality of glass sheets between a first setter plate and a second setter plate in a glass stack configuration; and exposing the glass stack configuration to a ceramming cycle to ceram the plurality of glass sheets.

A hundred fifth aspect includes a method of the hundred fourth aspect, wherein reducing the thickness variation in the plurality of glass sheets comprises reducing the thickness variation in the plurality of glass sheets to a maximum thickness variation of 21 μm or less.

A hundred sixth aspect includes a method of any one of the hundred fourth to hundred fifth aspects, further comprising removing the edge beads on each of the plurality of glass sheets.

A hundred seventh aspect includes a method of any one of the hundred fourth to hundred sixth aspects, further comprising forming a parting agent layer between one of the plurality of glass sheets and adjacent one of the plurality of glass sheets from an aqueous dispersion of boron nitride and a colloidal inorganic binding agent.

A hundred eighth aspect includes a method of any one of the hundred fourth to hundred seventh aspects, wherein during the predetermined period of time at which the glass sheets are maintained at a nucleation temperature, the glass stack configuration has a ΔT of 2.2° C. or less between a glass sheet proximate the first setter plate and a glass sheet proximate the second setter plate.

A hundred ninth aspect includes a method of any one of the hundred fourth to hundred eighth aspects, wherein the ceramming process includes a controlled cooling from a maximum temperature in the ceramming process to a temperature of about 450° C. at a rate of about 4° C./min followed by a quenching step to a temperature of approximately room temperature.

A hundred tenth aspect includes a method of any one of the hundred fourth to hundred ninth aspects, wherein each of the first setter plate and the second setter plate has a maximum flatness of less than or equal to about 25 μm.

A hundred eleventh aspect includes a method of any one of the hundred fourth to hundred tenth aspects, wherein the glass stack configuration is supported on a carrier plate comprising steel in an open grid configuration.

A hundred twelfth aspect includes a method of ceramming a plurality of glass sheets comprising: positioning the plurality of glass sheets in a stack between a first setter plate and a second setter plate in a glass stack configuration; and exposing the glass stack configuration to a ceramming cycle to ceram the plurality of glass sheets, wherein the first setter plate and the second setter plate each have: a specific heat capacity of from about 670 J/kg*K to about 850 J/kg*K, as measured in accordance with ASTM E1461 at room temperature; a bulk density of greater than about 2500 kg/m$^3$, as measured in accordance with ASTM C20; or a thermal diffusivity of greater than about $2.50 \times 10^{-5}$ m$^2$/s.

A hundred thirteenth aspect includes a method of the hundred twelfth aspect, wherein the first setter plate and the second setter plate each have a specific heat capacity of from about 670 J/kg*K to about 850 J/kg*K, as measured in accordance with ASTM E1461 at room temperature and a bulk density of greater than about 2500 kg/m$^3$, as measured in accordance with ASTM C20.

A hundred fourteenth aspect includes a method of any one of the hundred twelfth to hundred thirteenth aspects, wherein the first setter plate and the second setter plate each have a specific heat capacity of from about 670 J/kg*K to about 850 J/kg*K, as measured in accordance with ASTM E1461 at room temperature and a thermal diffusivity of greater than about $2.50 \times 10^{-5}$ m$^2$/s.

A hundred fifteenth aspect includes a method of any one of the hundred twelfth to hundred fourteenth aspects, wherein the first setter plate and the second setter plate each have a bulk density of greater than about 2500 kg/m³, as measured in accordance with ASTM C20 and a thermal diffusivity of greater than about $2.50 \times 10^5$ m²/s.

A hundred sixteenth aspect includes a method of any one of the hundred twelfth to hundred fifteenth aspects, wherein at least one of the first setter plate and the second setter plate comprises at least 85 wt % reaction bonded silicon carbide.

A hundred seventeenth aspect includes a method of any one of the hundred twelfth to hundred sixteenth aspects, wherein at least one of the first setter plate and the second setter plate has a porosity of less than about 1%.

A hundred eighteenth aspect includes a method of any one of the hundred twelfth to hundred seventeenth aspects, wherein at least one of the first setter plate and the second setter plate has a maximum flatness of less than or equal to about 100 μm.

A hundred nineteenth aspect includes a method of any one of the hundred twelfth to hundred eighteenth aspects, wherein at least one of the first setter plate and the second setter plate has a maximum flatness of less than or equal to about 75 μm.

A hundred twentieth aspect includes a method of any one of the hundred twelfth to hundred nineteenth aspects, wherein at least one of the first setter plate and the second setter plate has a maximum flatness of less than or equal to about 50 μm.

A hundred twenty first aspect includes a method of any one of the hundred twelfth to hundred twentieth aspects, wherein at least one of the first setter plate and the second setter plate has a maximum flatness of less than or equal to about 25 μm.

A hundred twenty second aspect includes a method of any one of the hundred twelfth to hundred twenty first aspects, wherein the first setter plate and the second setter plate each have a thickness t of from about 6.5 mm to about 10 mm.

A hundred twenty third aspect includes a method of any one of the hundred twelfth to hundred twenty second aspects, wherein the first setter plate and the second setter plate each have a specific heat capacity of from about 670 J/kg*K to about 700 J/kg*K, as measured in accordance with ASTM E1461 at room temperature.

A hundred twenty fourth aspect includes a method of any one of the hundred twelfth to hundred twenty third aspects, wherein the first setter plate and the second setter plate each have a bulk density of from about 3000 kg/m³ to about 3500 kg/m³, as measured in accordance with ASTM C20.

A hundred twenty fifth aspect includes a method of any one of the hundred twelfth to hundred twenty fourth aspects, wherein the first setter plate and the second setter plate each have a thermal diffusivity of from about $7.50 \times 10^{-5}$ m²/s to about $1.50 \times 10^{-4}$ m²/s.

A hundred twenty sixth aspect includes a method of any one of the hundred twelfth to hundred twenty fifth aspects, wherein the first setter plate and the second setter plate each have a thermal conductivity of from about 180 W/m-K to about 250 W/m-K, as measured in accordance with ASTM E1461 at room temperature.

A hundred twenty seventh aspect includes a system for ceramming a plurality of glass sheets comprising: a carrier plate to support the plurality of glass sheets during a ceramming process; and at least one setter plate supported by the carrier plate, the at least one setter plate comprising reaction bonded silicon carbide and having a maximum flatness of less than or equal to about 100 μm.

A hundred twenty eighth aspect includes a method of the hundred twenty seventh aspect, wherein the setter plate has a maximum flatness of less than or equal to about 25 μm.

A hundred twenty ninth aspect includes a method of any one of the hundred twenty seventh to hundred twenty eighth aspects, wherein the setter plate has: a specific heat capacity of from about 670 J/kg*K to about 850 J/kg*K, as measured in accordance with ASTM E1461 at room temperature; a bulk density of greater than about 2500 kg/m³, as measured in accordance with ASTM C20; or a thermal diffusivity of greater than about $2.50 \times 10^{-5}$ m²/s.

A hundred thirtieth aspect includes a method of any one of the hundred twenty seventh to hundred twenty ninth aspects, wherein the carrier plate comprises steel in an open grid configuration.

A hundred thirty first aspect includes a method of any one of the hundred twenty seventh to hundred thirtieth aspects, wherein the setter plate has a thickness t of from about 6.5 mm to about 10 mm.

A hundred thirty second aspect includes a coated glass article comprising: a glass substrate having a parting agent layer thereon, the parting agent layer formed from an aqueous dispersion comprising boron nitride and a colloidal inorganic binding agent.

A hundred thirty third aspect includes a coated glass article of the hundred thirty second aspect, wherein the colloidal inorganic binding agent comprises aluminum oxide.

A hundred thirty fourth aspect includes a coated glass article of any one of the hundred thirty second to hundred thirty third aspects, wherein the boron nitride is present in the form of agglomerated particles having an average particle size of from about 2 μm to about 4 μm.

A hundred thirty fifth aspect includes a coated glass article of any one of the hundred thirty second to hundred thirty fourth aspects, wherein the aqueous dispersion is substantially free of volatile organic solvents.

A hundred thirty sixth aspect includes a coated glass article of any one of the hundred thirty second to hundred thirty fifth aspects, wherein the aqueous dispersion further comprises at least one dispersant.

A hundred thirty seventh aspect includes a coated glass article of any one of the hundred thirty second to hundred thirty sixth aspects, wherein the parting agent layer has a dry coat weight of from about 2 gsm to about 6 gsm.

A hundred thirty eighth aspect includes a coated glass article of any one of the hundred thirty second to hundred thirty seventh aspects, wherein the glass substrate comprises a glass ceramic substrate.

A hundred thirty ninth aspect includes a coated glass article of any one of the hundred thirty second to hundred thirty eighth aspects, wherein the coated glass substrate has a percent transmission of from about 76% to about 83% as measured in accordance with ASTM D1003.

A hundred fortieth aspect includes a coated glass article of any one of the hundred thirty eighth to hundred thirty ninth aspects, wherein the coated glass substrate has a percent haze of from about 25% to about 38% as measured in accordance with ASTM D1044.

A hundred forty first aspect includes a method of ceramming a plurality of glass sheets comprising: spray coating an aqueous dispersion comprising boron nitride and a colloidal inorganic binding agent onto at least one of a setter plate and one or more of the plurality of glass sheets; positioning the plurality of glass sheets between at least two setter plates in a glass stack configuration; and exposing the glass stack configuration to a ceramming cycle sufficient to ceram the plurality of glass sheets.

A hundred forty second aspect includes the method of the hundred forty first aspect, wherein the colloidal inorganic binding agent comprises aluminum oxide.

A hundred forty third aspect includes the method of any one of the hundred forty first to hundred forty second aspects, wherein the boron nitride is present in the form of agglomerated particles having an average particle size of from about 2 µm to about 4 µm.

A hundred forty fourth aspect includes the method of any one of the hundred forty first to hundred forty third aspects, wherein the aqueous dispersion is substantially free of volatile organic solvents.

A hundred forty fifth aspect includes the method of any one of the hundred forty first to hundred forty third aspects, wherein the aqueous dispersion has a specific gravity of from about 1.0 to about 1.2.

A hundred forty sixth aspect includes the method of any one of the hundred forty first to hundred forty fifth aspects, wherein the aqueous dispersion has a viscosity of from about 120 cP to about 160 cP.

A hundred forty seventh aspect includes the method of any one of the hundred forty first to hundred forty sixth aspects, wherein the aqueous dispersion has a pH of from about 3 to about 5.

A hundred forty eighth aspect includes the method of any one of the hundred forty first to hundred forty seventh aspects, wherein the aqueous dispersion is spray coated onto a surface of one of the plurality of glass sheets to form a parting agent layer, and wherein positioning the plurality of glass sheets between the at least two setter plates comprises positioning the glass sheet having the parting agent layer thereon below an adjacent glass sheet such that the parting agent layer is between the surface of the glass sheet and the adjacent glass sheet.

A hundred forty ninth aspect includes the method of any one of the hundred forty first to hundred forty eighth aspects, wherein the parting agent layer has a dry coat weight of from about 2 gsm to about 6 gsm.

A hundred fiftieth aspect includes the method of any one of the hundred forty first to hundred forty ninth aspects, wherein, after exposing the glass stack configuration to the ceramming cycle, the glass sheet having the parting agent layer thereon has a percent transmission of from about 76% to about 83% as measured in accordance with ASTM D1003.

DETAILED DESCRIPTION

Figure 1:
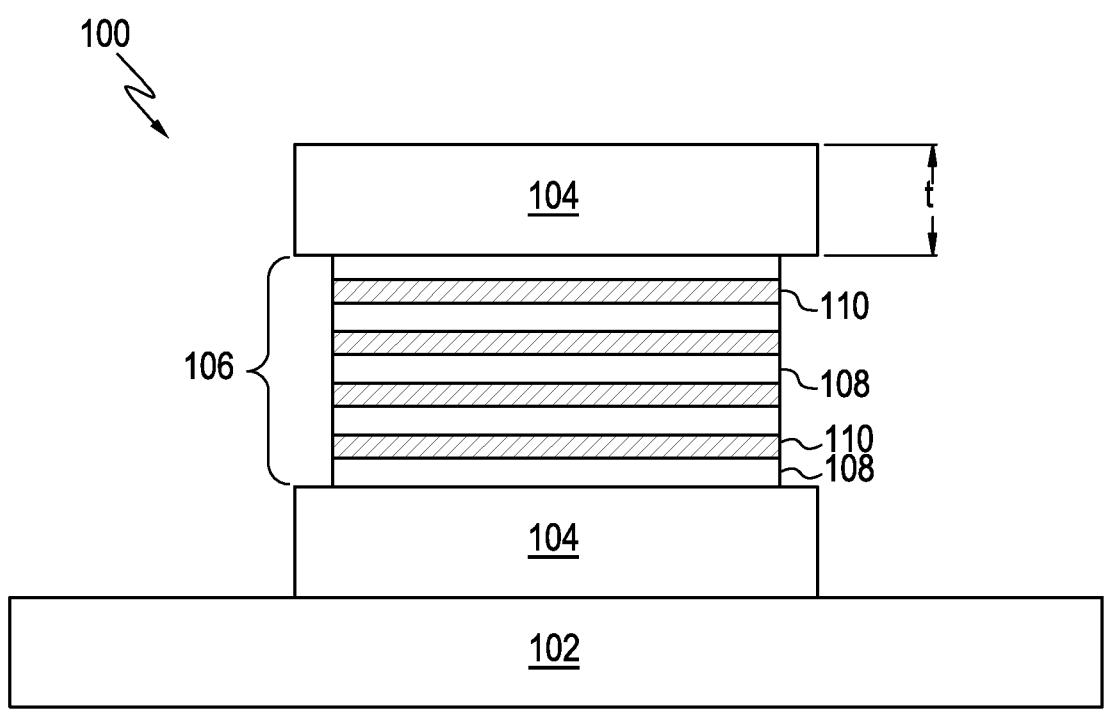
FIG. 1 schematically depicts a glass stack according to embodiments disclosed and described herein.

Reference will now be made in detail to embodiments of cerammed glass articles, methods for ceramming glass articles, and systems for ceramming glass articles have advantageous properties; embodiments of which are illustrated in the accompanying drawings. Various embodiments will be described herein with specific reference to the appended drawings.

Definitions and Measurement Techniques

As used herein, the term "glass-ceramic" are solids prepared by controlled crystallization of a precursor glass and have one or more crystalline phases and a residual glass phase.

As used herein, "depth of compression" or "DOC" refers to the depth of a compressive stress (CS) layer and is the depth at which the stress within a glass-ceramic article changes from compressive stress to tensile stress and has a stress value of zero. According to the convention normally used in the art, compressive stress is expressed as a negative (<0) stress and tensile stress is expressed as a positive (>0) stress. Throughout this description, however, and unless otherwise noted, CS is expressed as a positive or absolute value—that is, as recited herein, CS=|CS|.

The DOC and maximum central tension (CT) values are measured using a scattered light polariscope (SCALP) model number SCALP-04 available from GlasStress Ltd., located in Tallinn, Estonia.

The surface CS measurement method depends on whether or not a vitreous region or layer is formed at the surface of the glass-ceramic article during ion exchange. If there is no vitreous layer or region, then the surface CS is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety. If a vitreous region or layer is formed, then the surface CS (and the CS of the vitreous layer or region) is measured by the birefringence of the first transmission (coupling) resonance of the vitreous region in a prism coupling measurement and measures the depth of layer of the vitreous region by the spacing between the first and second transmission resonances or the breadth of the first transmission resonance.

The CS in the remainder of the CS region is measured by the refracted near-field (RNF) method described in U.S. Pat. No. 8,854,623, entitled "Systems and methods for measuring a profile characteristic of a glass sample", which is hereby incorporated by reference in its entirety. The RNF measurement is force balanced and calibrated to the maximum CT value provided by a SCALP measurement. In particular, the RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

The stress profile may be measured with a combination of RNF for the inner CS, SCALP for the CT region, and the method used for measuring the surface CS.

Stored tensile energy in ($J/m^2$) is calculated using the following Equation (1):

$$\text{stored tensile energy } (J/m^2) = [(1-\nu)/E] \int (\sigma^2)(dt) \qquad (1)$$

where $\nu$ is Poisson's ratio, E is the Young's modulus, $\sigma$ is the stress, t is the thickness, and the integration is calculated across the thickness of the tensile region only.

Fracture toughness is measured following Chevron Notch Short Bar (CNSB) ASTM E 1304-97 method. The samples measured are prepared from a thick patty of glass of the desired composition and cerammed with the ceramming cycle of interest ("COR" in the example presented) in a box furnace.

Hardness is measured using a MITUTOYO HM 114 Hardness testing machine with a Vickers indenter with a 200 gram indentation load (Dwell time is 15 seconds). Measurement of indentation diagonals is performed using calibrated optical microscopy. Values are average of measurements from 5 indentations per sample. Tests are performed on optically polished samples with plane parallel faces.

The crystalline phase assemblage (before ion exchange) and weight percentage of the crystalline phases and residual glass phase is determined based on x-ray diffraction (XRD) using a Rietveld analysis.

The following procedure, referred to herein as "the Fragment Test," is used for determining the number of fragments the glass-ceramic article breaks into upon fracture. An ion-exchanged glass-ceramic article have dimensions of 50 mm by 50 mm by 0.8 mm is placed on a steel surface. A stylus with a tungsten carbide tip (available from Fisher Scientific Industries, under the trademark TOSCO® and manufacturer identifying number #13-378, with a 60 degree coni-spherical tip), having a weight of 40 g is connected to a clamp on a gear driven mechanism that moves the stylus up and down. The tip of the stylus is placed in contact with the glass-ceramic article and then the gear mechanism is incrementally turned until the glass-ceramic article breaks. Then the number of fragments is counted.

The fracture toughness value ($K_{1C}$) was measured by chevron notched short bar (CNSB) method disclosed in Reddy, K. P. R. et al, "Fracture Toughness Measurement of Glass and Ceramic Materials Using Chevron-Notched Specimens," J. Am. Ceram. Soc., 71 [6], C-310-C-313 (1988) except that $Y^*_m$ is calculated using equation 5 of Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (October 1992). For thin sheets, fracture toughness can be measured using a Vickers indentor at a 500 gf load according to the methods presented in Nihara et al., The Young's modulus values recited in this disclosure refer to a value as measured by a resonant ultrasonic spectroscopy technique of the general type set forth in ASTM E2001-13.

Haze of a glass-ceramic article is measured using a haze meter, such as the BYK Gardner Haze-Gard I, such as following ASTM D1003 or ASTM D1044.

The transmittance, as utilized herein refers to total transmittance, and is measured with a Perkin Elmer Lambda 950 UV/VIS/NIR spectrophotometer with a 150 mm integrating sphere. The samples were mounted at the sphere's entrance port, allowing for collection of wide angle scattered light. The total transmittance data was collected with the reference Spectralon reflectance disc over the sphere's exit port. The percent of total transmittance (% T) was calculated relative to an open beam baseline measurement.

Stress is measured as the retardance of the glass-ceramics after ceramming is measured by the GFP1400 sold by Stress Photonics Inc. of Madison, Wisconsin (GFP=Grey Field Polarizer). Similar measurements may be made with other systems, such as commercially available systems (systems sold by Axometrics, Inc.) or custom-made systems." The stress is typically measured on the full sheets after ceramming. The measurement area corresponds to an area ~5 mm inbound from the dimensions of the full sheet (full sheets have dimensions ~245×641 (+/−10 mm) in the given examples). Alternatively, the stress can be measured on parts cut from the full sheets after ceramming. The parting agent remaining on the surface of the sheets may lead to higher stress values reported. This parting agent can be removed (brushing or washing the surface) prior to measurements.

Optical transmission is measured in the 250-1000 nm range on optically polished samples with plane parallel faces using a Perkin Elmer Lambda 950 spectrophotometer, with data interval of 2 nm. The transmission is measured on the glass ceramic article itself without any coatings or other applications.

X-ray diffraction (XRD) is measured using a Bruker D4 Endeavor equipped with Cu radiation and a LynxEye detector. Rietveld is done using Bruker's Topas software package.

Raman data is measured using DXR2 SmartRaman from Thermo Fisher.

Heat capacity is measured according ASTM E1461 at room temperature and all ranges and subranges there between.

Density is measured according to as measured in accordance with ASTM C20.

Thermal conductivity is measured according to ASTM E1461 at room temperature.

The optical retardation may be measured according to ASTM F218-13.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation; and the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

Directional terms as used herein—for example up, down, right, left, front, back, top, bottom, vertical, horizontal—are made only with reference to the figures as drawn and are not intended to imply absolute orientation unless otherwise expressly stated.

As used herein, the terms "warp" and "flatness"—and any variations thereof—are used interchangeably and have the same meaning.

Any ranges used herein include all ranges and subranges and any values there between unless explicitly stated otherwise.

General Overview of Glass-Ceramic Articles

Reference will now be made in detail to the present preferred embodiment(s), examples of which is/are illustrated in the accompanying drawings. Whenever possible, the same reference numerals will be used throughout the drawings to refer to the same or like parts.

Glass-ceramic articles have attributes that can be tailored for use as cover substrates and/or housings for mobile electronic devices. For example, without being bound by theory, glass-ceramic articles with high fracture toughness and/or Young's modulus can provide resistance to crack penetration and drop performance. When such glass-ceramic articles are chemically strengthened, for example through ion exchange, the resistance to crack penetration and drop performance can be further enhanced. And the high fracture toughness and/or Young's modulus can also increase the amount of stored tensile energy and maximum central tension that can be imparted to the glass-ceramic article through chemical tempering while maintaining desirable fragmentation of the glass-ceramic article upon fracture. As another example, the optical characteristics of the glass-ceramic articles, such as transparency and haze, can be tailored through adjusting the heating/ceramming schedule used to turn a glass article into a glass-ceramic article as well as through chemical strengthening, such as through ion exchange, to design or control the properties of the glass-ceramic article.

Stack Configurations for Forming Glass Ceramic Articles

In general, a process for forming a glass-ceramic includes forming a glass article and ceramming the glass article to transform the glass article into a glass-ceramic form. Referring to FIG. 1, an example stack configuration 100 for ceramming is illustrated. The stack configuration 100 includes a carrier plate 102 supporting two setter plates 104, and a glass stack 106 positioned between the setter plates 104.

In some embodiments, insulation layers (not shown) may be located on the top surface of the upper setter plate 104 and one the bottom surface of the lower setter plate 104. The insulation layers may be formed from any material having a low thermal conductivity and can reduce or even eliminate axial temperature gradients of the glass sheets 108 on the top and bottom of the glass stack 106.

As shown in FIG. 1, the glass stack 106 includes a plurality of glass sheets 108, each glass sheet 108 being separated from an adjacent glass sheet 108 by a parting agent layer 110. The parting agent layer 110 reduces or even eliminates the sticking of the glass sheets 108 in the glass stack 106 during the ceramming process. Although not depicted in FIG. 1, in some embodiments, the glass stack 106 may further include a parting agent layer 110 between the glass sheet 108 and the setter plate 104. In other embodiments, such as in various embodiments described below, the setter plate 104 is made from a material that does not react with the glass sheet 108, and a parting agent layer 110 is not required to prevent interactions between the glass sheet 108 and the setter plate 104.

Generally, to form the glass-ceramic, the glass stack 106 is heated at a temperature above its annealing point for a time sufficient to develop crystal nuclei (also referred to as "nucleation"). The heat treatment can be performed, for example, in a lehr or furnace. After being heated above its annealing point, the glass is then further heated, usually at a higher temperature between the glass annealing point and the glass softening point, to develop the crystal phase (also referred to as "growth" or "crystallization"). In various embodiments, the heat treatment, or ceramming process, includes heating the glass stack to a nucleation temperature, maintaining the nucleation temperature for a predetermined period of time, heating the glass stack to a crystallization temperature, and maintaining the crystallization temperature for a predetermined period of time.

The glass sheets 108 may be made from any glass composition that is suitable for forming glass-ceramic articles, although it should be understood that the glass composition of the glass sheets 108 can impact the mechanical and optical properties of the glass-ceramic article. In various embodiments, the glass composition is selected such that the resultant glass-ceramic article has a petalite crystalline phase and a lithium silicate crystalline phase and wherein the petalite crystalline phase and the lithium silicate crystalline phase have higher weight percentages than other crystalline phases present in the glass-ceramic article.

Having described the stack configuration 100 in general, additional detail will now be provided with regard to the components of the stack configuration 100.

Carrier Plate

In various embodiments, the carrier plate 102 supports two or more setter plates 104. The structure and material of the carrier plate 102 may be selected to control the thermal uniformity of the glass sheets loaded on top of it in the stack configuration 100. In some embodiments, the carrier plate 102 has an open carrier design (shown in FIG. 2), while in other embodiments, the carrier plate 102 has a closed carrier design (shown in FIG. 3). In the embodiment depicted in FIG. 2, the carrier plate 102 is approximately 17% solid metal (e.g., steel), while the carrier plate 102 in the embodiment depicted in FIG. 3 is a hollow plate made of reaction bonded silicon carbide beams with approximately 45% solid metal.

Figure 3:
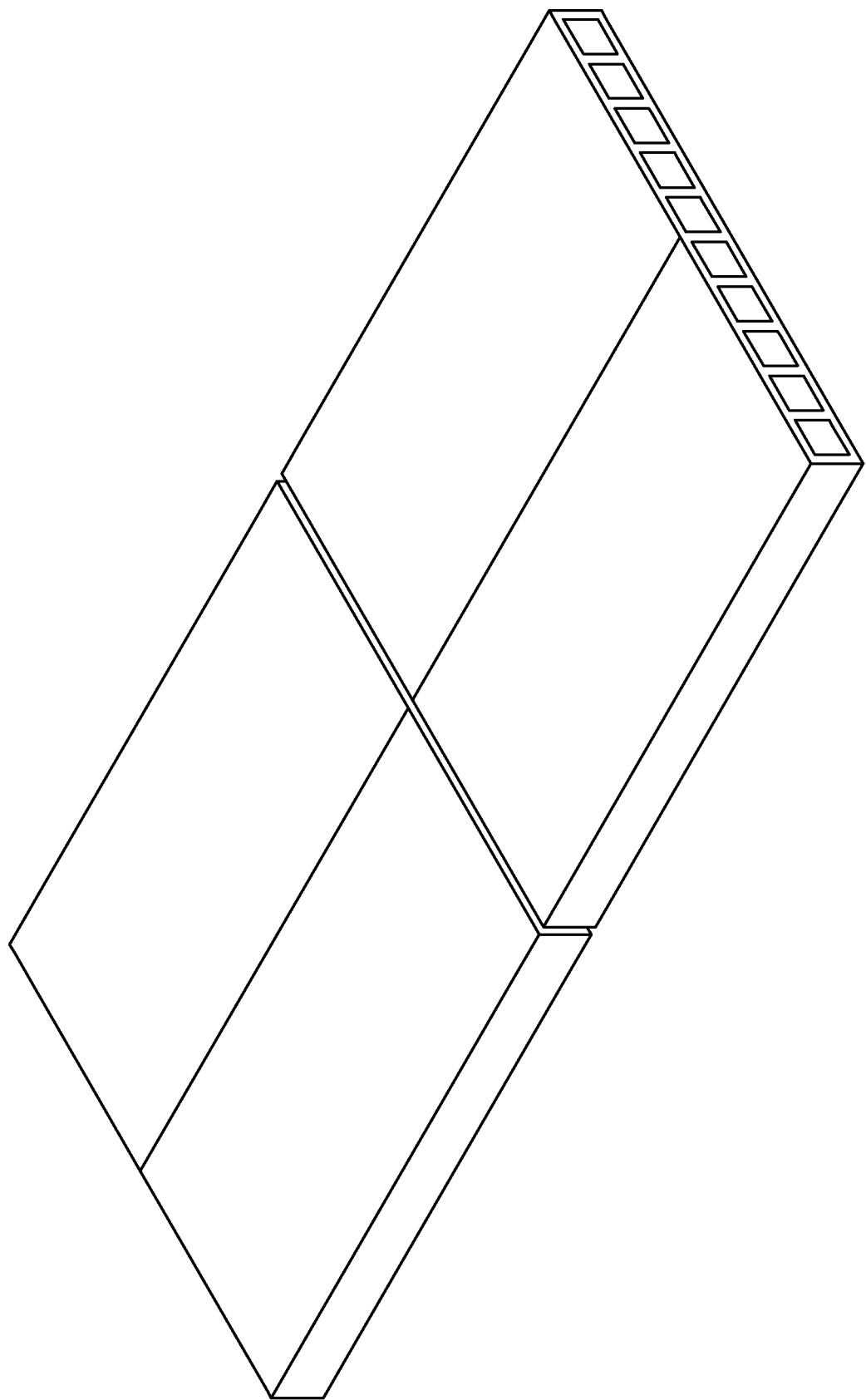
FIG. 3 is a schematic illustration of a carrier plate having a hollow plate configuration in accordance with one or more embodiments described herein.
Figure 4:
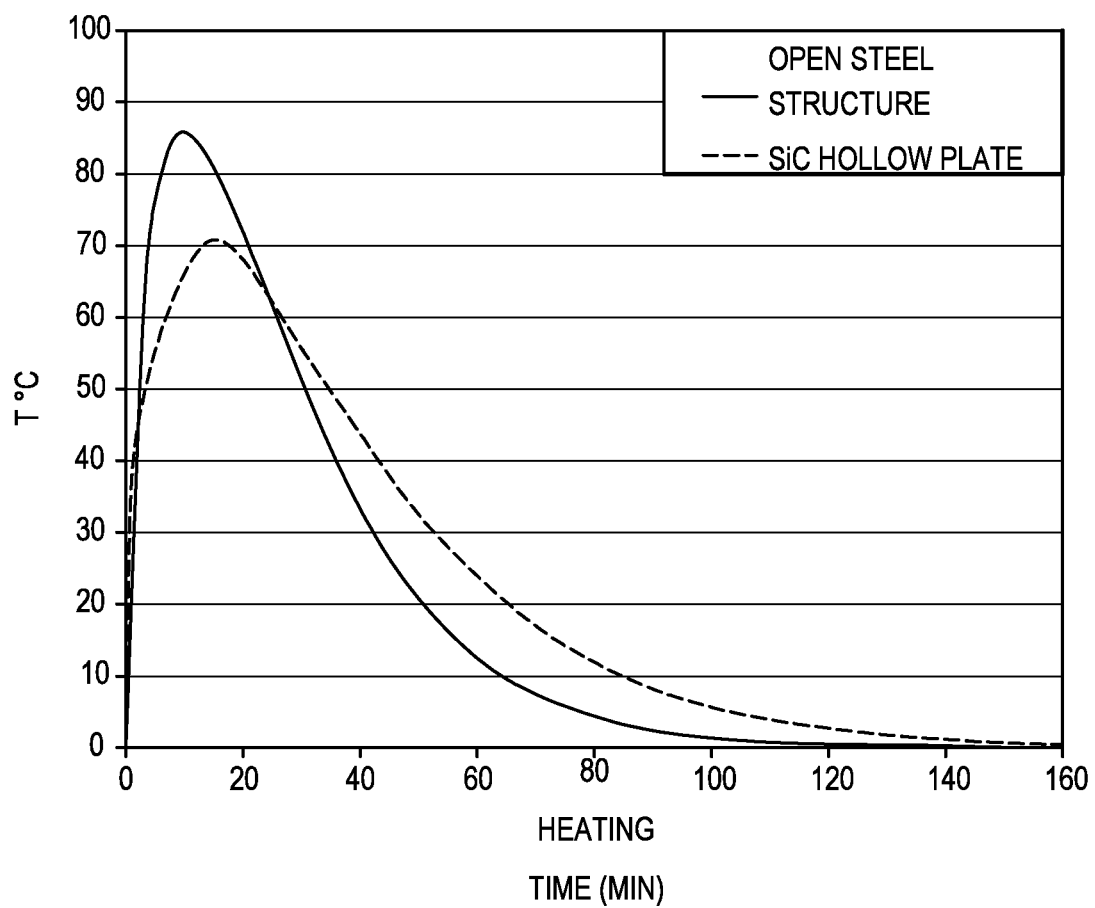
FIG. 4 is a graph plotting the modeled ΔT (° C.; y-axis) as a function of heating time (minutes; x-axis) for an open grid steel carrier plate and a silicon carbide hollow carrier plate in accordance with one or more embodiments described herein.

To evaluate the thermal impact of the carrier plate, a thermal model assuming production scale capacity with 9 stacks and 23 glass sheets in each stack on a carrier plate and 8 mm setter plates made from reaction bonded silicon carbide was run. As shown in the modeled data of FIG. 4, glass stacks on the hollow carrier plate exhibit reduced thermal uniformity as compared to glass stacks on the open steel carrier plate due to heat transfer. In particular, for the carrier made of silicon carbide beams (FIG. 3), larger glass stack temperature variations are expected as compared to the carrier made of the open steel grid design (FIG. 2), except at the very early stage of heating when the glass temperatures are low. Additionally, the blocking of direct radiation by the carrier plate also increases the overall heating time, despite the fact that the reaction-bonded silicon carbide is a better heat conductor than steel.

Figure 2:
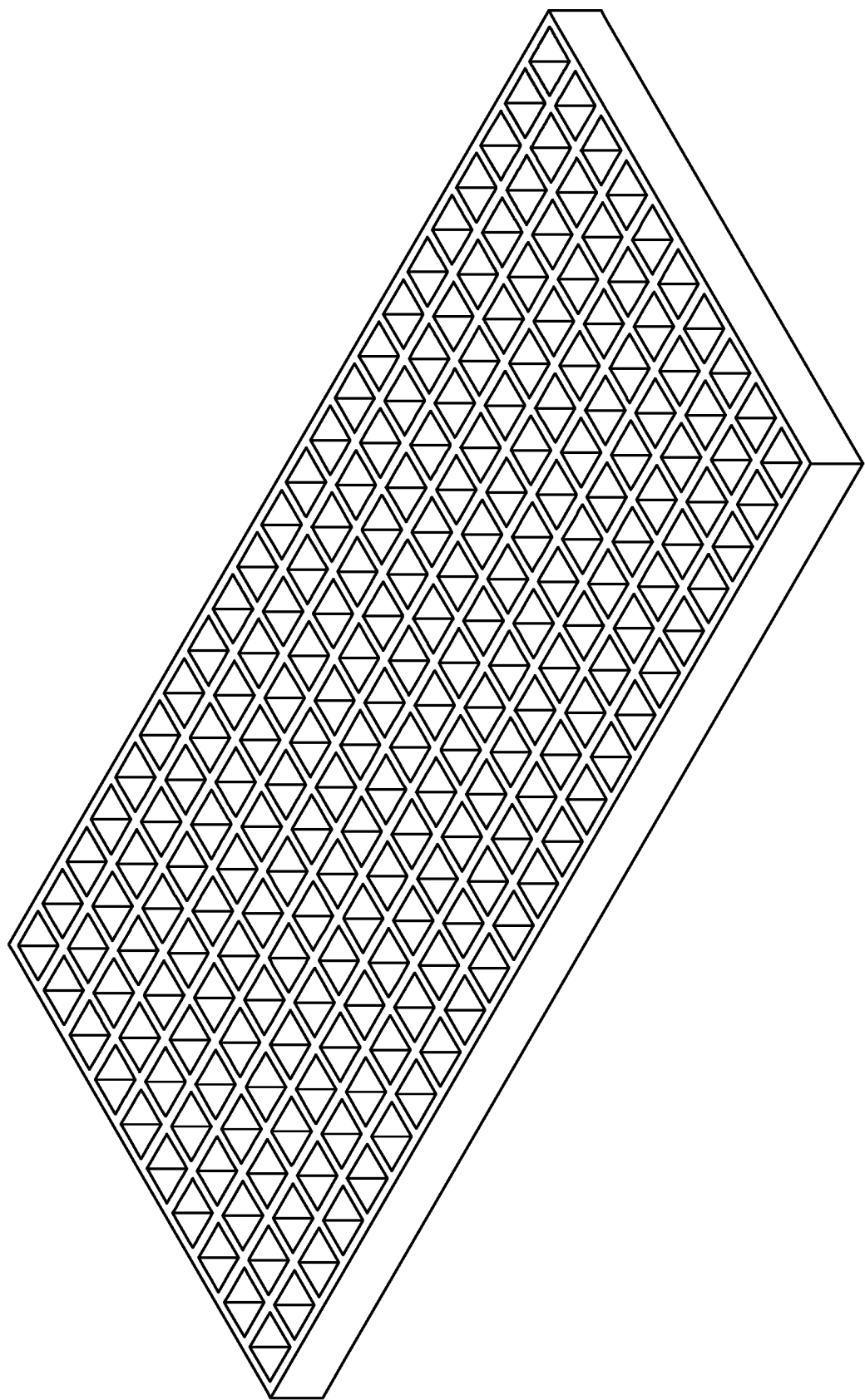
FIG. 2 is a schematic illustration of a carrier plate having an open grid configuration in accordance with one or more embodiments described herein.

Accordingly, although various designs and materials may be employed for the carrier plate 102, in various embodiments, the carrier plate is made from steel and has an open grid design, as depicted in FIG. 2.

Setter Plate

As shown in FIG. 1, in various embodiments, the carrier plate 102 supports at least two setter plates 104. For example, although the embodiment shown in FIG. 1 includes a single glass stack 106 with a setter plate 104 above the glass stack 106 and a setter plate 104 between the glass stack 106 and the carrier plate 102, it is contemplated that additional setter plates 104 may be included, such as being positioned within the glass stack 106, and/or by positioning multiple glass stacks 106 on the carrier plate 102, each glass stack 106 having at least a setter plate 104 above the glass stack 106 and a setter plate 104 between the glass stack 106 and the carrier plate 102.

While most conventional ceram processes utilize ceramic and refractory materials to form setter plates, such materials have heat transfer and heat capacity limitations which make them unsuitable for producing a high optical quality that is desired or required for certain applications. Additionally, setter plates made from such materials can experience thermal expansion, oxidation, and creep, which can in turn lead to warp in the glass ceramic article.

Moreover, the setter plates 104 binding the glass stack 106 provide a lateral heat transfer path to spread radiant heat from heating elements, which may lower the in-plane glass sheet temperature variations. Minimizing the temperature variations may in turn lead to a reduction in in-plane stresses and warp in the glass ceramic article. Accordingly, in various embodiments, the setter plates 104 are selected to maximize the reduction in glass sheet temperature variation. In particular, the setter plates 104 are selected to have a particular specific heat capacity, density, and thermal diffusivity.

According to various embodiments, the setter plates have a specific heat capacity ($c_p$) of from about 670 J/kg*K to about 850 J/kg*K, as measured in accordance with ASTM E1461 at room temperature. For example, the setter plates may have a specific heat capacity of from about 670 J/kg*K to about 850 J/kg*K, from about 670 J/kg*K to about 800 J/kg*K, from about 670 J/kg*K to about 750 J/kg*K, or from about 670 J/kg*K to about 700 J/kg*K, as measured in accordance with ASTM E1461 at room temperature and all ranges and subranges there between. Without being bound by theory, it is believed that when the specific heat capacity is outside of this range, the material is not able to give up heat and accept heat at the appropriate rate, which causes stress, and warp in the glass in stacking configurations.

The setter plates in various embodiments additionally or alternatively may be selected to have a bulk density of greater than about 2500 kg/m$^3$, as measured in accordance with ASTM C20. For example, the setter plates may have a bulk density of from about 2500 kg/m$^3$ to about 4000 kg/m$^3$, from about 2750 kg/m$^3$ to about 3750 kg/m$^3$, or from about 3000 kg/m$^3$ to about 3500 kg/m$^3$, as measured in accordance with ASTM C20 and all ranges and subranges there between. Without being bound by theory, it is believed that materials having bulk densities in this range have low porosity and do not significantly increase the weight in the stack. A bulk density that is too low can lead to material deterioration over time and decreased life use of the material, whereas a bulk density that is too high can lead to stress in the stack due to increased force on the glass.

Moreover, in various embodiments, the setter plates have a thermal diffusivity of greater than about $2.50 \times 10^{-5}$ m$^2$/s. For example, the setter plates may have a thermal diffusivity of from about $2.50 \times 10^{-5}$ m$^2$/s to about $5.50 \times 10^{-4}$ m$^2$/s, from about $3.0 \times 10^{-5}$ m$^2$/s to about $5.00 \times 10^{-4}$ m$^2$/s, from about $4.0 \times 10^{-5}$ m$^2$/s to about $4.50 \times 10^{-4}$ m$^2$/s, from about $4.50 \times 10^{-5}$ m$^2$/s to about $4.00 \times 10^{-4}$ m$^2$/s, from about $5.00 \times 10^{-5}$ m²/s to about 3.50×10⁻⁴ m²/s, from about 5.50×10⁻⁵ m²/s to about 3.00×10⁻⁴ m²/s, from about 6.00×10⁻⁵ m²/s to about 2.50×10⁻⁴ m²/s, from about 6.50×10⁻⁵ m²/s to about 2.0× 10⁻⁴ m²/s, from about 7.00×10⁻⁵ m²/s to about 2.00×10⁻⁴ m²/s, or from about 7.50×10⁻⁵ m²/s to about 1.50×10⁻⁴ m²/s and all ranges and subranges there between. Without being bound by theory, if the thermal diffusivity is too low, the material will take too long to heat up and cool down causing thermal gradients in the stack, which will lead to stress and warp. However, if the thermal diffusivity is too high, it could also lead to stress due to imparting thermal gradients in the stack. Glass sheets in contact with the setter plates would be affected by heat transfer at different rates as opposed to the glass sheets in the center of the stack. Thermal diffusivity a can be defined according to the following equation:

$$\alpha = \frac{k}{\rho c_p}$$

where k is thermal conductivity (W/m*K), $\rho$ is density (kg/m³), and $c_p$ is specific heat capacity (J/kg*K).

Accordingly, in various embodiments, the setter plates have a thermal conductivity (k) of greater than about 100 W/m-K, greater than about 125 W/m-K, greater than about 150 W/m-K, greater than about 175 W/m-K, or even greater than about 180 W/m-K, as measured in accordance with ASTM E1461 at room temperature. For example, the setter plate may have a thermal conductivity of from about 100 W/m-K to about 350 W/m-K, from about 125 W/m-K to about 325 W/m-K, from about 150 W/m-K to about 300 W/m-K, from about 175 W/m-K to about 275 W/m-K, or from about 180 W/m-K to about 250 W/m-K, as measured in accordance with ASTM E1461 at room temperature and all ranges and subranges there between. Without being bound by theory, thermal conductivity too high or too low can induce thermal gradients in the stack leading to stress and warp.

Various materials having the desired specific heat capacity, density, and thermal diffusivity may be suitable for use in forming the setter plates described herein. One example material that is particularly suitable for use is reaction-bonded silicon carbide (SiSiC). In embodiments, the setter plate 104 may comprise from about 85 wt % to about 90 wt % reaction bonded silicon carbide. The setter plate 104 may further comprise from about 10 wt % to about 15 wt % silicon metal (Si) and binding agents. Commercially available reaction bonded silicon carbide products that may be suitable for use in forming the setter plate 104 can include, by way of example and not limitation, CRYSTAR RB™ available from Saint-Gobain Ceramic Materials.

To confirm the impact of the thermal properties of the material used to form the setter plates, three different materials were used to form setter plates having a thickness of 8 mm. In particular, Example A was formed from reaction-bonded silicon carbide, Comparative Example 1 was formed using nitride bonded silicon carbide, and Comparative Example 2 was formed using silicon refractory board. The thermal properties of each of these materials are provided in Table 1.

Table 1:

TABLE 1

Thermal Properties of Setter Plate Materials

| | Nitride Bonded SiC | Reaction Bonded (SiSiC) | Si Refractory Board |
|---|---|---|---|
| Thermal Conductivity at room temperature (W/m*K) | 31 | 185 | 0.6 |
| Bulk Density (kg/m³) | 2200 | 3030 | 2100 |
| Specific Heat at room temperature (J/kg*K) | 663 | 670 | 878 |
| Thermal Diffusivity (m²/s) | 2.13E−05 | 9.11E−05 | 3.25E−07 |

Figure 5:
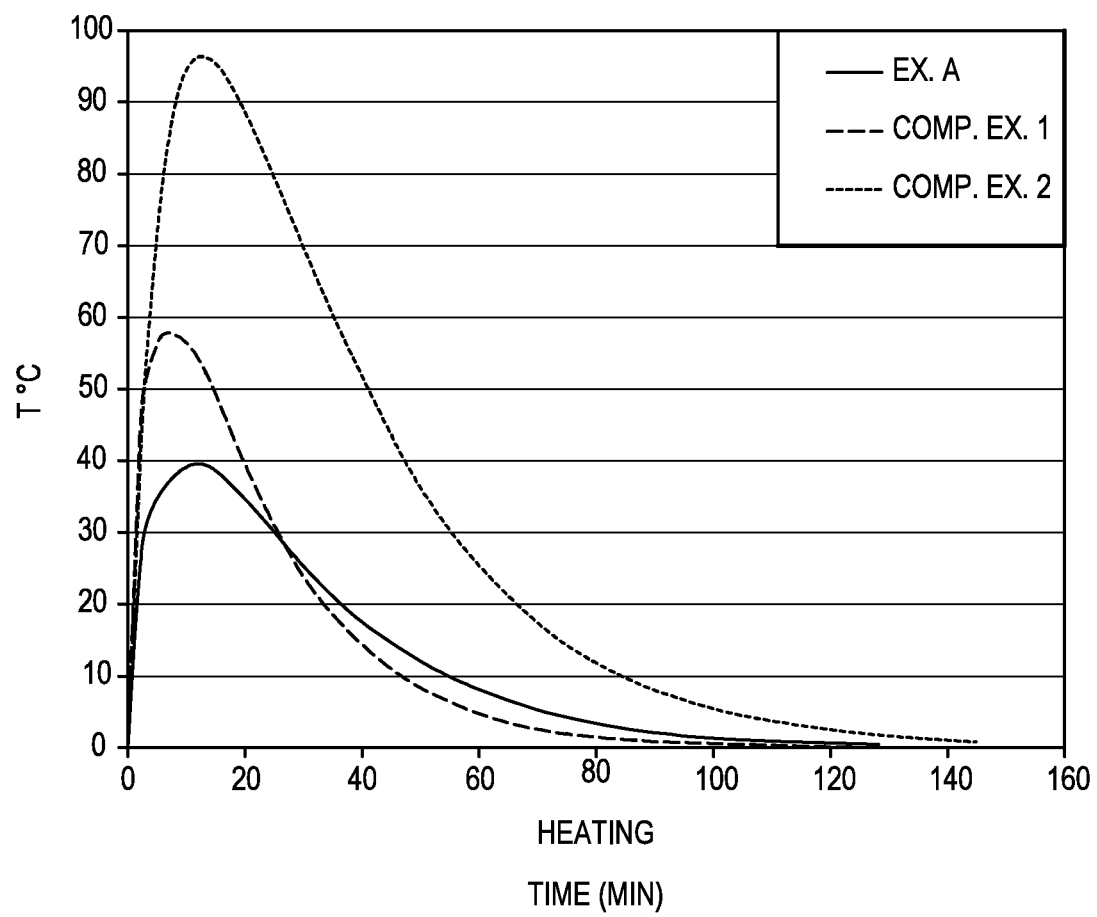
FIG. 5 is a graph plotting the modeled ΔT (° C.; y-axis) as a function of heating time (minutes; x-axis) for the setter plates of Example A and Comparative Examples 1 and 2.

The ΔT of the glass stack during heating ramp up was measured. The results are shown in FIG. 5. In particular, as shown in FIG. 5 the reaction bonded silicon carbide exhibits a reduced heating time and a reduced ΔT during the process. Comparative Example 2 using setter plates formed from silicon refractory board exhibited a significantly larger temperature variation, most likely because it is a poor heat conductor. However, the larger thermal diffusivity of Example A and Comparative Example 1 (nitride-bonded silicon carbide) showed more uniform temperatures.

Figure 6:
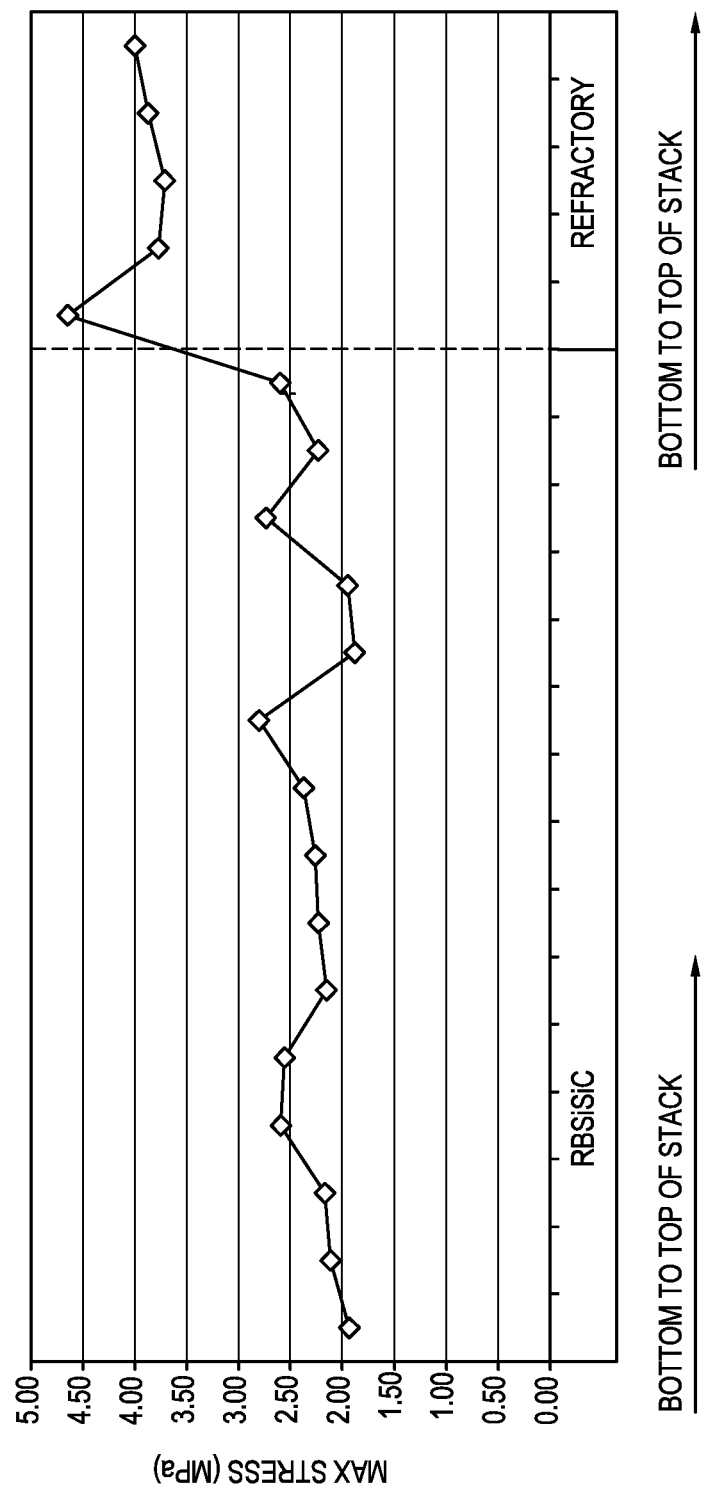
FIG. 6 is a graph plotting the maximum stress (MPa; y-axis) for two different setter materials in which reaction bonded silicon carbide is used on the left and silicon refractory board is used on the right.

In addition to decreasing the temperature variation in the glass stack, the setter plate 104 of various embodiments is made from a material that imparts lower stress as compared to conventional materials. For example, the thermal diffusivity of the reaction-bonded silicon carbide imparts lower stress in the glass ceramic article following ceramming heat treatment as compared to conventional setter plate materials. As shown in FIG. 6 the reaction bonded silicon carbide produced a lower maximum stress on the stacks (left hand side of the graph) as compared to stacks in contact with a silicon refractory board setter plate (right hand side of the graph). Without being bound by theory, it is believed that the reduced temperature delta resulting from the thermal diffusivity of the reaction-bonded silicon carbide reduces stress in the glass ceramic article as it grows crystals and phase transformation occurs in the article. The stress reduction directly impacts the warp in the glass ceramic article. In particular, increased stresses induce higher warp in the article, which can make it unusable for certain applications, such as handheld electronic displays. However, the use of reaction bonded silicon carbide reduces the stress in the glass ceramic article, thereby providing low warp in the final product.

Figure 7:
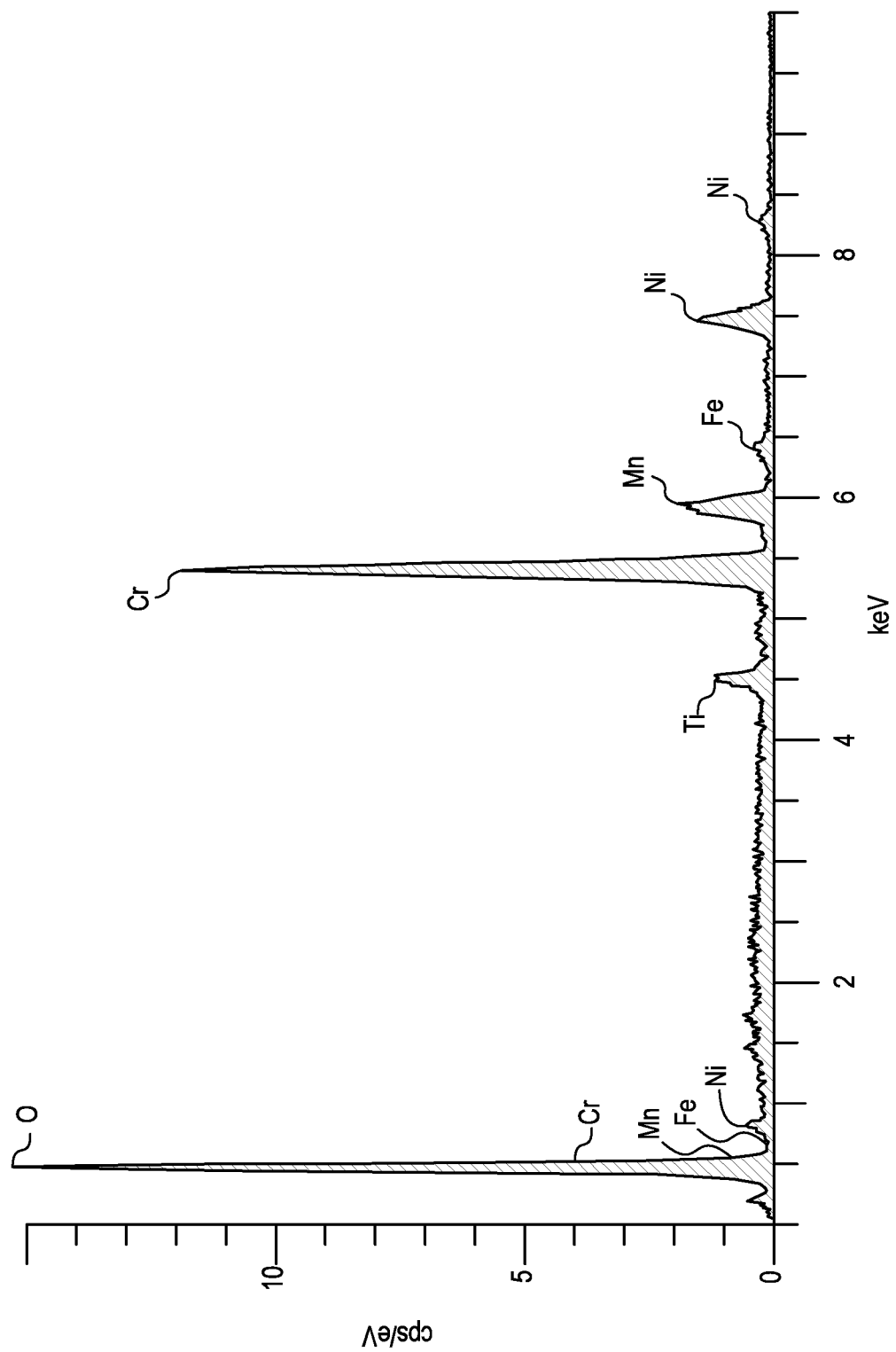
FIG. 7 depicts EDX (energy dispersive X-ray) showing the lack of Si on the surface of reaction-bonded silicon carbide setter plates post ceramming in accordance with one or more embodiments described herein.

In various embodiments, the material used to form the setter plate 104 is further selected based on its lack of reactivity with both the carrier plate 102 and the glass ceramic article. Reaction bonded silicon carbide is an example material that demonstrates low or even no reaction with materials typically used to form the carrier plate 102. In particular, setter plates made from reaction bonded silicon carbide in contact with stainless steel alloy and Ni-based super alloy metal carrier plates were tested up to 800° C. in air for 24 hour and for 100 hours. As shown in FIG. 7, SEM (scanning electron microscope) and EDX examination showed that there was no reaction of the metals with the reaction bonded silicon carbide. Specifically, the lack of Si found on the carrier plate surfaces showed that there was no reaction with the free Si in the reaction bonded silicon carbide microstructure.

Figure 8:
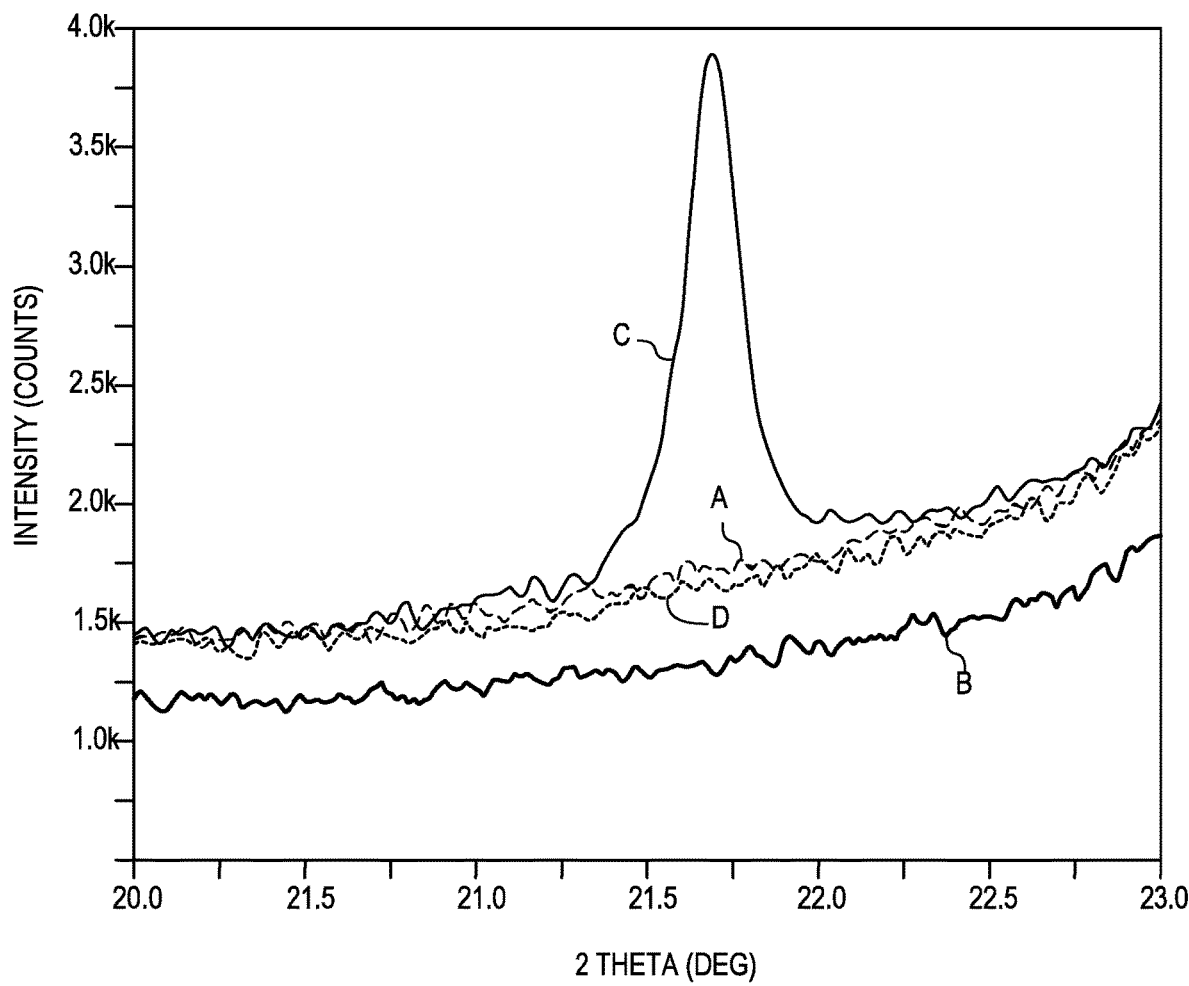
FIG. 8 depicts the XRD (X-ray diffraction) of various glass ceramic articles in accordance with one or more embodiments described herein.

Moreover, Li-based glass ceramics in contact with reaction bonded silicon carbide material during a thermal ceramming process do not exhibit any skin effects, according to XRD phase assemblage characterization. For example, as shown in FIG. 8, the glass in contact with the reaction bonded silicon carbide setter plate (A) is similar in phase to the bulk glass (B).

In addition to having improved thermal properties over other materials, reaction bonded silicon carbide has a low porosity (<1%), which can increase the life of the setter plate during thermal cycling due to increased resistance to oxidation, cracking, and reactivity through diffusion with other elements and materials.

In various embodiments, the setter plate 104 is also dimensioned to reduce warp in the glass ceramic article. In particular, the thickness of the setter plate 104 and the flatness of the setter plate 104 are controlled to reduce both warp and stress in the glass ceramic.

Figure 9:
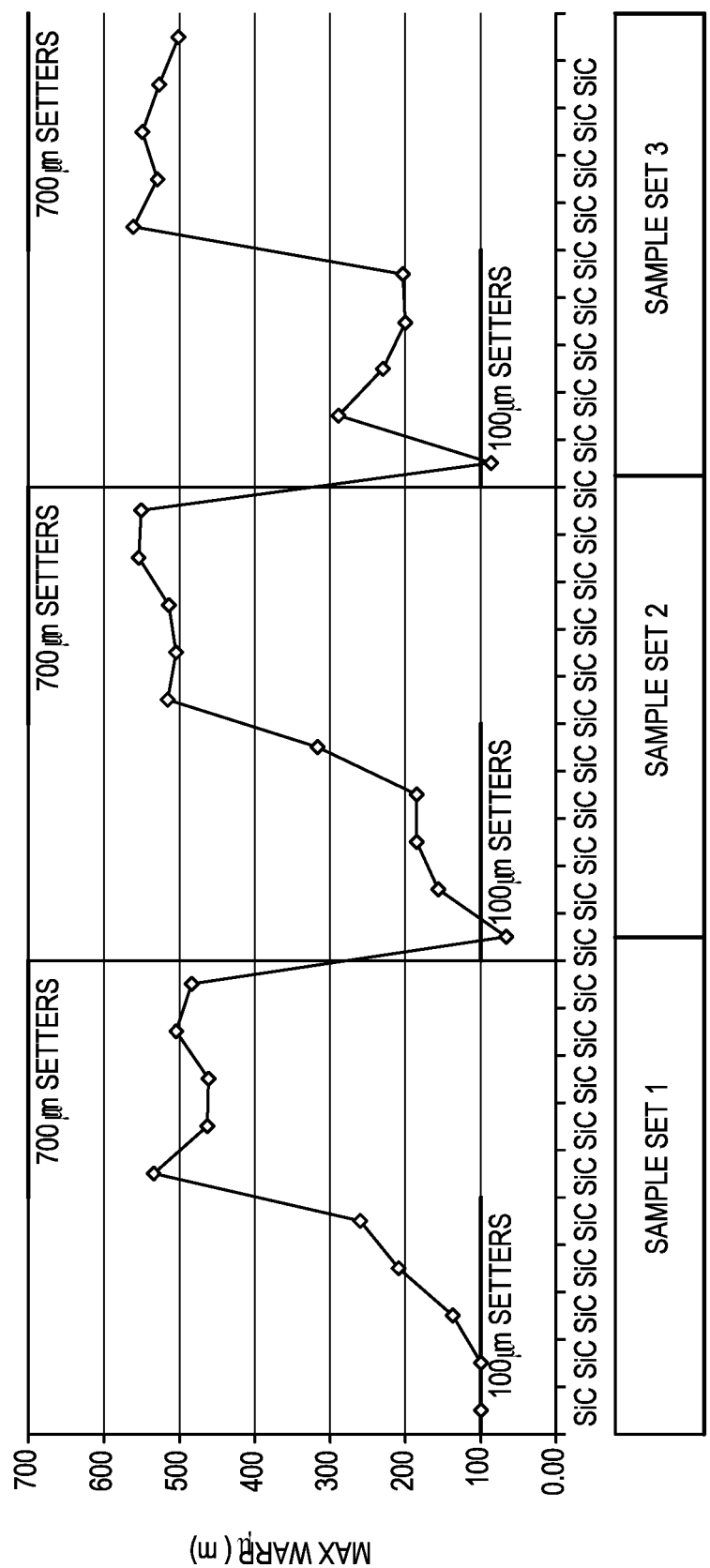
FIG. 9 is a graph of the maximum warp (µm; y-axis) for various setter plate flatnesses and additional weight in accordance with one or more embodiments described herein.

During the ceramming process, the glass sheets 108 forming the glass stack 106, which is in contact with the setter plates 104, move and conform to the flatness of the setter plate 104. In various embodiments, the setter plate 104 may be machined to obtain a particular flatness after formation. As used herein, the term "flatness" refers to a tolerance zone defined by two parallel planes within which the surface lies. For example, a flatness of 100 µm means that the surface must lie entirely between two parallel planes that are at most 100 µm apart. The impact of the flatness of the setter plate 104 on the flatness of the glass ceramic article is shown in FIG. 9. Specifically, as shown in FIG. 9, the maximum warp of the glass ceramic article is decreased for setter plates having a flatness of 100 µm as compared to setter plates having a flatness of 700 µm.

FIG. 9 further demonstrates that the use of additional weight (e.g., double weight as used in Sample Set 1) does not significantly reduce warp. For example, for each of Sample Set 1, Sample Set 2, and Sample Set 3, the first five samples of each set were performed using a setter with a flatness of 100 µm, while the last 5 samples of each set were performed using a setter with a flatness of 700 µm. The flatter setter reduced the warp to approximately the same amount independent of the weight, as shown by comparing Sample Set 1, which had double weight, to Sample Sets 2 and 3, each of which have equalized weight.

In various embodiments, the setter plate 104 has a maximum flatness of less than or equal to about 100 µm, less than or equal to about 75 µm, less than or equal to about 50 µm, less than or equal to about 45 µm, less than or equal to about 40 µm, less than or equal to about 35 µm, less than or equal to about 30 µm, or even less than or equal to about 25 µm.

Figure 10:
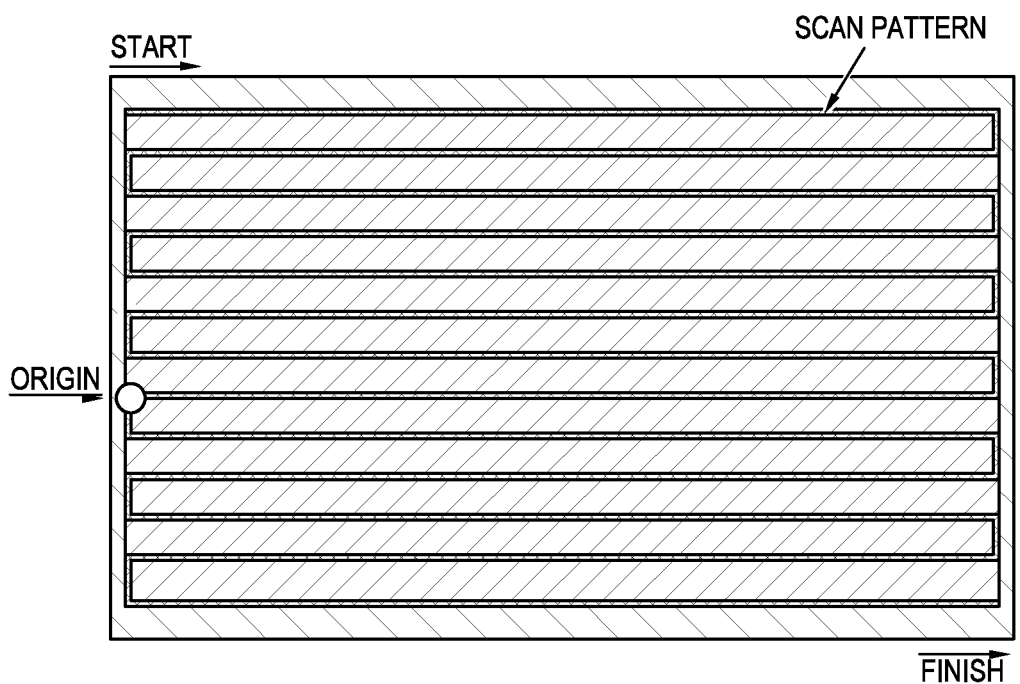
FIG. 10 is a schematic illustrating the scan pattern for the CMM (coordinate measuring machine) measurement of the flatness of setter plates in accordance with one or more embodiments described herein.

Flatness can be measured using a CMM and touch and/or non-touch probes. In various embodiments, the measurement density is 1 point/mm throughout the sweep trajectory and the measurement region is about 10 mm inbound from a side of the setter plate. The origin of alignment is at the center of the shorter edge, as shown in FIG. 10. To locate the origin, the CMM finds the corners of the setter plate 104 and calculates the distance between the two corners. The origin is the distance divided by two. To determine the region of inspection, the probe is moved 10 mm horizontally inbound from edge of the setter plate at the origin. Then, the probe is moved upwards about 325 mm to the start point. The sweep begins at that point. Spacing between each line is about 15 mm, and the setter plate is scanned in a serpentine pattern, as shown in FIG. 10. Flatness is evaluated by the CMM using the minimum zone method.

The thickness t of the setter plate 104 (shown in FIG. 1) is selected, at least in part, to balance the thermal effects of the setter plate 104 on the glass stack 106 with inducement of warp. In particular, the thickness should be minimized for heat transfer and uniformity, yet maximized for strength and warp resistance. Accordingly, in various embodiments, the setter plate 104 has a thickness t of from about 6.5 mm to about 10 mm, or from about 7 mm to about 9.5 mm, or from about 7.5 mm to about 9 mm, or from about 7.9 mm to about 8.2 mm and all ranges and subranges there between.

Figure 11:
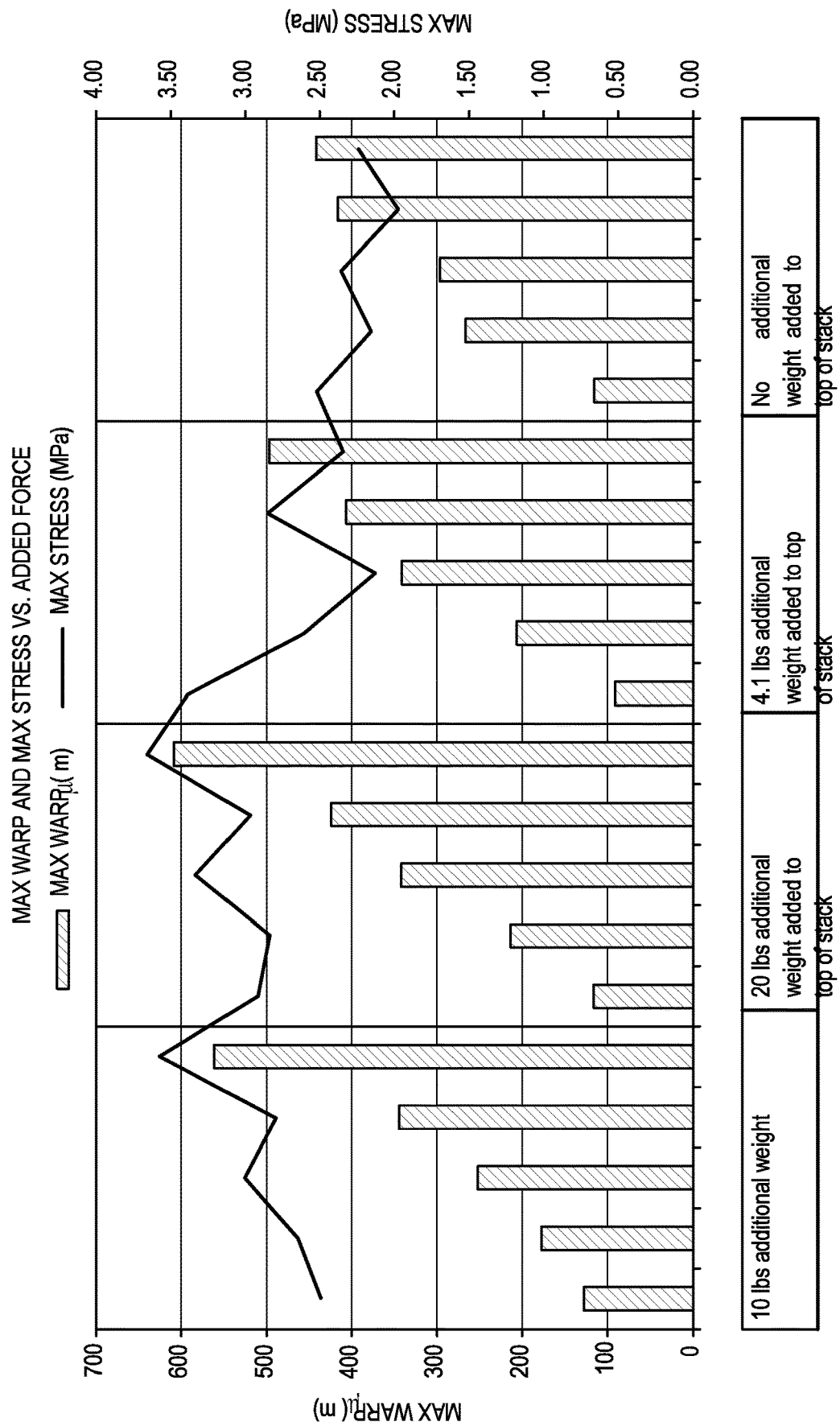
FIG. 11 is a graph illustrating the maximum warp (µm; left y-axis) as bars through the thickness of the glass stack for various amounts of applied force and the maximum stress (MPa; right y-axis) as a line graph for the various amounts of applied force in accordance with one or more embodiments described herein.

The density of the material used to form the setter plate 104 and the thickness of the setter plate 104 may further be selected based on the applied force on the glass stack 106. FIG. 11 illustrates how additional force on the glass stack can contribute to increased stress in the glass ceramic article. In particular, as shown in FIG. 11, the addition of weight not only did not improve the warp (e.g., decrease the maximum warp), but it further increased the maximum stress at various points within the glass stack. Without being bound by theory, it is believed that the addition of additional force constrains the glass sheets during the ceramming process when shrinkage occurs. Accordingly, it is believed that the ability of the material to move freely during the ceramming process decreases warp in the glass ceramic article. In various embodiments, setter plates 104 made from reaction bonded silicon carbide may provide good heat transfer while maintaining low applied force, thereby resulting in low warp and stress in the glass ceramic article.

Parting Agent Layer

As described hereinabove, in various embodiments, a parting agent layer 110 is deposited between adjacent glass sheets 108 in the glass stack 106. In some embodiments, a parting agent layer 110 may also be deposited between the setter plate 104 and the glass stack 106. For example, a parting agent layer 110 may be coated onto the setter plate 104, or may be deposited on the surface of the glass sheet 108 at the top and/or bottom of the glass stack 106.

In various embodiments, the parting agent layer 110 is formed from a parting agent composition, which comprises an aqueous dispersion including boron nitride and a colloidal inorganic binding agent. In embodiments, the parting agent composition is substantially free of volatile organic solvents. Accordingly, processes employing the parting agent composition may generate less hazardous waste than conventional processes using alcohol-based products.

According to various embodiments, the parting agent composition includes boron nitride as a lubricant. The use of boron nitride enables the parting agent composition to be used in high temperatures (e.g., >500° C.) applications, which may not be possible with alternative lubricants. Additionally, boron nitride may be particularly well suited for use as a lubricant in various embodiments because it maintains its lubrication properties throughout the ceramming process. In the parting agent composition of various embodiments, the boron nitride is present in the form of agglomerated particles having an average particle size of from about 2 µm to about 4 µm. Although the particle size may vary depending on the particular embodiment employed, the particle size generally should not exceed about 4 µm to reduce surface roughness and enable the formation of ultra-thin (e.g., 2 gsm dry weight) coating layers.

As described above, the parting agent composition further includes a colloidal inorganic binding agent. The colloidal inorganic binding agent may include, by way of example and not limitation, aluminum oxide (AlOx). Other colloidal inorganic binding agents may be used, provided that they do not fully decompose during the heat treatment (e.g., cerammming) process.

In some embodiments, the parting agent composition may optionally include one or more dispersants or other additives. For example, antimicrobial additives may be employed. Suitable dispersants include nitric acid or other dispersants known and used in the art. However, in other embodiments, the parting agent composition may be substantially free of additional components in order to reduce the likelihood of reaction between the parting agent layer 110 and the glass sheets 108 and/or the setter plate 104.

The parting agent composition has a specific gravity of from about 1.0 to about 1.2 as measured using a syringe to pull off a predetermined volume of the parting agent composition and weighing that volume. Specifically, to measure the specific gravity, a 20 mL syringe is used to pull about 10 mL of the parting agent composition into the syringe and pushed back out to evacuate bubbles. The syringe is then wiped clean, placed on a scale, and the scale is zeroed out. Then, exactly 20 mL of the parting agent composition is pulled into the syringe; the syringe is wiped clean, and placed on the scale to get the weight in grams in the syringe. The weight is then divided by 20 to get the specific gravity.

Additionally or alternatively, in various embodiments, the parting agent composition has a viscosity of from about 120 centipoise (cP) to about 160 cP as measured on a Brookfield DV2TLV Viscometer, four spindle and all ranges and subranges there between. Although the viscosity may vary depending on the particular embodiment, a viscosity greater than 160 cP or less than 120 cP may adversely impact the application of the composition to the glass sheets, and may result in an uneven parting agent layer.

In various embodiments, the parting agent composition has a pH of from about 3 to about 5 and all ranges and subranges there between. In particular, when the parting agent composition has a pH in this range, the composition is compatible with application to the surface of the glass sheet without concern for pitting or etching the surface. Suitable commercially available parting agents include those available from Zyp Coatings (Tennessee).

As described above, the parting agent composition may be applied to one or more surfaces of the glass sheets 108 and/or the setter plates 104 to form a parting agent layer 110. In various embodiments, the parting agent composition is applied via a spray dispersion technique, such as rotary atomization and/or air assisted spray dispersion. Without being bound by theory, it is believed that other application techniques, including but not limited to roller coating, dipping, and ultrasonic powder application, are unable to achieve the desired layer thickness and uniformity desired by various embodiments. Accordingly, in various embodiments, the parting agent composition is dried to form a parting agent layer 110 having a dry coat weight of from about 2 gsm to about 6 gsm and all ranges and subranges there between. Although the thickness of the parting agent layer 110 can vary depending on the particular embodiment, it is generally expected that dry coat weights of less than about 2 gsm may have an increased risk of sticking. Additionally, in various embodiments, the parting agent layer 110 has a substantially uniform distribution on the surface of the glass sheet 108 and/or the setter plate 104.

In embodiments described herein, coating uniformity was characterized by percent haze and percent transmittance using a BYK Haze-Gard Plus instrument from the Paul N. Gardner Company, Inc. in accordance with ASTM D 1003 (for transmission) and ASTM D 1044 (for haze). The Haze-Gard Plus is capable of directly determining total transmittance, haze and clarity. The instrument utilizes an Illuminant C light source representing average day light with a correlated color temperature of 6774 K. In various embodiments, the cerammed glass sheet 100 having a parting agent layer 110 on one surface thereof has a percent transmission of from about 76% to about 83% as measured in accordance with ASTM D1003 and a percent haze of from about 25% to about 38% as measured in accordance with ASTM D1044.

Figure 12:
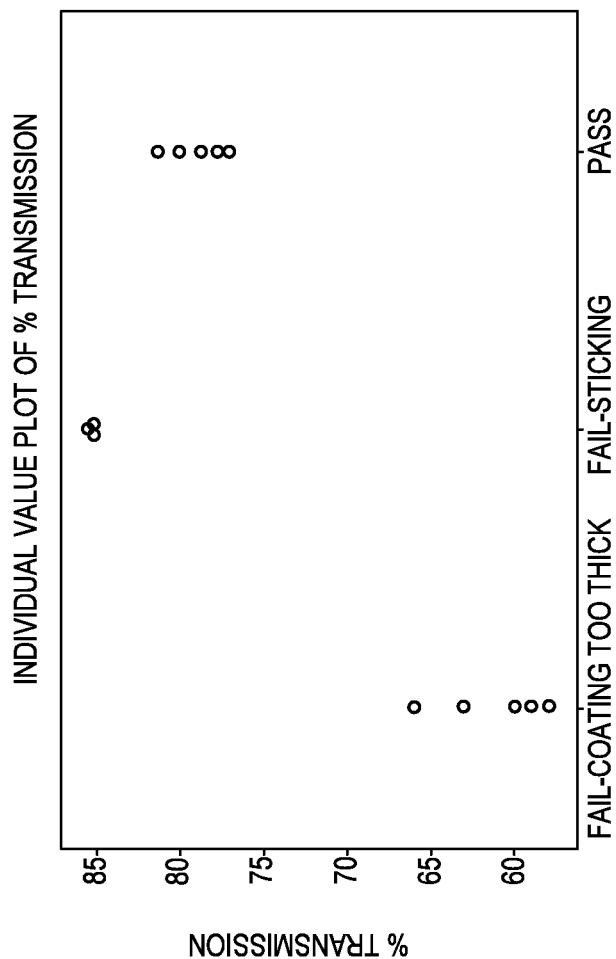
FIG. 12 is a graph of the % transmission (y-axis) for various glass stacks in accordance with one or more embodiments described herein.

FIG. 12 is a plot of the percent transmission (y-axis) versus acceptability of the samples (x-axis). In particular, the percent transmission is shown for Li-based glass ceramic articles including a parting agent layer. As shown in FIG. 12, a coating that is too thick (e.g., greater than about 6 gsm) exhibits a percent transmission of less than 70%, while a coating that is too thin (e.g., less than about 2 gsm) exhibits a percent transmission of about 85%, but the glass sticks to adjacent glass sheets. However, samples that were otherwise acceptable exhibited a percent transmission of from about 76% to about 83% as measured in accordance with ASTM D1003.

Figure 13:
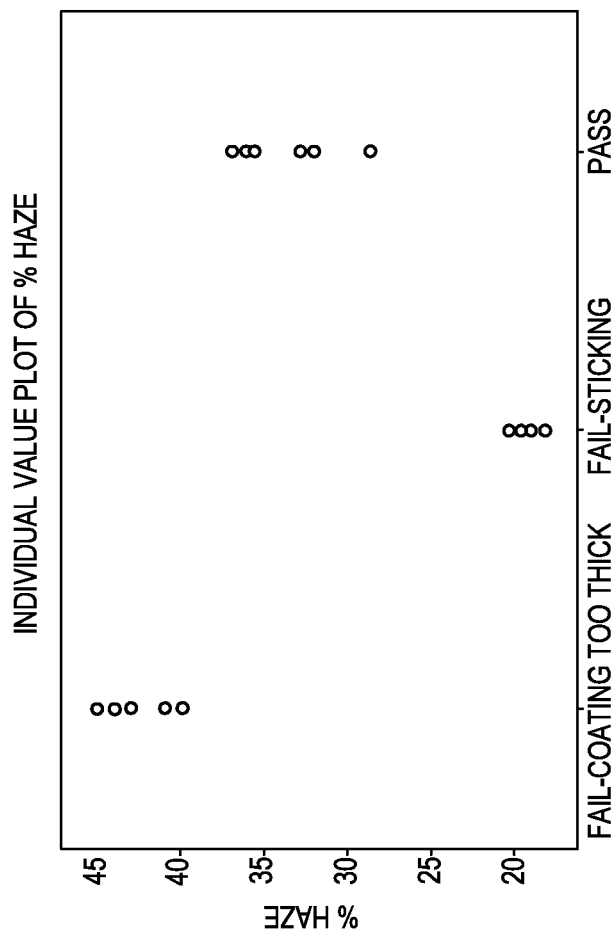
FIG. 13 is a graph of the % haze (y-axis) for various glass stacks in accordance with one or more embodiments described herein.

FIG. 13 is a plot of the percent haze (y-axis) versus the acceptability of the samples (x-axis). For samples having a coating that was too thick (e.g., greater than about 6 gsm), the percent haze was greater than about 40%, while samples that had coatings that were too thin (e.g., less than about 2 gsm), the percent haze was less than about 25% and the samples exhibited sticking. However, samples that were otherwise acceptable exhibited a percent haze of from about 25% to about 38% as measured in accordance with ASTM D1044.

In various embodiments, glass ceramic articles including the parting agent layer 110 exhibit less warp than glass ceramic articles formed without the parting agent layer 110. In other words, in addition to reducing the sticking between a glass sheet 108 and an adjacent glass sheet 108 and/or the setter plate 104, the parting agent layer 110 can reduce warp in the final glass ceramic article. Without being bound by theory, it is believed that application of a parting agent layer 110 as described herein can prevent localized sticking which contributes to warp in the glass ceramic article. In particular, during the ceramming process, the glass experiences shrinkage during phase change and crystal growth and the presence of the parting agent layer 110 allows the glass to move freely without constraint in the glass stack 106.

Figure 14:
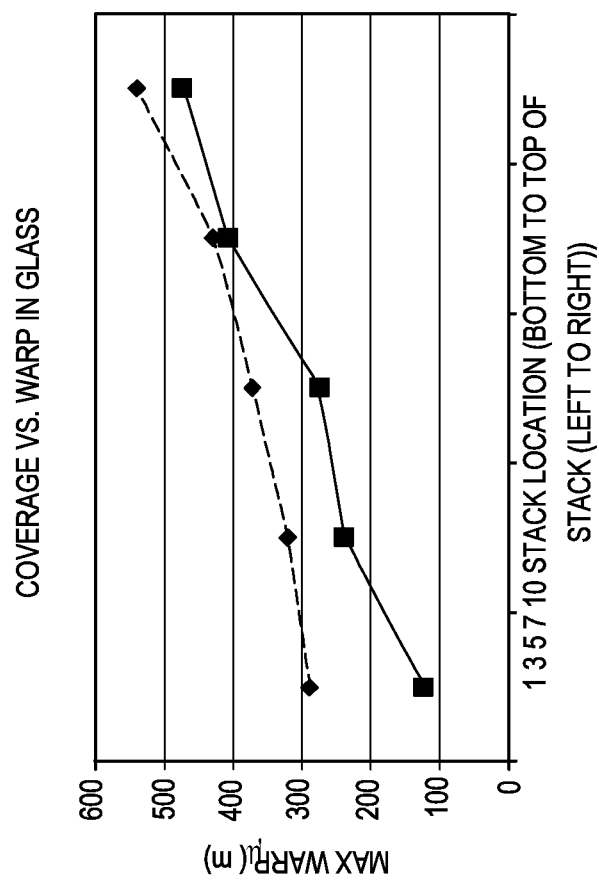
FIG. 14 is a graph plotting the maximum warp (µm; y-axis) as a function of stack location (bottom of stack to top of stack from left to right; x-axis) for application of a parting agent coating using varying spray head spacings in accordance with one or more embodiments described herein.

FIG. 14 is a graph of the maximum warp (in μm; y-axis) as a function of glass stack location (x-axis). The coating was applied with a 1.5" spray head spacing (solid line) and a 3.0" spray head spacing (dotted line). FIG. 14 shows that maximum warp increases from the bottom of the glass stack (left) to the top of the glass stack (right). Additionally, in embodiments in which the coating was applied with slight variances in the thickness and uniformity of the coating layer (3.0" spray head spacing), the max warp increases over the entire thickness of the glass stack as compared to a uniform application of the coating layer at dry coat weight of about 2 gsm with a 1.5" spray head spacing. Thus, demonstrated by the data presented in FIG. 14, sticking causes lower yields and physical degradation of the glass ceramic article and localized stiction constrains the glass, which increases warp in the final product.

In addition to decreasing the warp of the glass ceramic article, the parting agent layer 110 of various embodiments described herein has been found to leave the phase assemblage of the glass ceramic article unchanged. FIG. 8 is an XRD of the glass ceramic article including the parting agent layer 110 as cerammed (C) and post polishing (D). The surface layer effect is measured to be less than about 1 μm.

Thus, in various embodiments, the parting agent layer 110 can reduce CTE mismatch between the glass sheets 108 and the setter plate 104, reduce scuffing, and extend the life of the setter plates 104 by reducing wear. For example, it is believed that the CTE mismatch between the glass sheets 108 and the setter plate 104 can lead to scuffing if the glass sheets 108 stick to the setter plate 104. However, various embodiments of the parting agent composition, and particularly the colloidal binder, do not fully decompose during the thermal process. Accordingly, parting agent composition can be used to coat the setter plate 104 for multiple uses (e.g., greater than about 25 cycles) before the setter plate 104 needs to be re-coated. Therefore, in various embodiments, the parting agent layer 110, when applied in as an ultra-thin and uniform layer, prevents sticking in high temperature glass-glass stacking configurations, which can, in turn, reduce warp of a final glass ceramic article.

Glass Stack Configuration

In various embodiments described herein, multiple glass sheets 108 are arranged in a glass stack 106 for the ceramming process. In addition to the variables described above as impacting the warp and stress of the final glass ceramic article, it was further discovered that various elements of the glass-stacking configuration have an impact on the warp and stress of the glass ceramic article.

Figure 15:
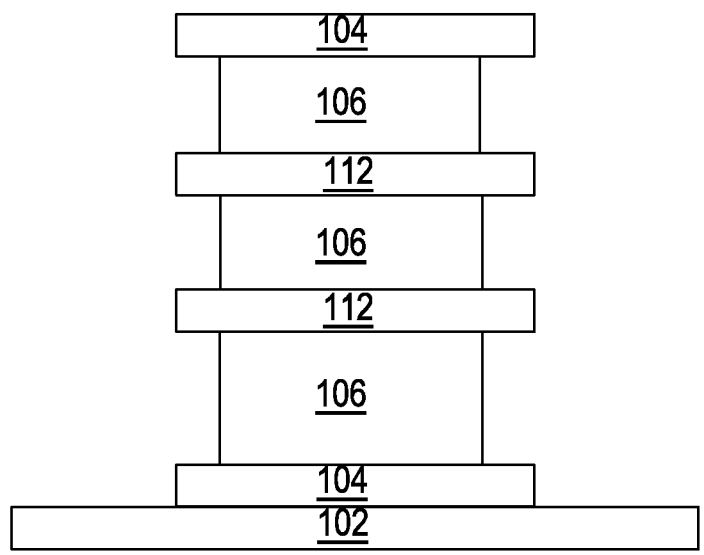
FIG. 15 is a schematic illustration of a glass stack configuration including interlayer setter plates in accordance with one or more embodiments described herein.
Figure 16:
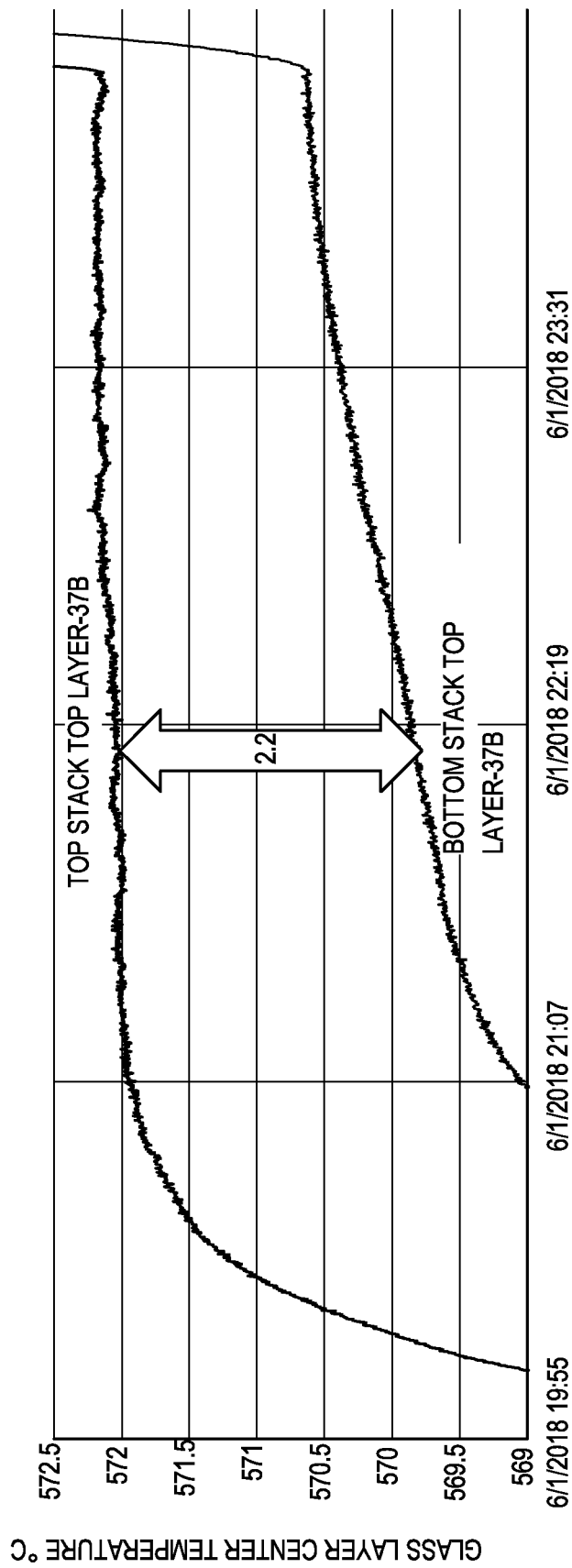
FIG. 16 is a graph plotting the glass layer center temperature (° C.; y-axis) as a function of time (x-axis) for the top sheet of glass in a glass stack and the bottom sheet of glass in the glass stack in accordance with one or more embodiments described herein.
Figure 17:
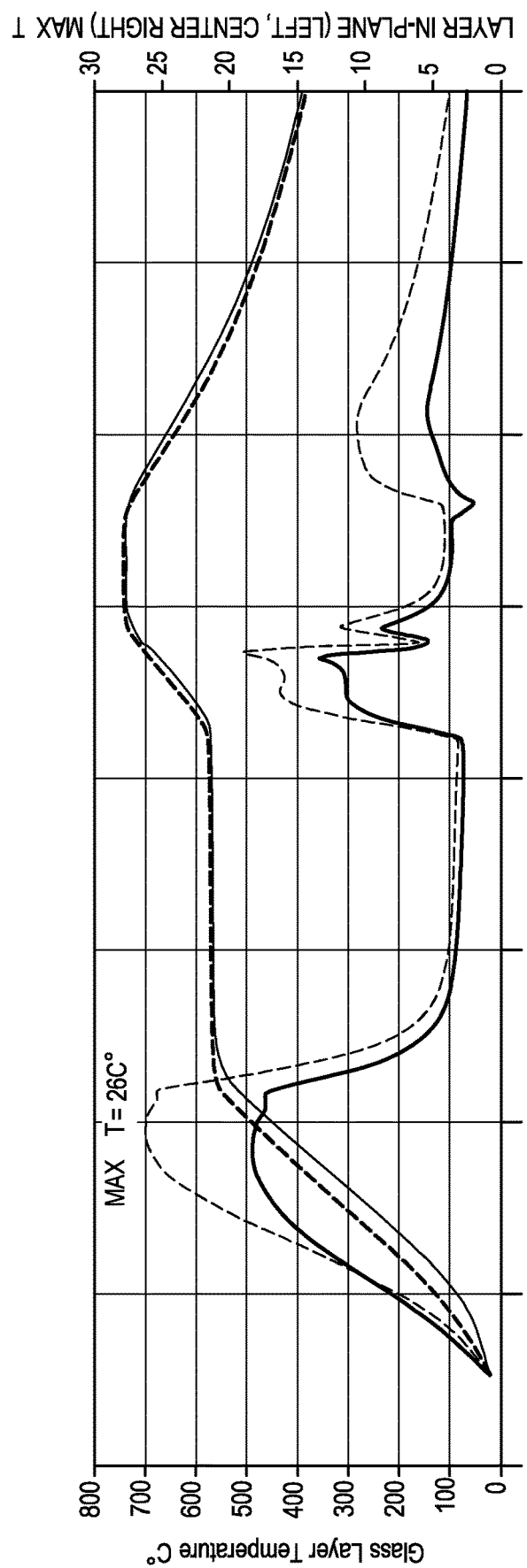
FIG. 17 is a graph plotting the glass layer temperature (° C.; y-axis) as a function of time (x-axis) during a ceramming process for the top sheet of glass in a glass stack and the bottom sheet of glass in the glass stack in accordance with one or more embodiments described herein.

Accordingly, in various embodiments, interlayer setter plates 112 may be placed within the glass stack 106, as shown in FIG. 15. The inclusion of the interlayer setter plates 112 can increase heat transfer and decrease the temperature lag from the top of the glass stack to the bottom of the glass stack. As shown in FIG. 16, when the temperature of each glass sheet in the stack including three interlayer setter plates is measured during the nucleation stage of the ceramming process, there is a 2.2° C. variability between the top layer of the top stack and the bottom layer of the bottom stack. Moreover, as shown in FIG. 17, although there remains a temperature differential during the ramping periods of the ceramming process, the inclusion of interlayer setter plates in the glass stack achieves temperature uniformity throughout the glass stack during the soaking periods.

Figure 18:
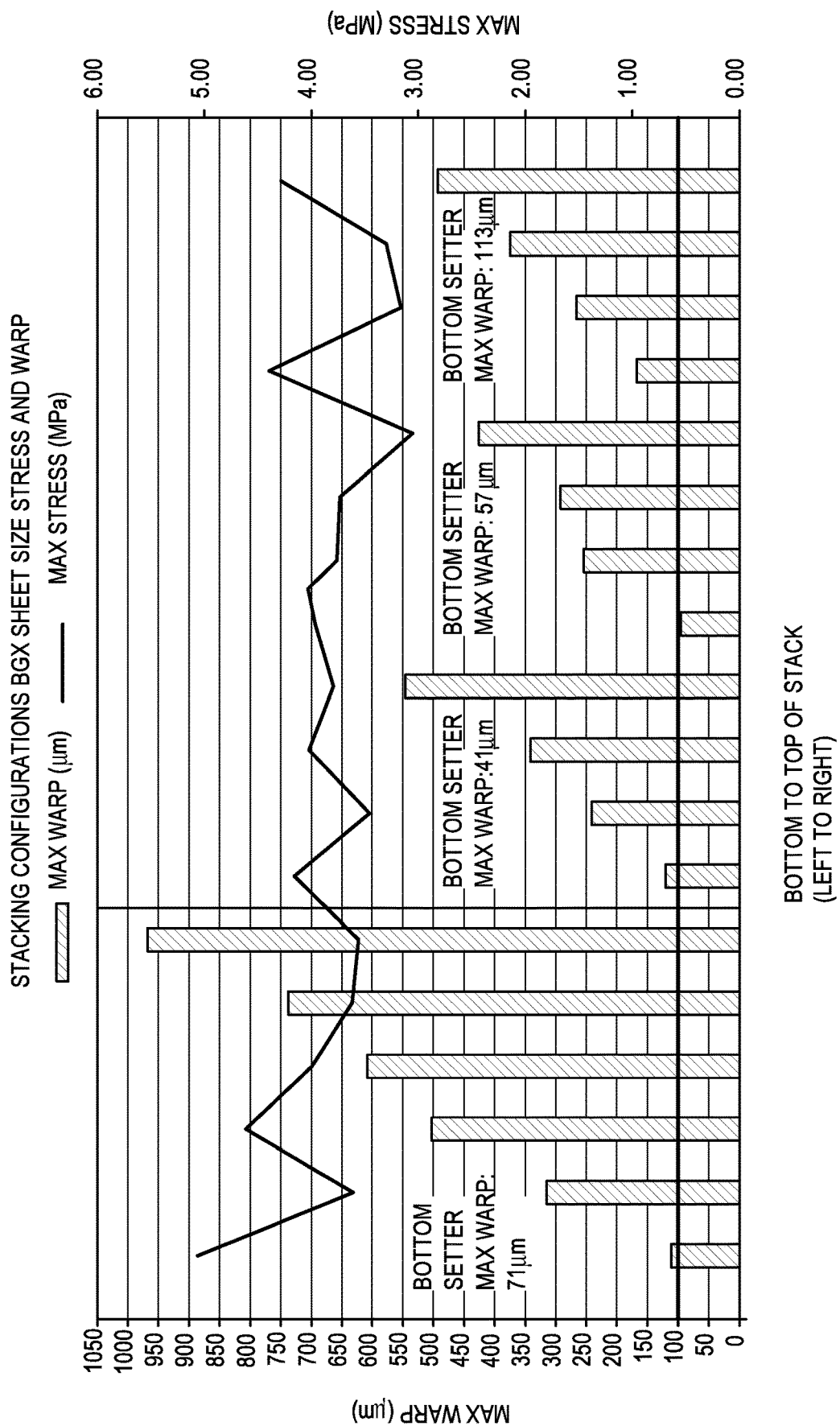
FIG. 18 is a graph illustrating the maximum warp (µm; left y-axis) as bars through the thickness of the glass stack for various amounts of applied force and the maximum stress (MPa; right y-axis) as a line graph for glass stacks without interlayer setter plates (left) and including interlayer setter plates (right) in accordance with one or more embodiments described herein.

Additionally, the inclusion of interlayer setter plates 112 reduces the warp and does not significantly impact the stress in the glass ceramic article, as shown in FIG. 18. Specifically, FIG. 18 shows that the inclusion of the interlayer setter plates 112 (right side of the graph) can reset the additive warp at each interlayer setter plate as compared to the increasing warp of the glass stack without interlayer setter plates (left side of the graph). The maximum stress is shown in FIG. 18 as the line graph, which does not increase with the addition of the interlayer setter plates.

In addition to including interlayer setter plates 112 within the glass stack 106, warp and stress in the glass ceramic article may further be controlled or reduced by limiting the number of glass sheets incorporated in the glass stack. For example, in some embodiments, the glass stack can be from 6 to 24 glass sheets, or from 10 to 20 glass sheets from setter plate 104 to setter plate 104. In embodiments in which interlayer setter plates are disposed within the glass stack, the number of glass sheets between each interlayer setter plate may be from 5 glass sheets to 15 glass sheets, or from 6 glass sheets to 10 glass sheets.

Stack Mass

Crystallization of the glass when forming a glass ceramic, such as discussed below, is an exothermic process that can cause localized heating within the glass stack 106. This localized heating can cause thermal gradients within the stack in all directions of the stack. As will be shown in more detail below, these thermal gradients can lead to warp, or reduced flatness, in the glass sheets present in the stack. According to embodiments, the mass of glass in a glass stack can be controlled, such as, for example, by modifying the height of the glass stack, to control the thermal gradients caused by crystallization of glass.

Ceramming cycle, according to embodiments, will comprise a nucleation step at a given temperature, followed by a growth step at a higher temperature. The precursor glass composition and the ceramming cycle will determine the phase assemblage in the final product. According to embodiments, the cycle of record (COR) for ceramming comprised heating the precursor glass composition to 570° C. and holding at that temperature for four hours followed by heating to 740° C. and holding at that temperature for 1 hour.

Figure 19:
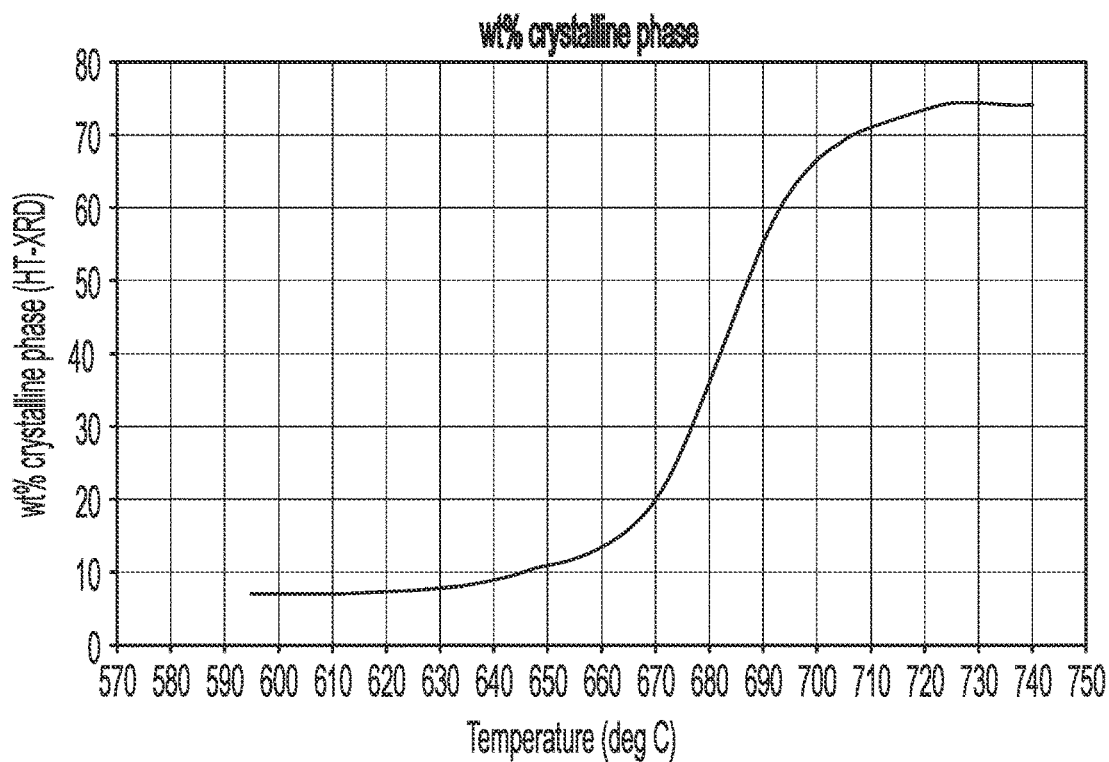
FIG. 19 graphically depicts crystalline phase of glass ceramic articles during a ceramming cycle according to embodiments disclosed and described herein.
Figure 20:
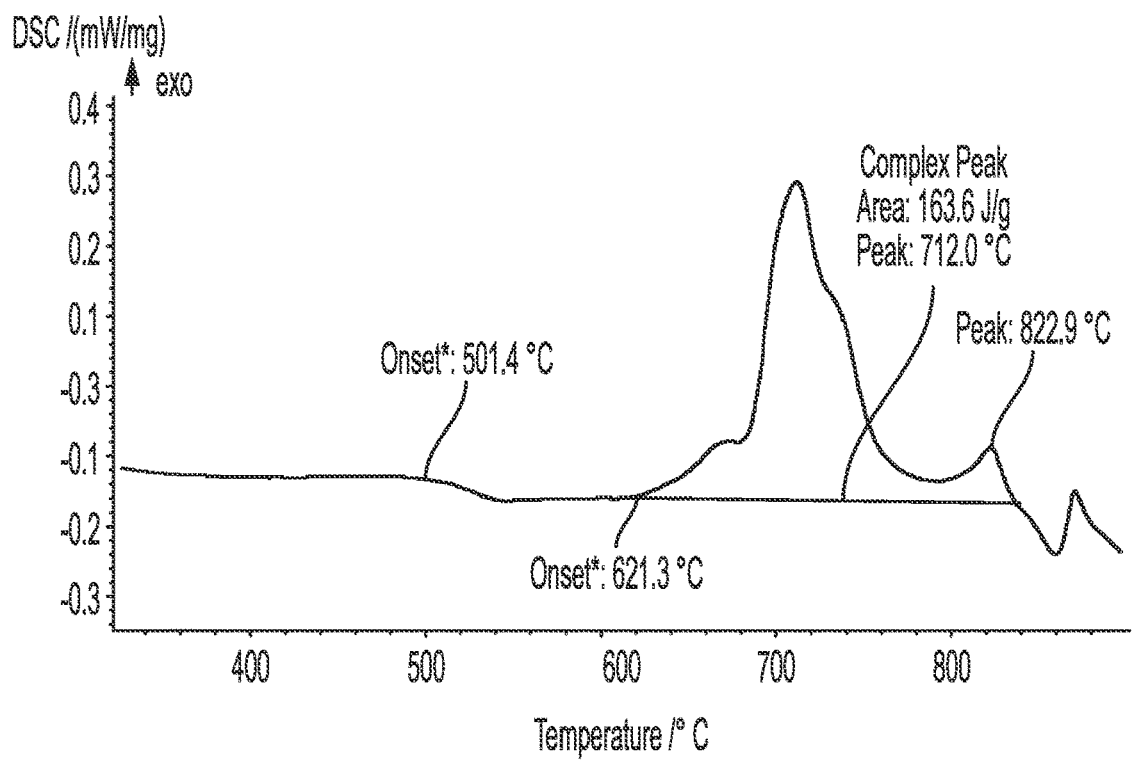
FIG. 20 graphically depicts calorimetry of glass ceramic articles during a ceramming cycle according to embodiments disclosed and described herein.

As shown in FIG. 19, when a precursor glass is cerammed with the COR, the glass shows an increase in the amount of crystalline phases precipitated starting around 620° C., with a sharp increase in the crystalline phases in the temperature range from 680° C. to 700° C. range, which corresponds to the ramp from nucleation to growth. Between 570° C. and 740° C., the amount of crystalline phase in the material goes from less than 10 wt % to greater than 70 wt % (as measured by high-temperature XRD analysis of the surface of a sample during ceramming of COR, analyzed by Rietveld method). This phenomenon is shown graphically in FIG. 19 by the sharp increase in wt % of crystalline phase, and particularly in the steep increase from about 660° C. to about 710° C. Similarly, FIG. 20 shows differential scanning calorimetry versus temperature, which indicates the energy released from crystallization at certain temperatures within the ceramming cycle. As shown in FIG. 20, according to embodiments, the energy released from crystallization increases rapidly at temperatures around 700° C., where crystalline phase formation is rapidly increasing (as shown in FIG. 20). Thus, a view of the of FIG. 19 and FIG. 20 shows that crystalline formation is an exothermic process that, as mentioned above, can cause temperature gradients in the glass stack.

Figure 21A:
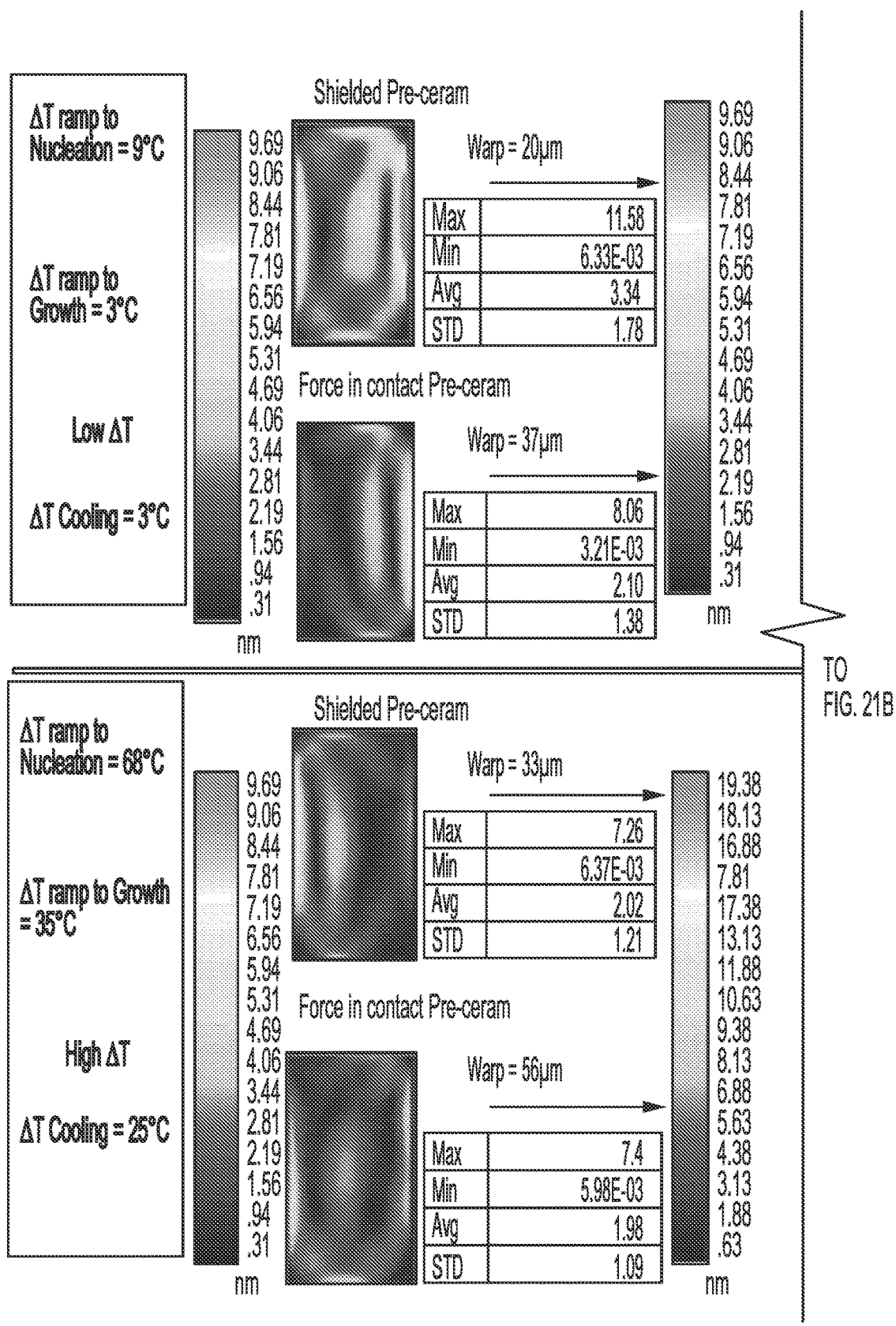
FIGS. 21A and 21B schematically depict stress and warp of shielded glass ceramic articles and force in contact glass ceramic articles according to embodiments disclosed and described herein.
Figure 21B:
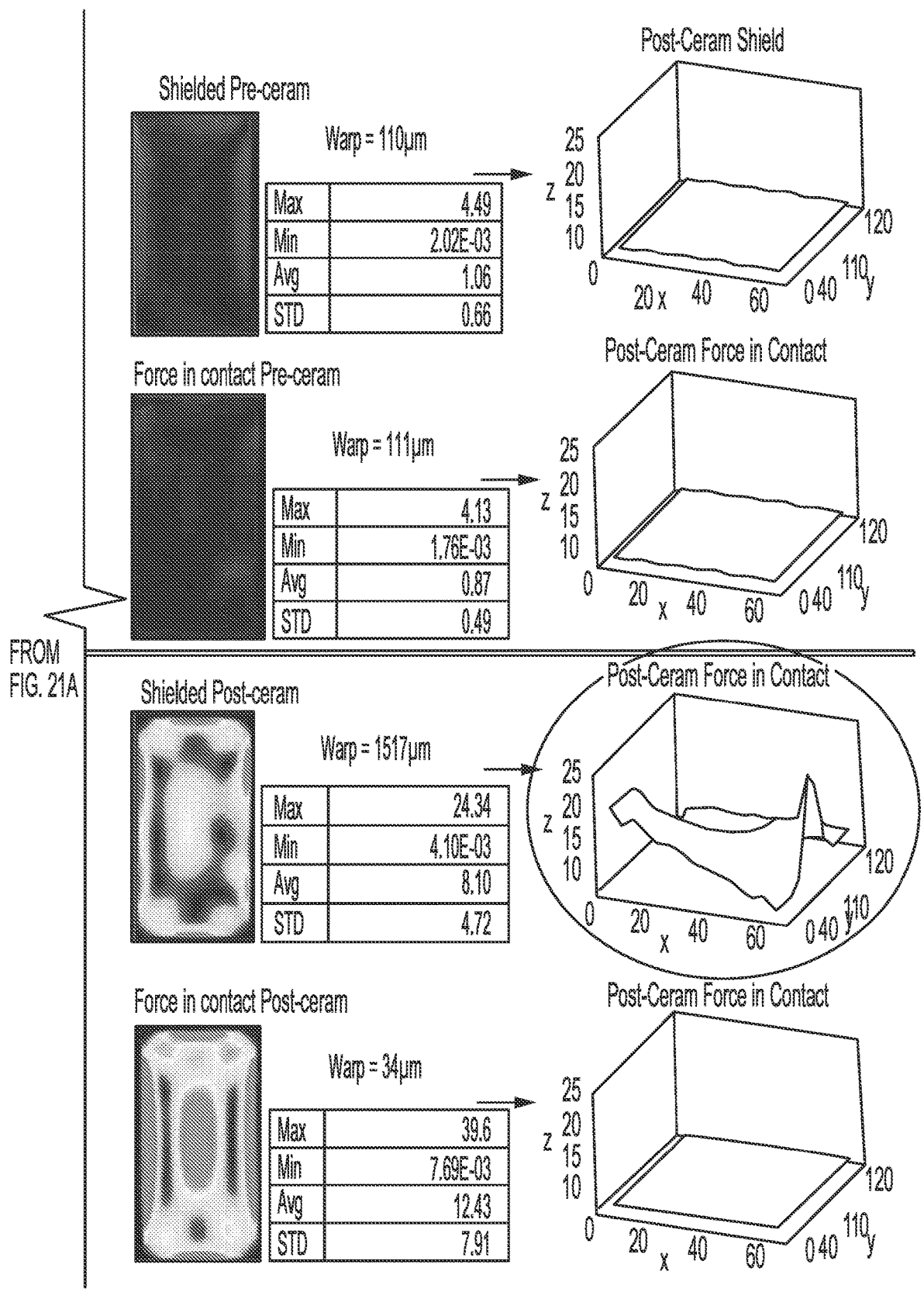

With reference now to FIGS. 21A and 21B, it is shown that when thermal gradients (ΔTs) are present in a glass sheet during the ramp from nucleation to growth, warp can be generated in the formed glass ceramic sheet if the glass sheet is not constrained underweight during the ceramming cycle in embodiments. Moreover, when the glass sheet is constrained underweight during the ceramming cycle, the glass sheet may not warp, but internal stresses can be caused by the ΔTs. This is evidenced In FIGS. 21A and 21B where two samples were formed with low ΔTs and two samples were formed at high ΔTs (four total samples). One sample in the high ΔTs and one sample in the low ΔTs had force applied to the glass sheet, which are labeled as "Force in Contact" in FIGS. 21A and 21B. In addition, one sample in the high ΔTs and one sample in the low ΔTs had a component that did not apply force to the glass sheet, but had a setter placed at a predetermined distance from the surface of the glass sheet, thereby constricting the amount of warp in the glass sheet; these samples are labeled "Shielded" in FIGS. 21A and 21B.

FIGS. 21A and 21B show pre-ceram conditions for low ΔTs of a glass sheet that is force in contact and a glass sheet that is shielded. FIGS. 21A and 21B also show the warp and stresses in those glass sheets. The warp of the shielded glass sheet is 20 μm and there are average stresses of 3.34 MPa in the shielded glass sheet, and the warp of the force in contact glass sheet is 37 μm and there are average stresses of 2.10 MPa in the force in contact glass sheet. FIGS. 21A and 21B show post-ceram conditions for low ΔTs of a glass sheet that is force in contact and a glass sheet that is shielded. FIGS. 21A and 21B also show the warp and stresses in those glass sheets. The warp of the shielded glass sheet is 110 μm and there are average stresses of 1.06 MPa in the shielded glass sheet, and the warp of the force in contact glass sheet is 111 μm and there are average stresses of 0.87 MPa in the force in contact glass sheet. FIGS. 21A and 21B graphically depict the warp of the post-ceram shielded glass sheet and the post-ceram force in contact glass sheet.

FIGS. 21A and 21B show pre-ceram conditions for high ΔTs of a glass sheet that is force in contact and a glass sheet that is shielded. FIGS. 21A and 21B also show the warp and stresses in those glass sheets. The warp of the shielded glass sheet is 33 μm and there are average stresses of 2.02 MPa in the shielded glass sheet, and the warp of the force in contact glass sheet is 56 μm and there are average stresses of 1.98 MPa in the force in contact glass sheet. FIGS. 21A and 21B show post-ceram conditions for high ΔTs of a glass sheet that is force in contact and a glass sheet that is shielded. FIGS. 21A and 21B also show the warp and stresses in those glass sheets. The warp of the shielded glass sheet is 1517 μm and there are average stresses of 8.10 MPa in the shielded glass sheet, and the warp of the force in contact glass sheet is 34 μm and there are average stresses of 12.43 MPa in the force in contact glass sheet. FIGS. 21A and 21B graphically depict the warp of the post-ceram shielded glass sheet and the post-ceram force in contact glass sheet.

As shown in FIGS. 21A and 21B thermal gradients (ΔTs) in the glass sheets during ceramming can cause warping and/or stresses in the glass sheet. Without being bound by any particular theory, these thermal gradients may be caused by the exothermic crystallization during the ceramming process.

Figure 22:
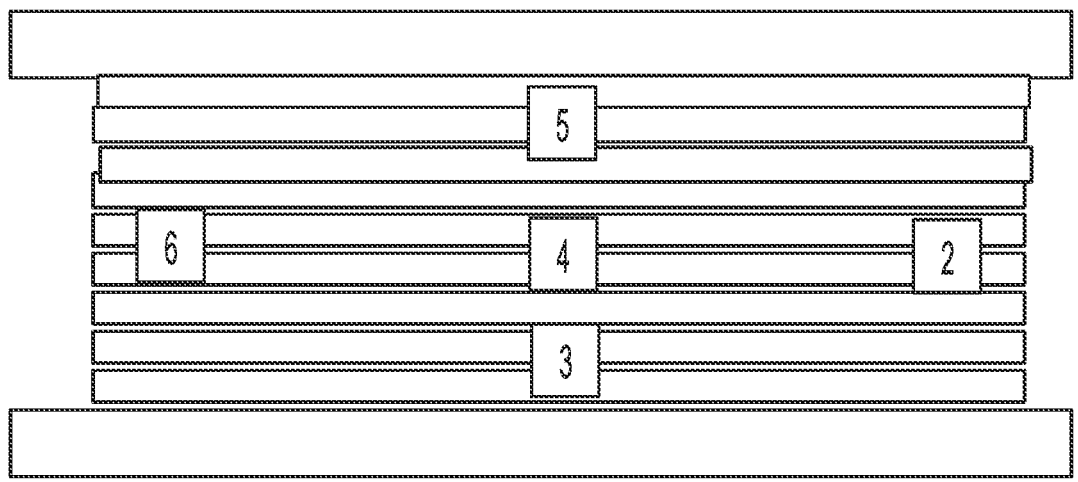
FIG. 22 schematically depicts locations of thermocouples within a stack according to embodiments disclosed and described herein.
Figure 23:
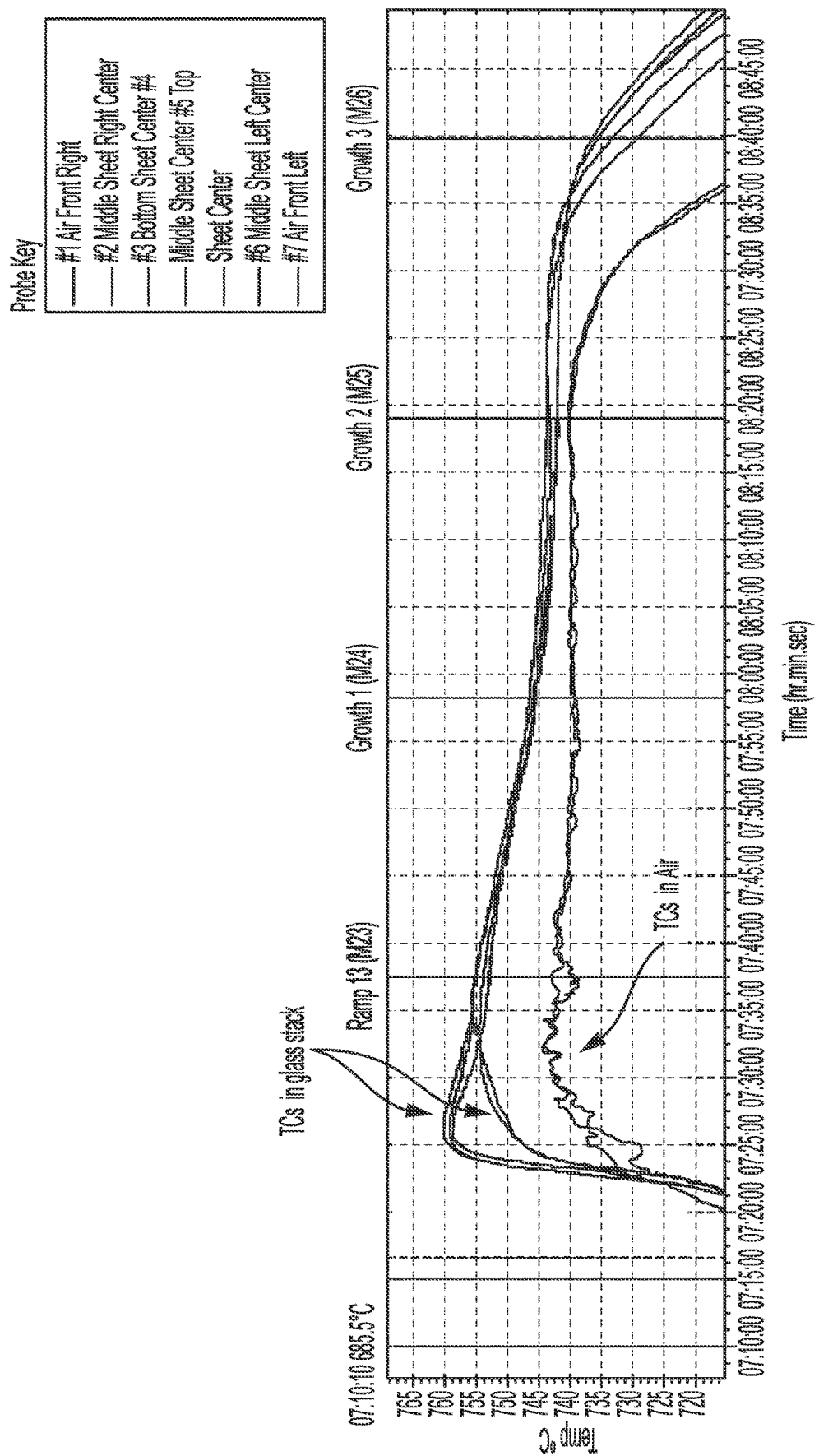
FIG. 23 graphically depicts temperatures read by thermocouples during a ceramming cycle according to embodiments disclosed and described herein.

During ceramming of stacks of glass sheets, the temperature increase within the glass stack during heating from the nucleation stage to the crystallization stage exceeds the temperature increase in the atmosphere in the heating chamber surrounding the glass stack. FIG. 22 shows the placement of thermocouples 2-6 within the glass stack. Namely, thermocouples 2 and 6 are positioned on the left and right side of the stack, respectively, and thermocouples 3-5 are positioned in the center of the stack at the bottom, middle, and top of the stack, respectively. In addition, thermocouples 1 and 7 were placed in the atmosphere of the heating chamber outside of the stack. FIG. 23 shows the temperature readings of the thermocouples during a ceramming cycle. As can be seen in FIG. 23, the thermocouples in the glass stack (thermocouples 2-6) read temperatures significantly higher than the thermocouples outside of the stack in the atmosphere of the heating chamber (thermocouples 1 and 7) during the crystallization step, which is from around 7:20 to around 7:30. During the temperature hold in the crystallization step, the temperature readings of the thermocouples in the glass stack approach the temperature readings of the thermocouples in the outside of the glass, which indicates that the exothermic crystallization of the glass sheet causes a spike in stack temperature during the heating from the nucleation step to the crystallization step.

This temperature difference between the glass stack and the atmosphere of the heating chamber increases as the stack height increases, or in other words, increases as the mass of glass within the stack increases. Table 2 shows six stack configurations having different stack heights and, correspondingly, different mass indexes (mass index is the thickness of the glass sheets multiplied by the number of sheets in the stack).

TABLE 2

| Run | Stack Configuration (number of sheet in stack) | Thickness of each sheet (mm) | Mass Index |
|---|---|---|---|
| 1 | 23 | 1.11 | 25.3 |
| 2 | 23 | 1.11 | 25.3 |
| 3 | 10 | 1.11 | 11.0 |
| 4 | 15 | 1.11 | 16.5 |
| 5 | 23 | 1.11 | 25.3 |
| 6 | 3 | 4.3 | 12.9 |

Figure 24:
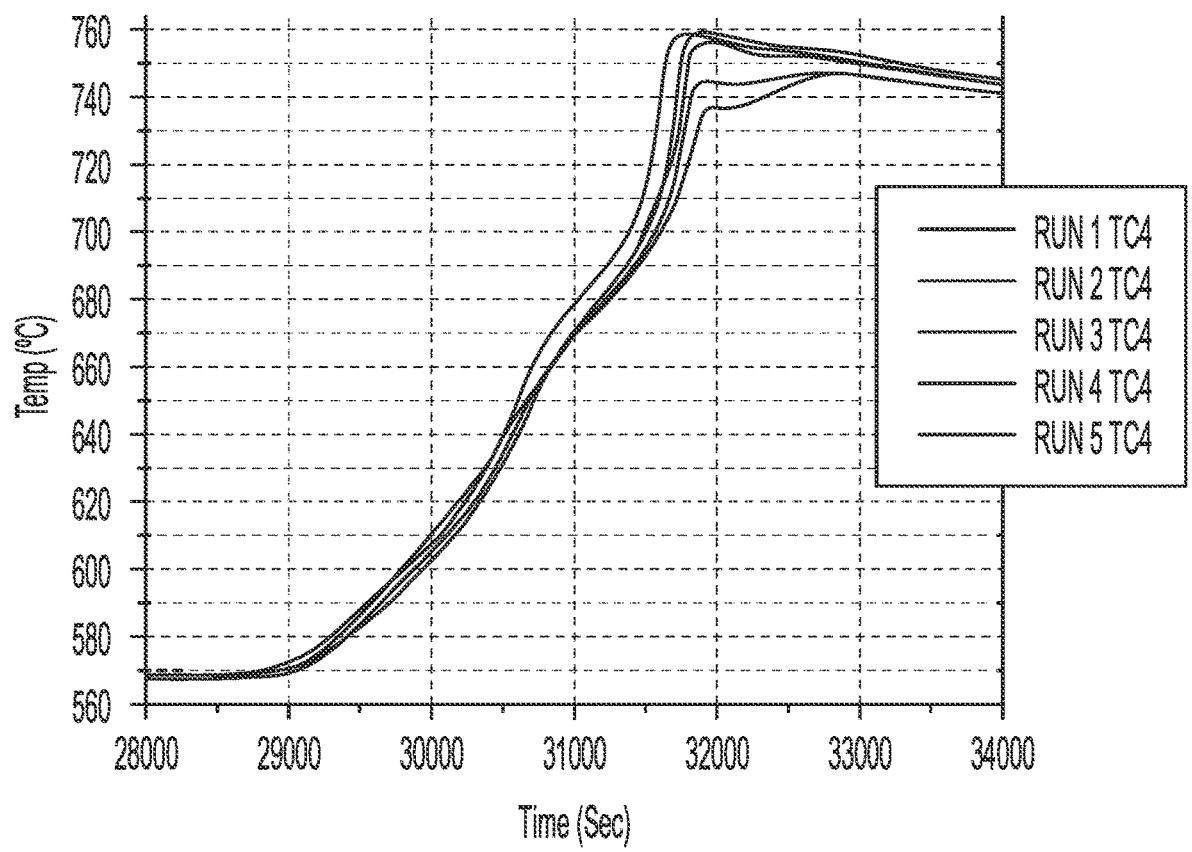
FIG. 24 graphically depicts temperatures read by thermocouples during a ceramming cycle according to embodiments disclosed and described herein.

The COR ceramming cycle disclosed above was run on stacks having the configurations disclosed in Table 2 above. FIG. 24 graphically depicts the results of this test, which were conducted on sheets have dimensions—other than thickness—of 260 mm×680 mm. As disclosed above, the COR ceramming cycle heats the atmosphere of a heating chamber, such as, for example a lehr or an oven, from a nucleation hold of about 540° C. to a crystalline growth temperature of 740° C., where the atmosphere of the heating chamber is held at 740° C. for a duration of time. Thus, glass stacks that have the smallest effect of the exothermic crystallization will have maximum temperatures that are closest to 740° C. As shown in FIG. 24, glass stacks having a lower mass index will have a maximum temperature. In particular, Runs 3 and 4 in Table 2, which include stacks having a mass index of 11.0 and 16.5, respectively, have maximum temperatures that are closer to 740° C. than Runs 1, 2, and 5, which all include stacks having a mass index of 23. This data indicates that stacks having lower mass indexes will have less effects of the exothermic crystallization and, thereby will have less temperature gradients and less warp.

Figure 25:
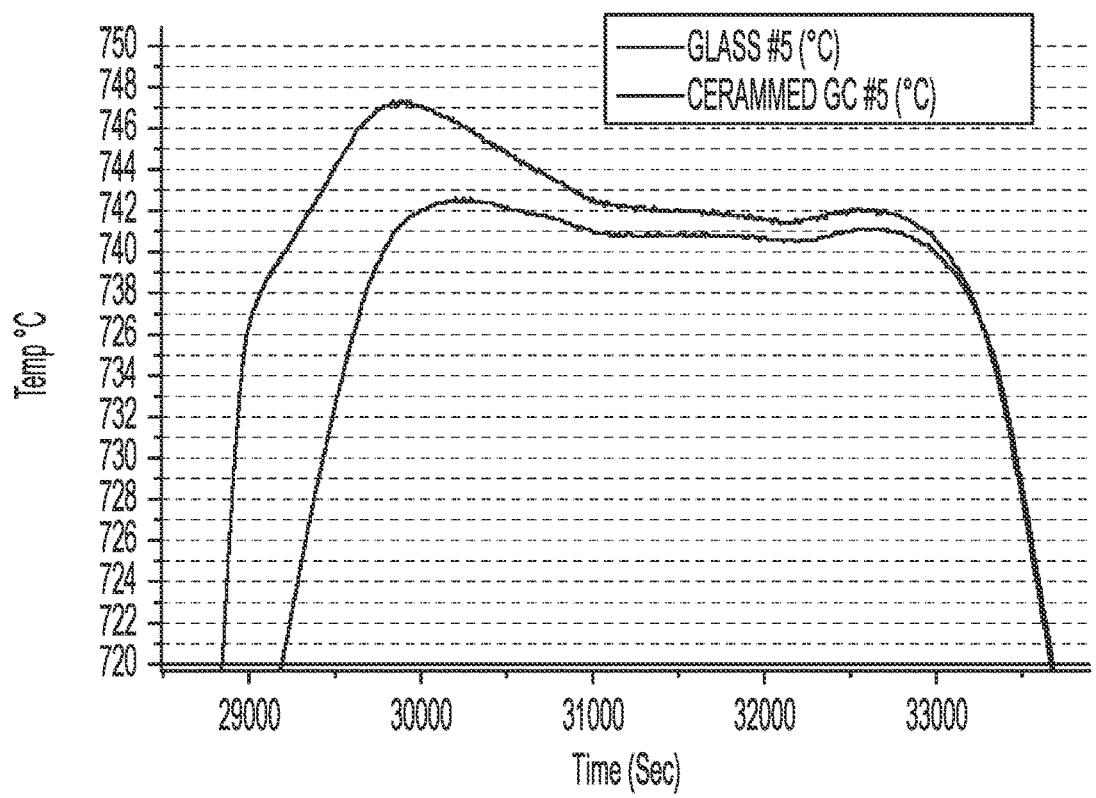
FIG. 25 graphically depicts temperatures read by thermocouples during a ceramming cycle of a glass sheet and a cerammed sheet according to embodiments disclosed and described herein.
Figure 26:
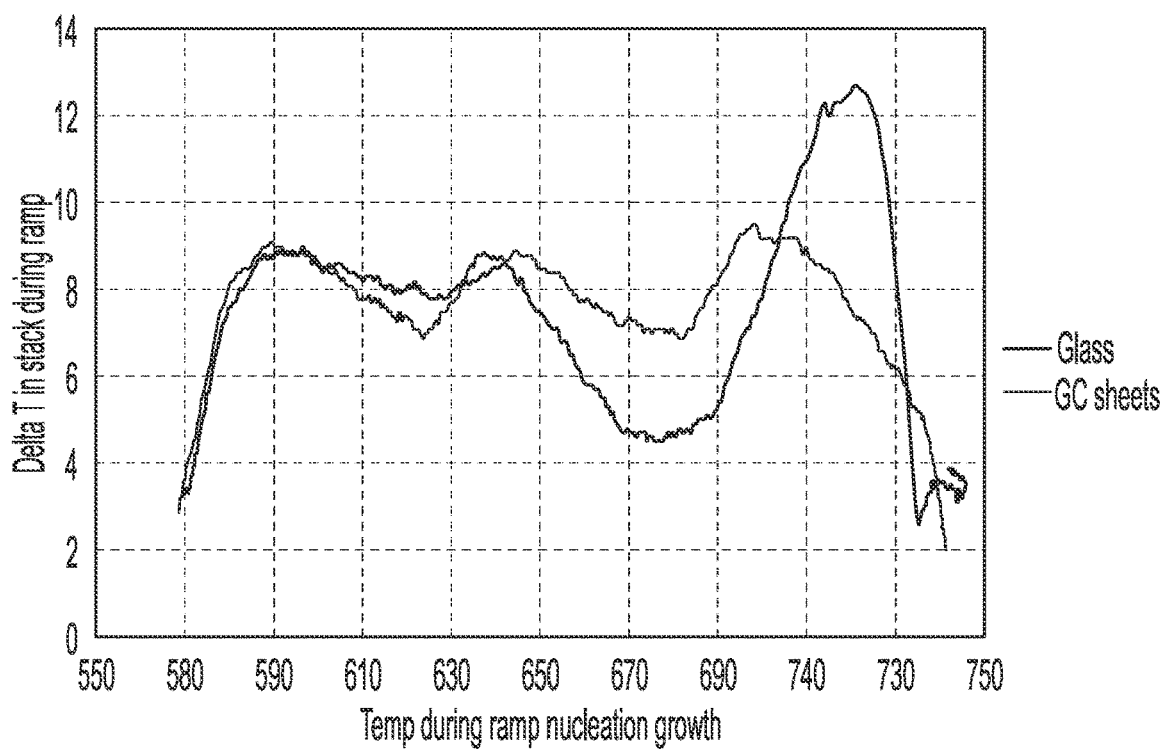
FIG. 26 graphically depicts temperatures read by thermocouples during a ceramming cycle of a glass sheet and a cerammed sheet according to embodiments disclosed and described herein.

The impact of the exothermic crystallization is further confirmed by a comparison of two cycles using the configuration of Run 6 in Table 2 above. In the first cycle glass sheets were used that underwent nucleation and crystallization, and in the second cycle the same crystallized glass sheets used for the first cycle were subjected to the cycle again. In this way, a comparison is made of sheets that undergo crystallization in the first cycle and sheets that do not undergo crystallization in the second cycle-because the sheets were already crystallized in the first cycle. Accordingly, little to no exothermic crystallization is expected in the second cycle because the sheets have already undergone crystallization and will not crystallize a second time. This is confirmed as shown in FIG. 25, which graphically depicts the results of the stack temperature during the cycle. In FIG. 25 the glass sheets showed increased temperatures during the cycle (particularly during the crystallization step), while the crystallized sheets did not show increased temperature during the cycle. However, the temperatures of the glass stack and the temperatures of the crystallized stacks are relatively similar during the other parts of the cycle and only differ significantly while heating from the nucleation step to the growth step (i.e., the temperature range where significant crystallization events and exothermic reactions are known to occur). FIG. 26 graphically compares the temperature readings of thermocouples within the stack and thermocouples outside of the stack using the thermocouple configuration disclosed in FIG. 22. As shown in FIG. 26, the temperature within the stack does not exceed the temperature in the air surrounding the stack for these crystallized sheets.

The exothermic crystallization can also effect the temperature gradients across the stack. Using the thermocouple configuration disclosed in FIG. 22, temperatures at multiple locations within the stack are measured during the cycle. For the stack of crystallized sheets, the temperature is more uniform throughout the stack, as shown in FIG. 26. Thus, the magnitude of the thermal gradients throughout the stack increases with increased magnitude of overshoot. The stack of glass sheets, which experiences the exothermic reactions due to crystallization during this thermal treatment, show increased thermal gradients above 700° C. As shown above, thermal gradients in the glass sheets can lead to increased warp and/or stresses in the sheets.

To moderate the temperature gradients that occur during the ceramming cycle, in embodiments, stacks of glass sheets have a mass index less than or equal to 35, such as less than or equal to 34, less than or equal to 33, less than or equal to 32, less than or equal to 31, less than or equal to 30, less than or equal to 29, less than or equal to 28, less than or equal to 27, less than or equal to 26, less than or equal to 25, less than or equal to 24, less than or equal to 23, less than or equal to 22, less than or equal to 21, less than or equal to 20, less than or equal to 19, less than or equal to 18, less than or equal to 17, less than or equal to 16, less than or equal to 15, less than or equal to 14, less than or equal to 13, less than or equal to 12, less than or equal to 11, or less than or equal to 10. It should be understood that the minimum mass index is not limited and can be any number greater than 0.

Sheet Configuration

Figure 27:
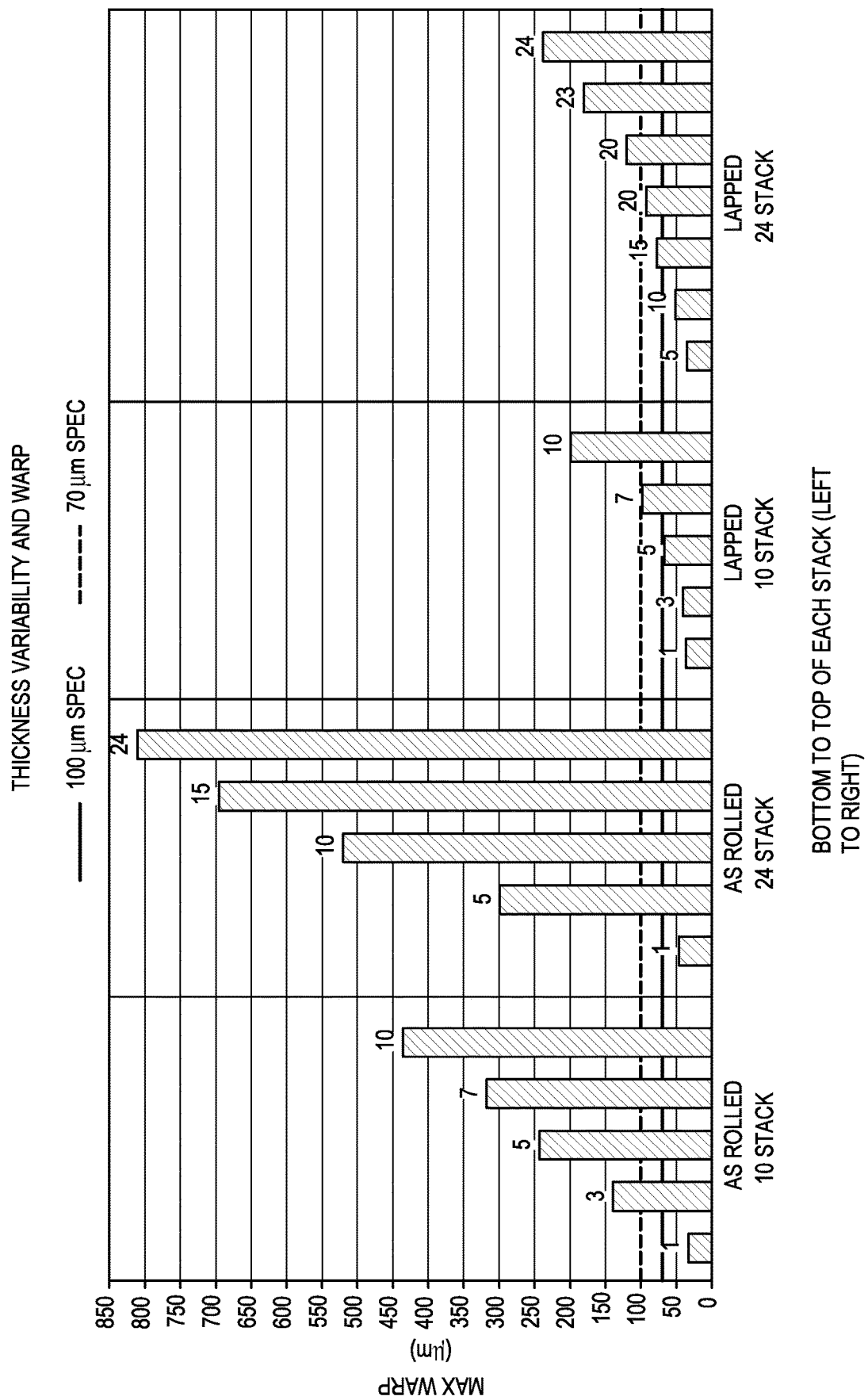
FIG. 27 is a graph illustrating the maximum warp (μm; y-axis) through the thickness of glass stacks having various thickness variability in accordance with one or more embodiments described herein.
Figure 28:
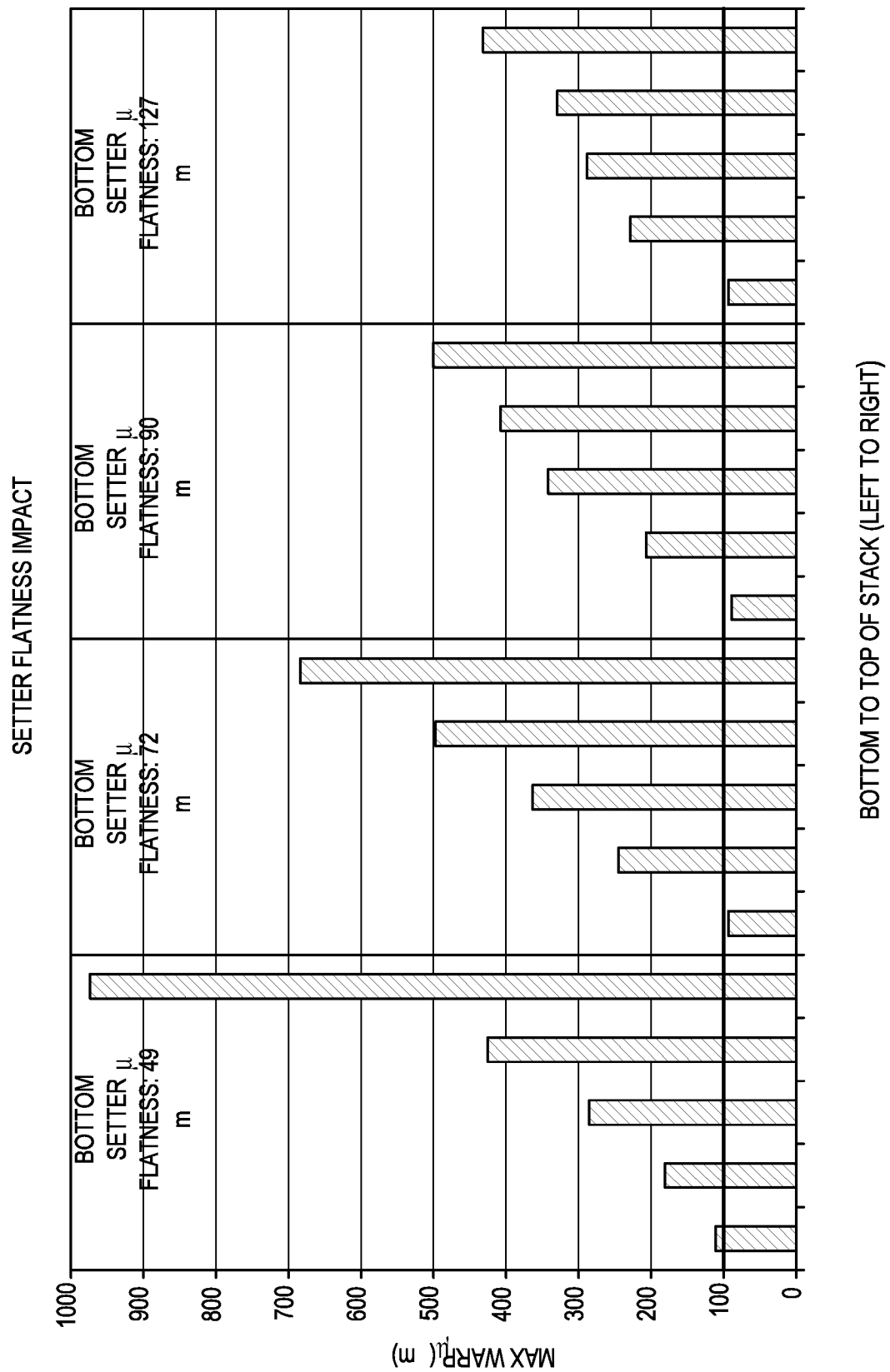
FIG. 28 is a graph illustrating the maximum warp (μm; y-axis) through the thickness of the glass stack for various setter plate flatnesses in accordance with one or more embodiments described herein.

According to various embodiments herein, the thickness uniformity of the glass sheets 108 is controlled to decrease the warp of the glass ceramic article. In FIG. 27, the maximum warp for glass stacks of 10 glass sheets and 24 glass sheets for both as-rolled glass and lapped glass is shown. As shown in FIG. 27, for glass stacks including as-rolled glass sheets with a maximum thickness variation of 64 μm, the maximum warp was significantly increased as compared to glass stacks including lapped glass sheets with a maximum thickness variation of 21 μm. Additionally, as demonstrated by the data in FIG. 28, the flatness of the setter plate 104 (as described above) has an impact that is limited by the variability of the thickness of the glass sheets. In particular, FIG. 28 shows that for a 10-glass sheet stack configuration of as-rolled glass, a 78 μm reduction in the flatness of the setter plate has a limited impact on the warp of the glass ceramic article. Accordingly, following sheet formation, in various embodiments, the glass sheets may be machined or otherwise processed to reduce the thickness variability of the glass sheets.

Figure 29A:
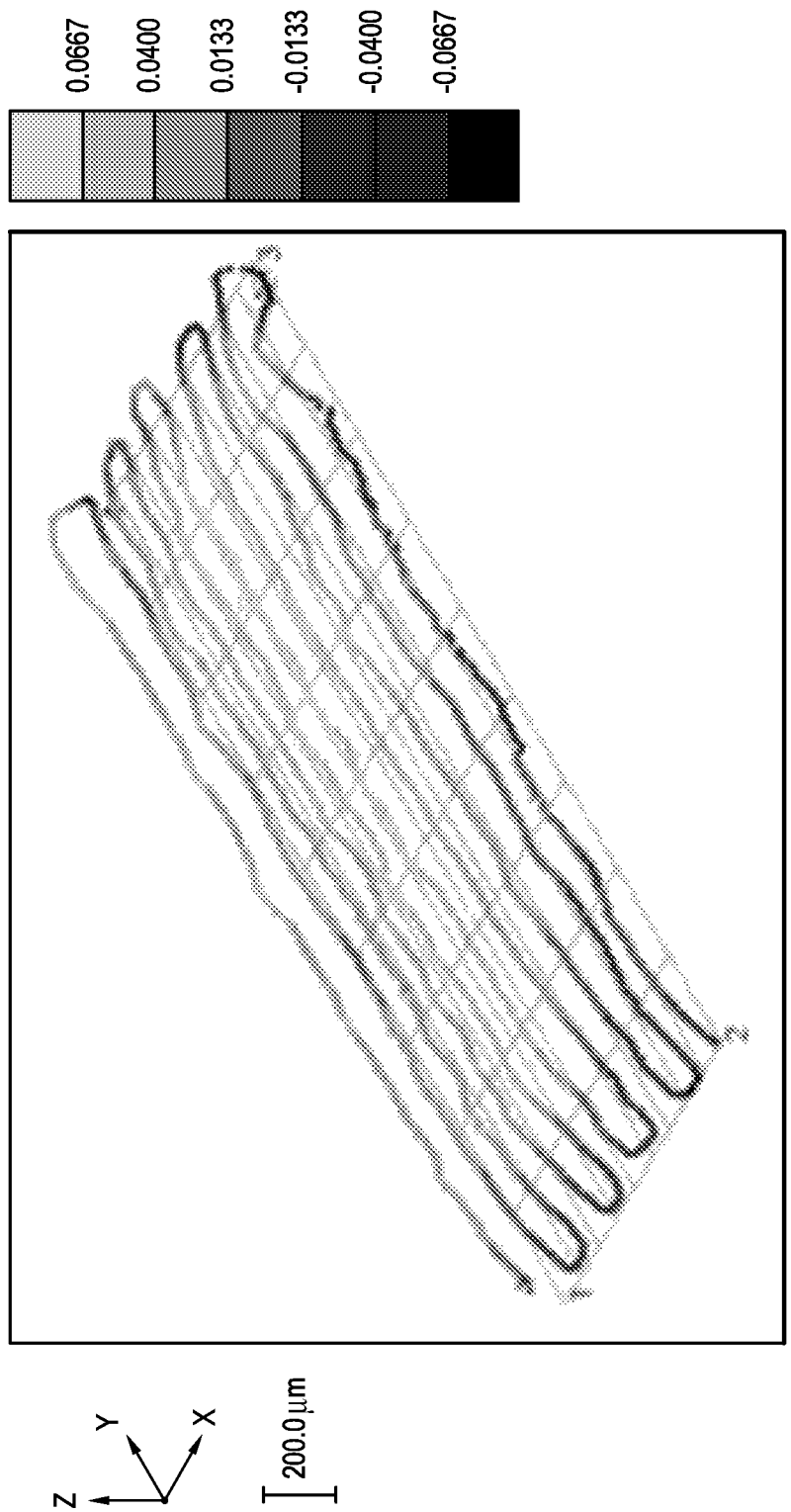
FIG. 29A is a graphical representation of the warp of a 26 5-mm glass strip with the edge bead removed in accordance with one or more embodiments described herein.
Figure 29B:
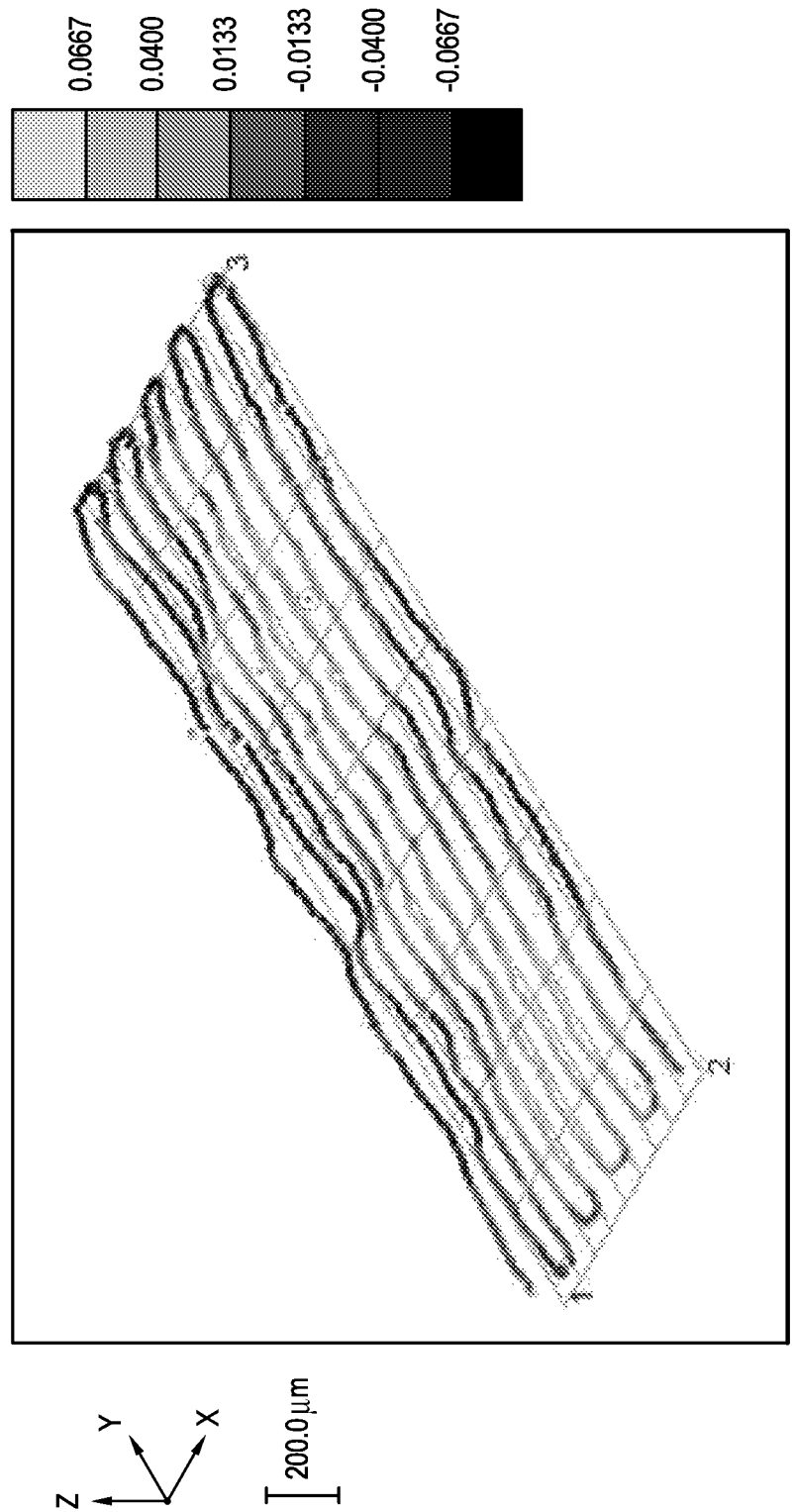
FIG. 29B is a graphical representation of the warp of a 26 5-mm glass strip with the edge bead remaining in accordance with one or more embodiments described herein.
Figure 30:
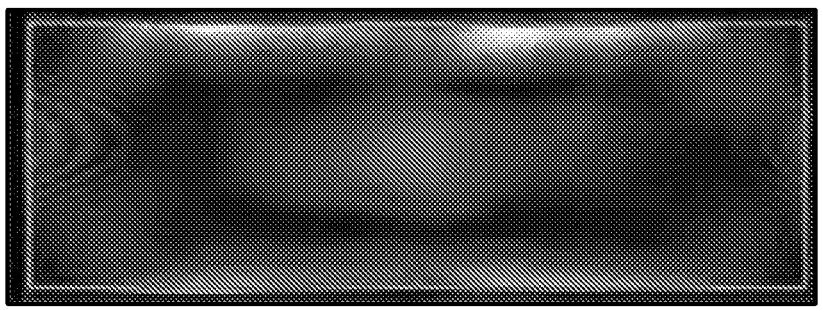
FIG. 30 is a graphical representation of the stress of a glass ceramic article with the edge bead remaining (top) and with the edge bead removed (bottom) in accordance with one or more embodiments described herein.
Figure 30:
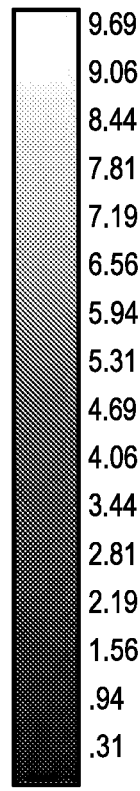
Figure 30:
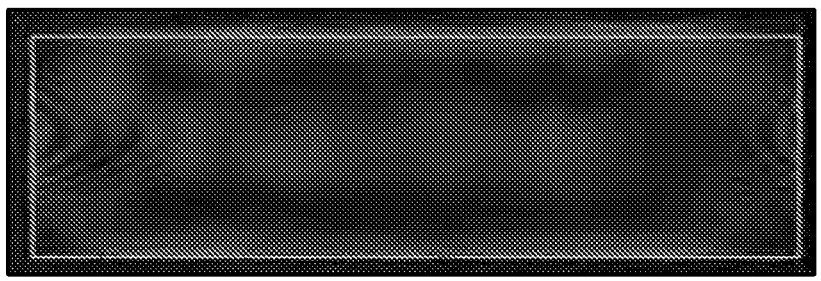

In various embodiments, the edge bead may be removed from glass sheets to decrease the amount of warp observed in the glass ceramic article. It is believed that the edge beads have higher thickness non-uniformity and therefore contribute to warp during the ceramming process. In particular, in embodiments in which a single sheet of glass is subjected to the ceramming process (e.g., not incorporated into a glass stack), the removal of the edge bead can reduce warp in the glass sheet. As shown in FIG. 29A, the removal of the edge bead (approximately 10 mm on each side of the glass sheet) decreases the maximum flatness by 56 μm as compared to the glass sheet without removal of the edge bead (FIG. 29B). Additionally, as shown in FIG. 30, the stress in the glass ceramic article is reduced when the bead is removed (bottom) as compared to when the glass ceramic article is cerammed including the bead (top). However, unexpectedly, removal of the edge bead from glass sheets incorporated into a glass stack during the ceramming process results in increased warp in embodiments in which a parting agent layer is not also incorporated into the glass stack. Without being bound by theory, it is believed that the increase in surface area contact resulting from the removal of the edge beads of adjacent glass sheets provides additional area for sticking to occur. Accordingly, in embodiments in which the edge bead is removed and the glass sheet is to be incorporated into a glass stack, a parting agent layer is incorporated.

Figure 31:
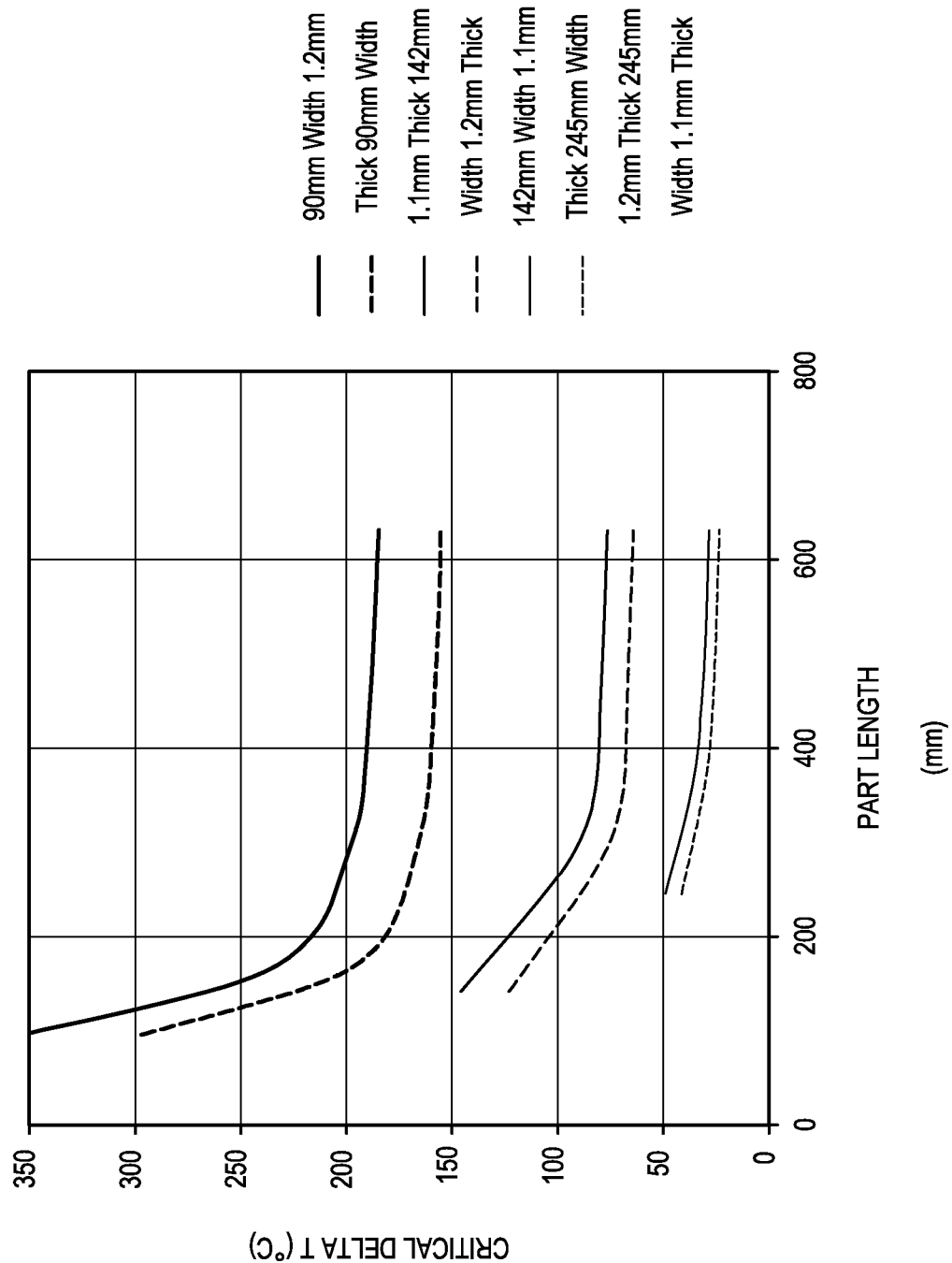
FIG. 31 is a graph plotting the critical delta T (° C.; y-axis) as a function of part length (mm; x-axis) for glass ceramic parts of various lengths and widths in accordance with one or more embodiments described herein.

In various embodiments, part size is also taken into account to control warp and stress in the glass ceramic article. As shown in FIG. 31, the critical ΔT decreases with part size. In particular, the critical ΔT is the ΔT at which stress and warp may be induced for various part lengths and widths. Accordingly, for larger parts, a larger ΔT may be acceptable without inducing warp or buckling into the final glass ceramic article.

Accordingly, in various embodiments, the thickness variation of the glass sheets can be controlled individually and throughout the glass stack, such as by edge bead removal and lapping, to reduce the warp and stress imparted to the glass ceramic article.

Composition of Glass or Glass Ceramic Precursors

Embodiments of glass or glass ceramic precursor compositions are provided in both weight percent (wt %) and mole percent (mol %) below. The compositions are provided in their respective percentages on an oxide basis.

Compositions in Weight Percent

The glass sheets 108 may be made from any glass composition that is suitable for forming glass ceramic articles, although it should be understood that the glass composition of the glass sheets 108 can impact the mechanical and optical properties of the glass ceramic article. In various embodiments, the glass composition is selected such that the resultant glass ceramic article has a petalite crystalline phase and a lithium silicate crystalline phase and wherein the petalite crystalline phase and the lithium silicate crystalline phase have higher weight percentages than other crystalline phases present in the glass ceramic article.

By way of example and not limitation, in various embodiments, the glass sheets 108 may be formed from a glass composition including from about 55 wt % to about 80 wt % $SiO_2$, from about 0 wt % to about 20 wt % $Al_2O_3$, from about 5 wt % to about 20 wt % $Li_2O$, from about 0 wt % to about 10 wt % $B_2O_3$, from about 0 wt % to about 5 wt % $Na_2O$, from about 0 wt % to about 10 wt % ZnO, from about 0.5 wt % to about 6 wt % $P_2O_5$, and from about 0.2 wt % to about 15 wt % $ZrO_2$. In embodiments, the glass or glass ceramic precursors may comprise alkali salts, such as $K_2O$, $Rb_2O$, or $Cs_2O$.

$SiO_2$, an oxide involved in the formation of glass, can function to stabilize the networking structure of glasses and glass-ceramics. In various glass compositions, the concentration of $SiO_2$ should be sufficiently high in order to form petalite crystal phase when the glass sheet is heat treated to convert to a glass-ceramic. The amount of $SiO_2$ may be limited to control the melting temperature of the glass, as the melting temperature of pure $SiO_2$ or high-$SiO_2$ glasses is undesirably high. In some embodiments, the glass or glass-ceramic composition comprises from about 55 wt % to about 80 wt % $SiO_2$. In some embodiments, the glass or glass-ceramic composition comprises from about 69 wt % to about 80 wt % $SiO_2$. In some embodiments, the glass or glass-ceramic composition can comprise from about 55 wt % to about 80 wt %, about 55 wt % to about 77 wt %, about 55 wt % to about 75 wt %, about 55 wt % to about 73 wt %, about 60 wt % to about 80 wt %, about 60 wt % to about 77 wt %, about 60 wt % to about 75 wt %, about 60 wt % to about 73 wt %, about 69 wt % to about 80 wt %, about 69 wt % to about 77 wt %, about 69 wt % to about 75 wt %, about 69 wt % to about 73 wt %, about 70 wt % to about 80 wt %, about 70 wt % to about 77 wt %, about 70 wt % to about 75 wt %, about 70 wt % to about 73 wt %, about 73 wt % to about 80 wt %, about 73 wt % to about 77 wt %, about 73 wt % to about 75 wt %, about 75 wt % to about 80 wt %, about 75 wt % to about 77 wt %, or about 77 wt % to about 80 wt % $SiO_2$.

$Al_2O_3$ may also provide stabilization to the network and also provides improved mechanical properties and chemical durability. If the amount of $Al_2O_3$ is too high, however, the fraction of lithium silicate crystals may be decreased, possibly to the extent that an interlocking structure cannot be formed. The amount of $Al_2O_3$ can be tailored to control viscosity. Further, if the amount of $Al_2O_3$ is too high, the viscosity of the melt is also generally increased. In some embodiments, the glass or glass-ceramic composition can comprise from about 0 wt % to about 20 wt % $Al_2O_3$. In some embodiments, the glass or glass-ceramic composition can comprise from about 6 wt % to about 9 wt % $Al_2O_3$. In some embodiments, the glass or glass-ceramic composition can comprise from about 2 wt % to about 20 wt %, about 2 wt % to about 18 wt %, about 2 wt % to about 15 wt %, about 2 wt % to about 12 wt %, about 2 wt % to about 10 wt %, about 2 wt % to about 9 wt %, about 2 wt % to about 8 wt %, about 2 wt % to about 5 wt %, about 5 wt % to about 20 wt %, about 5 wt % to about 18 wt %, about 5 wt % to about 15 wt %, about 5 wt % to about 12 wt %, about 5 wt % to about 10 wt %, about 5 wt % to about 9 wt %, about 5 wt % to about 8 wt %, 6 wt % to about 20 wt %, about 6 wt % to about 18 wt %, about 6 wt % to about 15 wt %, about 6 wt % to about 12 wt %, about 6 wt % to about 10 wt %, about 6 wt % to about 9 wt %, 8 wt % to about 20 wt %, about 8 wt % to about 18 wt %, about 8 wt % to about 15 wt %, about 8 wt % to about 12 wt %, about 8 wt % to about 10 wt %, 10 wt % to about 20 wt %, about 10 wt % to about 18 wt %, about 10 wt % to about 15 wt %, about 10 wt % to about 12 wt %, about 12 wt % to about 20 wt %, about 12 wt % to about 18 wt %, or about 12 wt % to about 15 wt % $Al_2O_3$.

In the glass and glass-ceramics herein, $Li_2O$ aids in forming both petalite and lithium silicate crystal phases. In fact, to obtain petalite and lithium silicate as the predominant crystal phases, it is desirable to have at least about 7 wt % $Li_2O$ in the composition. Additionally, it has been found that once $Li_2O$ gets too high (greater than about 15 wt %), the composition becomes very fluid. Accordingly, in some embodiments, the glass or glass-ceramic composition can comprise from about 5 wt % to about 20 wt % $Li_2O$. In other embodiments, the glass or glass-ceramic composition can comprise from about 10 wt % to about 14 wt % $Li_2O$. In some embodiments, the glass or glass-ceramic composition can comprise from about 5 wt % to about 20 wt %, about 5 wt % to about 18 wt %, about 5 wt % to about 16 wt %, about 5 wt % to about 14 wt %, about 5 wt % to about 12 wt %, about 5 wt % to about 10 wt %, about 5 wt % to about 8 wt %, about 7 wt % to about 20 wt %, about 7 wt % to about 18 wt %, about 7 wt % to about 16 wt %, about 7 wt % to about 14 wt %, about 7 wt % to about 12 wt %, about 7 wt % to about 10 wt %, about 10 wt % to about 20 wt %, about 10 wt % to about 18 wt %, about 10 wt % to about 16 wt %, about 10 wt % to about 14 wt %, about 10 wt % to about 12 wt %, about 12 wt % to about 20 wt %, about 12 wt % to about 18 wt %, about 12 wt % to about 16 wt %, about 12 wt % to about 14 wt %, about 14 wt % to about 20 wt %, about 14 wt % to about 18 wt %, about 14 wt % to about 16 wt %, about 16 wt % to about 20 wt %, about 16 wt % to about 18 wt %, or about 18 wt % to about 20 wt % $Li_2O$.

As noted above, $Li_2O$ is generally useful for forming various glass-ceramics, but the other alkali oxides tend to decrease glass-ceramic formation and form an aluminosilicate residual glass in the glass-ceramic. It has been found that more than about 5 wt % $Na_2O$ or $K_2O$, or combinations thereof, leads to an undesirable amount of residual glass, which can lead to deformation during crystallization and undesirable microstructures from a mechanical property perspective. The composition of the residual glass may be tailored to control viscosity during crystallization, minimizing deformation or undesirable thermal expansion, or control microstructure properties. Therefore, in general, the glass sheets may be made from glass compositions having low amounts of non-lithium alkali oxides. In some embodiments, the glass or glass-ceramic composition can comprise from about 0 wt % to about 5 wt % $R_2O$, wherein R is one or more of the alkali cations Na and K. In some embodiments, the glass or glass-ceramic composition can comprise from about 1 wt % to about 3 wt % $R_2O$, wherein R is one or more of the alkali cations Na and K. In some embodiments, the glass or glass-ceramic composition can comprise from 0 wt % to about 5 wt %, 0 wt % to about 4 wt %, 0 wt % to about 3 wt %, 0 wt % to about 2 wt %, 0 wt % to about 1 wt %, >0 wt % to about 5 wt %, >0 wt % to about 4 wt %, >0 wt % to about 3 wt %, >0 wt % to about 2 wt %, >0 wt % to about 1 wt %, about 1 wt % to about 5 wt %, about 1 wt % to about 4 wt %, about 1 wt % to about 3 wt %, about 1 wt % to about 2 wt %, about 2 wt % to about 5 wt %, about 2 wt % to about 4 wt %, about 2 wt % to about 3 wt %, about 3 wt % to about 5 wt %, about 3 wt % to about 4 wt %, or about 4 wt % to about 5 wt % $Na_2O$, $K_2O$, or combinations thereof.

The glass and glass-ceramic compositions can include $P_2O_5$. $P_2O_5$ can function as a nucleating agent to produce bulk nucleation. If the concentration of $P_2O_5$ is too low, the precursor glass does crystallize, but only at higher temperatures (due to a lower viscosity) and from the surface inward, yielding a weak and often deformed body. However, if the concentration of $P_2O_5$ is too high, the devitrification, upon cooling during the formation of the glass sheets, can be difficult to control. Embodiments can include from >0 wt % to about 6 wt % $P_2O_5$. Other embodiments can include from about 2 wt % to about 4 wt % $P_2O_5$. Still other embodiments can include from about 1.5 wt % to about 2.5 wt % $P_2O_5$. In some embodiments, the glass or glass-ceramic composition can include from 0 wt % to about 6 wt %, 0 wt % to about 5.5 wt %, 0 wt % to 5 wt %, 0 wt % to about 4.5 wt %, 0 wt % to about 4 wt %, 0 wt % to about 3.5 wt %, 0 wt % to about 3 wt %, 0 wt % to about 2.5 wt %, 0 wt % to about 2 wt %, 0 wt % to about 1.5 wt %, 0 wt % to about 1 wt %, >0 wt % to about 6 wt %, >0 wt % to about 5.5 wt %, >0 wt % to 5 wt %, >0 wt % to about 4.5 wt %, >0 wt % to about 4 wt %, >0 wt % to about 3.5 wt %, >0 wt % to about 3 wt %, >0 wt % to about >2.5 wt %, 0 wt % to about 2 wt %, >0 wt % to about 1.5 wt %, >0 wt % to about 1 wt %, about 0.5 wt % to about 6 wt %, about 0.5 wt % to about 5.5 wt %, about 0.5 wt % to 5 wt %, about 0.5 wt % to about 4.5 wt %, about 0.5 wt % to about 4 wt %, about 0.5 wt % to about 3.5 wt %, about 0.5 wt % to about 3 wt %, about 0.5 wt % to about 2.5 wt %, about 0.5 wt % to about 2 wt %, about 0.5 wt % to about 1.5 wt %, about 0.5 wt % to about 1 wt %, about 1 wt % to about 6 wt %, about 1 wt % to about 5.5 wt %, about 1 wt % to 5 wt %, about 1 wt % to about 4.5 wt %, about 1 wt % to about 4 wt %, about 1 wt % to about 3.5 wt %, about 1 wt % to about 3 wt %, about 1 wt % to about 2.5 wt %, about 1 wt % to about 2 wt %, about 1 wt % to about 1.5 wt %, about 1.5 wt % to about 6 wt %, about 1.5 wt % to about 5.5 wt %, about 1.5 wt % to 5 wt %, about 1.5 wt % to about 4.5 wt %, about 1.5 wt % to about 4 wt %, about 1.5 wt % to about 3.5 wt %, about 1.5 wt % to about 3 wt %, about 1.5 wt % to about 2.5 wt %, about 1.5 wt % to about 2 wt %, about 2 wt % to about 6 wt %, about 2 wt % to about 5.5 wt %, about 2 wt % to 5 wt %, about 2 wt % to about 4.5 wt %, about 2 wt % to about 4 wt %, about 2 wt % to about 3.5 wt %, about 2 wt % to about 3 wt %, about 2 wt % to about 2.5 wt %, about 2.5 wt % to about 6 wt %, about 2.5 wt % to about 5.5 wt %, about 2.5 wt % to 5 wt %, about 2.5 wt % to about 4.5 wt %, about 2.5 wt % to about 4 wt %, about 2.5 wt % to about 3.5 wt %, about 2.5 wt % to about 3 wt %, about 3 wt % to about 6 wt %, about 3 wt % to about 5.5 wt %, about 3 wt % to 5 wt %, about 3 wt % to about 4.5 wt %, about 3 wt % to about 4 wt %, about 3 wt % to about 3.5 wt %, about 3.5 wt % to about 6 wt %, about 3.5 wt % to about 5.5 wt %, about 3.5 wt % to 5 wt %, about 3.5 wt % to about 4.5 wt %, about 3.5 wt % to about 4 wt %, about 4 wt % to about 6 wt %, about 4 wt % to about 5.5 wt %, about 4 wt % to 5 wt %, about 4 wt % to about 4.5 wt %, about 4.5 wt % to about 6 wt %, about 4.5 wt % to about 5.5 wt %, about 4.5 wt % to about 5 wt %, about 5 wt % to about 6 wt %, about 5 wt % to about 5.5 wt %, or about 5.5 wt % to about 6 wt % $P_2O_5$.

In various glass and glass-ceramic compositions, it is generally found that $ZrO_2$ can improve the stability of $Li_2O$—$Al_2O_3$—$SiO_2$—$P_2O_5$ glass by significantly reducing glass devitrification during forming and lowering liquidus temperature. At concentrations above 8 wt %, $ZrSiO_4$ can form a primary liquidus phase at a high temperature, which significantly lowers liquidus viscosity. Transparent glasses can be formed when the glass contains over 2 wt % $ZrO_2$. The addition of $ZrO_2$ can also help decrease the petalite grain size, which aids in the formation of a transparent glass-ceramic. In some embodiments, the glass or glass-ceramic composition can comprise from about 0.2 wt % to about 15 wt % $ZrO_2$. In some embodiments, the glass or glass-ceramic composition can include from about 2 wt % to about 4 wt % $ZrO_2$. In some embodiments, the glass or glass-ceramic composition can comprise from about 0.2 wt % to about 15 wt %, about 0.2 wt % to about 12 wt %, about 0.2 wt % to about 10 wt %, about 0.2 wt % to about 8 wt %, about 0.2 wt % to about 6 wt %, about 0.2 wt % to about 4 wt %, about 0.5 wt % to about 15 wt %, about 0.5 wt % to about 12 wt %, about 0.5 wt % to about 10 wt %, about 0.5 wt % to about 8 wt %, about 0.5 wt % to about 6 wt %, about 0.5 wt % to about 4 wt %, about 1 wt % to about 15 wt %, about 1 wt % to about 12 wt %, about 1 wt % to about 10 wt %, about 1 wt % to about 8 wt %, about 1 wt % to about 6 wt %, about 1 wt % to about 4 wt %, about 2 wt % to about 15 wt %, about 2 wt % to about 12 wt %, about 2 wt % to about 10 wt %, about 2 wt % to about 8 wt %, about 2 wt % to about 6 wt %, about 2 wt % to about 4 wt %, about 3 wt % to about 15 wt %, about 3 wt % to about 12 wt %, about 3 wt % to about 10 wt %, about 3 wt % to about 8 wt %, about 3 wt % to about 6 wt %, about 3 wt % to about 4 wt %, about 4 wt % to about 15 wt %, about 4 wt % to about 12 wt %, about 4 wt % to about 10 wt %, about 4 wt % to about 8 wt %, about 4 wt % to about 6 wt %, about 8 wt % to about 15 wt %, about 8 wt % to about 12 wt %, about 8 wt % to about 10 wt %, about 10 wt % to about 15 wt %, about 10 wt % to about 12 wt %, or about 12 wt % to about 15 wt % $ZrO_2$.

$B_2O_3$ is conducive to providing a glass sheet with a low melting temperature. Furthermore, the addition of $B_2O_3$ in the glass sheet and thus the glass-ceramic article helps achieve an interlocking crystal microstructure and can also improve the damage resistance of the glass-ceramic article. When boron in the residual glass is not charge balanced by alkali oxides or divalent cation oxides, it will be in trigonal-coordination state (or three-coordinated boron), which opens up the structure of the glass. The network around these three coordinated boron is not as rigid as tetrahedrally coordinated (or four-coordinated) boron. Without being bound by theory, it is believed that glass sheets and glass-ceramics that include three-coordinated boron can tolerate some degree of deformation before crack formation. By tolerating some deformation, the Vickers indentation crack initiation values are increased. Fracture toughness of the glass sheets and glass-ceramics that include three-coordinated boron may also be increased. Without being bound by theory, it is believed that the presence of boron in the residual glass of the glass-ceramic (and glass sheet) lowers the viscosity of the residual glass (or glass sheet), which facilitates the growth of lithium silicate crystals, especially large crystals having a high aspect ratio. A greater amount of three-coordinated boron (in relation to four-coordinated boron) is believed to result in glass-ceramics that exhibit a greater Vickers indentation crack imitation load. In some embodiments, the amount of three-coordinated boron (as a percent of total $B_2O_3$) may be about 40% or greater, 50% or greater, 75% or greater, 85% or greater, or even 95% or greater. The amount of boron in general should be controlled to maintain chemical durability and mechanical strength of the cerammed bulk glass-ceramic.

In one or more embodiments, the glass or glass-ceramic composition comprises from 0 wt % to about 10 wt % or from 0 wt % to about 2 wt % $B_2O_3$. In some embodiments, the glass or glass-ceramic composition can comprise from 0 wt % to about 10 wt %, 0 wt % to about 9 wt %, 0 wt % to about 8 wt %, 0 wt % to about 7 wt %, 0 wt % to about 6 wt %, 0 wt % to about 5 wt %, 0 wt % to about 4 wt %, 0 wt % to about 3 wt %, 0 wt % to about 2 wt %, 0 wt % to about 1 wt %, >0 wt % to about 10 wt %, >0 wt % to about 9 wt %, >0 wt % to about 8 wt %, >0 wt % to about 7 wt %, >0 wt % to about 6 wt %, >0 wt % to about 5 wt %, >0 wt % to about 4 wt %, >0 wt % to about 3 wt %, >0 wt % to about 2 wt %, >0 wt % to about 1 wt %, about 1 wt % to about 10 wt %, about 1 wt % to about 8 wt %, about 1 wt % to about 6 wt %, about 1 wt % to about 5 wt %, about 1 wt % to about 4 wt %, about 1 wt % to about 2 wt %, about 2 wt % to about 10 wt %, about 2 wt % to about 8 wt %, about 2 wt % to about 6 wt %, about 2 wt % to about 4 wt %, about 3 wt % to about 10 wt %, about 3 wt % to about 8 wt %, about 3 wt % to about 6 wt %, about 3 wt % to about 4 wt %, about 4 wt % to about 5 wt %, about 5 wt % to about 8 wt %, about 5 wt % to about 7.5 wt %, about 5 wt % to about 6 wt %, or about 5 wt % to about 5.5 wt % $B_2O_3$.

MgO can enter petalite crystals in a partial solid solution. In one or more embodiments, the glass or glass-ceramic composition can comprise from 0 wt % to about 8 wt % MgO. In some embodiments, the glass or glass-ceramic composition can comprise from 0 wt % to about 8 wt %, 0 wt % to about 7 wt %, 0 wt % to about 6 wt %, 0 wt % to about 5 wt %, 0 wt % to about 4 wt %, 0 wt % to about 3 wt %, 0 wt % to about 2 wt %, 0 wt % to about 1 wt %, about 1 wt % to about 8 wt %, about 1 wt % to about 7 wt %, about 1 wt % to about 6 wt %, about 1 wt % to about 5 wt %, about 1 wt % to about 4 wt %, about 1 wt % to about 3 wt %, about 1 wt % to about 2 wt %, about 2 wt % to about 8 wt %, about 2 wt % to about 7 wt %, about 2 wt % to about 6 wt %, about 2 wt % to about 5 wt %, about 2 wt % to about 4 wt %, about 2 wt % to about 3 wt %, about 3 wt % to about 8 wt %, about 3 wt % to about 7 wt %, about 3 wt % to about 6 wt %, about 3 wt % to about 5 wt %, about 3 wt % to about 4 wt %, about 4 wt % to about 8 wt %, about 4 wt % to about 7 wt %, about 4 wt % to about 6 wt %, about 4 wt % to about 5 wt %, about 5 wt % to about 8 wt %, about 5 wt % to about 7 wt %, about 5 wt % to about 6 wt %, about 6 wt % to about 8 wt %, about 6 wt % to about 7 wt %, or about 7 wt % to about 8 wt % MgO.

ZnO can enter petalite crystals in a partial solid solution. In one or more embodiments, the glass or glass-ceramic composition can comprise from 0 wt % to about 10 wt % ZnO. In some embodiments, the glass or glass-ceramic composition can comprise from 0 wt % to about 10 wt %, 0 wt % to about 9 wt %, 0 wt % to about 8 wt %, 0 wt % to about 7 wt %, 0 wt % to about 6 wt %, 0 wt % to about 5 wt %, 0 wt % to about 4 wt %, 0 wt % to about 3 wt %, 0 wt % to about 2 wt %, 0 wt % to about 1 wt %, about 1 wt % to about 10 wt %, about 1 wt % to about 9 wt %, about 1 wt % to about 8 wt %, about 1 wt % to about 7 wt %, about 1 wt % to about 6 wt %, about 1 wt % to about 5 wt %, about 1 wt % to about 4 wt %, about 1 wt % to about 3 wt %, about 1 wt % to about 2 wt %, about 2 wt % to about 10 wt %, about 2 wt % to about 9 wt %, about 2 wt % to about 8 wt %, about 2 wt % to about 7 wt %, about 2 wt % to about 6 wt %, about 2 wt % to about 5 wt %, about 2 wt % to about 4 wt %, about 2 wt % to about 3 wt %, about 3 wt % to about 10 wt %, about 3 wt % to about 9 wt %, about 3 wt % to about 8 wt %, about 3 wt % to about 7 wt %, about 3 wt % to about 6 wt %, about 3 wt % to about 5 wt %, about 3 wt % to about 4 wt %, about 4 wt % to about 10 wt %, about 4 wt % to about 9 wt %, about 4 wt % to about 8 wt %, about 4 wt % to about 7 wt %, about 4 wt % to about 6 wt %, about 4 wt % to about 5 wt %, about 5 wt % to about 10 wt %, about 5 wt % to about 9 wt %, about 5 wt % to about 8 wt %, about 5 wt % to about 7 wt %, about 5 wt % to about 6 wt %, about 6 wt % to about 10 wt %, about 6 wt % to about 9 wt %, about 6 wt % to about 8 wt %, about 6 wt % to about 7 wt %, about 7 wt % to about 10 wt %, about 7 wt % to about 9 wt %, about 7 wt % to about 8 wt %, about 8 wt % to about 10 wt %, about 8 wt % to about 9 wt %, or about 9 wt % to about 10 wt % ZnO.

In various embodiments, the glass or glass-ceramic composition may further include one or more constituents, such as, by way of example and not limitation, $TiO_2$, $CeO_2$, and $SnO_2$. Additionally or alternatively, antimicrobial components may be added to the glass or glass-ceramic composition. Antimicrobial components that may be added to the glass or glass-ceramic may include, but are not limited to, Ag, AgO, Cu, CuO, $Cu_2O$, and the like. In some embodiments, the glass or glass-ceramic composition may further include a chemical fining agent. Such fining agents include, but are not limited to, $SnO_2$, $As_2O_3$, $Sb_2O_3$, F, Cl, and Br. Additional details on glass and/or glass-ceramic compositions suitable for use in various embodiments may be found in, for example, U.S. Patent Application Publication No. 2016/0102010 entitled "High Strength Glass-Ceramics Having Petalite and Lithium Silicate Structures," filed Oct. 8, 2015, which is incorporated by reference herein in its entirety.

Compositions in Mole Percent

In embodiments, the glass or glass ceramic compositions may be expressed in mol % rather than wt % as described above. In such embodiments, the precursor glasses and glass-ceramics described herein may be generically described as lithium-containing aluminosilicate glasses or glass-ceramics and comprise $SiO_2$, $Al_2O_3$, and $Li_2O$. In addition to $SiO_2$, $Al_2O_3$, and $Li_2O$, the glasses and glass-ceramics embodied herein may further contain alkali salts, such as $Na_2O$, $K_2O$, $Rb_2O$, or $Cs_2O$, as well as $P_2O_5$, and $ZrO_2$ and a number of other components as described below. In some embodiments, the precursor glass (before ceramming) and/or the glass-ceramic (after ceramming) may have the following composition in mole percentage on an oxide basis:

$SiO_2$: 60-72%;
$Al_2O_3$: 0-6%;
$Li_2O$: 20-32%;
$B_2O_3$: 0-2%;
$Na_2O$: 0-2%;
$K_2O$: 0-2%;
$P_2O_5$: 0.7-2.2%; and
$ZrO_2$: 1.7-4.5%.

In some embodiments, precursor glass and/or the glass-ceramic may have the following optional additional components in mole percentage on an oxide basis:

$SnO_2$: 0.05-0.5%;
$Fe_2O_3$: 0-0.5%;
MgO: 0-1%;
ZnO: 0-1%;
BaO: 0-1%;
SrO: 0-1%;
$La_2O_3$: 0-1%;
$GeO_2$: 0-1%; and
$Ta_2O_5$: 0-1%.

Exemplary precursor glass and glass-ceramic compositions in mol % on a metal oxide basis, are listed in Table 3 below.

TABLE 3

| Composition | 1 | 2 | 3 | 4 | 5 | 6 | 7 |
|---|---|---|---|---|---|---|---|
| $SiO_2$ (mol %) | 70.52 | 62 | 70.7 | 69.3 | 69.8 | 70.5 | 70.3 |
| $Al_2O_3$ (mol %) | 4.27 | 0 | 4.3 | 4.2 | 4.3 | 4.3 | 4.3 |
| $B_2O_3$ (mol %) | 0 | 0 | 0 | 1.5 | 0 | 0 | 0 |
| $Li_2O$ (mol %) | 22.07 | 31 | 22.1 | 22.1 | 22 | 22 | 22 |
| $Na_2O$ (mol %) | 0.05 | 1.5 | 0 | 0.1 | 0 | 0.2 | 0.5 |
| $K_2O$ (mol %) | 0.09 | 0 | 0 | 0 | 0 | 0 | 0 |
| $P_2O_5$ (mol %) | 0.85 | 2 | 0.9 | 0.8 | 0.9 | 0.9 | 0.9 |
| $ZrO_2$ (mol %) | 1.97 | 3 | 2 | 1.9 | 3 | 2 | 2 |
| $SnO_2$ (mol %) | 0.15 | 0 | 0 | 0 | 0 | 0 | 0 |
| $Fe_2O_3$ (mol %) | 0.02 | 0 | 0 | 0 | 0 | 0 | 0 |
| $Li_2O/R_2O$ | 0.99 | 0.95 | 1.00 | 1.00 | 1.00 | 0.99 | 0.98 |

| Composition | 8 | 9 | 10 | 11 | 12 | 13 |
|---|---|---|---|---|---|---|
| $SiO_2$ (mol %) | 70 | 71.2 | 70.9 | 70.3 | 70.2 | 70.30 |
| $Al_2O_3$ (mol %) | 4.3 | 4.6 | 4.9 | 3.8 | 4.3 | 4.23 |
| $B_2O_3$ (mol %) | 0 | 0 | 0 | 0 | 0 | 0 |
| $Li_2O$ (mol %) | 21.9 | 21.2 | 21.3 | 22 | 21.9 | 21.36 |
| $Na_2O$ (mol %) | 1 | 0 | 0 | 0 | 0 | 1.51 |
| $K_2O$ (mol %) | 0 | 0 | 0 | 0 | 0 | 0 |

TABLE 3-continued

| | | | | | | |
|---|---|---|---|---|---|---|
| $P_2O_5$ (mol %) | 0.9 | 0.9 | 0.9 | 0.9 | 0.9 | 0.87 |
| $ZrO_2$ (mol %) | 2 | 2 | 2 | 3 | 2.7 | 1.66 |
| $SnO_2$ (mol %) | 0 | 0 | 0 | 0 | 0 | 0 |
| $Fe_2O_3$ (mol %) | 0 | 0 | 0 | 0 | 0 | 0 |
| $Li_2O/R_2O$ | 0.96 | 1.00 | 1.00 | 1.00 | 1.00 | 0.93 |

In some embodiments, the glass or glass-ceramic composition comprises from about 60 to about 72 mol % $SiO_2$. In some embodiments, the glass or glass-ceramic composition can comprise from about 60 to about 72 mol %, about 60 to about 70 mol %, about 60 to about 67 mol %, about 60 to about 65 mol %, 65 to about 72 mol %, about 65 to about 70 mol %, about 65 to about 67 mol %, and all ranges and subranges there between $SiO_2$. In some embodiments, the glass or glass-ceramic composition comprises about 60, 61, 62, 63, 64, 65, 66, 67, 68, 69, 70, 71, or 72 mol % $SiO_2$.

In some embodiments, the glass or glass-ceramic composition can comprise from about 0 to about 6 mol % $Al_2O_3$ and all ranges and subranges there between. In some embodiments, the glass or glass-ceramic composition can comprise about 1, 2, 3, 4, 5, or 6 mol % $Al_2O_3$.

In some embodiments, the glass or glass-ceramic composition can comprise from about 20 to about 32 mol %, about 20 to about 30 mol %, about 20 to about 27 mol %, about 20 to about 25 mol %, about 25 to about 32 mol %, about 25 to about 30 mol %, and all ranges and subranges there between $Li_2O$. In some embodiments, the glass or glass-ceramic composition can comprise about 20, 21, 22, 23, 24, 25, 26, 27, 28, 29, 30, 31, or 32 mol % $Li_2O$.

As noted above, $Li_2O$ is generally useful for forming the embodied glass-ceramics, but the other alkali oxides tend to decrease glass-ceramic formation and form an aluminosilicate residual glass in the glass-ceramic. It has been found that more if the amount of other alkali metal oxides, such as $Na_2O$, $K_2O$, $Rb_2O$, $Cs_2O$, is too high there can be an undesirable amount of residual glass which can lead to deformation during crystallization and undesirable microstructures from a mechanical property perspective. The composition of the residual glass may be tailored to control viscosity during crystallization, minimizing deformation or undesirable thermal expansion, or control microstructure properties. Therefore, in general, the compositions described herein have low amounts of non-lithium alkali oxides. In some embodiments, the glass or glass-ceramic composition can comprise a ratio of $Li_2O$ (mol %)/$R_2O$ (mol %) greater than about 0.85 to 1.0, from greater than 0.85 to 0.97, from greater than 0.85 to 0.95, from 0.86 to 1.0, from 0.86 to 0.97, from 0.86 to 0.95, from 0.87 to 1.0, from 0.87 to 0.97, from 0.87 to 0.95, from 0.88 to 1.0, from 0.88 to 0.97, from 0.88 to 0.95, from 0.89 to 1.0, from 0.89 to 0.97, from 0.89 to 0.95, from 0.9 to 1.0, from 0.9 to 0.97, from 0.9 to 0.95, from 0.91 to 1.0, from 0.91 to 0.97, from 0.91 to 0.95, from 0.92 to 1.0, from 0.92 to 0.97, from 0.93 to 1.0, from 0.93 to 0.97, from 0.94 to 1.0, from 0.95 to 1.0, from 0.96 to 1.0, from 0.97 to 1.0 and all ranges and subranges there between. $R_2O$ is the sum of all alkali metal oxides including $Li_2O$, $Na_2O$, $K_2O$, $Rb_2O$, and $Cs_2O$. In some embodiments the glass or glass-ceramic composition can comprise a ratio of $Li_2O$ (mol %)/$R_2O$ (mol %) greater than or equal to about 0.85, 0.86, 0.87, 0.88, 0.89, 0.9, 0.91, 0.92, 0.93, 0.94, 0.95, 0.96, 0.97, 0.98, or 0.99.

The glass and glass-ceramic compositions can include $P_2O_5$. $P_2O_5$ can function as a nucleating agent to produce bulk nucleation. If the concentration of $P_2O_5$ is too low, the precursor glass does crystallize, but only at higher temperatures (due to a lower viscosity) and from the surface inward, yielding a weak and often deformed body; however, if the concentration of $P_2O_5$ is too high, the devitrification, upon cooling during precursor glass forming, can be difficult to control. Embodied compositions can comprise from 0.7 to about 2.2 mol %, 0.7 to about 2 mol %, 0.7 to about 1.5 mol %, 0.7 to about 1 mol %, about 1 to about 2.2 mol %, about 1 to about 2 mol %, about 1.5 to about 2.2 mol %, and all ranges and subranges there between $P_2O_5$. In some embodiments, the glass or glass-ceramic composition can comprise about 0.7, 0.8, 0.9, 1.0, 1.1, 1.2, 1.3, 1.4, 1.5, 1.6, 1.7, 1.8, 1.9, 2.0, 2.1, or 2.2 mol % $P_2O_5$.

In the glass and glass-ceramics herein, it is generally found that $ZrO_2$ can improve the stability of $Li_2O$—$Al_2O_3$—$SiO_2$—$P_2O_5$ glass by significantly reducing glass devitrification during forming and lowering liquidus temperature. The addition of $ZrO_2$ can also help decrease the grain size of the crystals, which aids in the formation of a transparent glass-ceramic. In some embodiments, the glass or glass-ceramic composition can comprise from about 1.7 to about 4.5 mol %, about 1.7 to about 4 mol %, about 1.7 to about 3.5 mol %, about 1.7 to about 3 mol %, about 1.7 to 2.5 mol %, about 2 to about 4.5 mol %, 2 to about 4 mol %, about 2 to about 3.5 mol %, about 2 to about 3 mol %, about 2.5 to about 4.5 mol %, about 2.5 to 4 mol %, about 2.5 to about 3.5 mol %, and all ranges and subranges there between $ZrO_2$. In some embodiments, the glass or glass-ceramic composition can comprise about 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, or 4.5 mol % $ZrO_2$.

$B_2O_3$ is conducive to providing a precursor glass with a low melting temperature. Furthermore, the addition of $B_2O_3$ in the precursor glass and thus the glass-ceramics helps achieve an interlocking crystal microstructure and can also improve the damage resistance of the glass-ceramic. When boron in the residual glass is not charge balanced by alkali oxides or divalent cation oxides, it will be in trigonal-coordination state (or three-coordinated boron), which opens up the structure of the glass. The network around these three-coordinated boron is not as rigid as tetrahedrally coordinated (or four-coordinated) boron. Without being bound by theory, it is believed that precursor glasses and glass-ceramics that include three-coordinated boron can tolerate some degree of deformation before crack formation. By tolerating some deformation, the Vickers indentation crack initiation values are increased. Fracture toughness of the precursor glasses and glass-ceramics that include three-coordinated boron may also be increased. Without being bound by theory, it is believed that the presence of boron in the residual glass of the glass-ceramic (and precursor glass) lowers the viscosity of the residual glass (or precursor glass), which facilitates the growth of lithium silicate crystals, especially large crystals having a high aspect ratio. A greater amount of three-coordinated boron (in relation to four-coordinated boron) is believed to result in glass-ceramics that exhibit a greater Vickers indentation crack initiation load. In some embodiments, the amount of three-coordinated boron (as a percent of total $B_2O_3$) may be about 40% or greater, 50% or greater, 75% or greater, about 85% or greater or even about 95% or greater. The amount of boron in general should be controlled to maintain chemical durability and mechanical strength of the cerammed bulk glass-ceramic.

In one or more embodiments, the glasses and glass-ceramic herein can comprise from 0 to about 2 mol % and all ranges and subranges there between. In some embodiments, the glass or glass-ceramic composition can comprise about 0, >0, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, or 2 mol % $B_2O_3$.

In one or more embodiments, the glasses and glass-ceramics herein can comprise from 0 to about 0.5 mol % $SnO_2$. In some embodiments, the glass or glass-ceramic composition can comprise from 0 to about 0.5 mol %, 0 to about 0.4 mol %, 0 to about 0.3 mol %, 0 to about 0.2 mol %, 0 to about 0.1 mol %, about 0.05 to about 0.5 mol %, 0.05 to about 0.4 mol %, 0.05 to about 0.3 mol %, 0.05 to about 0.2 mol %, 0.05 to about 0.1 mol %, about 0.1 to about 0.5 mol %, about 0.1 to about 0.4 mol %, about 0.1 to about 0.3 mol %, about 0.1 to about 0.2 mol %, about 0.2 to about 0.5 mol %, about 0.2 to about 0.4 mol %, about 0.2 to about 0.3 mol %, about 0.3 to about 0.5 mol %, about 0.3 to about 0.4 mol %, about 0.4 to about 0.5 mol %, and all ranges and subranges there between $SnO_2$. In some embodiments, the glass or glass-ceramic composition can comprise about 0, >0, 0.05, 0.1, 0.2, 0.3, 0.4, or 0.5 mol % $SnO_2$.

When the amount of transmission metal oxides, for example $Fe_2O_3$, are too high they can affect the color of the glass-ceramic and thereby affect the transparency of the glass-ceramic. In some embodiments, the glass and/or glass-ceramic composition can comprise less than 0.5 mol %, 0.4 mol %, 0.3 mol %, 0.2 mol %, 0.1 mol %, or 0.05 mol % $Fe_2O_3$.

In various embodiments, the glass compositions can be manufactured into sheets via processes, including but not limited to, slot draw, float, rolling, and other sheet-forming processes known to those skilled in the art. It should also be understood that the compositions disclosed herein—whether in wt % or mol %—are on an oxide basis of the precursor glass or glass ceramic compositions before the ceramming process, unless explicitly states otherwise.

Heating Conditions for Forming Glass Ceramic Articles

In one or more embodiments, the processes for making glass-ceramic includes heat treating the precursor glasses at one or more preselected temperatures for one or more preselected times to induce glass homogenization and crystallization (i.e., nucleation and growth) of one or more crystalline phases (e.g., having one or more compositions, amounts, morphologies, sizes or size distributions, etc.). In some embodiments, the heat treatment may include (i) heating precursor glasses at a rate of 0.01-50° C./min to a nucleation temperature (Tn); (ii) maintaining the crystallizable glasses at the nucleation temperature for first predetermined period of time ($t_N$) to produce a nucleated crystallizable glass compositions; (iii) heating the nucleated crystallizable glasses at a rate in the range from about 0.01° C./min to about 50° C./min to a crystallization temperature (Tc); (iv) maintaining the nucleated crystallizable glasses at the crystallization temperature for a second predetermined period of time ($t_C$) to produce the glass-ceramic articles described herein; and (v) cooling the formed glass-ceramic to room temperature. The terms "ceram" or "ceramming", in the preceding embodiments, may be used to refer to steps (iii), (iv) and optionally (v), collectively. In some embodiments, the nucleation temperature can be in a range from 500° C. to 650° C. (for example, 500° C., 510° C., 520° C., 530° C., 540° C., 550° C., 560° C., 570° C., 580° C., 590° C., 600° C., 610° C., 620° C., 630° C., 640° C., or 650° C.) and all ranges and subranges there between; and/or the crystallization temperature can be in a range from 680° C. to 800° C. (for example, 680° C., 690° C., 700° C., 710° C., 720° C., 730° C., 740° C., 750° C., 760° C., 770° C., 780° C., 790° C., or 800° C.) and all ranges and subranges there between. In some embodiments, the first predetermined time for maintaining the nucleation temperature can be in a range from 1 minute to 6 hours (for example 1 minute, 5 minutes, 10 minutes, 20 minutes, 30 minutes, 40 minutes, 50 minutes, 1 hour, 1.5 hours, 2 hours, 2.5 hours, 3 hours, 3.5 hours, 4 hours, 4.5 hours, 5 hours, 5.5 hours, or 6 hours) and all ranges and subranges there between. In some embodiments, the second predetermined time for maintaining the crystallization temperature can be in a range from 1 minute to 4 hours (for example 1 minute, 5 minutes, 10 minutes, 20 minutes, 30 minutes, 40 minutes, 50 minutes, 1 hour, 1.5 hours, 2 hours, 2.5 hours, 3 hours, 3.5 hours, or 4 hours) and all ranges and subranges there between. In some embodiments, the crystallization temperature depends on whether a transparent or translucent/opaque glass-ceramic is desired. In some embodiments, a crystallization temperature of about 750° C. or below will result in a transparent glass-ceramic and a crystallization temperature above about 750° C. will result in a translucent/opaque glass-ceramic. In some embodiments, the glass can be heated from room temperature to a nucleation temperature of 570° C. at a rate of 5° C./min, maintained at the nucleation temperature for 4 hours, then heated to the crystallization temperature of 740° C. at a rate of 5° C./min, and maintained at the crystallization temperature for 1 hour.

In some embodiments, there may be one of more additional temperature holds between the nucleation temperature and the crystallization temperature. Thus, in some embodiments, after maintaining the article at the nucleation temperature, the article may be heated to one or more intermediate temperatures (wherein the intermediate temperatures are in a range between the nucleation temperature and the crystallization temperature) and held at the one or more intermediate temperatures for a predetermined time (for example, between 1 hour and 4 hours and all ranges and subranges there between) and then heated to the crystallization temperature. Example 5 below demonstrates exemplary 3-step heat treatment cycles with an intermediate temperature hold.

In some embodiments, once the composition is heated to the nucleation temperature, the composition is not maintained at the nucleation temperature but instead is continuously heated to one or more intermediate temperatures until the crystallization temperature is reached (i.e., the temperature is not maintained at any of the intermediate temperatures or the nucleation temperature). In some embodiments, the heating rate from room temperature to the nucleation temperature, the heating rate from the nucleation temperature to the intermediate temperature, the heating rate from the intermediate temperature to the crystallization temperature vary. In embodiments where there are multiple intermediate temperatures, the heating rate between the individual intermediate temperatures may also vary. Example 6 below demonstrates such exemplary heat treatment schedules. In some embodiments, the heating rates may vary and may be in a range from about 0.01° C./min to about 50° C./min, about 0.01° C./min, about 0.1° C./min, about 0.5° C./min, about 1° C./min, about 2° C./min, about 3° C./min, about 4° C./min, about 5° C./min, about 10° C./min, about 15° C./min, about 20° C./min, about 25° C./min, about 30° C./min, about 40° C./min, about 45° C./min, about 50° C./min, and all ranges and subranges there between. In some embodiments, the heating rate may increase from one heating rate to another heating rate. In other embodiments, the heating rate may decrease from one heating rate to another heating rate.

In some embodiments, the glass-ceramic article is cooled after being held at the crystallization temperature. In some embodiments, the glass-ceramic article may be cool to room temperature in a single stage at a constant cooling rate, in two stages each with a different cooling rate, or in three or more stages each with a different cooling rate. In some embodiments, the glass-ceramic articles are cooled at a controlled rate from the crystallization temperature in order to minimize temperature gradients across the articles as well as minimize residual stress across the articles. Temperature gradients and differences in residual stress may lead to the articles warping during cooling. Thus, controlling the cooling to control the temperature gradients and residuals stresses may also minimize warpage of the glass-ceramic articles.

Figure 32:
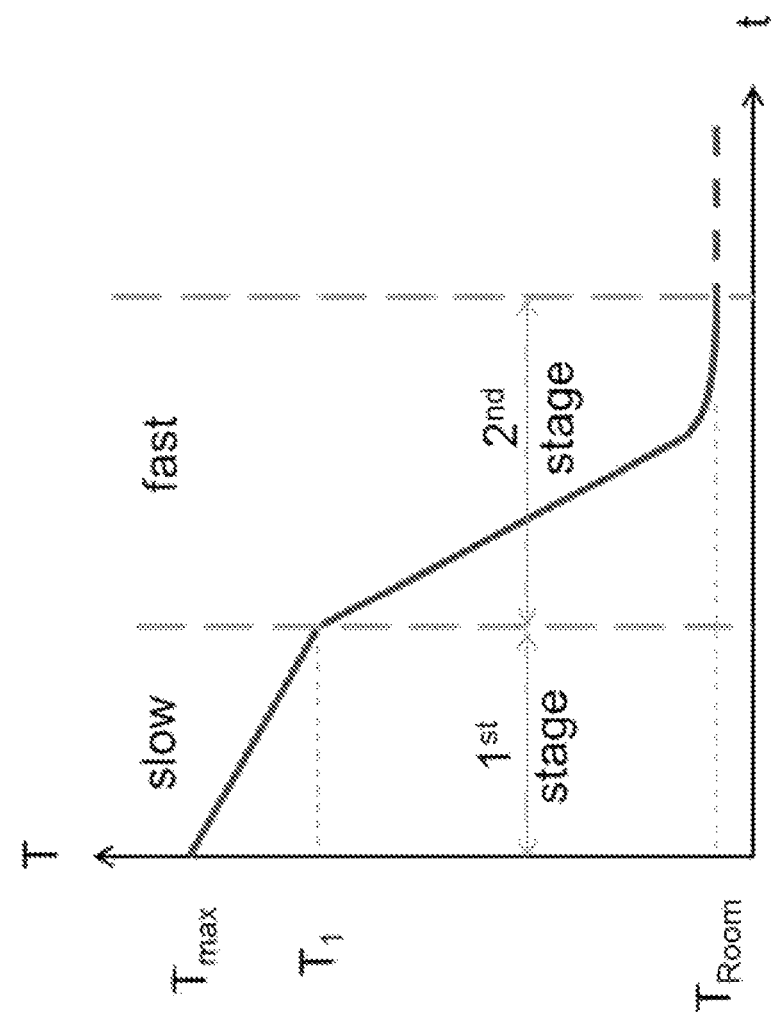
FIG. 32 is an exemplary diagram of a cooling cycle according to embodiments disclosed and described herein.

In some embodiments, as shown for example in FIG. 32, cooling may occur in two cooling stages. In such embodiments, in the first cooling stage, the temperature cools from $T_{max}$ (i.e., $T_C$—the crystallization temperature) to $T_1$ at a first cooling rate. In the second cooling stage, the temperature cools from $T_1$ to about room temperature ($T_{Room}$) at a second cooling rate. As shown in FIG. 32, the first cooling rate is slower than the second cooling rate. The first cooling rate during the first stage is slow to minimize the temperature gradient across the glass-ceramic article. In some embodiments, the temperature $T_1$ where the transition from the first cooling stage to the second cooling stage occurs is determined based on the temperature below which the glass-ceramic article behaves as an elastic material. Without be bound by theory, it is believed that the slower cooling rate of the first cooling stage is only needed to control the temperature gradients until the glass-ceramic article reaches the temperature below which it behaves as an elastic material. In some embodiments, temperature $T_1$ may be in a range from 450° C. to 550° C. and all ranges and subranges there between. In some embodiments, temperature $T_1$ may be less than or equal to 550° C., 540° C., 530° C., 520° C., 510° C., 500° C., 490° C., 480° C., 470° C., 460° C., or 450° C. In some embodiments, the temperature drop in the first cooling stage ($T_{max}-T_1$) is less than the temperature drop in the second cooling stage ($T_1-T_{Room}$). Without be bound by theory, it is believed that temperature gradients that develop in the first cooling stage have a greater effect on the residual stresses (and therefore warp) in the glass-ceramic article upon reaching room temperature (in the form of optical retardance) than temperature gradients that develop in the second cooling stage. Thus, in some embodiments, after controlled cooling in the first cooling stage, the glass-ceramic article may be allowed to cool to room temperature in an uncontrolled cooling environment.

Figure 33:
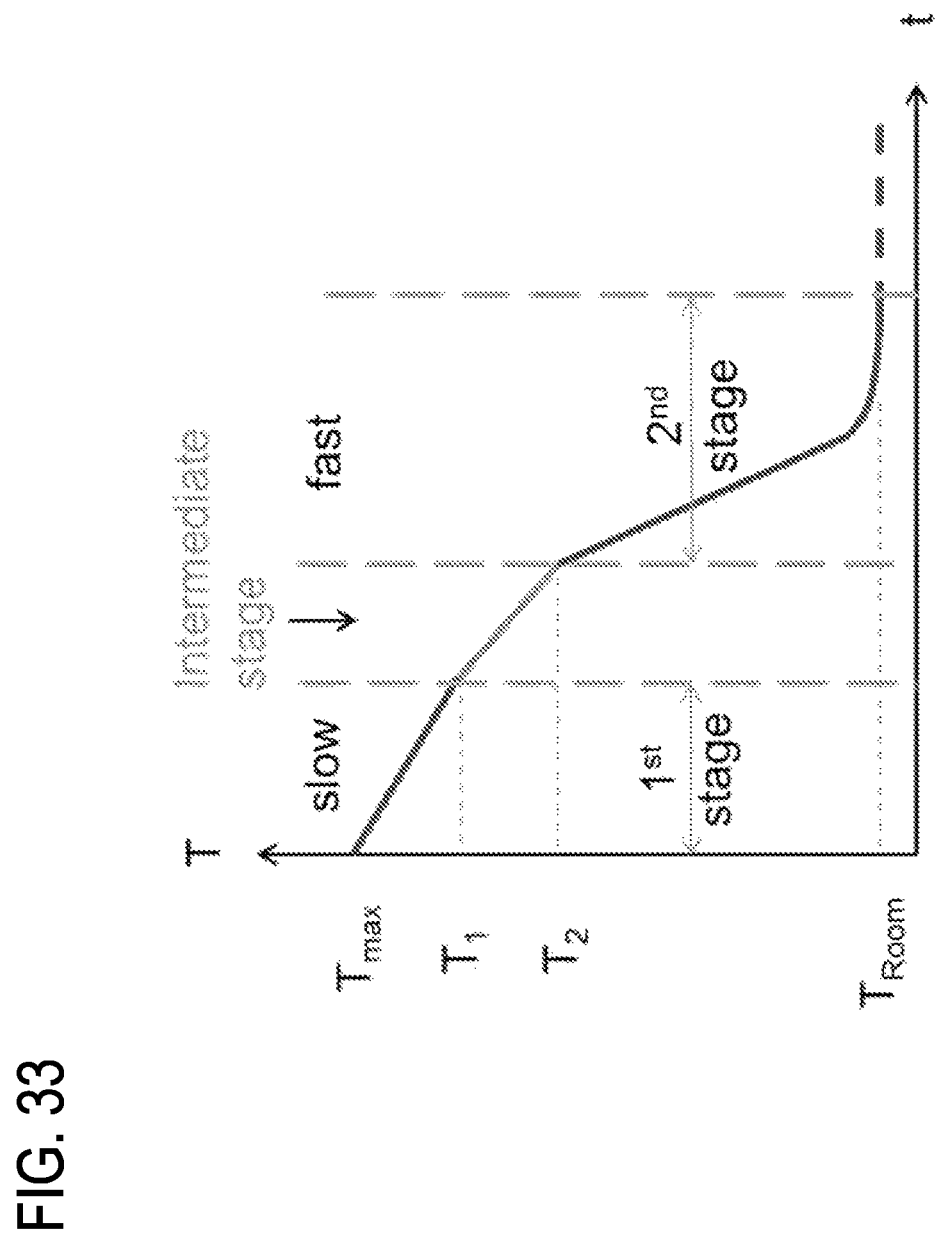
FIG. 33 is an exemplary diagram of another cooling cycle according to embodiments disclosed and described herein.
Figure 34:
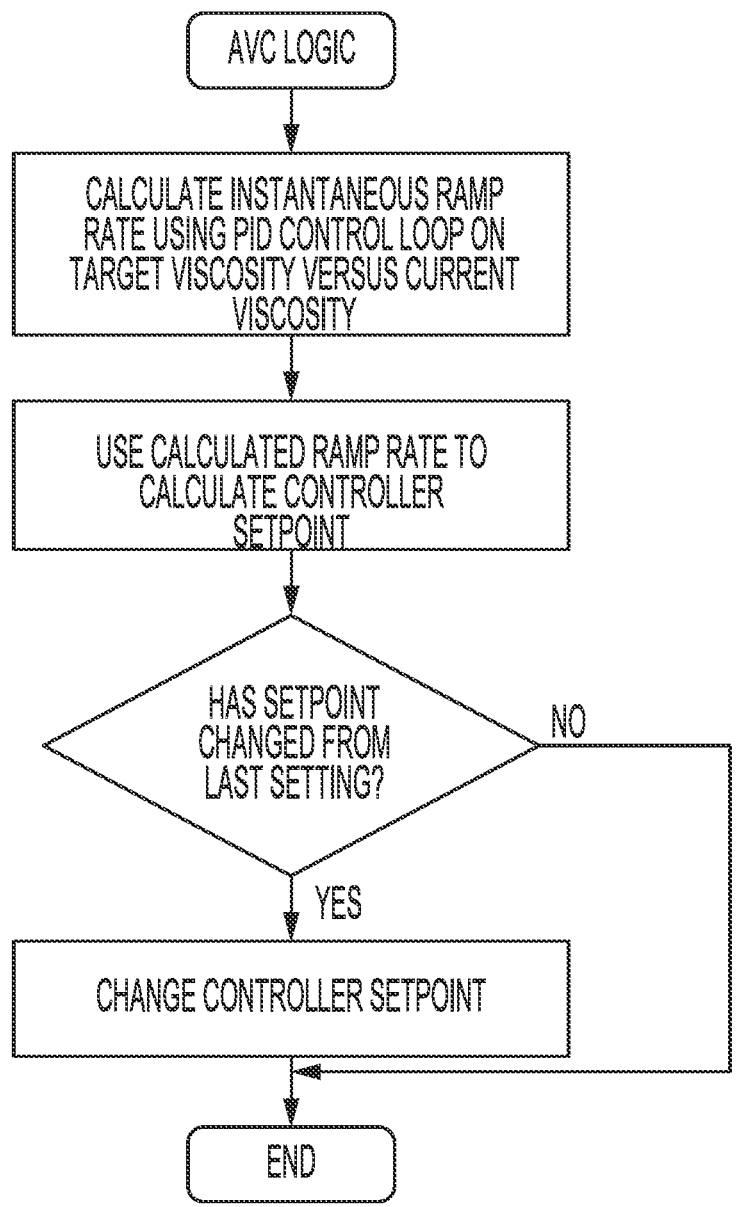
FIG. 34 is a flow chart of proportional-integral-derivative (PID) logic used in the automatic viscosity control (AVC) nucleation phase of a ceram cycle according to embodiments disclosed and described herein.

In some embodiments, as shown for example in FIG. 33, the cooling cycle may have an intermediate cooling stage in between the first cooling stage and the second cooling stage for a total of three cooling stages. In such embodiments, in the first cooling stage, the temperature cools from $T_{max}$ (i.e., $T_C$—the crystallization temperature) to $T_1$ at a first cooling rate. In the intermediate cooling stage, the temperature cools from $T_1$ to $T_2$ at a second cooling rate. In the second stage, the temperature cools from $T_2$ to about room temperature ($T_{Room}$) at a third cooling rate. As shown in FIG. 34, the cooling rate increases with each stage such that (i) the first cooling rate during the first cooling stage is less than the second cooling rate during the intermediate cooling stage and the third cooling rate during the second cooling stage and (ii) the second cooling rate during the intermediate cooling stage is less than the third cooling rate during the second cooling stage. In some embodiments, (i) the temperature drop in the first cooling stage ($T_{max}-T_1$) is less than the temperature drop in the intermediate cooling stage ($T_1-T_2$) and the temperature drop in the second cooling stage ($T_2-T_{Room}$) and (ii) the temperature drop in the intermediate cooling stage ($T_1-T_2$) is less than the temperature drop in the second cooling stage ($T_2-T_{Room}$). The intermediate cooling stages allows for a faster cooling cycle while still minimizing temperature gradients and residual stress. In some embodiments, $T_{max}$ may be about 740° C., $T_1$ may be about 640° C., and $T_2$ may be about 580° C.

In some embodiments, when having multiple cooling stages in the cooling cycle, the temperature gradients across the glass-ceramic article during the first cooling stage may be less than 15° C., less than 14° C., less than 13° C., less than 12° C., less than 11° C., less than 10° C., less than 9° C., less than 8° C., less than 7° C., less than 6° C., less than 5° C., less than 4° C., or less than 3° C. and/or the optical retardance at room temperature of the less than 15 nm/mm of thickness, less than 14 nm/mm of thickness, less than 13 nm/mm of thickness, less than 12 nm/mm of thickness, less than 11 nm/mm of thickness, less than 10 nm/mm of thickness, less than 9 nm/mm of thickness, less than 8 nm/mm of thickness, less than 7 nm/mm of thickness, less than 6 nm/mm of thickness, less than 5 nm/mm of thickness, less than 4 nm/mm of thickness, or less than 3 nm/mm of thickness. The optical retardation may be measured according to ASTM F218-13.

Upon performing the above heat treatments to the precursor glass, the resultant glass-ceramic has one or more crystalline phases and a residual glass phase. In some embodiments, the glass-ceramic contains the following exemplary crystalline phases: lithium disilicate, petalite, β-spodumene solid solution, β-quartz solid solution, lithium metasilicate, virgilite, cristobalite, lithium phosphate, baddeleyite and zirconia and any combinations thereof.

In some embodiments, lithium disilicate is the crystalline phase with the highest weight percentage. Lithium disilicate, $Li_2Si_2O_5$, is an orthorhombic crystal based on corrugated sheets of $\{Si_2O_5\}$ tetrahedral arrays. The crystals are typically tabular or lath-like in shape, with pronounced cleavage planes. Glass-ceramics based on lithium disilicate offer highly desirable mechanical properties, including high body strength and fracture toughness, due to their microstructures of randomly-oriented interlocked crystals—a crystal structure that forces cracks to propagate through the material via tortuous paths around these crystals. In some embodiments, the weight percentage of the lithium disilicate crystalline phase in the glass-ceramic compositions can be in a range from about 20 to about 60 wt %, about 20 to about 55 wt %, about 20 to about 50 wt %, about 20 to about 45 wt %, about 20 to about 40 wt %, about 20 to about 35 wt %, about 20 to about 30 wt %, about 20 to about 25 wt %, about 25 to about 60 wt %, about 25 to about 55 wt %, about 25 to about 50 wt %, about 25 to about 45 wt %, about 25 to about 40 wt %, about 25 to about 35 wt %, about 25 to about 30 wt %, about 30 to about 60 wt %, about 30 to about 55 wt %, about 30 to about 50 wt %, about 30 to about 45 wt %, about 30 to about 40 wt %, about 30 to about 35 wt %, about 35 to about 60 wt %, about 35 to about 55 wt %, about 35 to about 50 wt %, about 35 to about 45 wt %, about 35 to about 40 wt %, about 40 to about 60 wt %, about 40 to about 55 wt %, about 40 to about 50 wt %, about 40 to about 45 wt %, about 45 to about 60 wt %, about 45 to about 55 wt %, about 45 to about 50 wt %, about 50 to about 60 wt %, about 50 to about 55 wt %, or about 55 to about 60 wt %. In some embodiments, the glass-ceramic has 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt % lithium disilicate crystalline phase.

In some embodiments, petalite is the crystalline phase with the highest weight percentage. Petalite, $LiAlSi_4O_{10}$, is a monoclinic crystal possessing a three-dimensional framework structure with a layered structure having folded $Si_2O_5$ layers linked by Li and Al tetrahedral. The Li is in tetrahedral coordination with oxygen. The mineral petalite is a lithium source and is used as a low thermal expansion phase to improve the thermal downshock resistance of glass-ceramic or ceramic parts. Moreover, glass-ceramic articles based on the petalite phase can be chemically strengthened in a salt bath, during which $Na^+$ (and/or $K^+$) replaces $Li^+$ in the petalite structure, which causes surface compression and strengthening. In some embodiments, the weight percentage of the petalite crystalline phase in the glass-ceramic compositions can be in a range from about 20 to about 70 wt %, about 20 to about 65 wt %, about 20 to about 60 wt %, about 20 to about 55 wt %, about 20 to about 50 wt %, about 20 to about 45 wt %, about 20 to about 40 wt %, about 20 to about 35 wt %, about 20 to about 30 wt %, about 20 to about 25 wt %, about 25 to about 70 wt %, about 25 to about 65 wt %, about 25 to about 60 wt %, about 25 to about 55 wt %, about 25 to about 50 wt %, about 25 to about 45 wt %, about 25 to about 40 wt %, about 25 to about 35 wt %, about 25 to about 30 wt %, about 30 to about 70 wt %, about 30 to about 65 wt %, about 30 to about 60 wt %, about 30 to about 55 wt %, about 30 to about 50 wt %, about 30 to about 45 wt %, about 30 to about 40 wt %, about 30 to about 35 wt %, about 35 to about 70 wt %, about 35 to about 65 wt %, about 35 to about 60 wt %, about 35 to about 55 wt %, about 35 to about 50 wt %, about 35 to about 45 wt %, about 35 to about 40 wt %, about 40 to about 70 wt %, about 40 to about 65 wt %, about 40 to about 60 wt %, about 40 to about 55 wt %, about 40 to about 50 wt %, about 40 to about 45 wt %, about 45 to about 70 wt %, about 45 to about 65 wt %, about 45 to about 60 wt %, about 45 to about 55 wt %, about 45 to about 50 wt %, about 50 to about 70 wt %, about 50 to about 65 wt %, about 50 to about 60 wt %, about 50 to about 55 wt %, about 55 to about 70 wt %, about 55 to about 65 wt %, about 55 to about 60 wt %, about 60 to about 70 wt %, about 60 to about 65 wt %, or about 65 to about 70 wt %. In some embodiments, the glass-ceramic has about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt % petalite crystalline phase.

Accordingly, in embodiments, the glass ceramics may comprise a combined weight percent of lithium disilicate and petalite crystalline phase that is greater than or equal to 40 wt %, such as greater than or equal to 42 wt %, greater than or equal to 44 wt %, greater than or equal to 46 wt %, greater than or equal to 48 wt %, greater than or equal to 50 wt %, greater than or equal to 52 wt %, greater than or equal to 54 wt %, greater than or equal to 56 wt %, greater than or equal to 58 wt %, greater than or equal to 60 wt %, greater than or equal to 62 wt %, greater than or equal to 64 wt %, greater than or equal to 66 wt %, greater than or equal to 68 wt %, greater than or equal to 70 wt %, greater than or equal to 72 wt %, greater than or equal to 74 wt %, greater than or equal to 76 wt %, greater than or equal to 78 wt %, greater than or equal to 80 wt %, greater than or equal to 82 wt %, greater than or equal to 84 wt %, or greater than or equal to 85 wt %. In some embodiments, the crystalline phases other than lithium disilicate and petalite have a total wt % in the glass-ceramic article of less than 5 wt %, less than 4 wt %, less than 3 wt %, less than 2 wt %, or less than 1 wt %.

In embodiments, the glass ceramic may comprise lithium phosphate as a third crystalline phase. In embodiments, at least 80% of the phosphate present in the glass ceramic is present as lithium phosphate, such as at least 85%, at least 90%, or at least 95%. The Raman peak height ratio of petalite to lithium phosphate is, in embodiments, from 1.1 to 1.3, and the Raman peak height ration of lithium disilicate to lithium phosphate is from 1.0 to 1.2.

In some embodiments, the glass-ceramic has a residual glass content of about 5 to about 30 wt %, about 5 to about 25 wt %, about 5 to about 20 wt %, about 5 to about 15 wt % about 5 to about 10 wt %, about 10 to about 50 wt %, about 10 to about 45 wt %, about 10 to about 40 wt %, about 10 to about 35 wt %, about 10 to about 30 wt %, about 10 to about 25 wt %, about 10 to about 20 wt %, about 10 to about 15 wt %, about 15 to about 50 wt %, about 15 to about 45 wt %, about 15 to about 40 wt %, about 15 to about 35 wt %, about 15 to about 30 wt %, about 15 to about 25 wt %, about 15 to about 20 wt %, about 20 to about 50 wt %, about 20 to about 45 wt %, about 20 to about 40 wt %, about 20 to about 35 wt %, about 20 to about 30 wt % about 20 to about 25 wt %, about 25 to about 30 wt %, and all ranges and subranges there between. In some embodiments the residual glass content can be less than or equal to 30, 25, 20, 19, 18, 17, 16, 15, 14, 13, 12, 11, 10, 9, 8, 7, 6, 5, 4, 3, 2, or 1 wt %.

In some embodiments, the glass-ceramic may have a weight percentage of crystals in a range from greater than 20 wt % to 100 wt %, greater than 20 wt % to 90 wt %, greater than 20 wt % to 80 wt %, greater than 20 wt % to 70 wt %, 30 wt % to 100 wt %, 30 wt % to 90 wt %, 30 wt % to 80 wt %, 30 wt % to 70 wt %, 40 wt % to 100 wt %, 40 wt % to 90 wt %, 40 wt % to 80 wt %, 40 wt % to 70 wt %, 50 wt % to 100 wt %, 50 wt % to 90 wt %, 50 wt % to 80 wt %, 50 wt % to 70 wt %, and all ranges and subranges there between. In some embodiments, the inner region may have a weight percentage of crystals greater than 20 wt %, 25 wt %, 30 wt %, 35 wt %, 40 wt %, 45 wt %, 50 wt %, 55 wt %, 60 wt %, 65 wt %, 70 wt %, 75 wt %, 80 wt %, 85 wt %, or 90 wt %.

The grain size of the crystals in the crystalline phases is a factor that affects the transparency of the glass-ceramic. In some embodiments, the grains have a longest dimension in a range from about 5 nm to about 150 nm, about 5 nm to about 125 nm, about 5 nm to about 100 nm, about 5 nm to about 75 nm, about 5 nm to about 50 nm, about 25 nm to about 150 nm, about 25 nm to about 125 nm, about 25 nm to about 100 nm, about 25 nm to about 75 nm, about 50 nm to about 150 nm, about 50 nm to about 125 nm, about 50 nm to about 100 nm, and all ranges and subranges there between. In some embodiments, the longest dimension of the grains is less than 150 nm, less than 125 nm, less than 100 nm, less than 75 nm, less than 50 nm, or less than 25 nm. The longest dimension of the grains is measured using a scanning electron microscope (SEM).

In some embodiments, the phase assemblage and heat treatment conditions are chosen to create a glass-ceramic article with suitable optical properties, such as transparency and low haze, for use as a cover glass for a mobile electronic device. In some embodiments, the glass-ceramic article is transparent in that it has an average transmittance of 85% or greater, 86% or greater, 87% or greater, 88% or greater, 89% or greater, 90% or greater, 91% or greater, 92% or greater, 93% or greater (including surface reflection losses) of light over the wavelength range from 450 nm to 600 nm for a glass-ceramic article having a thickness of 1 mm. In other embodiments, glass-ceramic may be translucent over the wavelength range from 450 nm to 600 nm. In some embodiments a translucent glass-ceramic can have an average transmittance in a range from about 20% to less than about 85% of light over the wavelength range of about 450 nm to about 800 nm for a glass-ceramic article having a thickness of 1 mm. In some embodiments, the glass-ceramic article has a haze of less than 0.2, 0.19, 0.18, 0.17, 0.16, 0.15, 0.14, 0.13, 0.12, 0.11, or 0.1.

Equation (2) below estimates the haze of a glass-ceramic article based on the nucleation temperature (TN), the nucleation hold time (tN), the crystallization temperature (TC), and the crystallization hold time (tC).

$$\text{Estimated haze} = 103 - 0.260T_N + 0.000203(T_N)^2 - 7.96t_N + 0.1532(t_N)^2 - 0.019T_C - 0.000008(T_C)^2 - 10.03t_C + 0.00597T_N{}^*t_N + 0.00463t_N{}^*T_C + 0.01342T_C{}^*t_C \quad (2)$$

In some embodiments, the nucleation temperature (TN), the nucleation hold time (tN), the crystallization temperature (TC), and the crystallization hold time (tC) for the heat treatment cycle can be selected based on the estimated haze provide by Equation (2) to have an estimated haze of less than 0.2, 0.19, 0.18, 0.17, 0.16, 0.15, 0.14, 0.13, 0.12, 0.11, or 0.1. In some embodiments, the heat treatment may include (i) heating precursor glasses at a rate of 0.01-50° C./min to a nucleation temperature (Tn); (ii) maintaining the crystallizable glasses at the nucleation temperature for first predetermined period of time ($t_N$) to produce a nucleated crystallizable glass compositions; (iii) heating the nucleated crystallizable glasses at a rate in the range from about 0.01° C./min to about 50° C./min to a crystallization temperature (Tc); (iv) maintaining the nucleated crystallizable glasses at the crystallization temperature for a second predetermined period of time ($t_C$) to produce the glass-ceramic articles described herein; and (v) cooling the formed glass-ceramic to room temperature, such that the value of Equation (2) is less than 0.2, 0.19, 0.18, 0.17, 0.16, 0.15, 0.14, 0.13, 0.12, 0.11, or 0.1.

Methods for Determining Ceramming Cycles

Figure 35A:
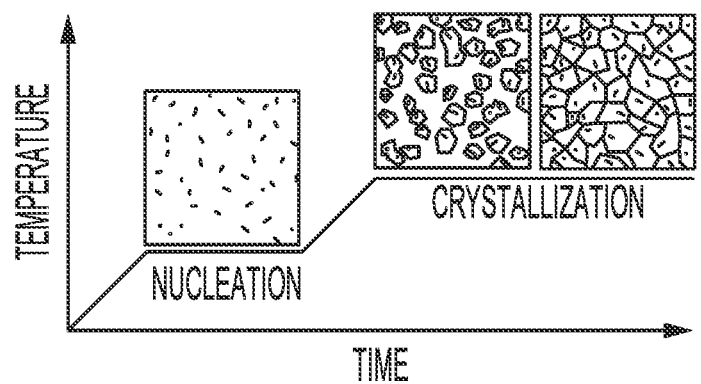
FIG. 35A graphically depicts temperature versus time measurements and nucleation and crystallization (growth) of a ceram cycle according to embodiments disclosed and described herein.
Figure 35B:
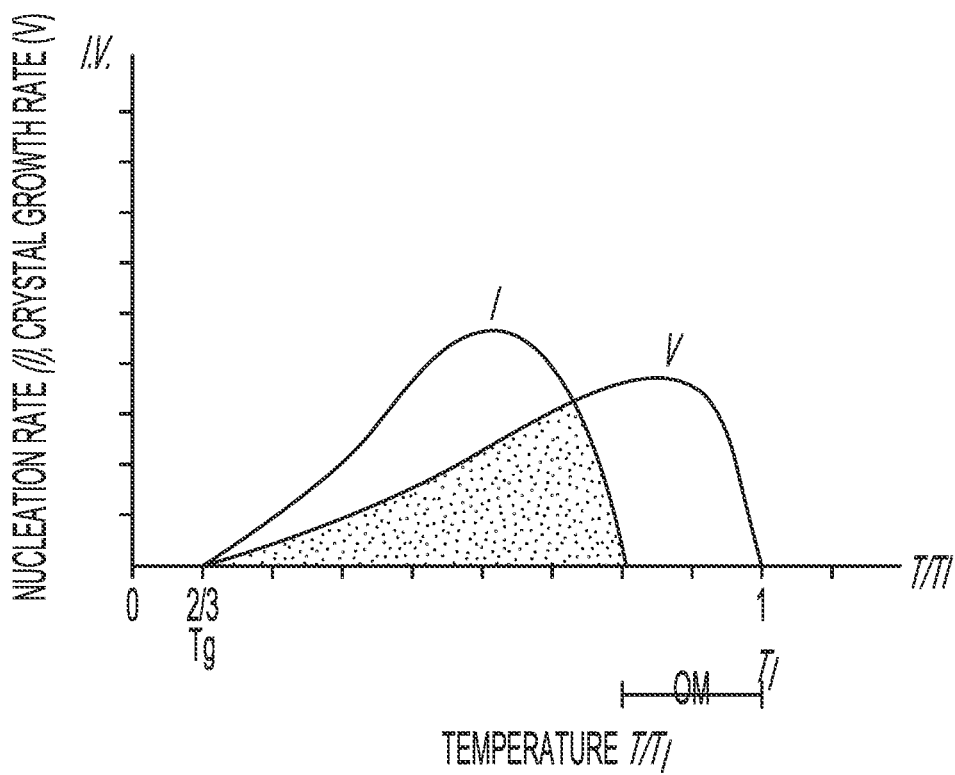
FIG. 35B graphically depicts the nucleation rate and crystal growth rate versus temperature in a ceram cycle according to embodiments disclosed and described herein.

Controlled bulk nucleation and growth are necessary to produce a desired glass-ceramic product. Bulk nucleation (both homogeneous and heterogeneous) is carried out at an elevated temperature for certain time as shown in FIG. 35A. Historically, the nucleation temperature and time are chosen empirically above the glass transition temperature (Tg) or anneal temperature as shown in FIG. 35B. Similarly, the growth temperature and time are also chosen empirically above the nucleation temperature. The optimized time and temperature can be achieved by changing both time and temperature for nucleation and growth stages of processing. The nucleation and crystal growth events are often overlapping. Therefore, physical properties such as viscosity evolve as a function of time in both nucleation and growth steps. However, the rate of the increase in density and/or viscosity changes when transitioning from the nucleation stage to the growth stage. When the rate of increase in the density and/or viscosity changes substantially, ceramming processes might not yield the desired final glass-ceramic product.

To avoid sagging, sticking, or viscous deformation, the time and temperature of the cycle should be controlled. Most conventional methods consist of trial and error based testing of intuitively designed thermal cycles, which are improved by materials characterization methods. Some examples of those characterization methods are the measurement of the heat flow of the crystallization peak as a function of annealing time with differential scanning calorimetry or in-situ analysis of X-ray diffraction peaks with time. Most of these methods do not assist the developers to find the optimum conditions for dimensional stability and they are very labor intensive and time-consuming. To overcome all those drawbacks, embodiments for creaming glass articles disclosed and described herein automatically determines ceramming cycles that will result in desired glass-ceramic articles. Embodiments of methods for ceramming comprise two analytical tools: (1) an automatic viscosity controller (AVC) to determine the cycle in the nucleation step and in the transitioning heating steps from nucleation to crystal growth; and (2) a non-contact in-situ density measurement method that determines the duration of the crystal growth. The entirety of the ceramming cycle is directly obtained using these two methods.

The objective of automatic viscosity control (AVC) is to hold the glass at a constant viscosity to define a time-temperature cycle with minimum sagging during a glass ceramming cycle. In this implementation, a constant viscosity is sustained by a) calculating the instantaneous viscosity using the deflection rate of a glass beam under constant stress in a 3-point beam bending set-up, and b) changing the heating/cooling rate dynamically using a proportional-integral-derivative (PID) control loop that defines the power output given to the furnace. When the viscosity of the glass article increases, the PID logic automatically increases the temperature, and when the viscosity of the glass article decreases, the PID logic decreases temperature. The PID control loop ensures a varying power output depending on the deviation from the target viscosity so that overshoots are avoided. FIG. 34 displays an embodiment of the implementation of AVC software logic. FIG. 34 is a PID flow chart that shows that an instantaneous ramp rate is first calculated using PID control loop on target viscosity versus the current, measured viscosity. Subsequently, the PID logic calculates a ramp rate to calculate the controller setpoint. Next, it is determined whether the previously calculated setpoint has changed from the last setter. If the calculated setpoint has changed, then the controller setpoint is changed and the PID logic is ended and reset. If the calculated set point has not changed, then the PID logic is ended and reset.

Figure 36:
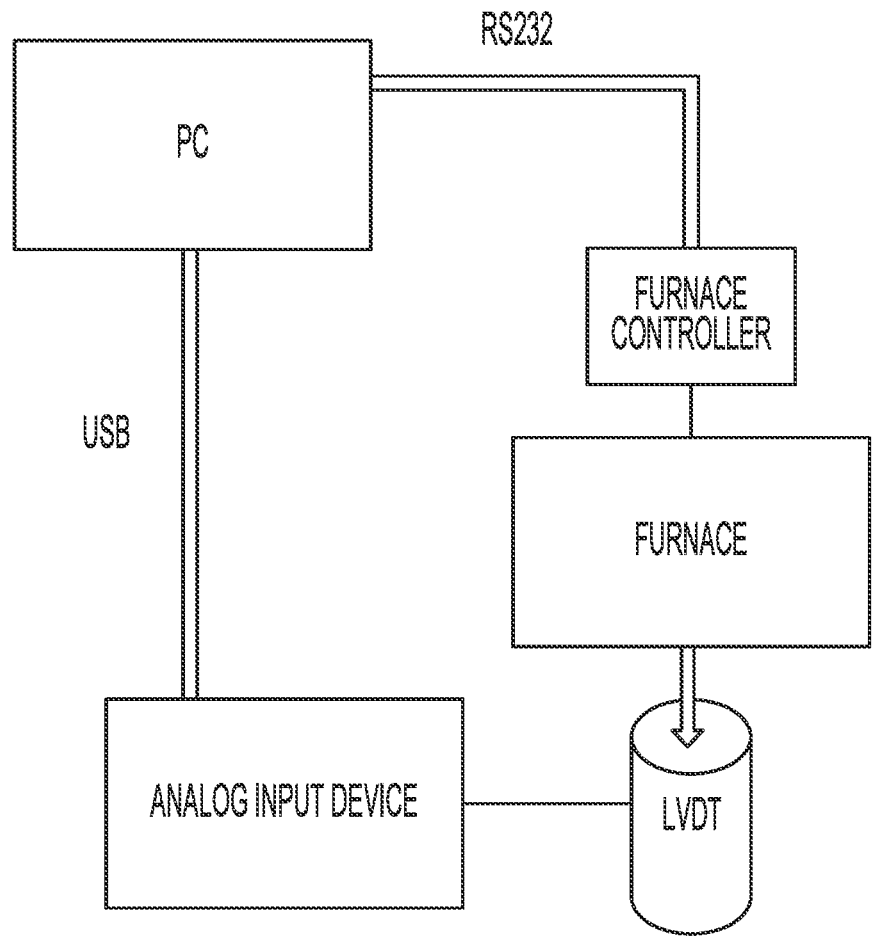
FIG. 36 is a block diagram that depicts a system used to operate AVC nucleation phase of a ceram cycle according to embodiments disclosed and described herein.

FIG. 36 shows the communication between the software logic-furnace and measurement set up according to embodiments. This method was applied to a 3-point bending viscometer based on the idea of constant stress, known geometry and varying furnace temperature. As shown in FIG. 36, a computer, such as a PC is connected to both the furnace controller and an analog input device. The furnace controller modifies parameters within the furnace, such as, for example temperature based on inputs it receives from the PC. The furnace is also connected to a linear variable differential controller (LVDT) that collects outputs from the furnace, such as outputs related to temperature, viscosity, etc. and transfers this data to the analog input device. As previously stated, the PC receives the data from the analog input device and calculates setpoints, such as temperature setpoints, to send to the furnace controller. Using such controls, the viscosity of the glass article can be kept relatively constant (such as within log viscosity±1.0 poise) during the nucleation stage.

Time-temperature cycle is obtained by defining a target constant viscosity where the glass article will be held. In this step—and according to embodiments-maximum temperature, maximum heating rate, target viscosity, sample geometry, sample dimensions, sample density, total applied load, span size of the three-point bending set-up are the only input in the software. Then following the software logic, as explained with reference to FIG. 34, the AVC automatically defines the time-temperature schedule until the beam deflection (glass viscosity) is out of the measurement range. The viscosity measurement range is typically good enough to capture the nucleation step and the transitioning (heating range change) from the nucleation to the crystal growth steps. However, the viscosity measurement does not accurately capture the crystal growth stage itself.

Figure 37:
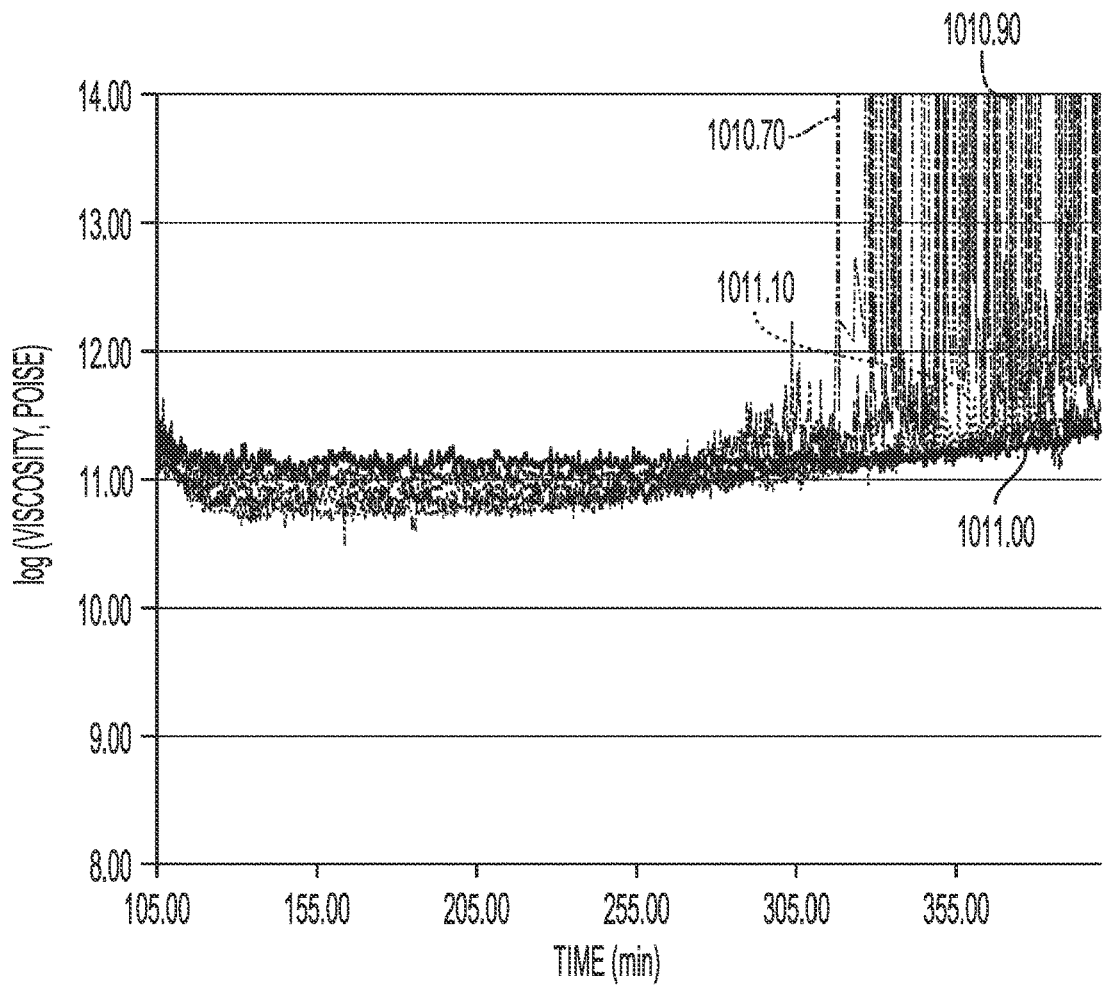
FIG. 37 graphically depicts log viscosity in poise versus time in minutes of a ceram cycle according to embodiments disclosed and described herein.

An embodiment of the method defined for three different viscosities by AVC is shown in FIG. 37 After reaching the target viscosity (e.g., around 11.00 in FIG. 37) the viscosity is maintained by the AVC until the crystal growth rate is accelerated (e.g., around 305 minutes). At the crystal growth stage, the AVC heating rate cannot maintain the constant viscosity and the viscosity starts to increase. When the deflection goes below the measurable range swings in viscosity are observed due to the limited reliability of the viscosity data. Therefore, time-temperature cycle defined by AVC should be limited to the time when the viscosity cannot be maintained.

Figure 38:
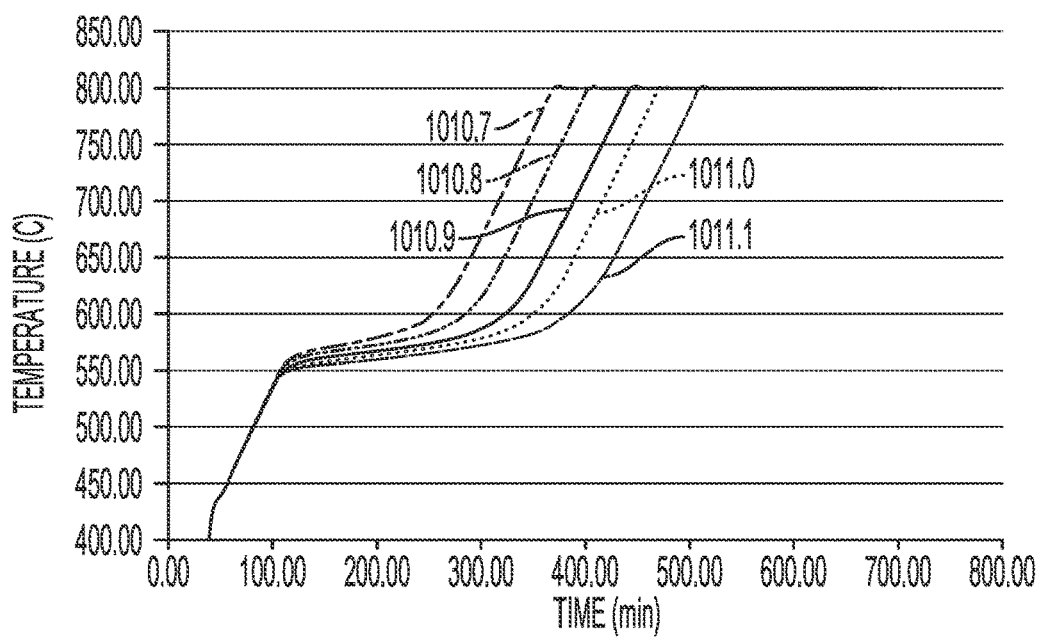
FIG. 38 graphically depicts temperature in degrees Celsius versus time in minutes of a ceram cycle according to embodiments disclosed and described herein.

FIG. 38 shows an example of a time-temperature cycle defined by AVC for 5 different log viscosities of 10.7, 10.8, 10.9, 11.0, and 11.1. In FIG. 38, all the cycles reach the same maximum temperature because 800° C. was inputted as the maximum temperature in the software. Above this temperature AVC would not be expected to control viscosity and, thus, is not monitored or controlled in embodiments. Similarly, after the transition is complete the heating rate is linear and the same value for each composition. This corresponds to the maximum heating rate value provided to the software to avoid overheating when the deflection rate (viscosity) is out of the measurement range. Therefore, the data obtained from AVC is limited to the range in the initial nucleation and the non-linear transition range. Again, this data does not accurately depict the process during the crystal growth stage. To measure the process during the crystal growth stage, in-situ density is monitored.

Figure 39:
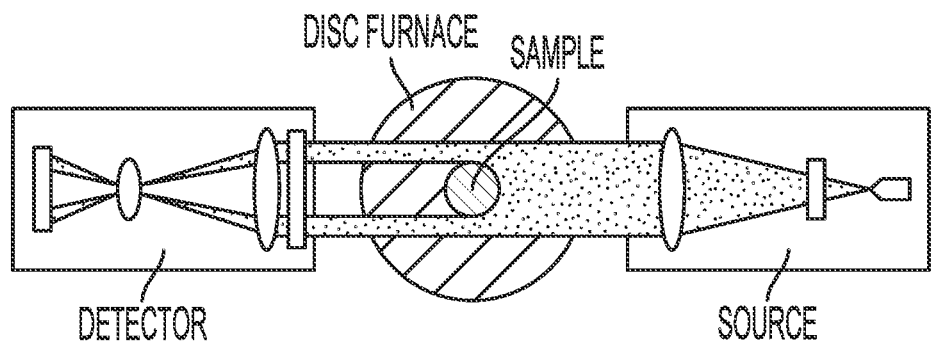
FIG. 39 schematically depicts a dilatometer that can be used in-situ to measure the density of a glass article according to embodiments disclosed and described herein.

In-situ density was calculated, according to one or more embodiments, by measuring the strain in one dimension as a function of time and temperature and assuming the glass ceramming process is isotropic. Therefore, there is believed to be a linear correlation between the volume and one-dimensional strain. Non-contact dilatometer measurements were performed using an optical dilatometer purchased from TA Instruments model DIL806. FIG. 39 shows the measurement apparatus schematically, which includes a light source that emits light into a disc furnace and to the glass sample. After the emitted light contacts the glass sample it is transmitted to the detector that can determine the changes in the light received therein, which subsequently can be used to measure the density of the sample. Basically, this method involves measurement of the shadow of the sample on both ends while it is being heat treated in the furnace. The light source is on the opposite side of the furnace from the detector, and the movement of the shadow is correlated to the density changes during the crystal growth process. Unlike conventional dilatometry, the sample is free standing on a sample holder and no external force is applied. Ceramming processes according to embodiments often occur in the log viscosity 9-12 poise viscosity range where viscous flow due to gravitational force is negligible in the process timescales.

According to embodiments, AVC defined nucleation and transitioning time-temp cycles are provided to the optical dilatometer software. Then the final crystal growth temperatures are varied and the isothermal step input is provided longer than any expected crystal growth duration to assure the crystal growth process is completed. When the density increase reaches a saturation point, it is considered that there is no significant change in the crystal size and, therefore, the viscosity and the density is constant as a function of time. This step helps identify any unwanted crystal formation or unexpected drop in viscosity at higher than needed growth temperatures. The final assemblage and phase of the glass-ceramic can be determined and compared to the data collected from density measurements to determine how the process affects the assemblage and phase of the glass-ceramic.

As used herein, a constant density refers to an absolute value of density rate that is less than or equal to 0.10 $(g/cm^3)/min$, such as less than or equal to 0.09 $(g/cm^3)/min$, less than or equal to 0.08 $(g/cm^3)/min$, less than or equal to 0.07 $(g/cm^3)/min$, less than or equal to 0.06 $(g/cm^3)/min$, less than or equal to 0.05 $(g/cm^3)/min$, less than or equal to 0.04 $(g/cm^3)/min$, less than or equal to 0.03 $(g/cm^3)/min$, less than or equal to 0.02 $(g/cm^3)/min$, less than or equal to 0.01 $(g/cm^3)/min$, or 0.00 $(g/cm^3)/min$. These ranges include all ranges and subranges included in the broadly disclosed ranges.

Figure 40:
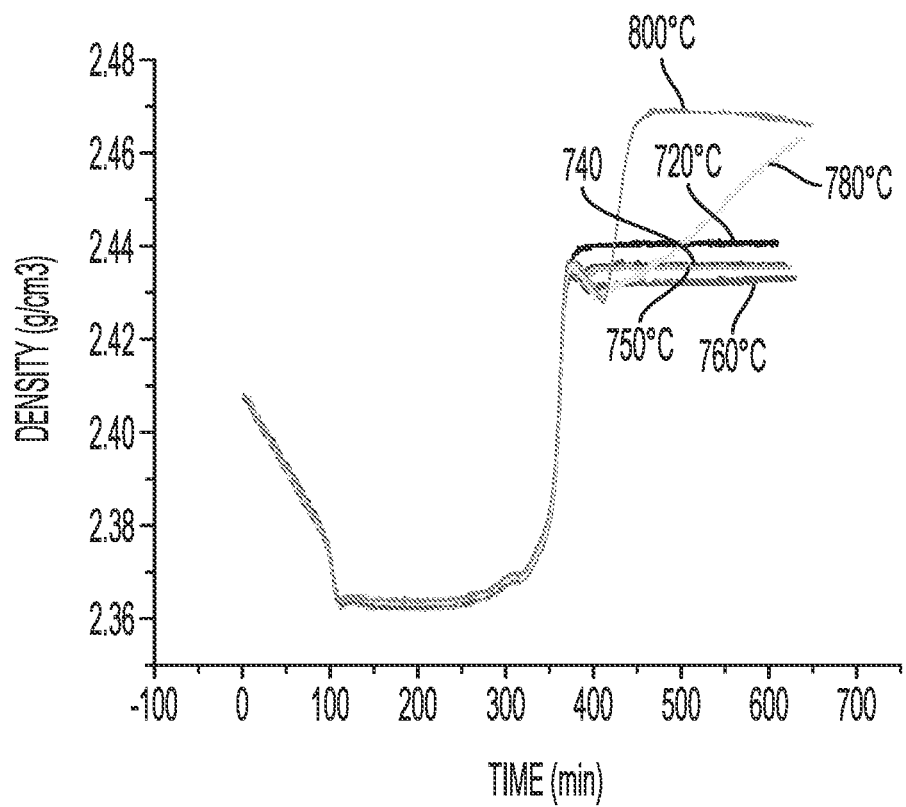
FIG. 40 graphically depicts density in grams per cubic centimeter versus time in minutes of a ceram cycle according to embodiments disclosed and described herein.

FIG. 40 shows the evolution of density at six different growth temperatures according to an embodiment. When the density reaches the plateau, the process is considered to be complete or close to be completed, and with the help of other characterization methods such as x-ray diffraction (XRD) it can be confirmed and used as the duration of the last step of the ceramming process. At high temperatures (i.e., 780° C. and 800° C.) there is a non-monotonic change in density due to possibly formation of undesired phases or phase separation.

Figure 41:
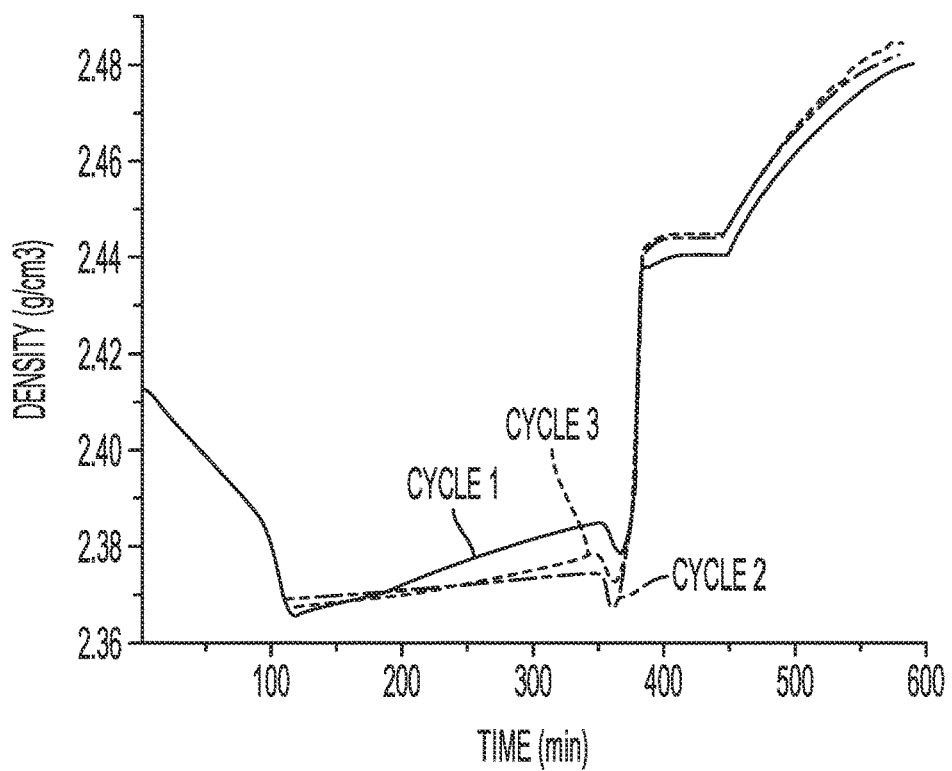
FIG. 41 graphically depicts density in grams per cubic centimeter versus time in minutes of a ceram cycle according to embodiments disclosed and described herein.

According to embodiments, it is desirable to modify the glass-ceramic ceramming cycle to achieve minimal warp. In-situ density measurement of the glass-ceramic during the ceramming process for various ceramming schedules is shown in FIG. 41. In FIG. 41, the density in grams per cubic centimeter (as measured on the y-axis) is plotted versus time in minutes (as measured on the x-axis) is shown. This figure shows that the glass article not only goes through the temperature dependent thermal expansion and shrinkage, but also goes through dynamic, time dependent non-thermal shrinkage during nucleation, ramping, and growth stages. As shown in FIG. 41, during the nucleation hold at a constant temperature (i.e., from about 100 minutes to about 350 minutes) the part is shrinking due to the material change, indicated by the density increasing. During the ramping from nucleation to growth, the density is seen to first decrease and then increase quickly, the latter in response to fast crystallization induced material shrinkage.

Figure 42:
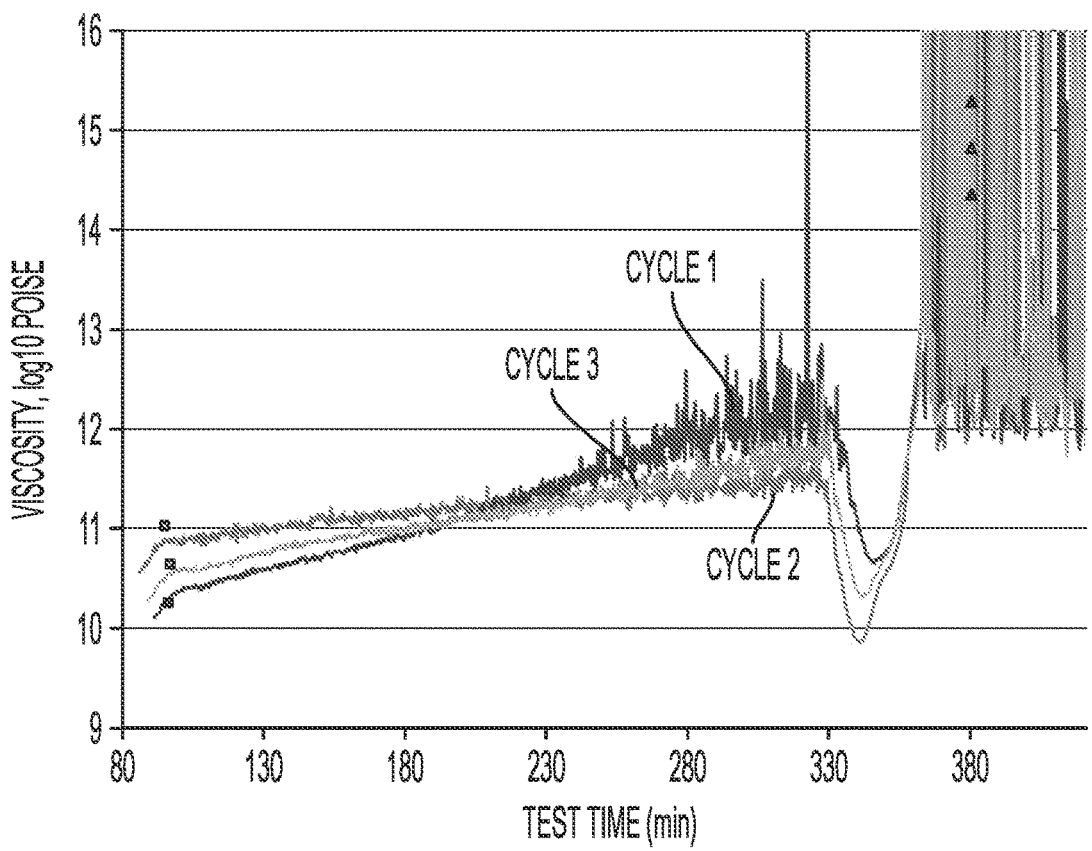
FIG. 42 graphically depicts viscosity in log 10 poise versus time in minutes of a ceram cycle according to embodiments disclosed and described herein.
Figure 43:
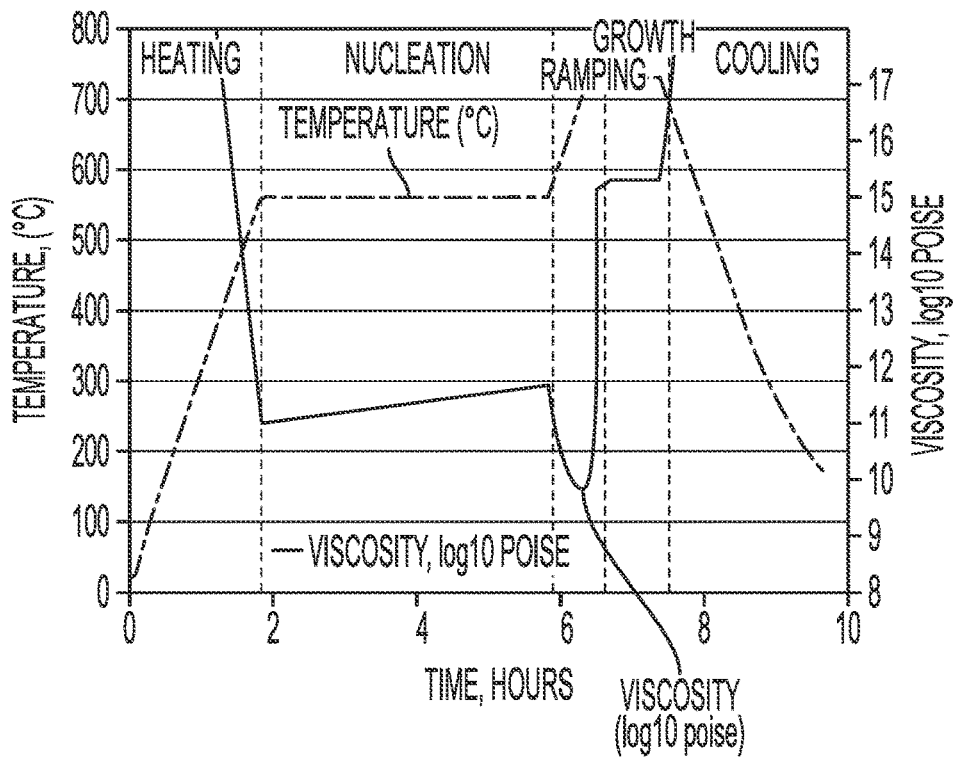
FIG. 43 graphically depicts temperature in degrees Celsius on the left y-axis versus time in hours on the y-axis, and viscosity in log 10 poise on the right y-axis versus time in hours on the x-axis of a ceram cycle according to embodiments disclosed and described herein.

FIG. 42 shows the in-situ viscosity measurement of the glass-ceramics during the ceramming process for various ceramming cycles according to embodiments described in FIG. 41. In FIG. 42, the y-axis indicates the log viscosity (log 10) poise and the x-axis indicates the test time in minutes. The viscosity has similar temperature dependent and time dependent non-thermal behaviors during the nucleation stage. During the nucleation hold at a constant temperature, the viscosity is increasing with a rate dependent on the nucleation temperature. During ramping, the viscosity first decreases and then increases, creating a dipping and a local minimum. Beam bending viscosity (BBV) measurement data for the precursor glass and ceram are used, together with the in-situ viscosity measurement data, to come up a unified ceramming viscosity model, as shown in FIG. 43. The composition of the glass shown in FIG. 42 is shown in Table 4 below.

TABLE 4

| Component | Wt % |
|---|---|
| $SiO_2$ | 73.89 |
| $Al_2O_3$ | 7.60 |
| $P_2O_5$ | 2.11 |
| $Li_2O$ | 11.50 |
| $Na_2O$ | 0.05 |
| $K_2O$ | 0.15 |
| $ZrO_2$ | 4.24 |
| $SnO_2$ | 0.40 |
| $Fe_2O_3$ | 0.06 |

Figure 44A:
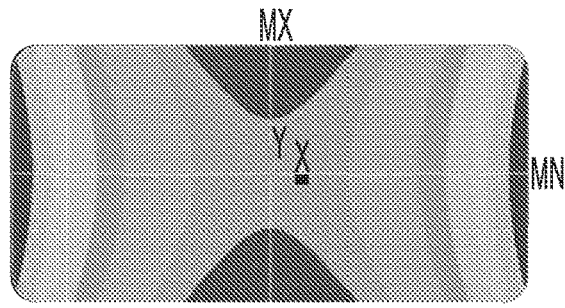
FIG. 44A shows the warp of a glass-ceramic article cerammed by a ceram cycle according to embodiments disclosed and described herein.
Figure 44B:
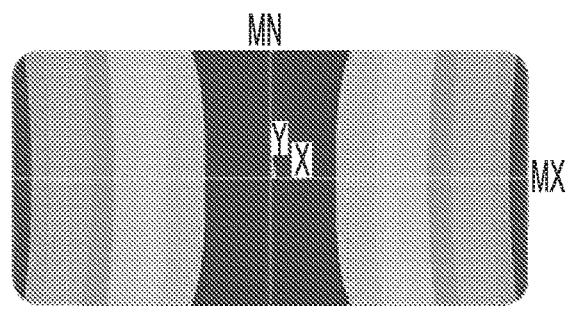
FIG. 44B shows the warp of a glass-ceramic article cerammed by a ceram cycle according to embodiments disclosed and described herein.
Figure 44C:
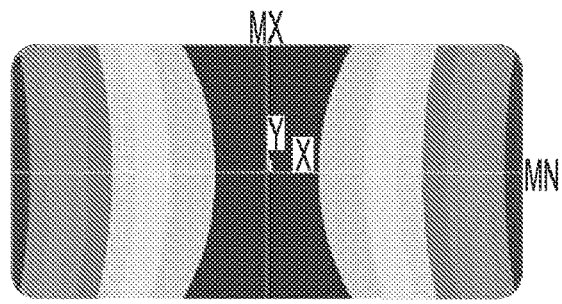
FIG. 44C shows the warp of a glass-ceramic article cerammed by a ceram cycle according to embodiments disclosed and described herein.

Viscoelastic numerical simulations are then performed in embodiments to understand the impacts of these viscosity changes on the warp. The numerical modeling discovered that the local minimum viscosity, combined with in-plane temperature gradients generated during the ramping, can trigger viscous buckling and cause warp. FIGS. 44A-44C show the warp for three hypothetical cycles (A, B, C). Cycle A is the base case, Cycle B has a faster viscosity increasing rate during nucleation and has higher minimal viscosity during ramping, and cycle C has the slower viscosity increasing rate during nucleation and has lower minimal viscosity during ramping. The warp values for these cases are: C>A>B, (shown in FIG. 44C, FIG. 44A, and FIG. 44B, respectively). Lower minimal viscosity will generate larger viscous buckling warp. In other words, increasing minimal viscosity is beneficial for reducing the buckling warp.

Figure 45A:
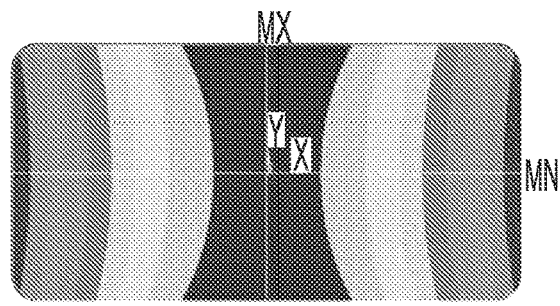
FIG. 45A shows the warp of a glass-ceramic article cerammed by a ceram cycle according to embodiments disclosed and described herein.
Figure 45B:
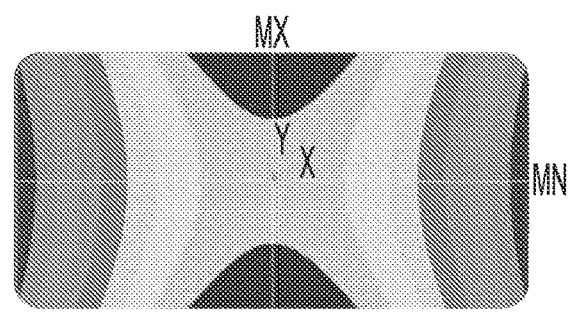
FIG. 45B shows the warp of a glass-ceramic article cerammed by a ceram cycle according to embodiments disclosed and described herein.
Figure 45C:
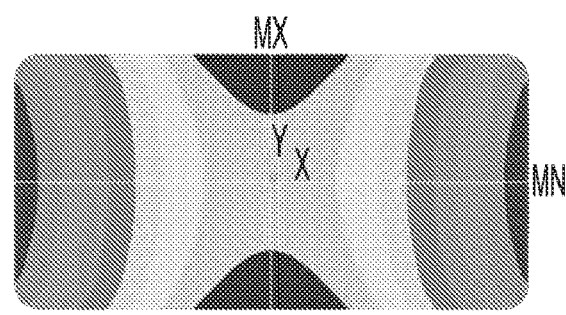
FIG. 45C shows the warp of a glass-ceramic article cerammed by a ceram cycle according to embodiments disclosed and described herein.

FIGS. 45A-45C show the warp for three ceramming cycles corresponding ±10° C. nucleation temperature and growth temperature. Cycle A is conducted at 560° C. nucleation temperature 4 hr, 730° C. growth temperature 1 hr (shown in FIG. 45A), cycle D is conducted at 570° C. nucleation temperature 4 hr, 740° C. growth temperature 1 hr (shown in FIG. 45B), cycle E is conducted at 580° C. nucleation temperature 4 hr, 750° C. growth temperature 1 hr (shown in FIG. 45C). The warp values for these cases are: E<D<A. Again it shows the same trend that increasing minimal viscosity will reduce the buckling warp. In cycle E, where the minimal viscosity during ramping is kept above log viscosity 11.0 poise, the resulted warp is very small, such as <1 μm.

When the objective is to ceram a flat piece of glass with minimum warp, cycle E would be preferred, in some embodiments, to other cycles due to low value of minimum viscosity during the growth ramp. Note that the lower viscosity for cycle E during the nucleation phase is less likely to cause buckling because of lower ΔT during periods of temperature hold (compared to periods of temperature ramp).

More generally, cycles that generate higher "minimum viscosity" during the "ramp-to-growth" stage—where the highest ΔT is observed—may be preferred, in some embodiments, to minimize warp associated with buckling. This could be referred to as the "minimum viscosity" during the ramp stage, and the modeling could be used to predict impact of that minimum value relative to the final warp as a screening tool.

Besides increasing the local minimal viscosity to reduce buckling warp, it is also possible to apply some weight constraining force to increase the buckling threshold. In a stack configuration, having the weight on the top of the stack sufficient to prevent buckling of the topmost piece of glass would ensure that the layers below do not buckle as well.

Figure 46:
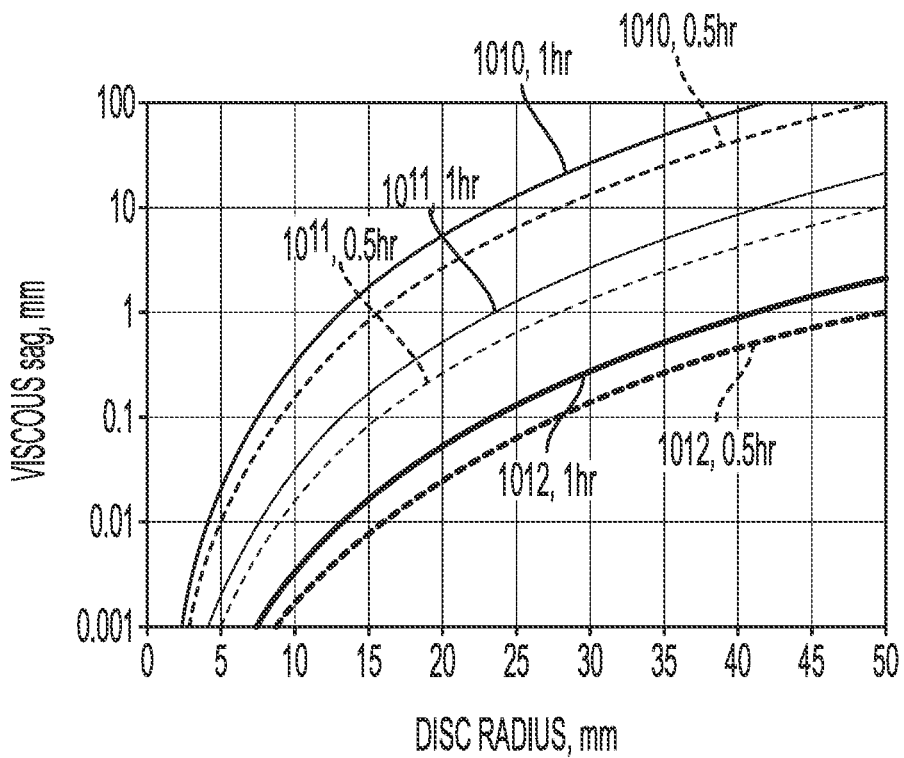
FIG. 46 graphically depicts viscous sag in mm versus disc radius in mm of a glass-ceramic article cerammed by a ceram cycle according to embodiments disclosed and described herein.

As the part is put horizontally on the setter material, the gravity can also generate warp, besides the viscous buckling induced warp, if the setter is not flat. Viscous sagging analysis is shown in FIG. 46. In an area of 30 mm diameter, at log viscosity 11.0 poise and 0.5 hr, the viscous sagging will reach about 100 μm. FIG. 46 suggests that larger area (>30 mm diameter)/lower viscosity (log viscosity <11 poise)/longer duration (>0.5 hr) will generate viscous sag >100 μm. If the setter has flatness better than 100 μm, the glass will sag and conform to the setter at those conditions. If the setter has flatness larger than 100 μm, the viscous sag will also be larger than 100 μm. Therefore the setter needs to be flat (e.g., less than or equal to 100 microns) for minimal gravity induced warp.

When the objective is to form the glass into 3D shapes, then cycles with lower viscosities would be preferred, in some embodiments, and the application of forming pressure would coincide with the periods of low viscosities during the cycle. 3D forming may be done before nucleation, during the nucleation, during the nucleation-to-growth ramp, and in some cases even during the growth hold stage. The right choice may depend on various factors, such as the 3D geometry to be formed, viscosities during each stage (which depends on temperature, time and ramp rates), and warp. For example, as ceramming 3D formed glass can lead to substantial warp, forming pre-nucleated glass may be a means of reducing the final post-ceram warp of the 3D article.

When 3D forming is to be done during the nucleation hold, cycle E (described above with reference to FIGS. 45A-45C) may be preferred, in some embodiments, to cycles A and D as it has lower viscosity than the other cycles for about 100 mins starting at the beginning of the nucleation hold. Results of FIG. 46 show that for curve E, viscosity is low enough to cause several millimeters of sag under gravity within 60 minutes. Thus many 3D shapes can be formed under these conditions with the aid of additional forming pressure during the nucleation hold stage. In the case of one-mold forming, such pressure can be in the form of partial or full vacuum on the side of the mold, or positive gas pressure (typically $N_2$ or air) on the other side of the forming mold. In the case of two (or multiple-) mold pressing, the pressure is applied from both sides.

Alternatively, in embodiments, 3D forming may be done completely in the nucleation to growth ramp stage. In such a case, cycle A would be preferred, in some embodiments, to cycles D and E. In that case, the buckling risk is still managed due to the mold contact/forming pressure constraining force.

New cycles may also be conceived for forming during nucleation. As an example, the nucleation temperature can be increased further, such as to 590° C., 600° C., or even 610° C. during a first part of the cycle, held for just enough time for the 3D forming to be completed, then lowered for the rest of the cycle (with shortened duration of nucleation hold, if needed) so that the final crystal content at the end of the cycle remains the same as for the base cycle A. The higher temperatures would create lower viscosities initially and allow forming of more challenging shapes in a shorter amount of time. Having the same crystal content as base case would mean, besides having the desirable distribution of phases that the low viscosity of curve A during ramp to growth could be replicated giving another opportunity to complete 3D forming.

3D forming and ceramming may be done in the same cycle or in multiple cycles. For example, in one embodiment, the precursor glass may be formed into the 3D shape and then a separate cycle may be used to ceram the 3D article. In another embodiment, the glass preform may be partially or fully "pre-nucleated" in a first cycle, then 3D formed in a second cycle, and then ceramming may be completed either in the second cycle or in a third, separate cycle. As 3D forming can be only done one glass article at a time, pre-nucleating the glass preform—versus nucleation and 3D forming in the same cycles—may increase throughput by allowing stacked configurations in nucleation.

The temperature ramp to growth is a natural choice for 3D forming when the glass preform is fully pre-nucleated. As stated earlier, cycle A may be preferred, in some embodiments, to cycles D or E in such a case, because of lower viscosity during ramp to growth. When the glass is only partially pre-nucleated, 3D forming may be done either during nucleation, during the ramp to growth, or partly during nucleation and partly during the ramp to growth.

To prevent warp of the 3D article during the ceramming cycle, ceramming may be done on mold (one piece, two piece, or three piece), temperature gradients should be kept low (e.g. by using molds of high thermal conductivity material such as graphite or SiC) and load should be applied to force the 3D article to remain conformed to the mold during ceramming.

As disclosed above, precise control of the glass article temperature is required to achieve a desired glass-ceramic article. Accordingly, thermal uniformity within the heating apparatus, such as, for example, a lehr or a furnace, and within the glass stack is an important attribute of the process, according to embodiments. For example, in embodiments, the temperature imparted to the stack varies by less than or equal to ±8° C., such as less than or equal to ±7° C., less than or equal to ±6° C., less than or equal to ±5° C., or less than or equal to ±4° C., where the temperature is measured on the glass sheets themselves.

To achieve the above-described thermal uniformity, thermal mapping is conducted on the interior chamber of an empty heating apparatus before inserting fixtures (such as the carrier, setters, and glass stack) into the heating apparatus. The thermal mapping of the empty heating apparatus chamber is conducted to determine the usable heating space within the heating apparatus chamber by defining the space that can maintain thermal uniformity within a desired tolerance. For example, portions of the heating apparatus chamber that cannot maintain a thermal uniformity of less than or equal to ±8° C. from the programmed cycle temperature will be excluded from the heating space in which glass stacks can be placed. Subsequent to mapping the empty heating apparatus chamber to determine the usable heating space, fixtures are placed into the now-defined heating space and the thermal uniformity with the glass stacks is measured to determine whether glass sheets within a given glass stack can be maintained within a desired temperature tolerance of the programmed cycle temperature. Once the thermal uniformity is determined, the glass stacks may be configured and placed into the heating space in such a way as to take advantage of the thermal uniformity measurements that were obtained.

Methods for determining thermal uniformity within an interior chamber of a heating apparatus will now be described with reference to FIG. 47A and FIG. 47B. The placement of measurement devices (such as, for example, thermocouples) within the chamber of the heating apparatus should, in embodiments, account for the heating apparatus design, such as, for example, walls, doors, heating elements, vents, etc. of the chamber of the heating apparatus. The measurement devices should be placed in locations and away from design elements so that any thermal non-uniformity caused by such design elements is ameliorated during the thermal mapping process. In addition, measurement devices should be placed in the chamber of the heating apparatus in such a way that thermal uniformity of entire heating space can be determined. For instance, the measurement devices should be placed within the heating apparatus chamber such measurements are made at numerous locations within the chamber of the heating apparatus to minimize any "dead spots" or locations where there are no measurements.

Figure 47A:
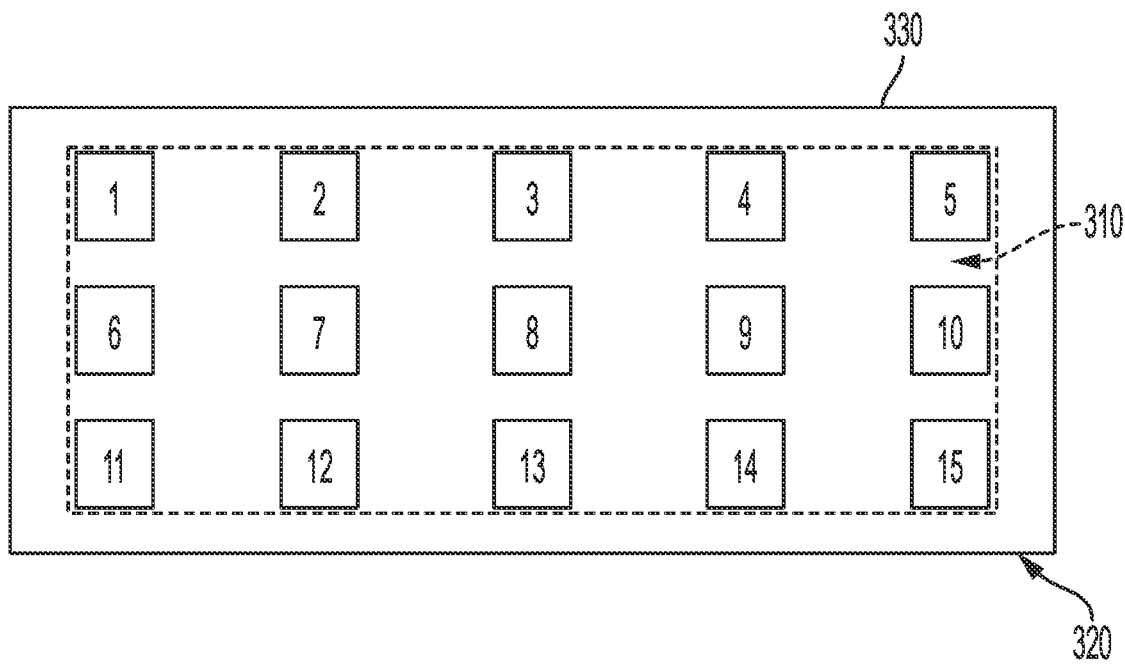
FIG. 47A graphically depicts the horizontal location of measurement devices within a chamber of a heating apparatus according to embodiments disclosed and described herein.
Figure 47B:
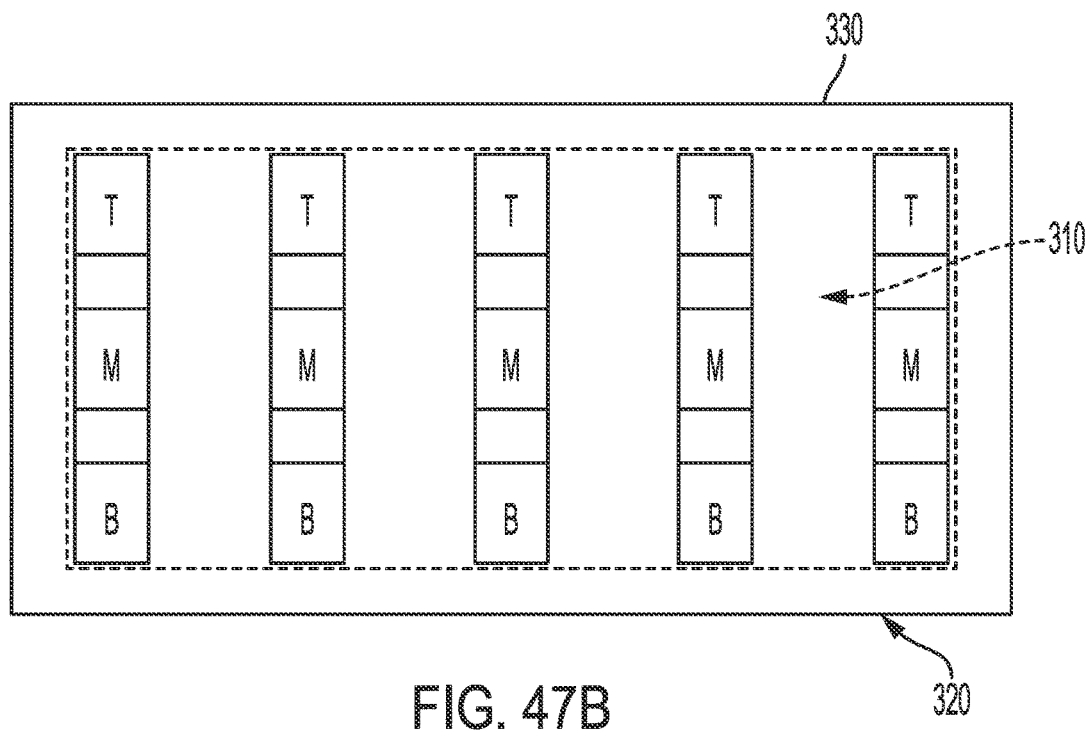
FIG. 47B graphically depicts the vertical location of measurement devices within a chamber of a heating apparatus according to embodiments disclosed and described herein.

FIG. 47A and FIG. 47B show the horizontal and vertical placement, respectively, of measurement devices within the chamber of a heating apparatus. Initially, an expected heating space 310 (indicated by the space within the dashed lines in FIG. 47A and FIG. 47B) is approximated taking into account the design elements of chamber of the heating apparatus. As shown in FIG. 47A and FIG. 47B, the expected heating space 310 is selected such that there is space between the top, bottom, and side walls of the chamber of the heating apparatus. FIG. 47A shows the horizontal placement (i.e., view from the top or bottom of the chamber of the heating apparatus) of measurement devices according to embodiments. As shown in FIG. 47A there are fifteen measurement devices (elements 1-15) placed in a spaced configuration in each horizontal cross-section of the chamber of the heating apparatus. The horizontal placement of measurement devices 1-15 in the chamber of the heating apparatus according to the embodiment depicted in FIG. 47A would be expected to provide adequate thermal mapping of the horizontal space of the chamber of the heating apparatus. However, it should be understood that other horizontal configurations of measurement devices may be used in alternative embodiments.

Similarly, FIG. 47B shows the vertical placement (i.e., side view) of measurement devices in the chamber of a heating apparatus. As shown in FIG. 47A, three rows of measurement devices—top, middle, and bottom represented respectively by "T", "M", and "B" in FIG. 47B—are placed into the chamber of the heating apparatus in a spaced configuration. The vertical placement of measurement devices in the top, middle, and bottom rows within the chamber of the heating apparatus according to the embodiment depicted in FIG. 47B would be expected to provide adequate thermal mapping of the vertical space of the chamber of the heating apparatus. However, it should be understood that other horizontal configurations of measurement devices may be used in alternative embodiments. When viewed together, FIG. 47A and FIG. 47B show 45 measurement devices (three rows-top, middle, and bottom of fifteen measurement devices) in a spaced configuration that would be expected to adequately map the thermal properties of the expected heating space 310. However, it should be understood that other configurations of measurement devices may be used in alternative embodiments.

In embodiments, the measurement devices are arranged at a minimum of each corner, all centerlines, and all center of volume points within the expected heating space. If thermally non-uniform design elements are present, additional measurement devices may be placed near such elements to map the effect of these elements on thermal uniformity and to determine how close the heating space may come to these thermally non-uniform design elements. The vertical placement of the measurement devices should account for and will, in embodiments, dictate the height of the glass stacks and/or fixtures that may be placed within the chamber of the heating apparatus. If the top or bottom surface of the chamber of the heating apparatus is heated or non-heated, adjacent measurement devices should account for the heater element locations and any other non-planar surface that may upset or interrupt the thermal response of the measurement device. Vertical spacing of an empty chamber of the heating apparatus is, in one or more embodiments, every 25 mm from the bottom 320 of the chamber of the heating apparatus to a distance that is between 50 and 100 mm from the top 330 of the chamber of the heating apparatus.

Once the measurement devices are placed into the empty chamber of the heating apparatus, a heating cycle is conducted. According to embodiments, the heating cycle may include the same heating conditions as a cycle for ceramming glass articles. During this heating cycle, the measurement devices periodically or consistently measure the temperature at their respective locations within the chamber of the heating apparatus. These temperatures that are measured by the measurement devices can then be analyzed and compare to determine whether one or more locations within the chamber of the heating apparatus do not fall within a desired tolerance, such as, for example ±8° C., of the programmed cycle temperature. If one or more locations of the chamber of the heating apparatus do not fall within the desired tolerance, those locations of the chamber of the heating apparatus will be excluded from the heating space that can be used in the ceramming cycle. In embodiments, if one or more locations of the chamber of the heating apparatus do not fall within the desired tolerance additional thermal mapping may be conducted by moving the measurement devices to exclude the locations within the chamber of the heating apparatus that did not fall within the desired tolerance and running one or more additional heating cycles. This process may be repeated any number of times to determine the heating space within the chamber of the heating apparatus that can be kept within the desired tolerances.

Once the measurement devices are in locations such that all measured locations of the chamber of the heating apparatus fall within the desired tolerance, the space within the chamber of the heating apparatus defined by the measurement devices will be considered the heating space. In embodiments, once the heating space has been determined, glass stacks and fixtures (such as, for example, carriers) can be designed and/or configured so that they fit within the heating space. The designed glass stacks and fixtures are then loaded into the heating space within the chamber of the heating apparatus, and the measurement devices in the center of the heating space are removed to accommodate the fixtures. A heating cycle that is, in embodiments, the same as the heating cycle used to determine the heating space is conducted to determine the effect that the fixtures have on the thermal uniformity within the heating space. Adjustments can then be made to the programmed thermal profile to accommodate for the effect of the fixtures and the glass stacks.

According to embodiments, after the heating space within the chamber of the heating apparatus and the effect of the glass stacks and fixtures on the thermal response have been determined, the thermal uniformity within glass stacks may be found by placing measurement devices into the glass stacks, and removing any measurement devices used to in the previous steps of determining the heating space and the effect of the glass stacks and fixtures on the thermal responsiveness.

Measurement device placement within the glass stack is important to provide reliable and repeatable data, according to embodiments. The thermal conductivity of the glass should be accounted for in each layer, thus having only one sheet of glass between the setter and the measurement device will provide sufficient thermal characterization of the glass sheets and will capture the thermal influence of the setter on the stack. Accordingly, the number of measurement devices included in the glass stack will vary in embodiments according to the physical dimensions of the glass stack and the desired detail of the thermal mapping. For instance, in one or more embodiments, nine measurement devices may be placed in the stack where three measurement devices are placed along the centerline of a glass sheet that is below the top setter; three measurement devices are placed along the centerline of a glass sheet that is in the geometrical center of the glass stack; and three measurement devices are placed along the centerline of a glass sheet that is one sheet above the bottom setter. The centerline, as used in this example, is a line drawn lengthwise across the glass sheet substantially parallel to two edges of the glass sheet and substantially perpendicular to the other two edges of the glass sheet and intersecting the geometrical center of the glass sheet. It should be understood that "substantially parallel" and "substantially perpendicular" as used herein means that the centerline is parallel or perpendicular, respectively, to such edges taking into account irregularities of the edges from manufacturing. In the embodiment disclosed above where three measurement devices are placed along a centerline of a glass sheet, a measurement device (such as, for example, a thermocouple) is placed on the centerline near the left side of the glass sheet, a measurement device is placed at the geometrical center of the glass sheet, and a measurement device is placed along the centerline of the glass sheet near the right side of the glass sheet. This configuration is followed for all three glass sheets in question. The middle layer of the stack typically provides a median reference of the entire stack. It should be understood that the above-disclosed configuration of measurement devices is exemplary only and other configurations may be used in embodiments depending on the desired specificity of the thermal mapping desired. For example, in embodiments where thermal uniformity is to be strictly controlled, more measurement devices will be placed on each glass sheet to get more detailed thermal mapping. Any number of measurement devices may be used in the glass stack so long as the number of measurement devices does not substantially interfere with the thermal profile of the glass sheets. All layers of the measurements can then be measured to understand the thermal profile of the glass response to the thermal profile as programmed, as discussed in more detail below.

Figure 48:
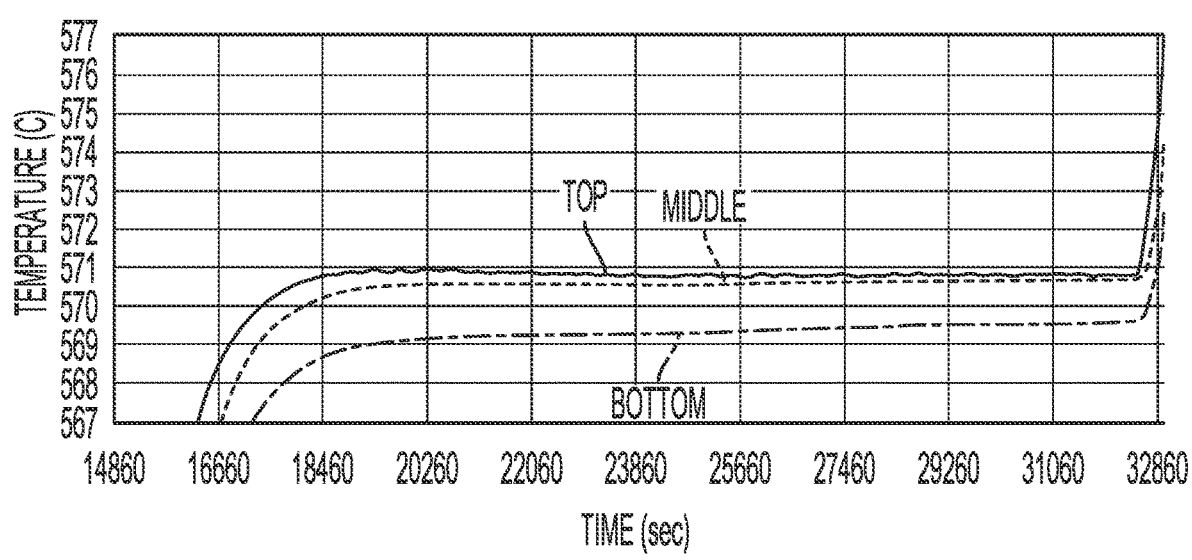
FIG. 48 graphically depicts temperature in degrees Celsius versus time in seconds as recording by measurement devices in an empty chamber of a heating apparatus according to embodiments disclosed and described herein.

FIG. 48 shows a stack glass temperature differential (ΔT) between the top (i.e., the glass sheet below the top setter), middle (i.e., the glass sheet at the geometrical center of the glass stack), and bottom (i.e., the glass sheet above the bottom setter) of the glass stack as measured by a measurement device positioned at or near the geometrical center of the respective glass sheet. Such a graph can be used to understand the magnitude and location of temperature deviations. FIG. 48 shows the temperature of a glass stack having 18 glass sheets and three setters dispersed within the stack such that there are six glass sheets between two respective setters. As shown in FIG. 48, the glass sheet located near the bottom of the glass stack has a lower temperature than both the glass sheet located near the middle of the glass stack and the glass sheet located near the top of the glass stack. This determination becomes integral because post-ceramming metrology variability of expected attributes, such as color, haze, stress, phase assemblage, etc. can be impacted by the time and temperature at which the glass article is cerammed. Accordingly, understanding and controlling the temperature differential between glass sheets in the glass stack has an impact on the final properties of the glass-ceramic article.

The temperature difference from the expected thermal profile is, in embodiments, measured and analyzed in both the vertical and horizontal planes. Vertical ΔT is typically impacted by setter material selection, glass stack height, and heating and cooling rates of the process equipment. Horizontal ΔT is typically impacted by non-uniformities of the process equipment, placement of the glass stack within the heating space, and the heating design (how heat is directed to the glass stack). Controlling the ΔT within the stack is important to obtain uniformity of the glass sheets at high throughputs, according to embodiments. It should be understood that the tolerances for ΔT will vary depending on the glass composition as well as the desired attributes of the final glass-ceramic article.

Figure 49:
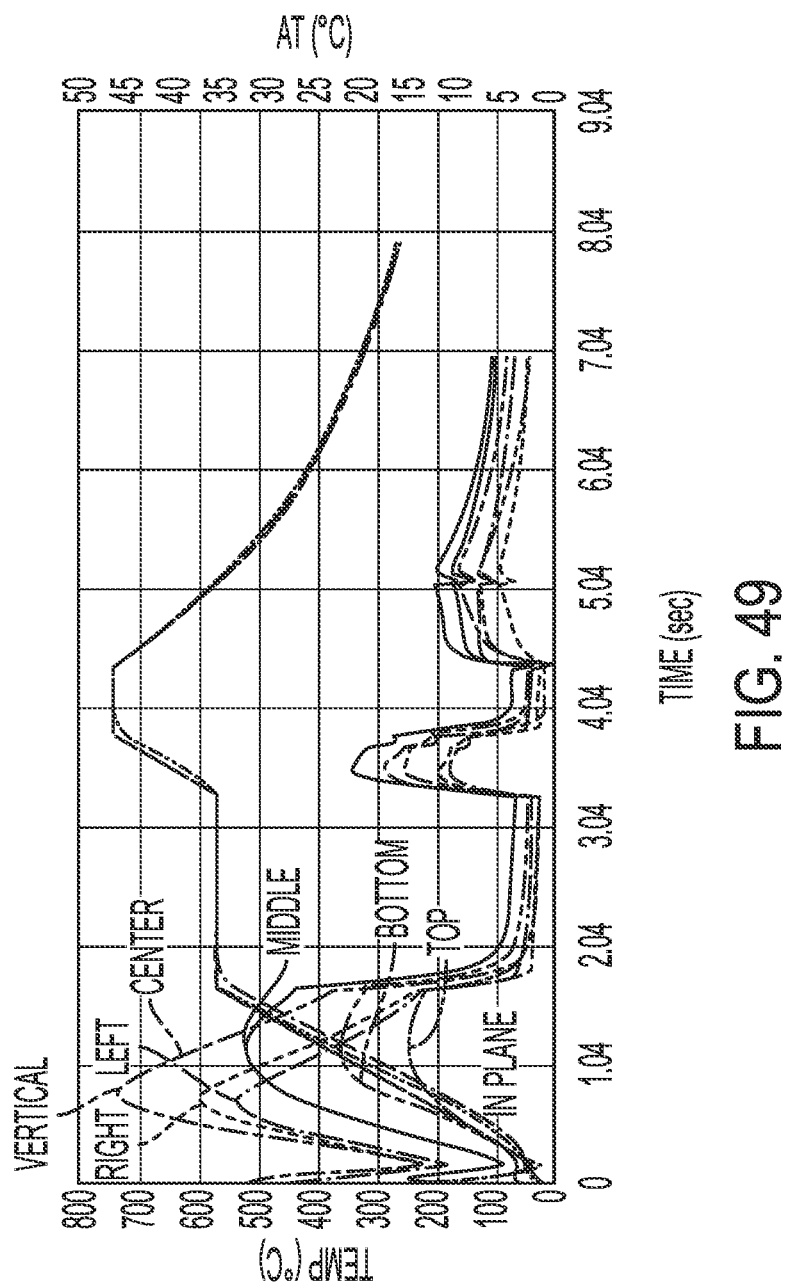
FIG. 49 graphically depicts the temperature of glass sheets in degrees Celsius on the left y-axis versus time in seconds on the x-axis and the temperature differential between glass sheets in degrees Celsius on the right y-axis versus time in seconds on the x-axis when cerammed by a ceram cycle according to embodiments disclosed and described herein.

In embodiments where the glass article has a glass composition as disclosed and described herein ΔT within the glass stack may be maintained within ±5° C. of the programmed temperature profile during the isothermal hold (also referred to as "soak") stages of the ceramming process (i.e., stages corresponding to the nucleation stage and the growth stage). When ΔT is outside of this tolerance in the isothermal hold during the nucleation and growth stages, various glass-ceramic sheets from the resulting ceramming process can have undesirable attributes, such as warp, bow, haze, etc. FIG. 49 shows results from a glass stack comprising eighteen measurement devices. In FIG. 49, the x-axis is time measured in seconds, the right y-axis is ΔT in ° C., and the left y-axis is temperature of the glass sheets in ° C. The tight grouping of plotted lines represent the temperature of the glass sheet (corresponding to the left y-axis), and the wider grouping of plotted lines show ΔT of the glass sheets (corresponding to the right y-axis). As shown in FIG. 49, during the first ramping cycle where the glass stack is heated from around ambient to about 570° C., ΔT—as measured from the programmed creaming temperature—for some glass sheets within the glass stack is over 40° C. However, after the ramping cycle is complete and the isothermal hold begins, the ΔT of the glass sheets drops and is maintained at or below ±5° C. during the isothermal hold. In embodiments, the ceramming cycle is modified based upon the ΔT measurements obtained.

For instance, it is desirable, in one or more embodiments, for the duration of the programmed isothermal hold to be conducted where ΔT is within ±5° C. As shown in FIG. 49, the isothermal hold at about 570° C. begins before ΔT of the glass stack is within ±5° C. of the programmed ceramming cycle. Thus, the programmed isothermal hold may be extended such that the original duration of the isothermal hold is conducted where ΔT is within ±° C. As a non-limiting example, if the isothermal hold at about 570° C. was originally programmed to have a duration of 4 hours, it may be desirable to hold the glass stack at a ΔT within ±5° C. for a duration of 4 hours (i.e., matching the originally programmed isothermal hold duration). To achieve this, the isothermal hold may have to be extended beyond 4 hours to account for the time that it takes the glass stack to reach a ΔT within +5° C. The amount of time that the isothermal hold is modified may be determined using the data collected in way as shown in FIG. 49 and determining the amount of time it takes for the ΔT of the entire glass stack to be within +5° C. In one or more embodiments, the duration of the isothermal hold during the nucleation stage may be modified by +10%, such as +9%, +8%, +7%, +6%, +5%, +4%, +3%, +2%, or +1%.

Similarly to the above description, FIG. 49 shows that ΔT during the ramp cycle from about 570° C. to about 750° C. exceeds ±5° C. and can reach more than 20° C. in certain glass sheets within the glass stack. However, as was the case at the isothermal hold during the nucleation stage at about 570° C., ΔT returns to within +5° C. after some time at the isothermal hold at about 750° C. during the growth stage. As was the case with the isothermal hold at about 570° C., in embodiments, it may be desirable to maintain the glass stacks at a ΔT within +5° C. for the original program duration of the isothermal hold during the growth stage. Thus, the duration of the growth stage isothermal hold can be modified as described above so that the glass stack is maintained at a ΔT within +5° C. for the originally programmed duration of the growth stage isothermal hold. In one or more embodiments, the duration of the isothermal hold during the growth stage may be modified by +10%, such as +9%, +8%, +7%, +6%, +5%, +4%, +3%, +2%, or +1%.

Figure 50:
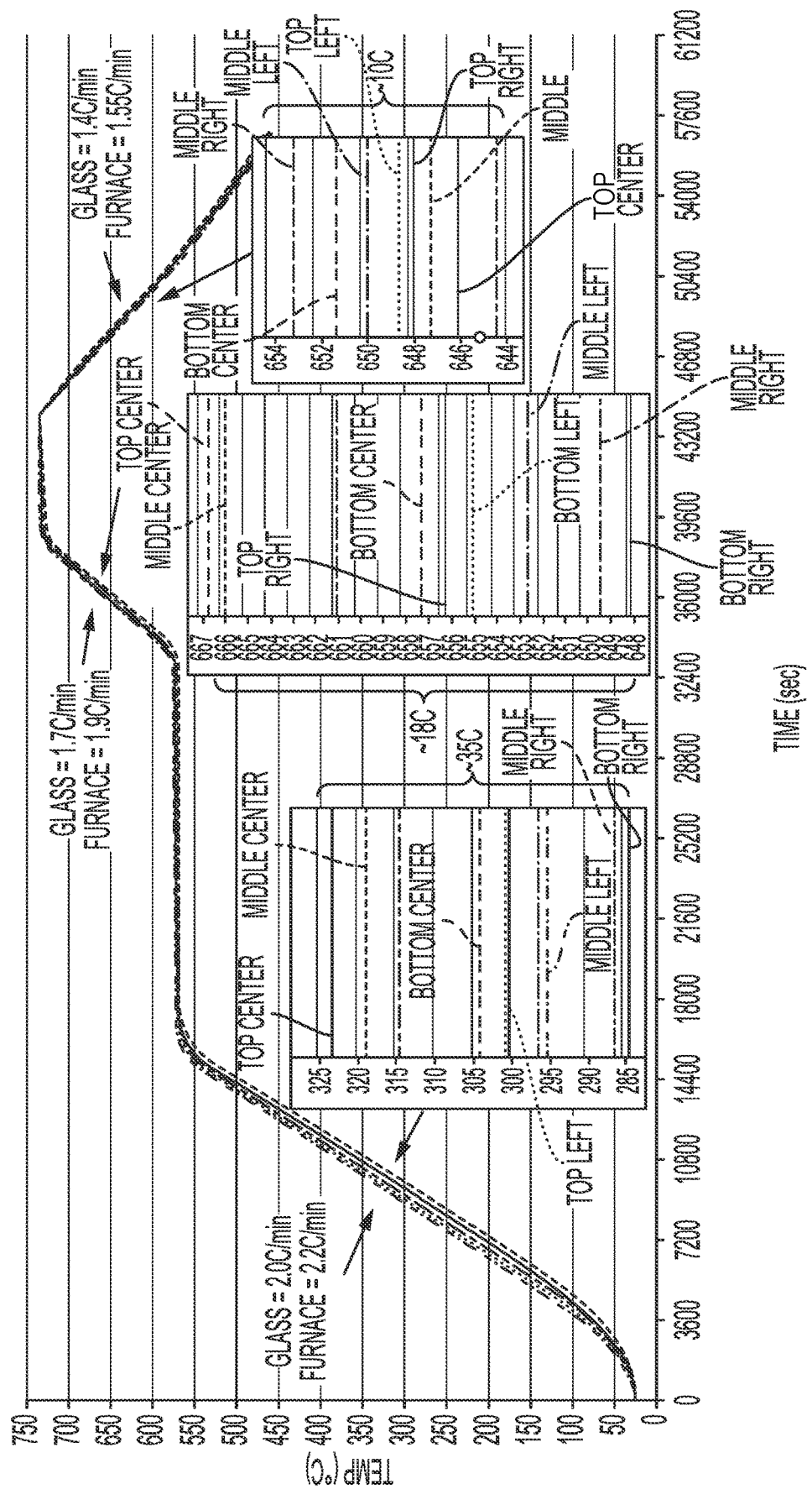
FIG. 50 graphically depicts the temperature of glass sheets in degrees Celsius versus time in seconds with expanded views of various portions of the graph of glass articles cerammed by a ceram cycle according to embodiments disclosed and described herein.

FIG. 50 represents a detailed look at the thermal response of a glass stack according to embodiments. The differences in temperature of individual sheets in the glass stack during various ramping cycles and the cooling cycle are shown in the expanded views within the graph of FIG. 50. This information helps to understand how the glass stack is thermally responding to the heating profile as programmed. Deviations of the measured temperature of the glass sheets from the heating profile as programmed during transition may or may not impact the glass attribute, but it can limit the process if the thermal processing equipment is operating at or near 100% power output to achieve the desired thermal profile. This data can be used to fine tune the thermal profiles to improve or maintain attributes of the final glass-ceramic article.

The temperature profiles within the chamber of the heating apparatus and within the glass stack provide important information that can be used, in various embodiments, to modify the programmed heating profile used during the ceramming cycle. In some embodiments, these modifications to the programmed heating profile will improve the attributes of the final glass-ceramic articles, such as, for example, the warp, bow, haze, clarity, etc. However, in other embodiments, these modifications to the programmed heating cycle may not affect the attributes of the final glass-ceramic article, but may improve the throughput of the ceramming process. However, in other embodiments, it may not be necessary to modify the programmed heating cycle based on the temperature uniformity that is measured. For instance, some end products have very demanding tolerances that require very clear, flat glass articles. For such products, it may be desirable to modify the programmed heating cycle. However, other end products may have broader tolerances for glass clarity, color, flatness, and stress. For such products, it may not be desirable to modify the programmed heating cycle based on the thermal uniformity within the glass stack.

As discussed in detail above, in embodiments, it may be desirable to modify the programmed heating cycle in view of the thermal uniformity data collected. However, it may also be possible to control the thermal uniformity within the glass stack. As mentioned above vertical ΔT, may be controlled by altering the stack configuration, the setter material, the setter configuration (such as inserting interlayers made of the setter material between the top setter and the bottom setter), etc. Another way that the thermal uniformity of within the glass stack can be controlled is by using multistage heating in the ceramming cycle. Slowing the ramp rate during the nucleation and/or growth stages by using multistage heating will result in the glass stacks heating more slowly and, thus, the thermal uniformity of the glass sheets will be increased. An exemplary embodiment of multistage heating is disclosed below.

Figure 51:
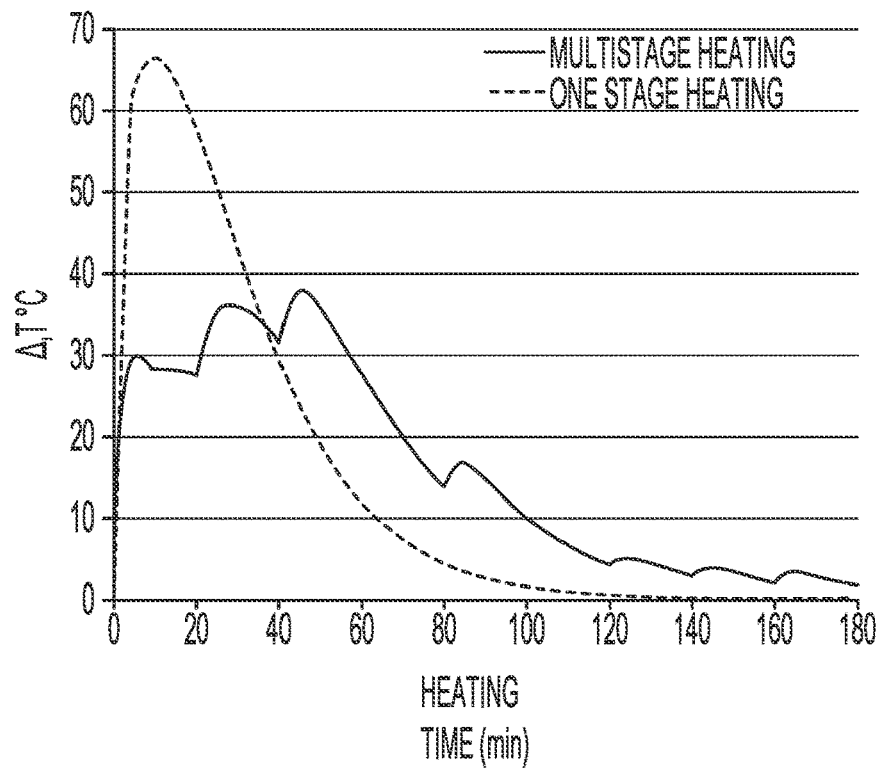
FIG. 51 graphically depicts the effect of multistage heating on the temperature differential of glass sheets in degrees Celsius versus time in minutes according to embodiments disclosed and described herein.

Glass sheet thermal uniformity can be improved by setting the heating sources (e.g., radiation heaters, convection heaters, etc.) at multiple intermediate levels during heating due to heating rate moderation. The effectiveness of this multistage heating operation can be evaluated using full scale Lehr thermal model assuming capacity with 9 stacks and 23 glass sheets in each stack on a single carrier. For heating from room temperature to the nucleation condition, a nine-stage heating scheme is studied, the controlled heater temperature levels in each stage are summarized in Table 5. A significant reduction in the glass sheet temperature variation is shown in FIG. 51 in comparison with single stage heating in which the heater is set to the nucleation temperature of 570° C. With multistage heating, the heating rate is lowered and longer heating time is required to achieve the target nucleation temperature. For the nine-stage heating as mentioned, it takes 180 minutes to reach the nucleation temperature, while single stage heating is conducted for 100 minutes. The multistage heating can be optimized to lower the thermal variation below desirable levels without adding significant amount of heating time.

TABLE 5

| Stage | 1 | 2 | 3 | 4 | 5 | 6 | 7 | 8 | 9 |
|---|---|---|---|---|---|---|---|---|---|
| Multi-stage (° C.) | 400 | 450 | 500 | 500 | 530 | 530 | 540 | 560 | 570 |
| Single Stage (° C.) | | | | | 570 | | | | |

Figure 52:
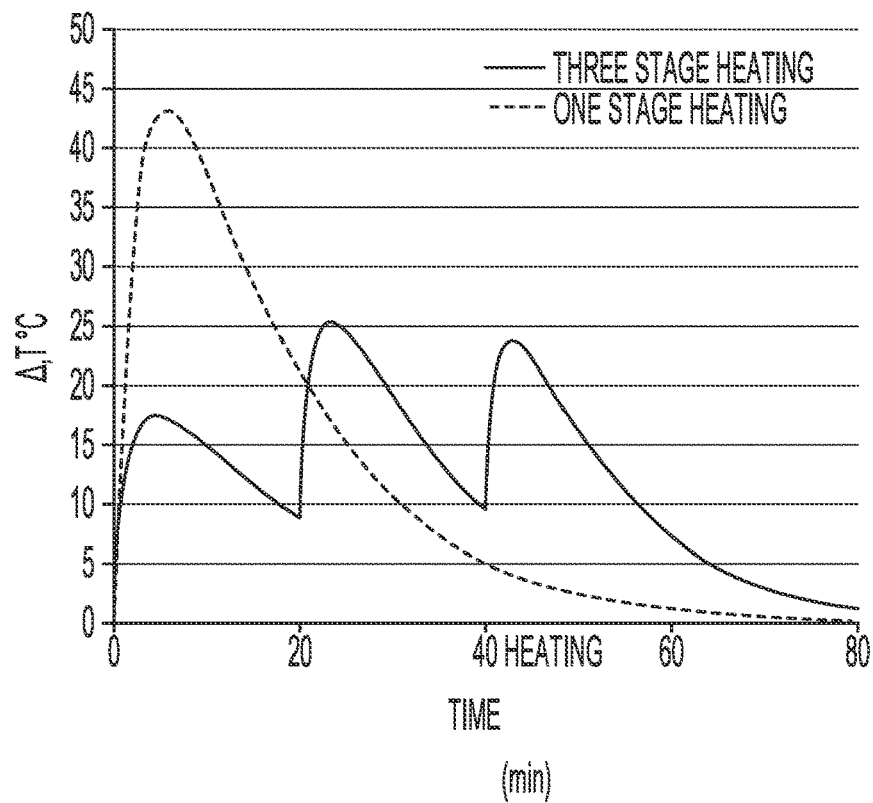
FIG. 52 graphically depicts the effect of multistage heating on the temperature differential of glass sheets in degrees Celsius versus time in minutes according to embodiments disclosed and described herein.

The multistage heater setting can be applied to the growth stage heating as well to reduce the thermal variability on the glass sheets. The same effect is illustrated in FIG. 52, which shows the maximum glass sheet temperature variation is reduced from over 40° C. to about 25° C. with three-stage heater setting. The actual heater temperature settings for the three-stage heating are 620° C., 680° C., and 740° C., while the heater is set to constant level of 740° C. for the single stage heating.

Figure 53:
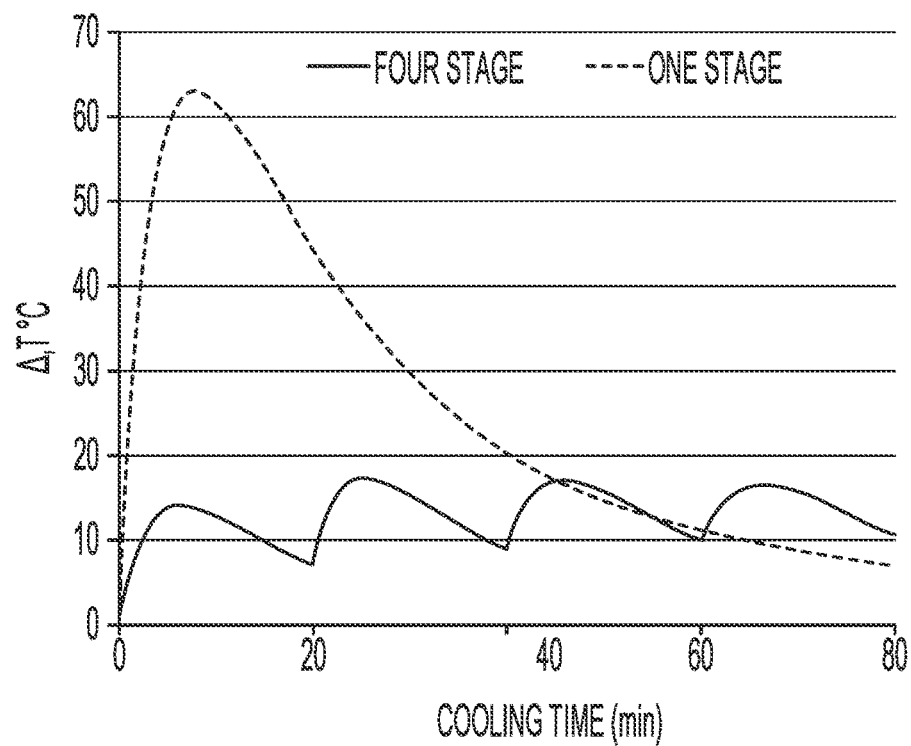
FIG. 53 graphically depicts the effect of multistage heating on the temperature differential of glass sheets in degrees Celsius versus time in minutes according to embodiments disclosed and described herein.

Maintaining thermal variability at low levels during post growth cooling is important, in embodiments, to meet glass-ceramic product stress and warp requirements. By controlling the thermal environment to which the hot glass stacks radiate heat out, the cooling rate can be moderated, which potentially lowers the glass sheet thermal variability. In Lehr operation, this can be implemented by setting the heaters at multiple intermediate levels during the cooling stage. The effectiveness of the multi-staged cooling is evaluated using full scale Lehr thermal model assuming mass production capacity. The significant reduction in the glass sheet temperature variability is achieved as shown in FIG. 53 in comparison with single stage cooling. The multistage cooling is carried out in four stages, and the heaters are controlled at 665° C., 590° C., 515° C. and 440° C., respectively. For the single stage cooling, the heater is set at 300° C. One tradeoff of multistage cooling is the cooling rate is lower, or longer time is required to achieve the target exit temperature. For the four-staged cooling as mentioned, the average cooling rate is 3.3° C., lower than 5.3° C. of the single stage cooling case.

In view of the above disclosure, the thermal uniformity of the glass stacks can be partially controlled by the configuration of the glass stack, the setters, and interlayers. In addition, the thermal uniformity of the glass stack can be partially controlled by the heating cycles used to heat the glass stack to the nucleation and growth temperatures. One or more of these controls may be used in ceramming cycles where tolerances for thermal uniformity are small, such as when it is desirable to control ΔT to be within ±5° C.

Figure 54:
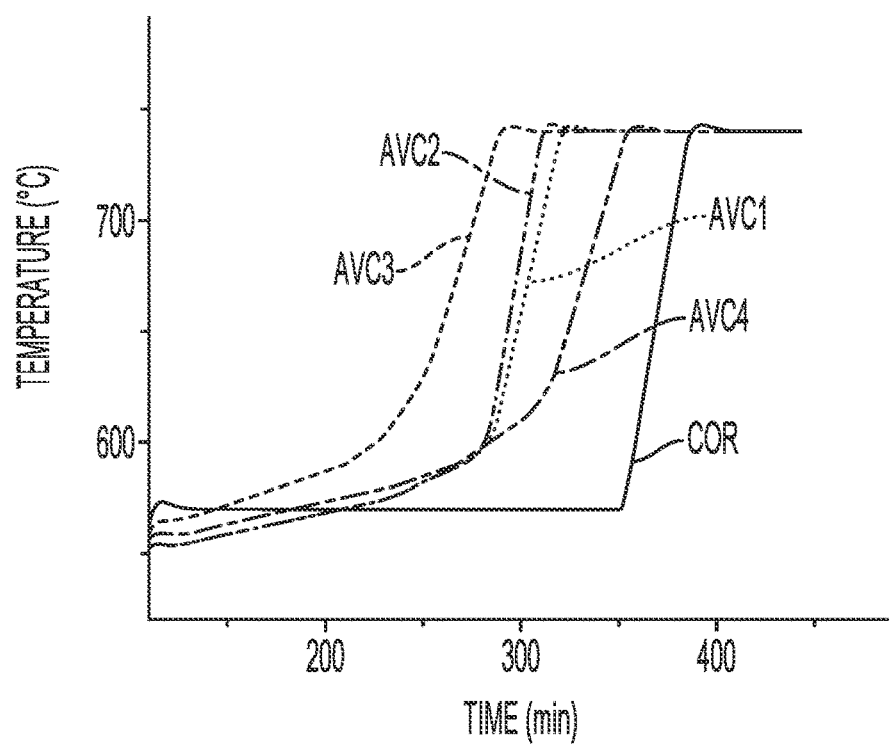
FIG. 54 graphically depicts temperature in degrees Celsius versus time in minutes of ceram cycles according to embodiments disclosed and described herein and conventional ceram cycles.

FIG. 54 shows a conventionally obtained ceramming cycle (labeled as COR) with two isothermal steps and a linear heating rate compared to AVC cycles for various target viscosities. As shown by the overlapping nucleation and growth steps, there is no isothermal step in the AVC method and the temperature increases at a relatively slower rate than the transitioning step. This also helps shorten the total ceramming duration.

Figure 55:
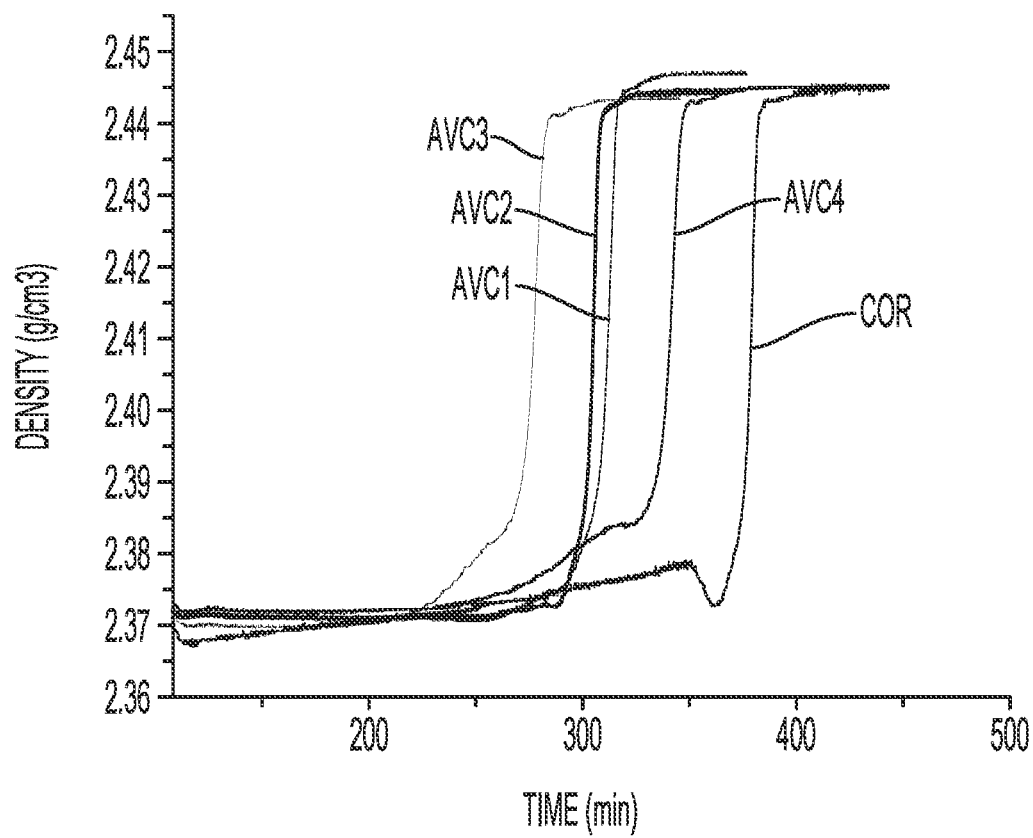
FIG. 55 graphically depicts density in in grams per cubic centimeter versus time in minutes of ceram cycles according to embodiments disclosed and described herein and conventional ceram cycles.

FIG. 55 shows the evolution of density for the same conventional COR cycle and AVC cycles as shown in FIG. 54. As expected the density stays constant during the nucleation step, so minimum deformation/flow gradient is observed until the crystals start to grow. Then, the transition follows a smoother trend unlike the conventional method where an inevitable non-monotonic behavior is observed with a sudden drop in density.

Properties of Glass Ceramic Articles

Figure 56:
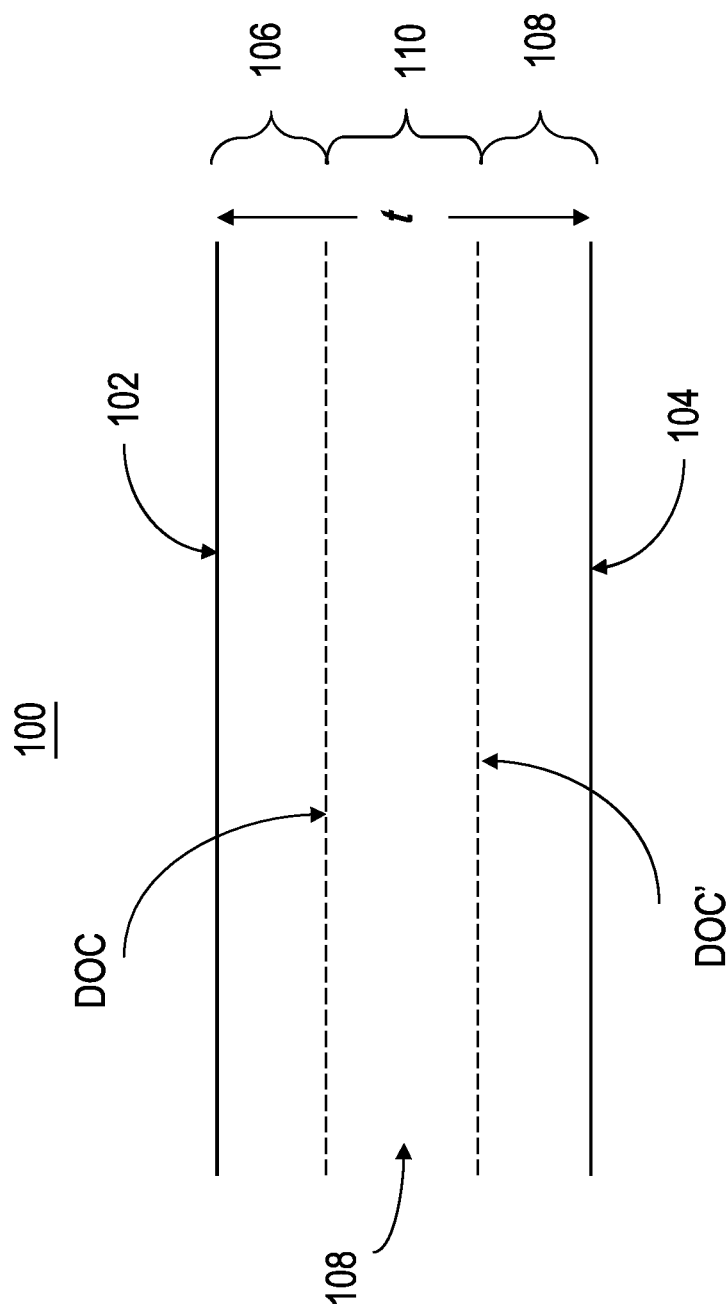
FIG. 56 is an exemplary cross-sectional view of a strengthened glass-ceramic article according to embodiments disclosed and described herein.

In embodiments, glass ceramic articles may be strengthened to have a compressive stress layer on one or more surface thereof. With reference now to FIG. 56, an exemplary cross-sectional side view of a strengthened glass-ceramic article 100 is depicted having a first surface 102 and an opposing second surface 104 separated by a thickness (t). In embodiments, strengthened glass-ceramic article 100 has been ion exchanged and has a compressive stress (CS) layer 106 (or first region) extending from first surface 102 to a depth of compression (DOC). In some embodiments, as shown in FIG. 56. 1, the glass-ceramic article 100 also has a compressive stress (CS) layer 108 extending from second surface 104 to a depth of compression DOC'. There is also a central tension region 110 under tensile stress in between DOC and DOC'. In some embodiments, DOC and DOC' may be in a range from greater than 0*t to 0.3*t, 0*t to 0.25*t, 0*t to 0.2*t, 0*t to 0.15*t, 0*t to 0.1*t. 0*t to 0.05*t. 0.05*t to 0.3*t, 0.05*t to 0.25*t, 0.05*t to 0.2*t, 0.05*t to 0.15*t, 0.05*t to 0.1*t, 0.1*t to 0.3*t, 0.1*t to 0.25*t, 0.1*t to 0.2*t, 0.1*t to 0.15*t, and all ranges and subranges there between wherein t is the thickness of the glass ceramic article 100. For example, the depth of a compressive stress layer (DOC, DOC') can be greater than 0.05*t, 0.06*t, 0.07*t, 0.08*t, 0.09*t, 0.1*t, 0.11*t, 0.12*t, 0.13*t, 0.14*t, 0.15*t, 0.16*t, 0.17*t, 0.18*t, 0.19*t, 0.2*t, 0.21*t, 0.22*t, 0.23*t, 0.24*t, 0.25*t, 0.26*t, 0.27*t, 0.28*t, 0.29*t, or 0.3*t. In other embodiments, the depth of a compressive stress layer (DOC, DOC') is in a range from 0.05 mm to 0.6 mm, 0.05 mm to 0.5 mm, 0.05 mm to 0.4 mm, 0.05 mm to 0.3 mm, 0.05 mm to 0.2 mm, 0.05 mm to 0.1 mm, 0.1 mm to 0.6 mm, 0.1 mm to 0.5 mm, 0.1 mm to 0.4 mm, 0.1 mm to 0.3 mm, 0.2 mm to 0.6 mm, 0.2 mm to 0.5 mm, 0.2 mm to 0.4 mm, and all ranges and subranges there between. In some embodiments the depth of the compressive stress layer is greater than or equal to 0.05 mm, 0.06 mm, 0.07 mm, 0.08 mm. 0.09 mm, 0.1 mm. 0.15 mm, 0.2 mm, 0.25 mm, 0.3 mm, 0.35 mm, 0.4 mm. 0.45 mm, 0.5 mm, 0.55 mm or 0.6 mm. In some embodiments DOC may be the same as DOC'. In other embodiments, DOC may be different than DOC'.

In embodiments, the glass ceramic articles may have a compressive stress (CS) of greater than 175 MPa, such as greater than 180 MPa, greater than 185 MPa, greater than 190 MPa, greater than 195 MPa, greater than 200 MPa, greater than 205 MPa, greater than 210 MPa, greater than 215 MPa, greater than 220 MPa, greater than 225 MPa, greater than 230 MPa, greater than 235 MPa, greater than 240 MPa, greater than 245 MPa, or greater than 250 MPa. In embodiments, the glass ceramic articles may have a CS from 175 MPa to 250 MPa, such as from 180 MPa to 250 MPa, from 185 MPa to 250 MPa, from 190 MPa to 250 MPa, from 195 MPa to 250 MPa, from 200 MPa to 250 MPa, from 205 MPa to 250 MPa, from 210 MPa to 250 MPa, from 215 MPa to 250 MPa, from 220 MPa to 250 MPa, from 225 MPa to 250 MPa, from 230 MPa to 250 MPa, from 235 MPa to 250 MPa, from 240 MPa to 250 MPa, or from 245 MPa to 250 MPa. In embodiments, the glass ceramic articles may have a CS from 175 MPa to 250 MPa, such as from 200 MPa to 250 MPa, from 200 MPa to 245 MPa, from 200 MPa to 240 MPa, from 200 MPa to 235 MPa, from 200 MPa to 230 MPa, from 200 MPa to 225 MPa, from 200 MPa to 220 MPa, from 200 MPa to 215 MPa, from 200 MPa to 210 MPa, or from 200 MPa to 205 MPa.

In some embodiments, the maximum central tension (CT) is in a range from greater than 80 MPa to 180 MPa. In some embodiments, the maximum CT is greater than or equal to 80 MPa, 90 MPa, 100 MPa, 110 MPa, 120 MPa, 130 MPa, 140 MPa, 150 MPa, 160 MPa, or 170 MPa. In some embodiments, the maximum CT can be in a range from greater than 80 MPa to 180 MPa, greater than 80 MPa to 170 MPa, greater than 80 MPa to 160 MPa, greater than 80 MPa to 150 MPa, greater than 80 MPa to 140 MPa, 100 MPa to 180 MPa, 100 MPa to 170 MPa, 100 MPa to 160 MPa, 100 MPa to 150 MPa, 100 MPa to 140 MPa, 110 MPa to 180 MPa, 110 MPa to 170 MPa, 110 MPa to 160 MPa, 110 MPa to 150 MPa, 110 MPa to 140 MPa, 120 MPa to 180 MPa, 120 MPa to 170 MPa, 120 MPa to 160 MPa, 120 MPa to 150 MPa, 120 MPa to 140 MPa, 130 MPa to 180 MPa, 130 MPa to 170 MPa, 130 MPa to 1500 MPa or any range and subranges there between.

In some embodiments, the stored tensile energy of the glass-ceramic article is in a range from greater than 22 J/m$^2$ to 60 J/m$^2$, greater than 22 J/m$^2$ to 55 J/m$^2$, greater than 22 J/m$^2$ to 50 J/m$^2$, greater than 22 J/m$^2$ to 45 J/m$^2$, greater than 22 J/m$^2$ to 40 J/m$^2$, greater than 22 J/m$^2$ to 35 J/m$^2$, greater than 22 J/m$^2$ to 30 J/m$^2$, 25 J/m$^2$ to 60 J/m$^2$, 25 J/m$^2$ to 55 J/m$^2$, 25 J/m$^2$ to 50 J/m$^2$, 25 J/m$^2$ to 45 J/m$^2$, 25 J/m$^2$ to 40 J/m$^2$, 25 J/m$^2$ to 35 J/m$^2$, 25 J/m$^2$ to 30 J/m$^2$, 30 J/m$^2$ to 60 J/m$^2$, 30 J/m$^2$ to 55 J/m$^2$, 30 J/m$^2$ to 50 J/m$^2$, 30 J/m$^2$ to 45 J/m$^2$, 30 J/m$^2$ to 40 J/m$^2$, 30 J/m$^2$ to 35 J/m$^2$, 35 J/m$^2$ to 60 J/m$^2$, 35 J/m$^2$ to 55 J/m$^2$, 35 J/m$^2$ to 50 J/m$^2$, 35 J/m$^2$ to 45 J/m$^2$, 35 J/m$^2$ to 40 J/m$^2$, 40 J/m$^2$ to 60 J/m$^2$, 40 J/m$^2$ to 55 J/m$^2$, 40 J/m$^2$ to 50 J/m$^2$, 40 J/m$^2$ to 45 J/m$^2$, 45 J/m$^2$ to 60 J/m$^2$, 45 J/m$^2$ to 55 J/m$^2$, 45 J/m$^2$ to 50 J/m$^2$, and all ranges and subranges there between. In some embodiments, the stored tensile energy can be greater than or equal to 22 J/m$^2$, 23 J/m$^2$, 24 J/m$^2$, 25 J/m$^2$, 30 J/m$^2$, 35 J/m$^2$, 40 J/m$^2$, 45 J/m$^2$, 50 J/m$^2$, or 55 J/m$^2$.

In some embodiments, the glass-ceramic article has a thickness t in a range from 0.2 mm to 4 mm, 0.2 mm to 3 mm, 0.2 mm to 2 mm, 0.2 mm to 1.5 mm, 0.2 mm to 1 mm, 0.2 mm to 0.9 mm, 0.2 mm to 0.8 mm, 0.2 mm to 0.7 mm, 0.2 mm to 0.6 mm, 0.2 mm to 0.5 mm, 0.3 mm to 4 mm, 0.3 mm to 3 mm, 0.3 mm to 2 mm, 0.3 mm to 1.5 mm, 0.3 mm to 1 mm, 0.3 mm to 0.9 mm, 0.3 mm to 0.8 mm, 0.3 mm to 0.7 mm, 0.3 mm to 0.6 mm, 0.3 mm to 0.5 mm, 0.4 mm to 4 mm, 0.4 mm to 3 mm, 0.4 mm to 2 mm, 0.4 mm to 1.5 mm, 0.4 mm to 1 mm, 0.4 mm to 0.9 mm, 0.4 mm to 0.8 mm, 0.4 mm to 0.7 mm, 0.4 mm to 0.6 mm, 0.5 mm to 4 mm, 0.5 mm to 3 mm, 0.5 mm to 2 mm, 0.5 mm to 1.5 mm, 0.5 mm to 1 mm, 0.5 mm to 0.9 mm, 0.5 mm to 0.8 mm, 0.5 mm to 0.7 mm, 0.8 mm to 4 mm, 0.8 mm to 3 mm, 0.8 mm to 2 mm, 0.8 mm to 1.5 mm, 0.8 mm to 1 mm, 1 mm to 2 mm, 1 mm to 1.5 mm, and all ranges and subranges there between. In some embodiments, the glass-ceramic article may be substantially planar and flat. In other embodiments, the glass-ceramic article may be shaped, for example it may have a 2.5D or 3D shape. In some embodiments, the glass-ceramic article may have a uniform thickness and in other embodiments, the glass-ceramic article may not have a uniform thickness.

In some embodiments, the fracture toughness of the glass-ceramic article is in a range from 1.0 MPa$\sqrt{m}$ to 2.0 MPa$\sqrt{m}$, 1.1 MPa$\sqrt{m}$ to 2.0 MPa$\sqrt{m}$, 1.2 MPa$\sqrt{m}$ to 2.0 MPa$\sqrt{m}$, 1.3 MPa$\sqrt{m}$ to 2.0 MPa$\sqrt{m}$, 1.4 MPa$\sqrt{m}$ to 2.0 MPa$\sqrt{m}$, 1.5 MPa$\sqrt{m}$ to 2.0 MPa$\sqrt{m}$, 1.0 MPa$\sqrt{m}$ to 1.9 MPa$\sqrt{m}$, 1.1 MPa$\sqrt{m}$ to 1.9 MPa$\sqrt{m}$, 1.2 MPa$\sqrt{m}$ to 1.9 MPa$\sqrt{m}$, 1.3 MPa$\sqrt{m}$ to 1.9 MPa$\sqrt{m}$, 1.4 MPa$\sqrt{m}$ to 1.9 MPa$\sqrt{m}$, 1.5 MPa$\sqrt{m}$ to 1.9 MPa$\sqrt{m}$, 1.0 MPa$\sqrt{m}$ to 1.8 MPa$\sqrt{m}$, 1.1 MPa$\sqrt{m}$ to 1.8 MPa$\sqrt{m}$, 1.2 MPa$\sqrt{m}$ to 1.8 MPa$\sqrt{m}$, 1.3 MPa$\sqrt{m}$ to 1.8 MPa$\sqrt{m}$, 1.4 MPa$\sqrt{m}$ to 1.8 MPa$\sqrt{m}$, 1.5 MPa$\sqrt{m}$ to 1.8 MPa$\sqrt{m}$, and all ranges and subranges there between. In some embodiments, the fracture toughness of the glass-ceramic article is greater than or equal to 1.0 MPa$\sqrt{m}$, 1.1 MPa$\sqrt{m}$, 1.2 MPa$\sqrt{m}$, 1.3 MPa$\sqrt{m}$, 1.4 MPa$\sqrt{m}$, 1.5 MPa$\sqrt{m}$, 1.6 MPa$\sqrt{m}$, 1.7 MPa$\sqrt{m}$, 1.8 MPa$\sqrt{m}$, or 1.9 MPa$\sqrt{m}$.

In some embodiments, the Young's modulus of the glass-ceramic article is in a range from 95 GPa to 110 GPa, 95 GPa to 105 GPa, 95 GPa to 100 GPa, 100 GPa to 110 GPa, 100 GPa to 105 GPa, 105 GPa to 110 GPa and all ranges and subranges there between. In some embodiments, the Young's modulus of the glass-ceramic article is greater than or equal to 95 GPa, 96 GPa, 97 GPa, 98 GPa, 99 GPa, 100 GPa, 101 GPa, 102 GPa, 103 GPa, 104 GPa, 105 GPa, 106 GPa, 107 GPa, 108 GPa, or 109 GPa.

In some embodiments, upon application of the Fragment Test (based on a 50 mm by 50 mm by 0.8 mm sample) described above, the glass-ceramic article breaks into less than 5 fragments, less than 4 fragments, or less than 3 fragments.

In some embodiments, the glass-ceramic article is capable of being chemically strengthened using one or more ion exchange techniques. In these embodiments, ion exchange can occur by subjecting one or more surfaces of such glass-ceramic article to one or more ion exchange mediums (for example molten salt baths), having a specific composition and temperature, for a specified time period to impart to the one or more surfaces with compressive stress layer(s). In some embodiments, the ion exchange medium is a molten bath containing an ion (for example an alkali metal ion) that is larger than an ion (for example an alkali metal ion) present in the glass-ceramic article wherein the larger ion from the molten bath is exchanged with the smaller ion in the glass-ceramic article to impart a compressive stress in the glass-ceramic article, and thereby increases the strength of the glass-ceramic article.

In some embodiments, a one step ion exchange process can be used and in other embodiments, a multi step ion exchange process can be used. In some embodiments, for both one step and multi step ion exchange processes the ion exchange mediums (for example, molten baths) can include 100 wt % of a sodium-containing salt (for example, NaNO₃) or can include a mixed salt bath, for example a combination of a sodium-containing salt (for example, NaNO₃) and a potassium-containing salt (for example KNO₃). In some embodiments, when the molten salt bath contains a sodium-containing salt (for example, NaNO₃) in a range from 3 wt % to 100 wt %, 3 wt % to 95 wt %, 3 wt % to 90 wt %, 3 wt % to 85 wt %, 3 wt % to 80 wt %, 3 wt % to 75 wt %, 5 wt % to 100 wt %, 5 wt % to 95 wt %, 5 wt % to 90 wt %, 5 wt % to 85 wt %, 5 wt % to 80 wt %, 5 wt % to 75 wt %, 10 wt % to 100 wt %, 10 wt % to 95 wt %, 10 wt % to 90 wt %, 10 wt % to 85 wt %, 10 wt % to 80 wt %, 10 wt % to 75 wt %, 20 wt % to 100 wt %, 20 wt % to 95 wt %, 20 wt % to 90 wt %, 20 wt % to 85 wt %, 20 wt % to 80 wt %, 20 wt % to 75 wt %, 30 wt % to 100 wt %, 30 wt % to 95 wt %, 30 wt % to 90 wt %, 30 wt % to 85 wt %, 30 wt % to 80 wt %, 30 wt % to 75 wt %, and all ranges and subranges there between. In some embodiments, other sodium and potassium salts may be used in the ion exchange solution, such as, for example sodium or potassium nitrites, phosphates, or sulfates.

After an ion exchange process is performed, it should be understood that a composition at the surface of the glass-ceramic may be different than the composition of the as-formed glass-ceramic (i.e., the glass-ceramic before it undergoes an ion exchange process). This results from one type of alkali metal ion in the as-formed glass-ceramic, such as, for example Li⁺ or Na⁺, being replaced with larger alkali metal ions, such as, for example Na⁺ or K⁺, respectively. However, the composition of the glass-ceramic at or near the center of the depth of the glass-ceramic article will, in embodiments, still have the composition of the as-formed glass-ceramic.

In embodiments, the warp of the glass ceramic article may be measured as a function of the diagonal measurement of a glass ceramic article for which warp is to be determined. The diagonal is measured on a surface of the glass ceramic article having the greatest surface area. For example, if a glass ceramic article has an essentially rectangular shape (e.g., rectangular with rounded corners or the like), the diagonal referred to in the warp measurement will be measured as a diagonal of the essentially rectangular surface. As another example, if the glass article has a circular surface, the diagonal is the diameter of the circle. As a further example, if the glass article has an oval-shaped surface, the diagonal is the longest straight line that can be drawn from one point on the circumference of the oval-shaped surface to another point on the oval-shaped surface. Accordingly, in embodiments using the ceramming cycles, glass precursor compositions, setter configurations, and stack configurations disclosed and described herein, the glass ceramic articles formed may have a warp that meets the following:

$$\text{Warp } (\mu m) < (3.65 \times 10^{-9} / \mu m \times \text{diagonal}^2).$$

It should be understood that the units for the warp value will be based on the units in which the diagonal is measured, such as μm.

Coinciding with the above measurement of warp based on the diagonal of the glass ceramic article, in embodiments, by using the ceramming cycles, glass precursor compositions, setter configurations, and stack configurations disclosed and described herein, the glass ceramic articles formed may have a warp measured on 156 mm×76 mm sheets of less than 110 μm, such as less than 105 μm, less than 100 μm, less than 95 μm, less than 90 μm, less than 85 μm, less than 80 μm, less than 75 μm, less than 70 μm, less than 65 μm, less than 60 μm, less than 55 μm, or less than 50 μm. In embodiments, the glass ceramic articles formed may have a warp on 156 mm×76 mm sheets from 45 μm to 100 μm, such as from 50 μm to 100 μm, from 55 μm to 100 μm, from 60 μm to 100 μm, from 65 μm to 100 μm, from 70 μm to 100 μm, from 75 μm to 100 μm, from 80 μm to 100 μm, from 85 μm to 100 μm, from 50 μm to 90 μm, or from 95 μm to 100 μm. In embodiments, the glass ceramic articles formed may have a warp on 156 mm×76 mm sheets from 45 μm to 95 μm, such as from 45 μm to 90 μm, from 45 μm to 85 μm, from 45 μm to 80 μm, from 45 μm to 75 μm, from 45 μm to 70 μm, from 45 μm to 65 μm, from 45 μm to 60 μm, from 45 μm to 55 μm, or from 45 μm to 50 μm.

In embodiments, by using the ceramming cycles, glass precursor compositions, setter configurations, and stack configurations disclosed and described herein, the glass ceramic articles formed may have stress of less than 30 nm of retardation per mm of sheet thickness, such as less than 28 nm of retardation per mm of sheet thickness, less than 26 nm of retardation per mm of sheet thickness, less than 25 nm of retardation per mm of sheet thickness, less than 24 nm of retardation per mm of sheet thickness, less than 22 nm of retardation per mm of sheet thickness, less than 20 nm of retardation per mm of sheet thickness, less than 18 nm of retardation per mm of sheet thickness, less than 16 nm of retardation per mm of sheet thickness, or less than 15 nm of retardation per mm of sheet thickness. In embodiments, the glass ceramic articles formed may have a stress from 15 nm to 30 nm of retardation per mm of sheet thickness, such as from 18 nm to 30 nm of retardation per mm of sheet thickness, from 20 nm to 30 nm of retardation per mm of sheet thickness, from 22 nm to 30 nm of retardation per mm of sheet thickness, from 24 nm to 30 nm of retardation per mm of sheet thickness, or from 28 nm to 30 nm of retardation per mm of sheet thickness. In embodiments, the glass ceramic articles formed may have a stress from 15 nm to 25 nm of retardation per mm of sheet thickness, from 18 nm to 25 nm of retardation per mm of sheet thickness, from 20 nm to 25 nm of retardation per mm of sheet thickness, or from 22 nm to 25 nm of retardation per mm of sheet thickness.

In embodiments, by using the ceramming cycles, glass precursor compositions, setter configurations, and stack configurations disclosed and described herein, the glass ceramic articles formed may have a haze that meets the following equation:

$$\text{haze } (\%) < 0.0994t + 0.12.$$

In the above equation, t is the thickness (mm) of the glass ceramic article.

Figure 89:
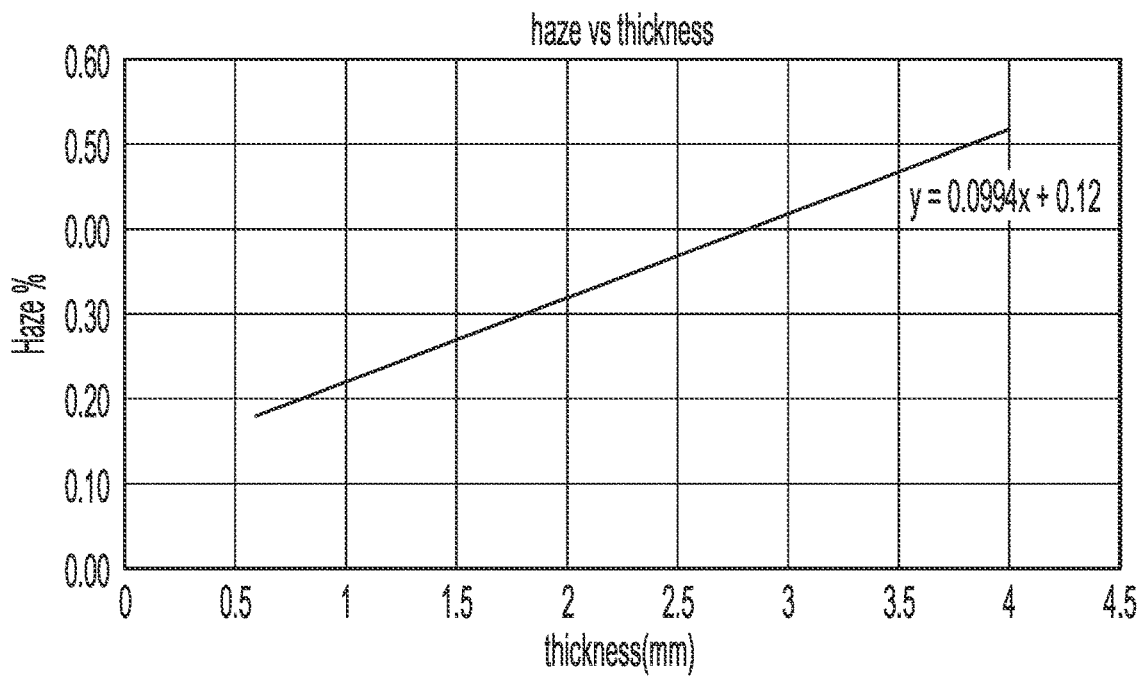
FIG. 89 graphically depicts haze of glass sheets according to embodiments disclosed and described herein.

The equation above was determined experimentally as shown in FIG. 89. According to embodiments, by using the ceramming cycles, glass precursor compositions, setter configurations, and stack configurations disclosed and described herein, the glass ceramic articles formed may have a haze of less than 0.30 at 0.8 mm thickness, such as less than 0.28 at 0.8 mm thickness, less than 0.26 at 0.8 mm thickness, less than 0.24 at 0.8 mm thickness, less than 0.22 at 0.8 mm thickness, less than 0.20 at 0.8 mm thickness, less than 0.18 at 0.8 mm thickness, less than 0.16 at 0.8 mm thickness, less than 0.14 at 0.8 mm thickness, less than 0.12 at 0.8 mm thickness, or less than 0.10 at 0.8 mm thickness. In embodiments, glass ceramic articles formed may have a haze from 0.10 to 0.28 at 0.8 mm thickness, such as from 0.10 to 0.26 at 0.8 mm thickness, from 0.10 to 0.24 at 0.8 mm thickness, from 0.10 to 0.22 at 0.8 mm thickness, from 0.10 to 0.20 at 0.8 mm thickness, from 0.10 to 0.18 at 0.8 mm thickness, from 0.10 to 0.16 at 0.8 mm thickness, from 0.10 to 0.14 at 0.8 mm thickness, or from 0.10 to 0.12 at 0.8 mm thickness. In embodiments, glass ceramic articles formed may have a haze from 0.10 to 0.20 at 0.8 mm thickness. The haze of glass ceramic articles is measured on the glass ceramic article itself without coatings or other alterations.

In embodiments, by using the ceramming cycles, glass precursor compositions, setter configurations, and stack configurations disclosed and described herein, the glass ceramic articles formed may have a haze that meets the following equation:

$$\text{transmission (\%)} > 0.91 \times 10^{(2-0.03t)}.$$

In the above equation, t is the thickness (in mm) of the glass ceramic article.

According to embodiments, by using the ceramming cycles, glass precursor compositions, setter configurations, and stack configurations disclosed and described herein, the glass ceramic articles formed may have an optical transmission of electromagnetic radiation wavelengths from 450 nm to 800 nm measured at a thickness of 0.8 mm of greater than 85%, greater than 88%, greater than 90%, greater than 93%, greater than 95%, or greater than 98%. In embodiments, glass ceramic articles formed may have an optical transmission of electromagnetic radiation wavelengths from 450 nm to 800 nm measured at a thickness of 0.8 mm of from greater than 75% to 95%, such as from greater than 75% to 93%, from greater than 75% to 90%, from greater than 75% to 88%, from greater than 75% to 85%, from greater than 75% to 83%, from greater than 75% to 80%, or from greater than 75% to 78%. As discussed previously herein, the transmission of glass ceramic articles is measured on the glass ceramic article itself without coatings or other alterations. In addition, the transmission percentage disclosed herein is the percent of transmission of electromagnetic radiation at each wavelength of electromagnetic radiation within the range of 450 nm to 800 nm.

In embodiments, by using the ceramming cycles, glass precursor compositions, setter configurations, and stack configurations disclosed and described herein, the glass ceramic articles formed may have a hardness measured by a Vickers indenter at a 200 gram load of greater than 680 kgf, such as greater than 685 kgf, greater than 690 kgf, greater than 695 kgf, greater than 700 kgf, greater than 705 kgf, greater than 710 kgf, greater than 715 kgf, greater than 720 kgf, greater than 725 kgf, greater than 730 kgf, greater than 735 kgf, greater than 740 kgf, greater than 745 kgf, or greater than 750 kgf. In embodiments, the glass ceramic articles formed may have a hardness measured by a Vickers indenter at a 200 gram load of from greater than 680 kgf to 750 kgf, such as from 685 kgf to 750 kgf, from 690 kgf to 750 kgf, from 695 kgf to 750 kgf, from 700 kgf to 750 kgf, from 705 kgf to 750 kgf, from 710 kgf to 750 kgf, from 715 kgf to 750 kgf, from 720 kgf to 750 kgf, from 720 kgf to 750 kgf, from 725 kgf to 750 kgf, from 730 kgf to 750 kgf, from 735 kgf to 750 kgf, from 740 kgf to 750 kgf, or from 745 kgf to 750 kgf.

End Products

Figure 57B:
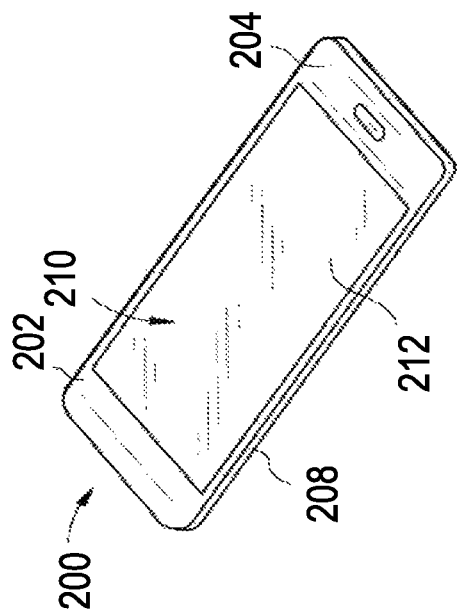
FIG. 57B is a perspective view of the exemplary electronic device according to embodiments disclosed and described herein.
Figure 57A:
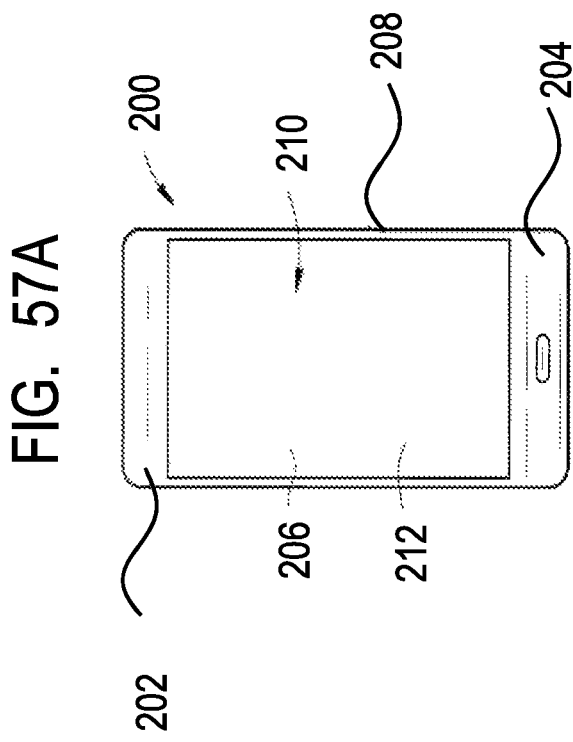
FIG. 57A is a plan view of an exemplary electronic device incorporating any of the glass-ceramic articles according to embodiments disclosed and described herein.

The glass-ceramic articles disclosed herein may be incorporated into another article such as an article with a display (or display articles) (e.g., consumer electronics, including mobile phones, tablets, computers, navigation systems, wearable devices (e.g., watches) and the like), architectural articles, transportation articles (e.g., automotive, trains, aircraft, sea craft, etc. for example for use an interior display cover, a window, or windshield), appliance articles, or any article that requires some transparency, scratch-resistance, abrasion resistance or a combination thereof. An exemplary article incorporating any of the strengthened glass-ceramic articles disclosed herein is shown in FIGS. 57A and 57B. Specifically, FIGS. 57A and 27B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. In some embodiments, at least one of the cover substrate 212 or a portion of housing 202 may include any of the glass-ceramic strengthened articles disclosed herein.

Accordingly, various embodiments described herein may be employed to produce glass ceramic articles having excellent optical quality and reduced warp while not adversely impacting, or even improving, stress in the glass ceramic articles as compared to glass articles cerammed according to conventional techniques. Such glass ceramic articles may be particularly well-suited for use in portable electronic devices due to their strength performance and high transmission values.

EXAMPLES

Various embodiments will be further clarified by the following examples.

Example 1

Figure 58:
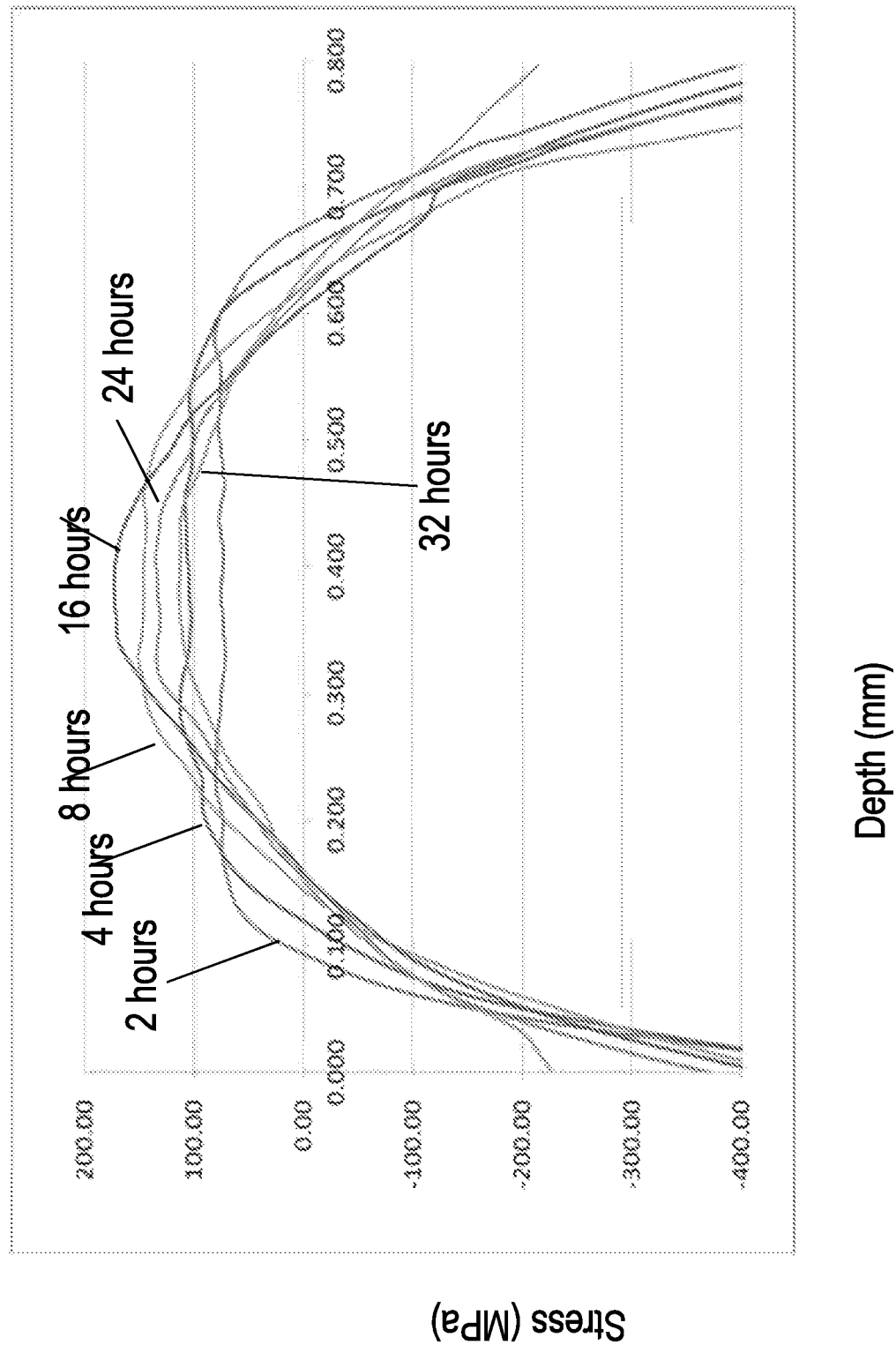
FIG. 58 is a plot of the stress profiles from Example 1.

Precursor glass samples having a thickness of 0.8 mm were formed having a composition of composition 3 listed in Table 3 above. The samples were heated from room temperature to approximately 560° C. at a heating rate of 5° C./min and held for 4 hours. Then the samples were heated to 730° C. at a heating rate of 5° C./min and held for 1 hour and a glass-ceramic article was formed. The glass-ceramic samples were then ion exchanged in a molten salt bath containing 95 wt % NaNO$_3$ and 5 wt % KNO$_3$ at 470° C. A first sample was ion exchanged for 2 hours, a second sample was ion exchanged for 4 hours, a third sample was ion exchanged for 7 hours, a fourth sample was ion exchanged for 16 hours, and a fifth sample was ion exchanged from 24 hours. The stress profiles for each of the samples is shown in FIG. 58 with the CT being shown a positive stress and the CS being shown as negative stress. The sample ion exchanged for 16 hours had a max CT about 135 MPa, a stored tensile stress of about 37 J/m$^2$ and broke into 2 fragments when subjected to the Fragment Test.

Example 2

Precursor glass samples having a thickness of 0.8 mm were formed having a composition of composition 3 listed in Table 3 and comparative composition 1 listed in Table 6 below.

TABLE 6

| Composition | Comparative Composition 1 |
|---|---|
| SiO$_2$ (mol %) | 70.30 |
| Al$_2$O$_3$ (mol %) | 4.23 |
| B$_2$O$_3$ (mol %) | 0 |
| Li$_2$O (mol %) | 21.36 |
| Na$_2$O (mol %) | 1.51 |
| K$_2$O (mol %) | 0 |

TABLE 6-continued

| Composition | Comparative Composition 1 |
|---|---|
| $P_2O_5$ (mol %) | 0.87 |
| $ZrO_2$ (mol %) | 1.66 |
| $Li_2O/R_2O$ | 0.93 |

Figure 59:
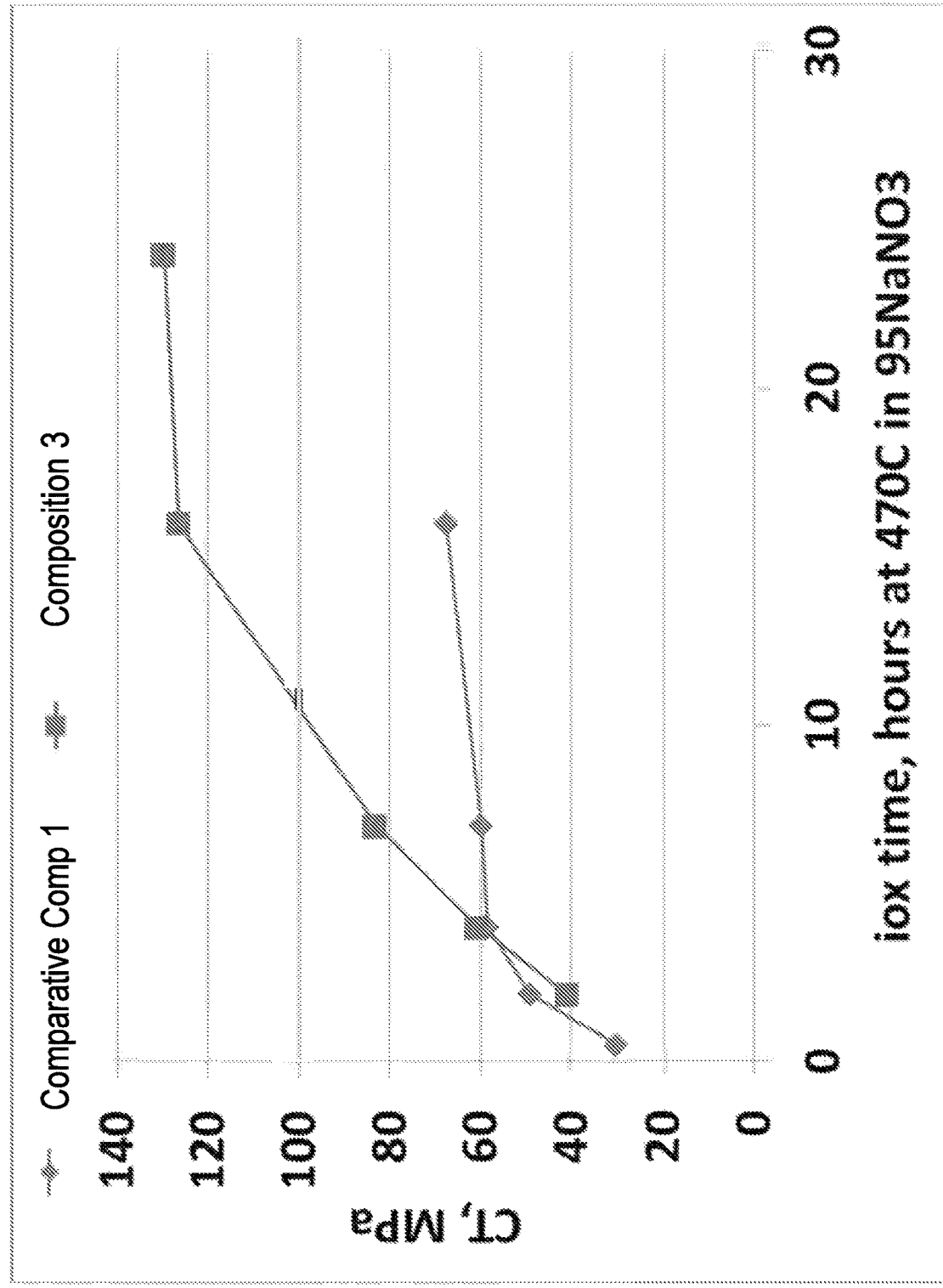
FIG. 59 is a plot of the central tension over increasing ion exchange durations from Example 2.

The glass samples were then heated from room temperature to approximately 560° C. at a heating rate of 5° C./min and held for 4 hours. Then the samples were heated to 730° C. at a heating rate of 5° C./min and held for 1 hour and a glass-ceramic article was formed. The glass-ceramic samples were then ion exchanged in a molten salt bath containing 95 wt % $NaNO_3$ and 5 wt % $KNO_3$ at 470° C. A first set samples was ion exchanged for 2 hours, a second set of samples was ion exchanged for 4 hours, a third set of samples was ion exchanged for 7 hours, a fourth set of samples was ion exchanged for 16 hours, and a fifth sample (for composition 3 only) was ion exchanged from 24 hours. FIG. 59 is a plot showing the maximum CT of each sample on the y axis vs the ion exchange time on the x axis. The glass-ceramic articles made from composition 3 achieved a maximum CT of approximately 135 MPa, whereas the glass-ceramic articles made from comparative composition 1 did not achieve the desired maximum CT of greater than 90 MPa (it reached about 70 MPa). Without being bound by theory, it is believed that the higher mol % of $ZrO_2$ in composition 3 allowed the glass-ceramic made from composition 3 to achieve a higher CT. Without being bound by theory, it is believed that a $ZrO_2$ concentration of 1.7 mol % or greater results in an ion-exchanged glass-ceramic article with a maximum CT of greater than 90 MPa and a stored tensile energy of greater than 22 $J/m^2$.

Example 3

Figure 60:
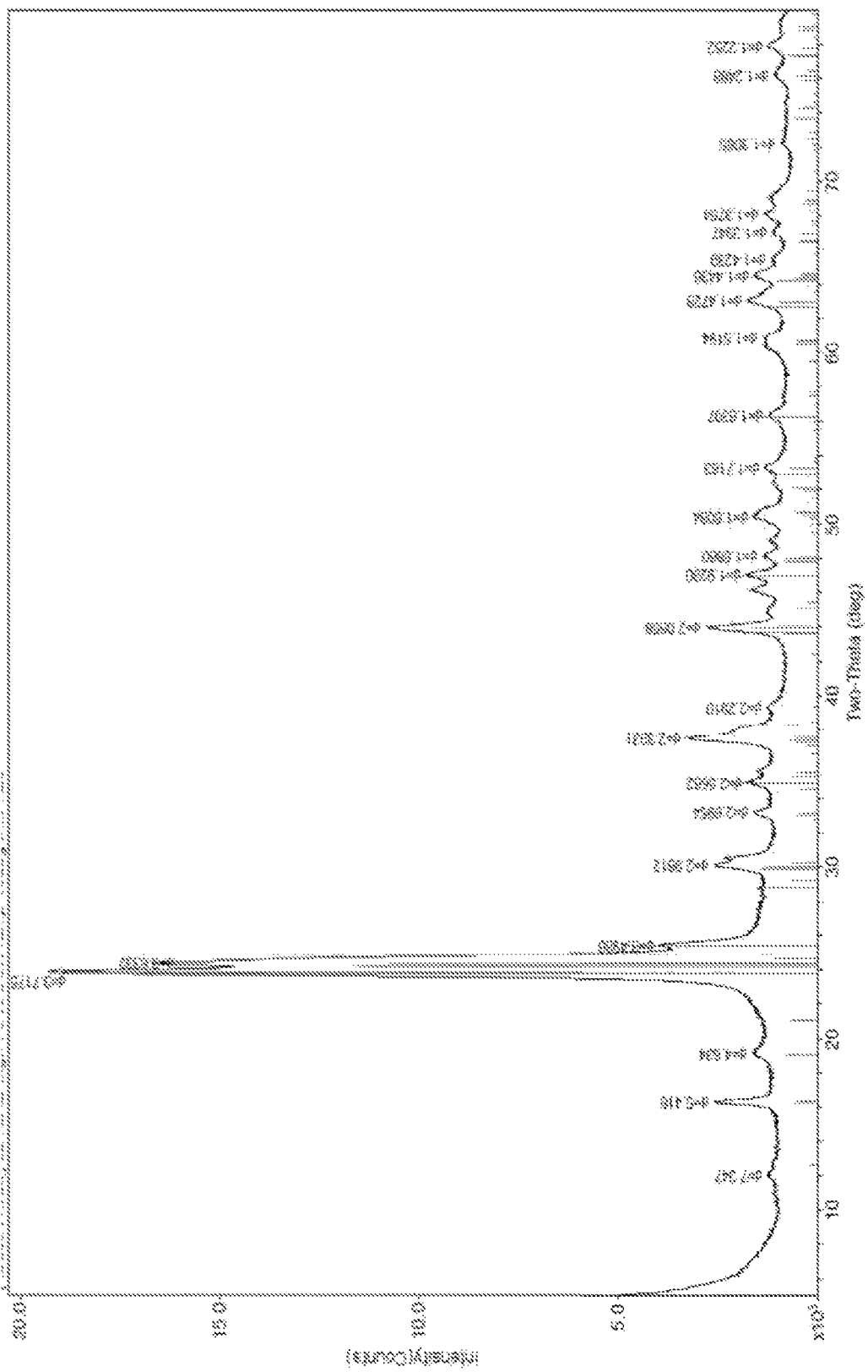
FIG. 60 is the phase assemblage of the glass-ceramic from Example 3.
Figure 61:
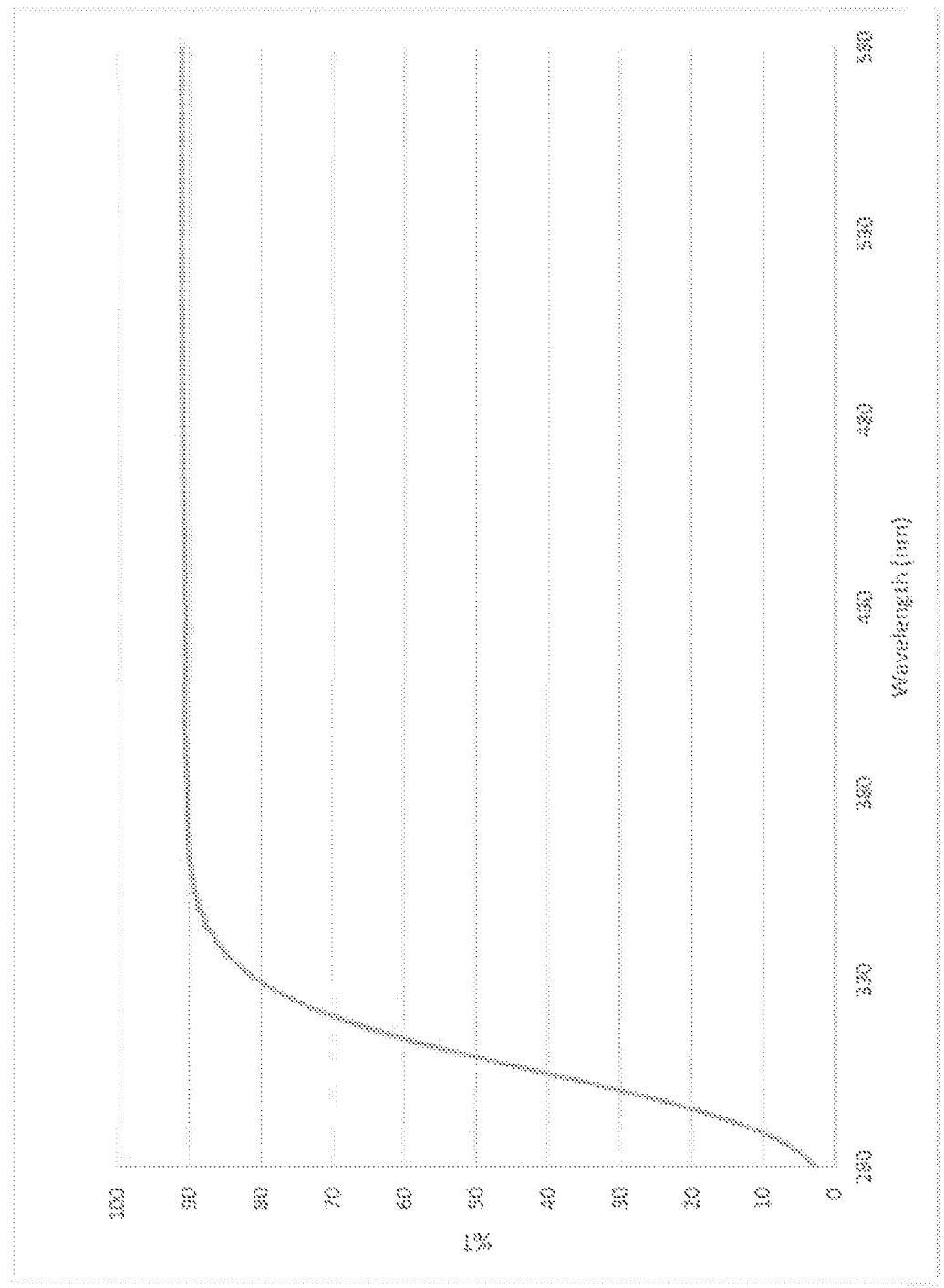
FIG. 61 is a plot of the transmittance of the glass-ceramic from Example 3.

Precursor glass samples having a thickness of 0.8 mm were formed having a composition of composition 1 listed in Table 3 above. The samples were heated from room temperature to approximately 570° C. at a heating rate of 5° C./min and held for 4 hours. Then the samples were heated to 740° C. at a heating rate of 5° C./min and held for 1 hour and a glass-ceramic article was formed. The glass-ceramic article was cooled to room temperature at a cooling rate of 5° C./min. The phase assemblage of the glass-ceramic article was about 12+/−2 wt % residual glass; 44+/−2 wt % petalite crystalline phase, and 44+/−2 wt % lithium disilicate crystalline phase. The sum of all other crystalline phases (e.g., other than petalite and lithium disilicate) was less than 1 wt %. FIG. 60 is the X-ray diffraction (XRD) results with the Reitveld analysis for the phase assemblage. The glass-ceramic had a 90% transmission in the visible wavelengths as shown in FIG. 61.

Example 4

Precursor glass samples having a thickness of 0.8 were formed having a composition of composition 1 listed in Table 3 above. The samples were subjected to the heat treatment cycle shown in Table 7 below along with the phase assemblage and haze. As can be seen the heat treatment cycle affects the phase assemblage and the haze. In particular, the haze is below 0.2 when the wt % of the crystalline phases other than lithium disilicate and petalite is less than 1 wt % of the glass-ceramic article.

TABLE 7

| Sample | Nucl. temp (° C.) | Nucl. Time (hours) | Crystal'n temp (° C.) | Crystal'n Time (hours) | Residual Glass phase (wt %) | Lithium Disilicate (wt %) | Petalite (wt %) | Lithium Metasilicate (wt %) | Virgilite (wt %) | Cristobalite (wt %) | Haze |
|---|---|---|---|---|---|---|---|---|---|---|---|
| 1 | 570 | 4 | 725 | 1.5 | 13 | 43 | 44 | | | | 0.14 |
| 2 | 570 | 4 | 730 | 1 | 14 | 43 | 43 | | | | 0.16 |
| 3 | 580 | 4 | 730 | 1 | 13 | 43 | 44 | | | | 0.16 |
| 4 | 580 | 3 | 730 | 1 | 14 | 43 | 43 | | | | 0.16 |
| 5 | 585 | 2.75 | 740 | 1 | 13 | 44 | 43 | | | | 0.13 |
| 6 | 585 | 2.75 | 740 | 1 | 13 | 44 | 43 | | | | 0.14 |
| 7 | 585 | 2.75 | 740 | 1 | 13 | 44 | 43 | | | | 0.14 |
| 8 | 585 | 2.75 | 740 | 1 | 12 | 44 | 44 | | | | 0.14 |
| 9 | 585 | 2.75 | 740 | 1 | 12 | 44 | 44 | | | | 0.14 |
| 10 | 585 | 2.75 | 740 | 2 | 13 | 44 | 44 | | | | 0.14 |
| 11 | 585 | 2.75 | 740 | 1 | 14 | 43 | 44 | | | | 0.14 |
| 12 | 585 | 2.75 | 740 | 1 | 12 | 44 | 43 | | | | 0.15 |
| 13 | 585 | 2.75 | 740 | 1 | 13 | 45 | 42 | | | | 0.16 |
| 14 | 585 | 2.75 | 740 | 1 | 12 | 45 | 43 | | | | 0.16 |
| 15 | 580 | 2 | 740 | 1 | 12 | 44 | 44 | | | | 0.17 |
| 16 | 580 | 2 | 750 | 1 | 13 | 43 | 44 | | | | 0.20 |
| 17 | 580 | 3 | 755 | 0.5 | 13 | 44 | 42 | | | | 0.13 |
| 18 | 600 | 2 | 755 | 0.25 | 13 | 44 | 43 | | <1 | | 0.14 |
| 19 | 570 | 4 | 755 | 1.5 | 13 | 45 | 42 | — | — | — | 0.16 |
| 20 | 570 | 4 | 755 | 0.5 | 12 | 44 | 44 | | | | 0.16 |
| 21 | 600 | 2 | 755 | 0.75 | 13 | 43 | 44 | | <1 | | 0.16 |
| 22 | 600 | 1.5 | 755 | 0.5 | 13 | 43 | 45 | | — | | 0.17 |
| 23 | 600 | 1.5 | 755 | 1.5 | 13 | 42 | 44 | | <1 | | 0.2 |
| 24 | 600 | 1 | 765 | 0.25 | 13 | 42 | 45 | | trace | | 0.17 |
| 25 | 600 | 2 | 765 | 0.5 | 13 | 43 | 45 | | <1 | | 0.18 |
| 26 | 590 | 1 | 765 | 0.25 | 13 | 42 | 45 | | trace | | 0.19 |
| 27 | 605 | 2 | 770 | 0.5 | 12 | 43 | 44 | | <1 | | 0.15 |
| 28 | 600 | 2 | 770 | 0.25 | 12 | 42 | 45 | | <1 | | 0.17 |
| 29 | 610 | 1 | 770 | 0.01 | 13 | 43 | 44 | | | | 0.18 |
| 30 | 605 | 2 | 770 | 0.01 | 12 | 44 | 44 | | <1 | | 0.18 |
| 31 | 600 | 1 | 770 | 0.25 | 13 | 43 | 44 | | trace | | 0.18 |
| 32 | 600 | 2 | 775 | 0.25 | 13 | 43 | 44 | | 1 | | 0.2 |
| 33 | 610 | 1 | 780 | 0.01 | 12 | 42 | 45 | | <1 | | 0.20 |

TABLE 7-continued

| Sample | Nucl. temp (° C.) | Nucl. Time (hours) | Crystal'n temp (° C.) | Crystal'n Time (hours) | Residual Glass phase (wt %) | Lithium Disilicate (wt %) | Petalite (wt %) | Lithium Metasilicate (wt %) | Virgilite (wt %) | Cristobalite (wt %) | Haze |
|---|---|---|---|---|---|---|---|---|---|---|---|
| 34 | 590 | 2 | 730 | 1 | 14 | 41 | 45 | | | | 0.19 |
| 35 | 580 | 2 | 730 | 1 | 11 | 41 | 46 | 2 | | — | 0.19 |
| 36 | 600 | 4 | 755 | 0.5 | 13 | 45 | 41 | | 1 | | 0.18 |
| 37 | 600 | 2.5 | 770 | 0.25 | 13 | 43 | 43 | | 1 | | 0.18 |
| 38 | 585 | 2.75 | 770 | 1 | 13 | 43 | 43 | | <1 | | 0.22 |
| 39 | 590 | 1 | 770 | 0.25 | 13 | 44 | 43 | | <1 | | 0.23 |
| 40 | 600 | 2 | 775 | 0.75 | 13 | 42 | 43 | | 2 | | 0.28 |
| 41 | 605 | 2 | 780 | 0.5 | 13 | 41 | 42 | | 3 | | 0.38 |
| 42 | 585 | 2.75 | 710 | 1 | 14 | 36 | 46 | 3 | | | 0.37 |
| 43 | 600 | 4 | 725 | 1.5 | 15 | 39 | 45 | 2 | — | — | 0.2 |
| 44 | 600 | 1.5 | 725 | 1.5 | 13 | 39 | 46 | 2 | | | 0.23 |
| 45 | 570 | 4 | 725 | 0.5 | 14 | 45 | 42 | 4 | | | 0.23 |
| 46 | 600 | 4 | 725 | 0.5 | 16 | 35 | 45 | 4 | | — | 0.24 |
| 47 | 600 | 1.5 | 725 | 0.5 | 12 | 40 | 42 | 3 | | 3 | 0.28 |
| 48 | 570 | 1.5 | 725 | 1.5 | 15 | 36 | 45 | 4 | | | 0.37 |
| 49 | 570 | 1.5 | 725 | 0.5 | 18 | 26 | 46 | 8 | — | 2 | 1.53 |
| 50 | 560 | 4 | 730 | 1 | 12 | 39 | 46 | 3 | | | 0.29 |
| 51 | 585 | 5.25 | 740 | 1 | 13 | 43 | 44 | 4 | | | 0.23 |
| 52 | 585 | 2.75 | 740 | 0.01 | 11 | 38 | 46 | 3 | | <1 | 0.24 |
| 53 | 615 | 2.75 | 740 | 1 | 15 | 37 | 45 | 2 | 1 | trace | 0.27 |
| 54 | 555 | 2.75 | 740 | 1 | 17 | 32 | 46 | 5 | <1 | trace | 0.70 |
| 55 | 585 | 0.25 | 740 | 1 | 16 | 28 | 47 | 5 | <1 | 4 | 2.29 |
| 56 | 570 | 1.5 | 755 | 0.5 | 13 | 43 | 43 | — | 1 | — | 0.21 |
| 57 | 600 | 4 | 755 | 1.5 | 13 | 42 | 43 | — | 1 | — | 0.25 |
| 58 | 570 | 1.5 | 755 | 1.5 | 14 | 41 | 44 | — | 1 | — | 0.38 |
| 59 | 600 | 2 min | 755 | 0.5 min | 22 | 15 | 48 | 10 | | 6 | 7.45 |

Example 5

Precursor glass samples having a thickness of 0.8 were formed having a composition of composition 1 listed in Table 3 above. The samples were subjected to the heat treatment cycle shown in Table 8 below and the phase assemblage is shown in Table 9 below. The heat treatment cycle in this example differs from the heat treatment cycles of Example 4 in that there is a 3-step heat cycle instead of a 2-step heat cycle. In particular, the samples are held at an intermediate temperature, wherein the intermediate temperature is greater than the nucleation temperature and less than the crystallization temperature. This example demonstrates that the desired phase assemblage—where the wt % of the crystalline phases other than lithium disilicate and petalite is less than 1 wt % of the glass-ceramic article—can be achieved with 3-step heat treatment cycle instead of a 2-step heat treatment cycle.

TABLE 8

| Sample | Nucleation temperature (° C.) | Nucleation time (hours) | Intermediate step temperature (° C.) | Intermediate step time (hours) | Crystallization temperature (° C.) | Crystallization time (hours) |
|---|---|---|---|---|---|---|
| 1 | 570 | 3 | 680 | 0.5 | 740 | 0.5 |
| 2 | 570 | 3 | 680 | 1 | 740 | 1 |
| 3 | 570 | 4 | 680 | 1 | 740 | 0.01 |
| 4 | 570 | 4 | 680 | 0.5 | 740 | 0.5 |
| 5 | 570 | 4 | 680 | 1 | 740 | 1 |
| 6 | 570 | 4 | 650 | 1 | 740 | 1 |
| 7 | 570 | 4 | 670 | 0.5 | 740 | 1 |

TABLE 9

| Sample | Residual Glass phase (wt %) | Lithium Disilicate (wt %) | Petalite (wt %) | Lithium Meta-silicate (wt %) | Virgilite (wt %) | Cristobalite (wt %) |
|---|---|---|---|---|---|---|
| 1 | 12 | 44 | 44 | — | — | — |
| 2 | 13 | 43 | 44 | — | — | — |
| 3 | 14 | 42 | 43 | — | — | — |
| 4 | 13 | 44 | 43 | — | — | — |
| 5 | 13 | 44 | 43 | — | — | — |
| 6 | 13 | 44 | 43 | — | — | — |
| 7 | 12 | 46 | 42 | — | — | — |

Example 6

Figure 62:
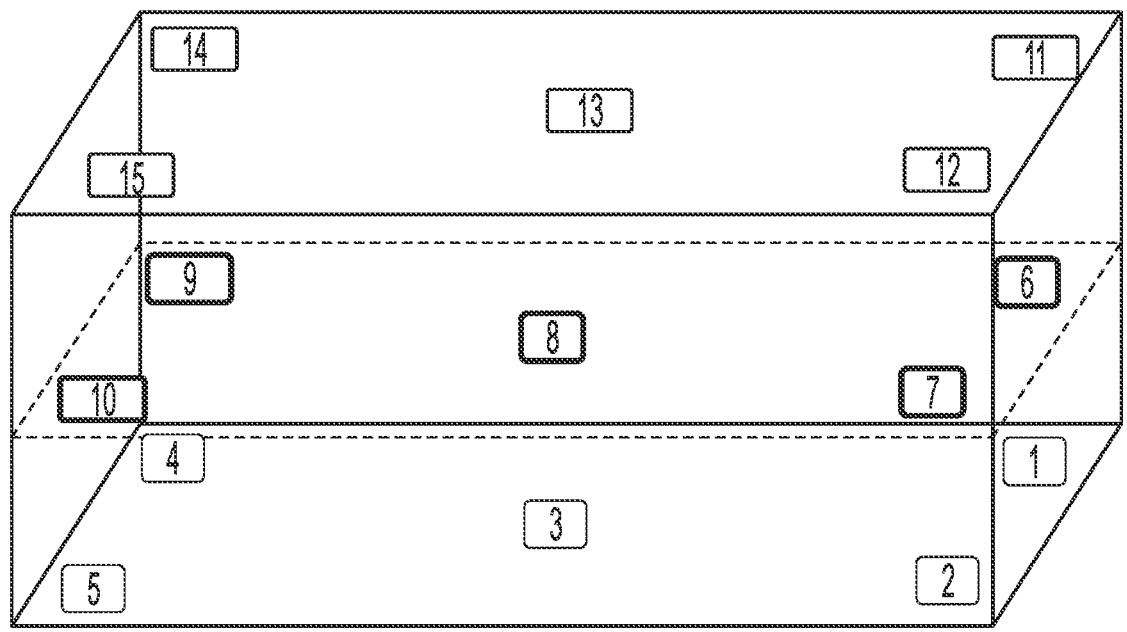
FIG. 62 schematically depicts locations of samples within a stack according to embodiments disclosed and described herein.

Precursor glass samples having a thickness of 0.8 were formed having a composition of composition 1 listed in Table 3 above. The samples were subjected to the heat treatment cycle shown in Table 10 below and the phase assemblage is shown in Table 11 below. The heat treatment cycle in this example differs from the heat treatment cycles of Example 4 in that the sample is not held at the nucleation temperature, but rather is heated to various temperatures at varying heating rates until the crystallization temperature is reached. This example demonstrates that the desired phase assemblage—where the wt % of the crystalline phases other than lithium disilicate and petalite is less than 1 wt % of the glass-ceramic article—can be achieved with this alternative heat treatment cycle.

above). The stacking configuration comprises a bottom setter, 10 sheets, and a top setter. For the presentation of these results, sheets are numbered from bottom (sheet 1) to top (sheet 10). In this example, the ceramming was done by placing 3 stacks of glass on a carrier that was sent through a lehr set to follow the ceramming cycle "COR" discussed above. Initial glass sheets dimensions pre-ceramming are 640×250×1.11 mm. Samples were taken from different locations from the stack, as depicted in FIG. 62, and measured for flatness (warp), haze, phase assemblage by XRD and hardness.

TABLE 10

| Step # | Cycle A Temperature change | Cycle A Heating Rate (deg ° C./min) | Cycle B Temperature change | Cycle B Heating Rate (deg ° C./min) |
|---|---|---|---|---|
| 1 | Room Temp to 560° C. | 5 | Room Temperature to 555° C. | 5 |
| 2 | 560° C. to 590° C. | 0.25 | 555° C. to 580° C. | 0.2 |
| 3 | 590° C. to 600° C. | 0.55 | 580° C. to 590° C. | 0.3 |
| 4 | 600° C. to 610° C. | 1 | 590° C. to 610° C. | 0.6 |
| 5 | 610° C. to 620° C. | 1.25 | 610° C. to 620° C. | 1 |
| 6 | 620° C. to 640° C. | 1.65 | 620° C. to 630° C. | 1.5 |
| 7 | 640° C. to 740° C. | 3 | 630° C. to 740° C. | 3 |
| 8 | Isothermal at 740° C. for 1 hour. | | Isothermal at 740° C. for 1 hour. | |

TABLE 11

| Cycle | Residual Glass phase (wt %) | Lithium Disilicate (wt %) | Petalite (wt %) | Lithium Meta-silicate (wt %) | Virgilite (wt %) | Cristobalite (wt %) |
|---|---|---|---|---|---|---|
| A | 12 | 46 | 42 | — | — | — |
| B | 12 | 45 | 44 | — | — | — |

TABLE 12

| | Composition A (wt %) | Composition B (wt %) |
|---|---|---|
| $SiO_2$ | 74.21 | 74.41 |
| $Al_2O_3$ | 7.53 | 7.56 |
| $P_2O_5$ | 2.12 | 2.1 |
| $Na_2O$ | 0.06 | 0.05 |
| $K_2O$ | 0.12 | 0.123 |
| $Li_2O$ | 11.30 | 11.2 |
| $ZrO_2$ | 4.22 | 4.31 |
| $Fe_2O_3$ | 0.06 | 0.059 |
| $SnO_2$ | 0.40 | 0.02 |

Example 7

Glass-ceramic sheets were produced by stacking sheets of glass on top of each other before heat-treating them with a "ceramming cycle" leading to the formation of a glass-ceramic comprising at least two major crystalline phases, petalite and lithium disilicate, with possible minor crystalline phases, and a residual glass phase. The glass-ceramic sheets were produced using a process in which the sheets of glass are stacked in between flat setters, in a stack comprising a bottom setter, glass sheets on top of each other, and a top setter as disclosed and described herein. The stack may also comprise one or several interlayers (i.e., additional setters placed in between the sheets of glass as described herein). To avoid sticking between the sheets of glass during the heat treatment process and allow for low stress and low warp after ceramming, the glass sheets are coated with a parting agent as disclosed herein before being stacked. The thermal treatment parameters (time and temperatures of the different steps involved during the ceramming), as well as thermal homogeneity throughout the stacks during the ceramming are also critical for the production of sheets with low warp and low stress, and with the desired combination of optical and mechanical attributes.

Figure 64:
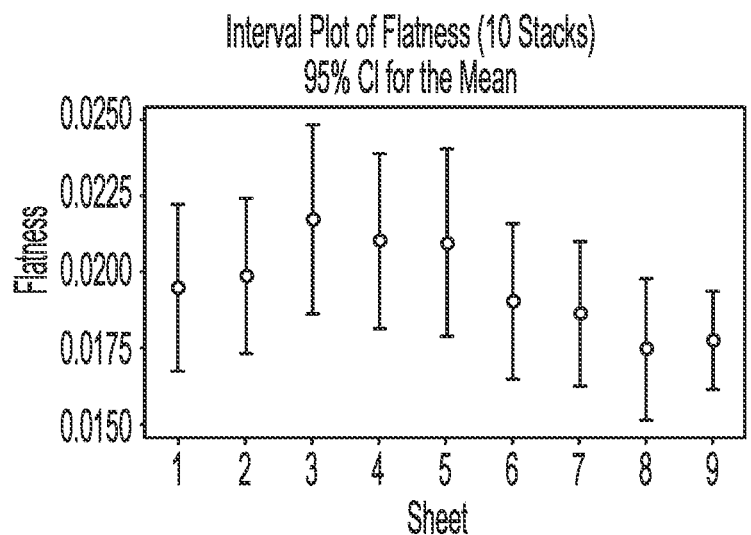
FIG. 64 graphically depicts flatness of glass sheets according to embodiments disclosed and described herein.
Figure 65:
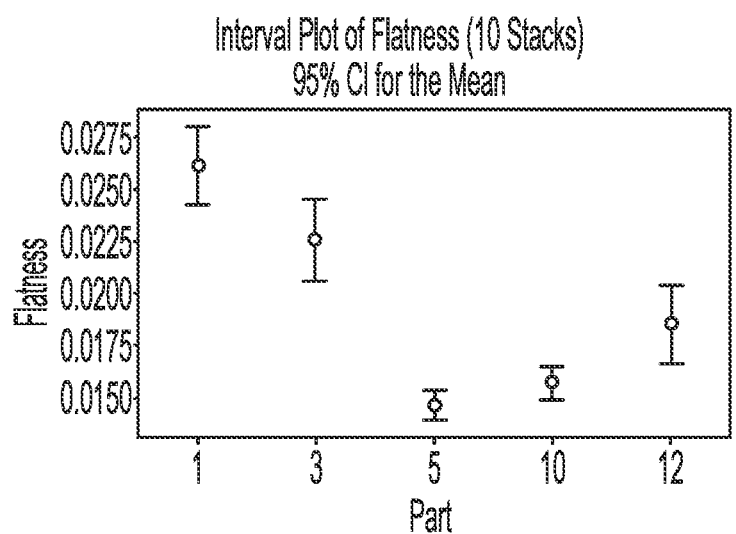
FIG. 65 graphically depicts flatness of glass sheets according to embodiments disclosed and described herein.

The combination of attributes for the glass-ceramics described herein is shown for sheets of the composition shown in Table 12 below, cerammed in a stack of 10-sheets high with the cycle "COR" (570 C/4 h+740 C/1 h described The flatness for the sheets produced was measured on part size using a EMD gauge. The sheets of glass-ceramic after ceramming are cut into 12 parts of dimensions 156×76 mm (thickness dependent on the initial thickness of the sheet cerammed) following the pattern depicted in FIG. 63. The part size flatness (PSF) measured on parts 1, 3, 5, 10 and 12 for sheets at different positions in the stacks (from bottom to top of the stack), are presented in FIG. 64 and FIG. 65.

Figure 63:
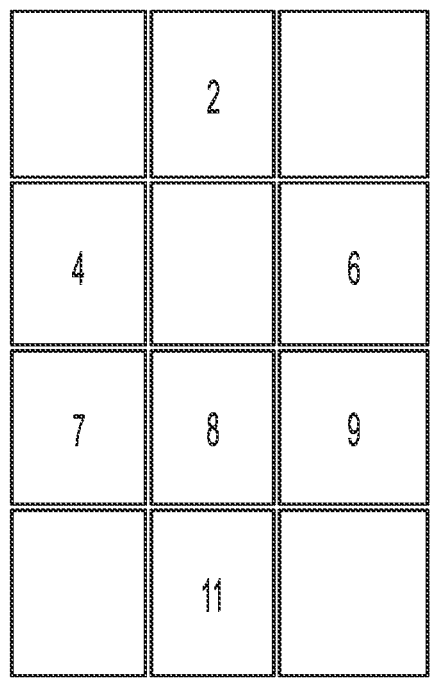
FIG. 63 schematically depicts locations of glass ceramic articles cut from a sheet according to embodiments disclosed and described herein.
Figure 66:
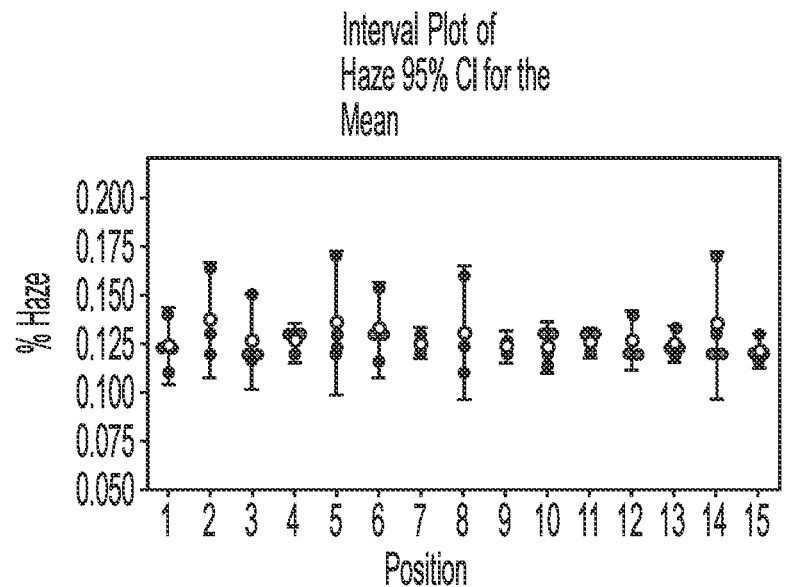
FIG. 66 graphically depicts haze of glass sheets according to embodiments disclosed and described herein.

Samples taken from the different locations depicted in FIG. 63 were polished to 0.8 mm thickness. The haze measured on the parts, using a haze meter (BYK Gardner Haze-Gard i) was below 0.2 for all the parts at the different locations in the stack, as shown in FIG. 66.

Figure 67:
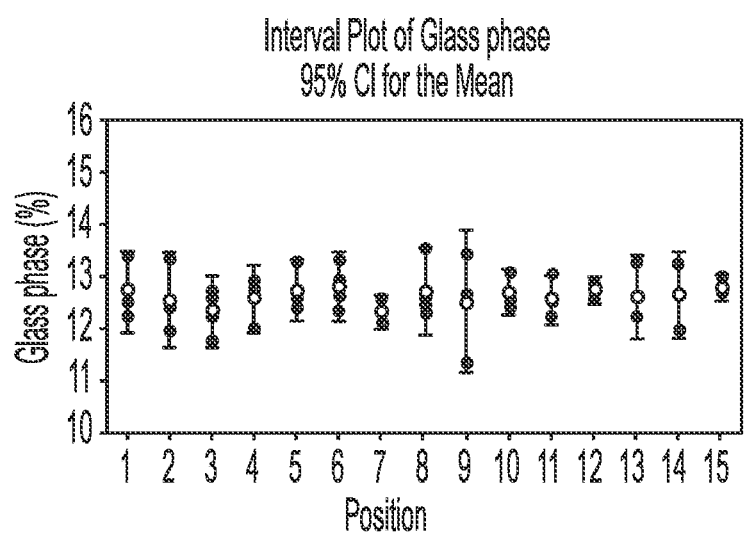
FIG. 67 graphically depicts the percentage of residual glass phase of glass sheets according to embodiments disclosed and described herein.
Figure 68:
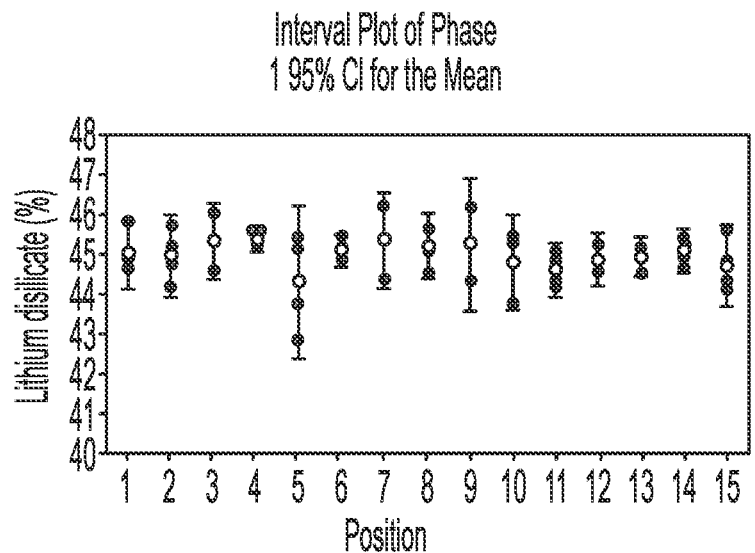
FIG. 68 graphically depicts the percentage of lithium disilicate crystalline phase of glass sheets according to embodiments disclosed and described herein.
Figure 69:
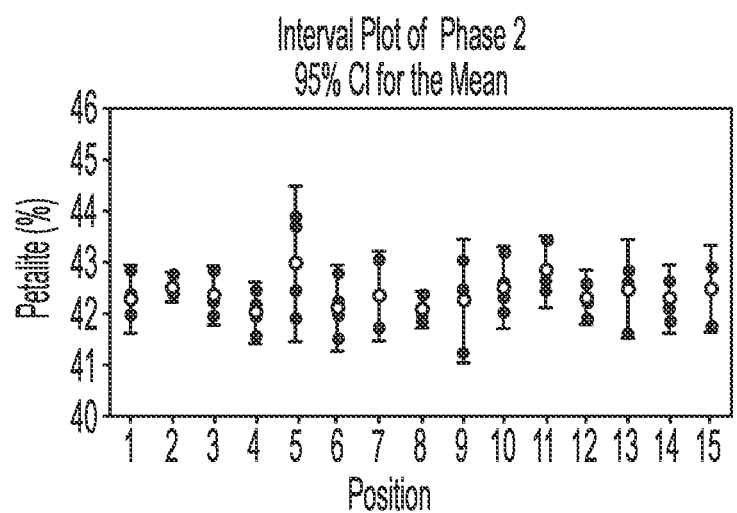
FIG. 69 graphically depicts the percentage of petalite of glass sheets according to embodiments disclosed and described herein.
Figure 70:
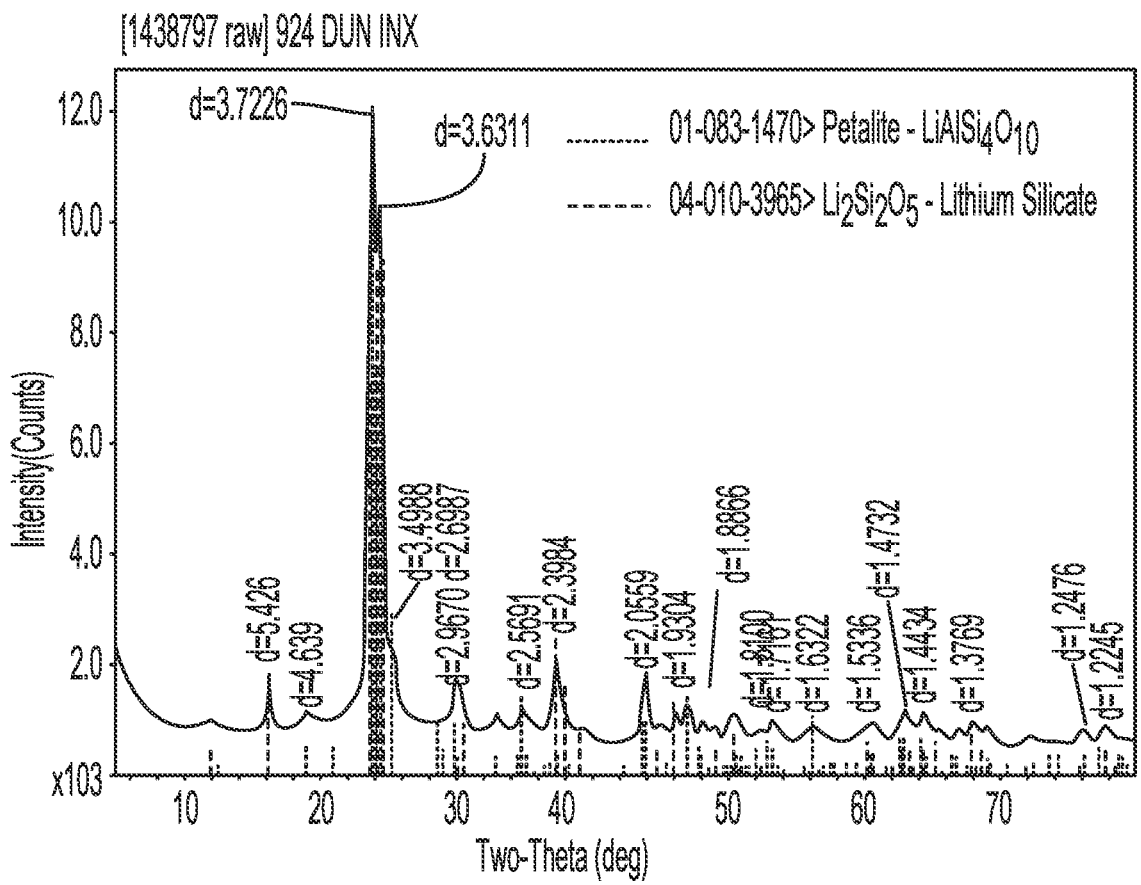
FIG. 70 graphically depicts Raman data of glass sheets according to embodiments disclosed and described herein.

Samples were also taken from these different locations in the stack, ground into a powder and measured by X-Ray Diffraction (XRD). A Rietveld method was applied to quantify the crystalline phase assemblage. Throughout the stacks, the glass-ceramics comprise between 10 wt % and 20 wt % of residual glass phase (FIG. 67), above 39 wt % of lithium disilicate (FIG. 68) and petalite (FIG. 69), and less than 3 wt % of any other crystalline phase as described above. A XRD diffraction pattern for the glass-ceramic described in this example is given in FIG. 70.

Figure 71:
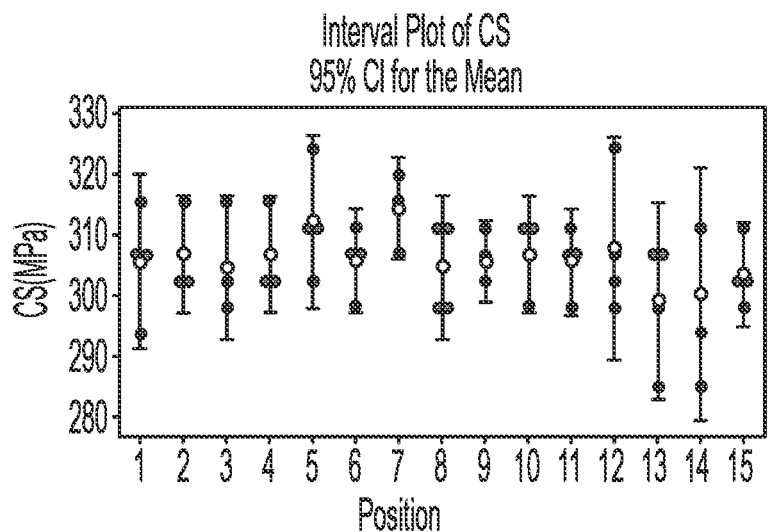
FIG. 71 graphically depicts compressive stress of glass sheets according to embodiments disclosed and described herein.
Figure 72:
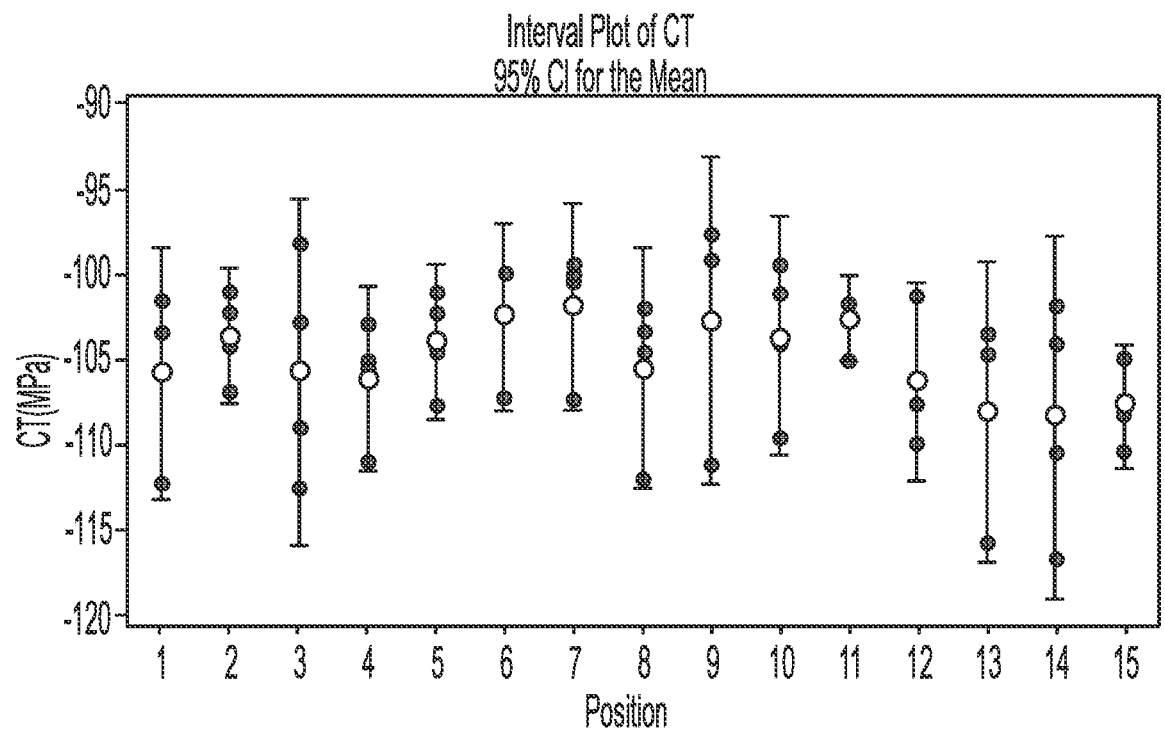
FIG. 72 graphically depicts central tension of glass sheets according to embodiments disclosed and described herein.
Figure 73:
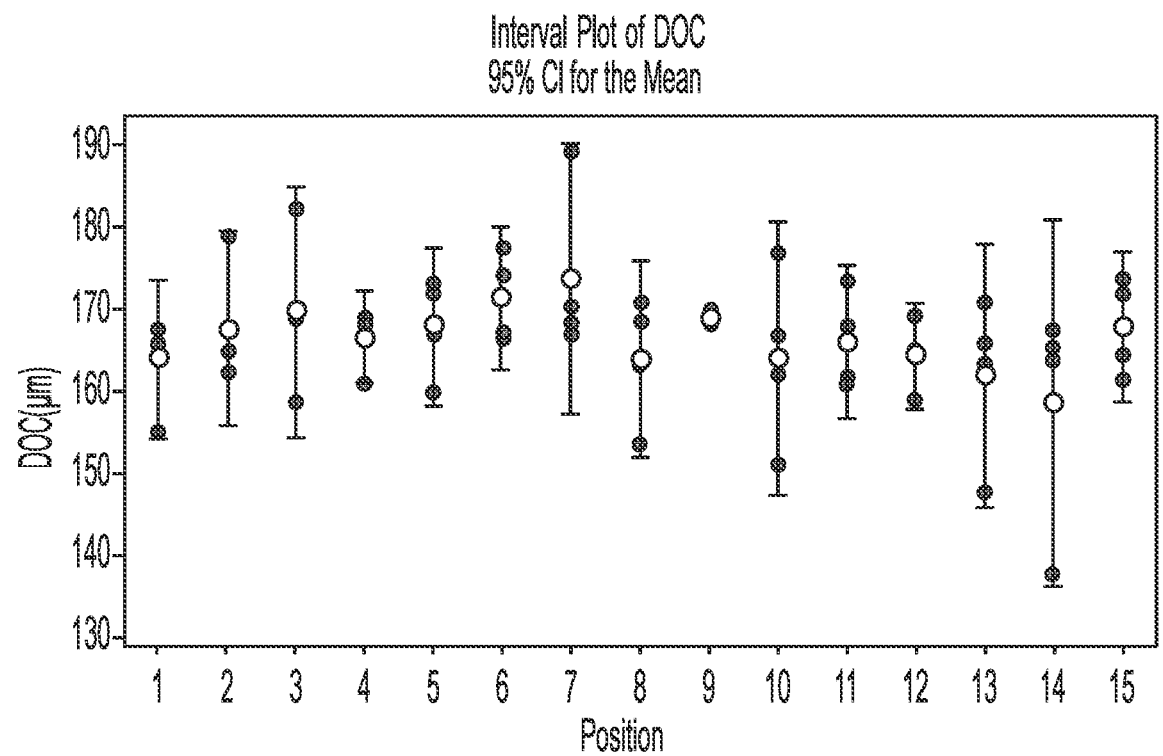
FIG. 73 graphically depicts depth of compression of glass sheets according to embodiments disclosed and described herein.

Samples taken from the locations depicted in FIG. 62 and polished to 0.8 mm thickness were ion-exchanged and the compressive stress (CS), central tension (CT), and depth of compressive layer (DOC) were measured (Orihara SLP 2000 operating at 405 nm). The results are shown in FIGS. 71-73 respectively, and show CS above 270 MPa, CT above 90 MPa and DOC above 130 μm.

Figure 74:
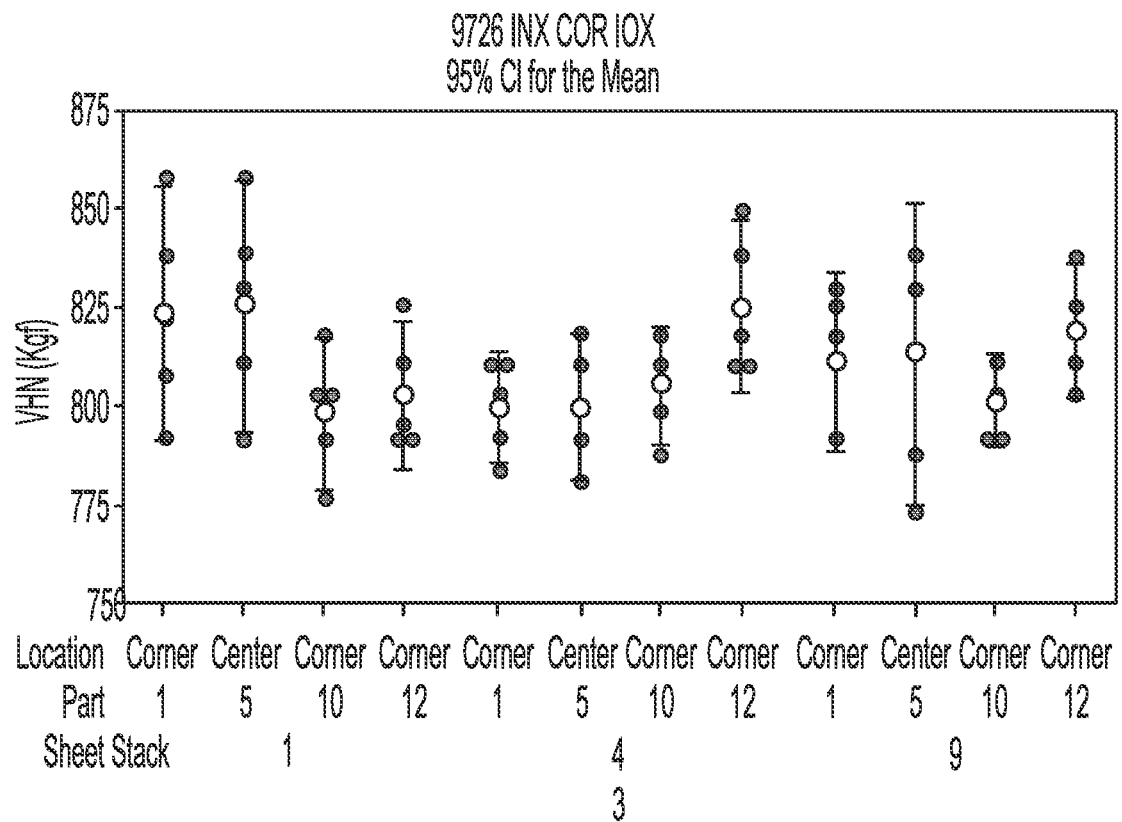
FIG. 74 graphically depicts hardness of glass sheets according to embodiments disclosed and described herein.

The Vickers hardness measured on 0.8 mm thickness ion-exchanged samples (Vickers indenter, 200 gr load) for samples taken from different locations in the stacks cerammed with COR cycle is above 700 kgf for all the samples, as shown in FIG. 74.

Figure 75:
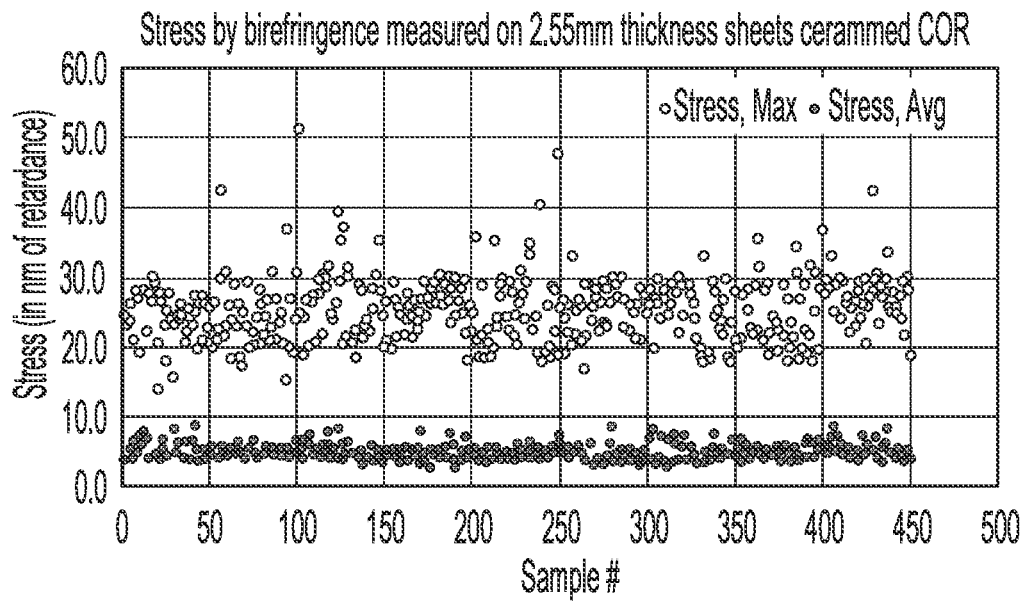
FIG. 75 graphically depicts stress of glass sheets according to embodiments disclosed and described herein.

The stress by birefringence, expressed as nm of retardance, was measured in the full sheets cerammed in stack using a GFP optical gauge. Results for the maximum and average stress measured on 450 sheets of 1.1 mm thickness are presented in FIG. 75, with a max stress value typically <25 nm at that thickness.

The fracture toughness (Critical Stress Intensity, KIC) measured via Chevron Notched Short Bar (CNSB) (MTS Sintech 2/G machine with loadcell: 50 lb) on glass-ceramic samples prepared from composition a and cerammed with the "COR" cycle in a box furnace is on average 1.14 MPa*m$^{1/2}$, as shown in Table 13

TABLE 13

| Specimen # | KIC_1304 Mpa m^(½) |
|---|---|
| 1 | 1.129 |
| 2 | 1.146 |
| 3 | 1.130 |
| 4 | 1.147 |
| 6 | 1.157 |
| 8 | 1.149 |
| 9 | 1.129 |
| Mean | 1.141 |
| Std. Dev. | 0.011 |
| % COV | 0.99 |

Figure 77:
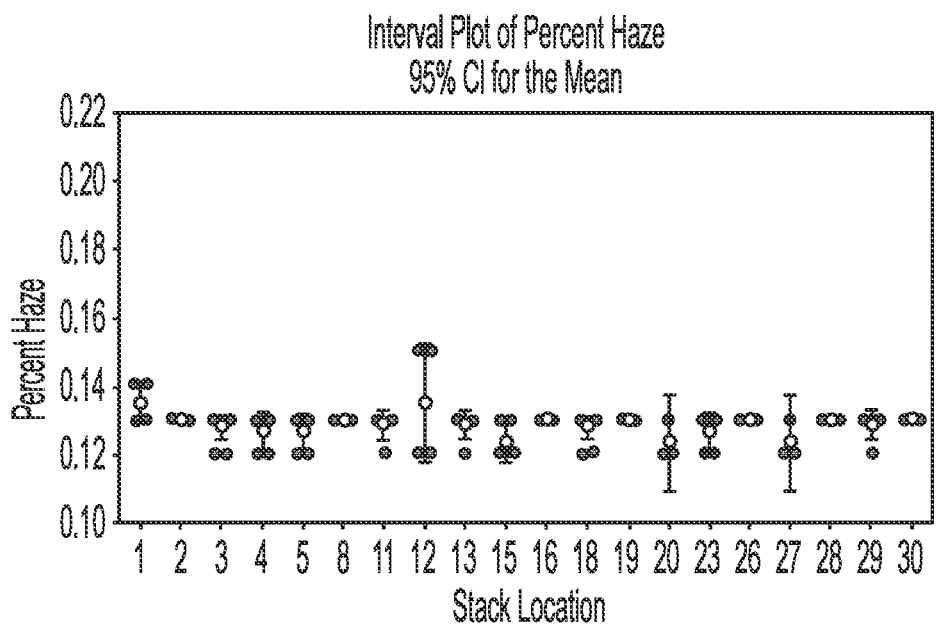
FIG. 77 graphically depicts haze of glass sheets according to embodiments disclosed and described herein.
Figure 78:
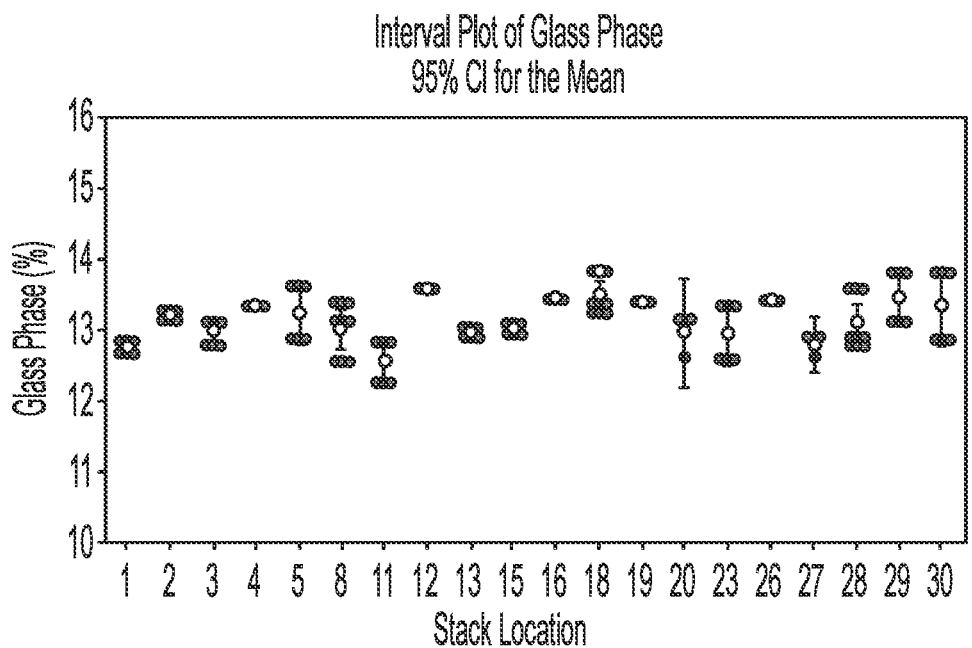
FIG. 78 graphically depicts the percentage of residual glass phase of glass sheets according to embodiments disclosed and described herein.
Figure 79:
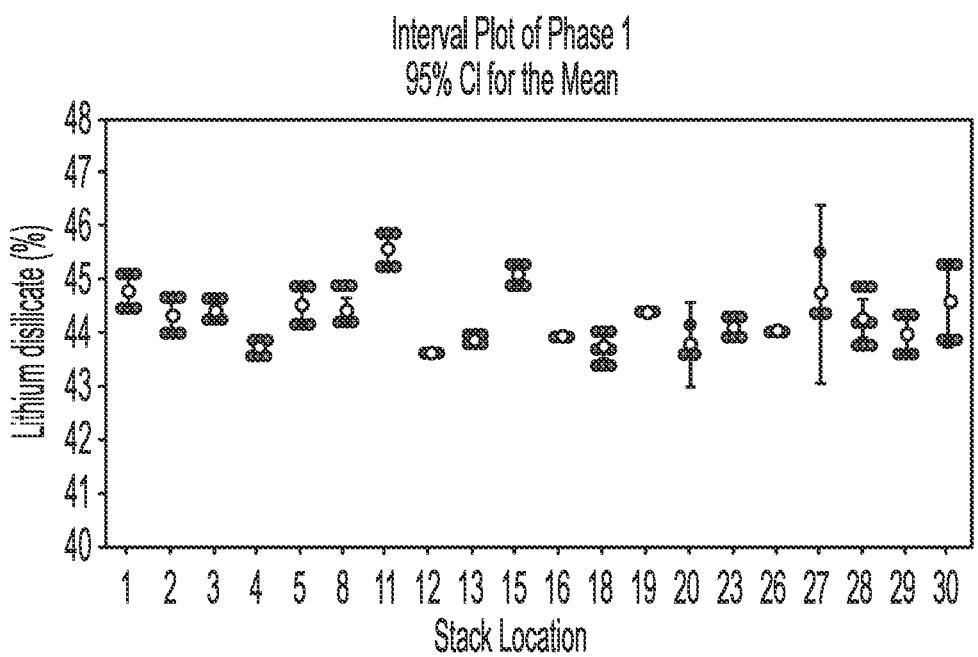
FIG. 79 graphically depicts the percentage lithium disilicate of glass sheets according to embodiments disclosed and described herein.
Figure 80:
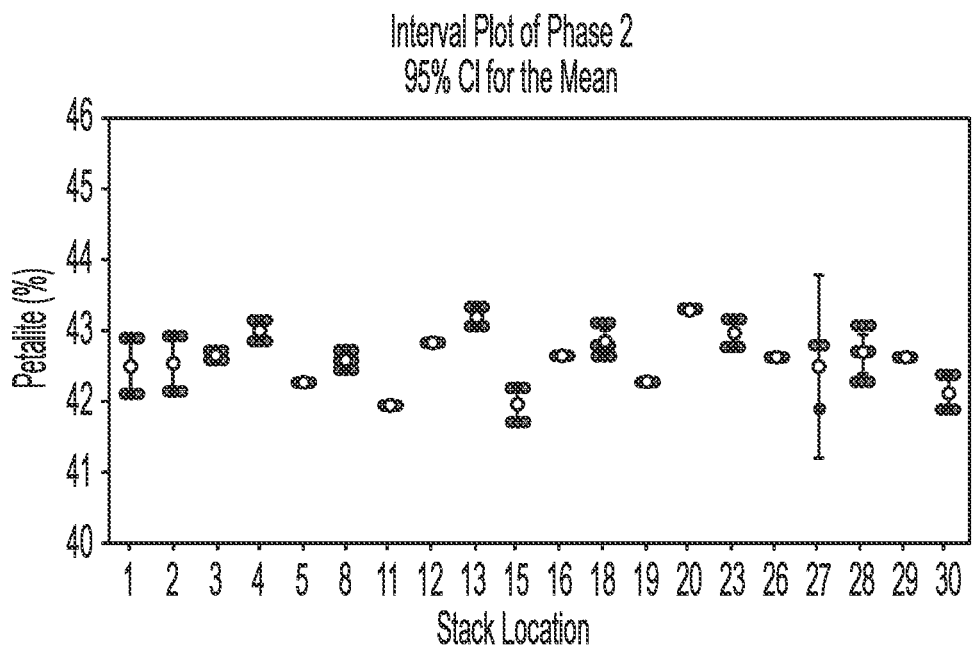
FIG. 80 graphically depicts the percentage of petalite of glass sheets according to embodiments disclosed and described herein.
Figure 81:
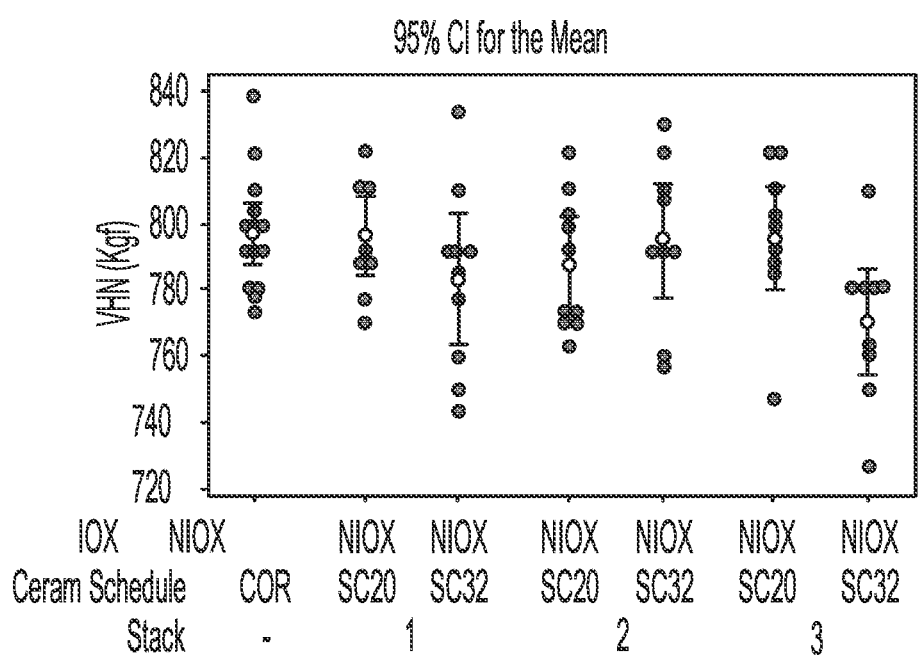
FIG. 81 graphically depicts hardness of glass sheets according to embodiments disclosed and described herein.

In another example, samples were taken from different locations from stacks of sheets of composition a cerammed with the ceramming cycle SC20 (see FIG. 76) with an interlayer configuration disclosed above. Samples polished to 0.8 mm thickness were measured for haze (FIG. 77) using a BYK Gardner Haze-guard), showing haze <0.2 for all the samples. Powdered samples were measured for XRD with Rietveld method, to quantify the residual glass phase (FIG. 78), lithium disilicate (FIG. 79), and petalite (FIG. 80) in the glass-ceramic sheets produced. The hardness measured on samples polished to 0.8 mm thickness, before ion-exchange and for different ceramming cycles is shown in FIG. 81. The hardness on ion-exchanged samples taken from different sheets, and different locations within sheets in the stacks of glass-ceramic sheets cerammed with different ceramming cycles, are presented in FIG. 82 and FIG. 83, and all present Vickers hardness values >700 kgf (Vickers indenter, 200 gr load). All these glass-ceramics produced in a stacking configuration present the combination of attributes described in this disclosure.

Figure 84:
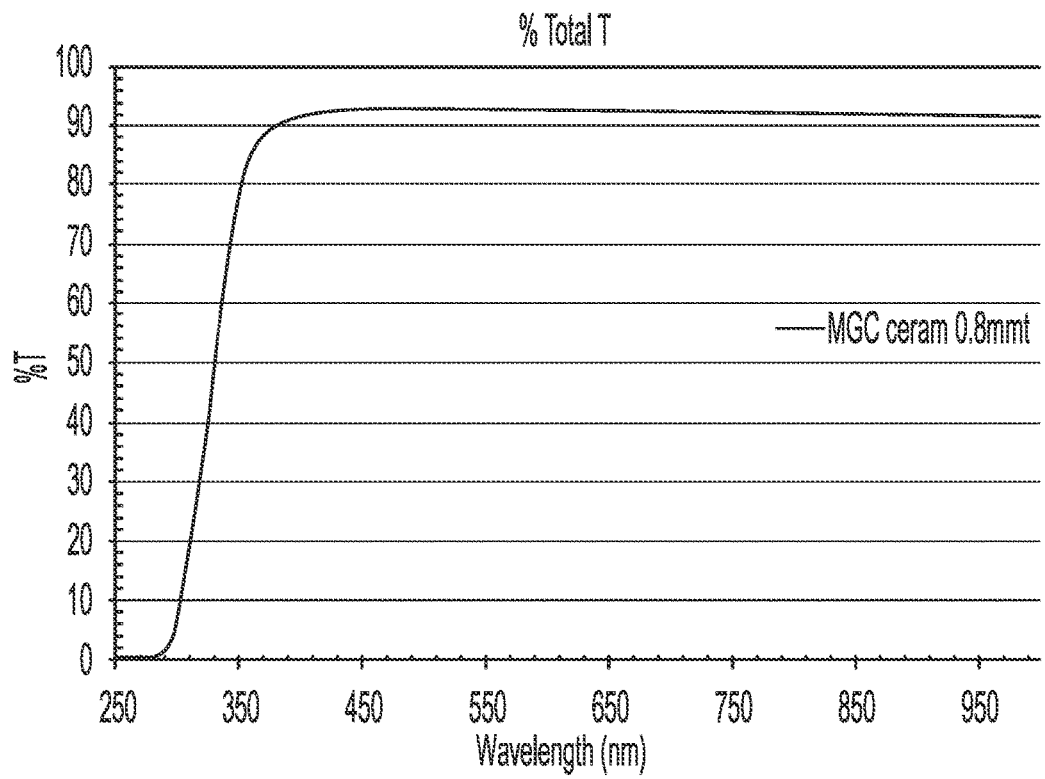
FIG. 84 graphically depicts transmission of glass sheets according to embodiments disclosed and described herein.

In addition to all the attributes described above, the glass-ceramics produced show a high optical transparency, characterized by an optical transmission >85% in the 450-800 nm range (see FIG. 84).

Figure 85:
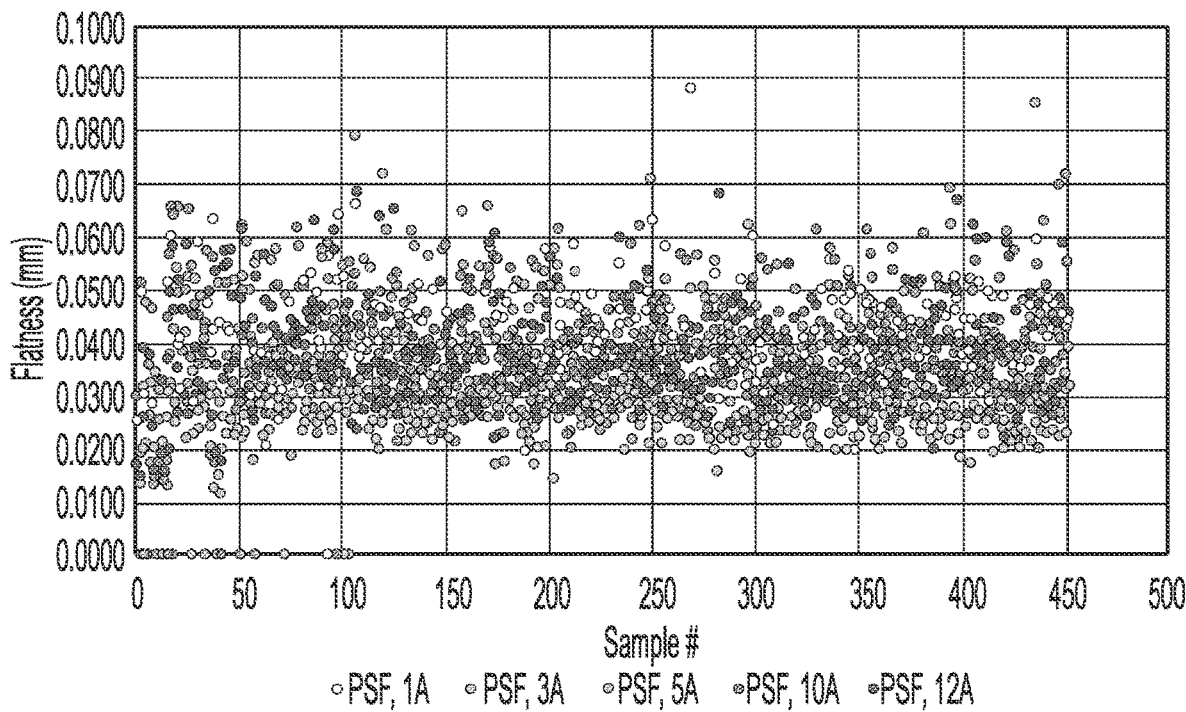
FIG. 85 graphically depicts flatness of glass sheets according to embodiments disclosed and described herein.
Figure 86:
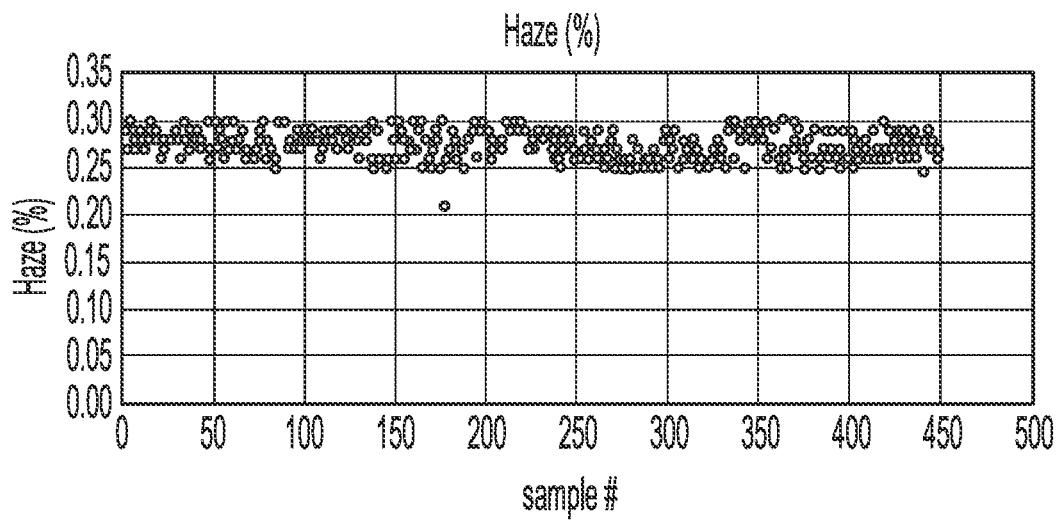
FIG. 86 graphically depicts haze of glass sheets according to embodiments disclosed and described herein.
Figure 87:
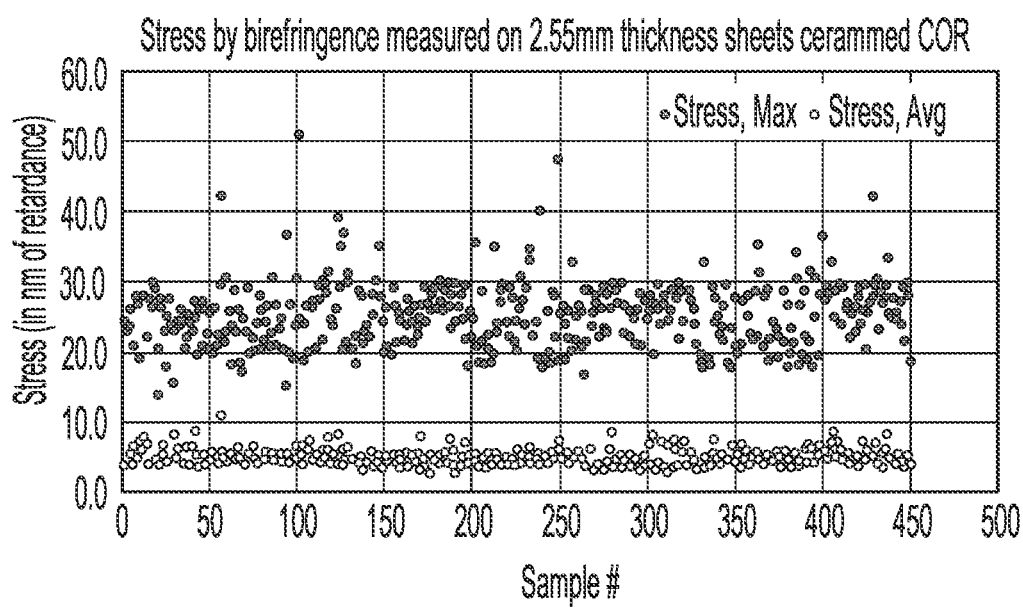
FIG. 87 graphically depicts stress of glass sheets according to embodiments disclosed and described herein.

The part size flatness, haze (at 2.3 mm thickness), and stress by birefringence measured on glass-ceramic sheets produced from glass sheets of 2.55 mm thickness stacked in stacks of 4-sheets high with the COR cycle are presented in FIG. 85-87, respectively.

Figure 76:
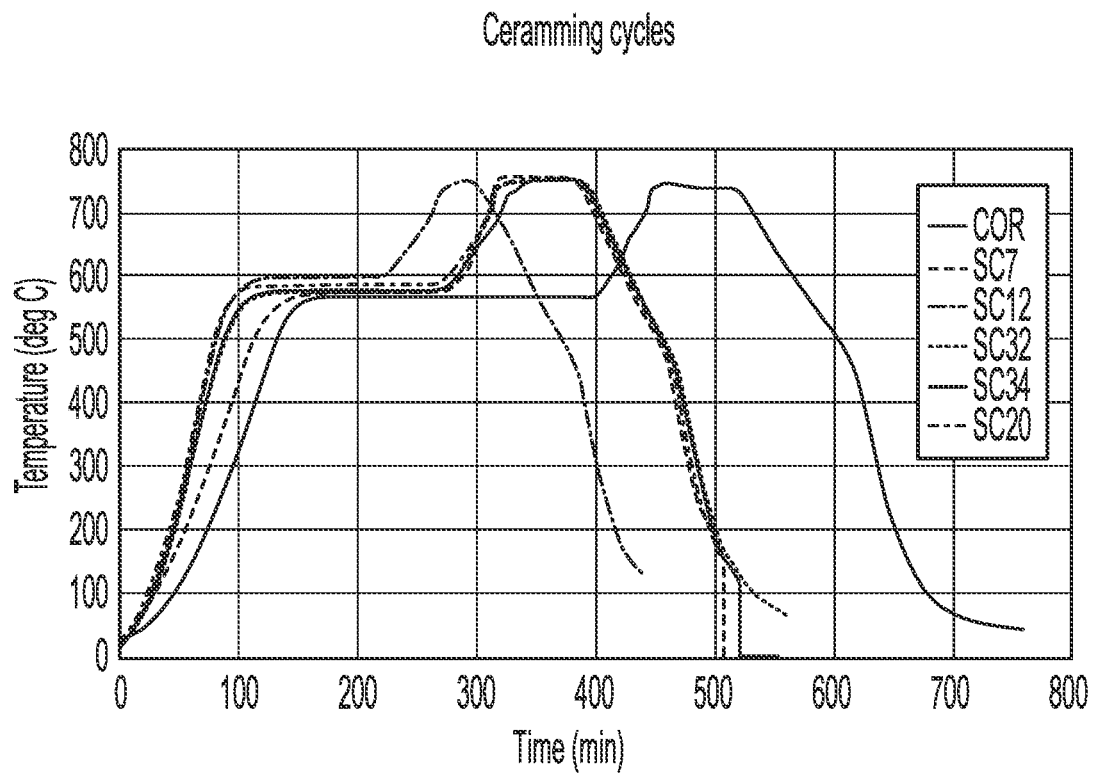
FIG. 76 graphically depicts ceramming cycles according to embodiments disclosed and described herein.
Figure 88:
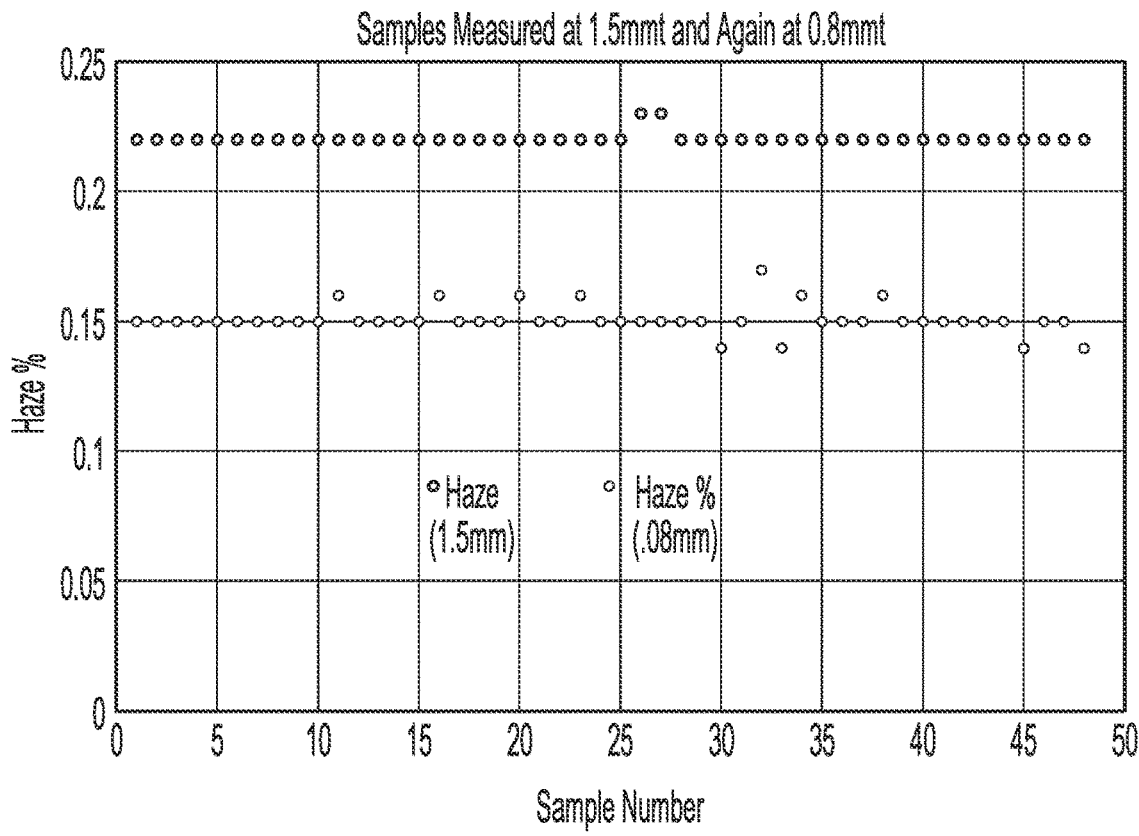
FIG. 88 graphically depicts haze of glass sheets according to embodiments disclosed and described herein.
Figure 90:
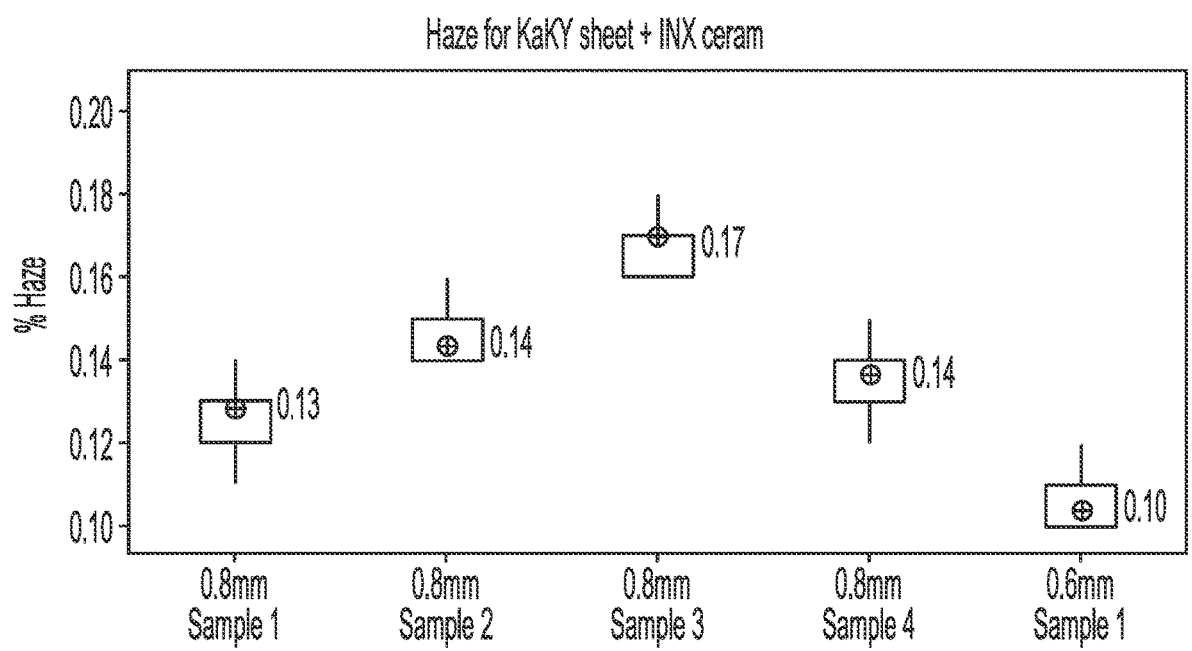
FIG. 90 graphically depicts haze of glass sheets according to embodiments disclosed and described herein.

The haze in those glass-ceramics is dependent on the thickness of the sample measured, and haze % increases with the thickness of the sample, as illustrated in FIG. 88, showing haze values for samples taken from sheets of 1.82 mm thickness cerammed in stacks with an interlayer 8+6 configuration (bottom setter/8 sheets/interlayer setter/6 sheets/top setter) with SC32 cycle (see FIG. 76). The samples were first prepared at 1.5 mm thickness, measured for haze, then thinned down to 0.8 mm thickness and re-measured for haze. It can clearly be seen that haze becomes lower when measured on thinner samples. The haze for the glass-ceramics described in this invention is lower than the trend curve presented in FIG. 89, which shows the evolution of haze with thickness for these material (thickness corresponding here to the thickness of polished samples used to measure the haze). The haze measured at different thicknesses for different ceramming cycles is shown in FIG. 90.

Note that other properties measured on the glass-ceramics produced according to the present disclosure are also thickness-dependent. Notably the stress by birefringence is proportional to thickness of the samples measured. In the case of the present invention, this stress remain below 25 nm of retardance per mm of thickness of the sheets measured.

Figure 82:
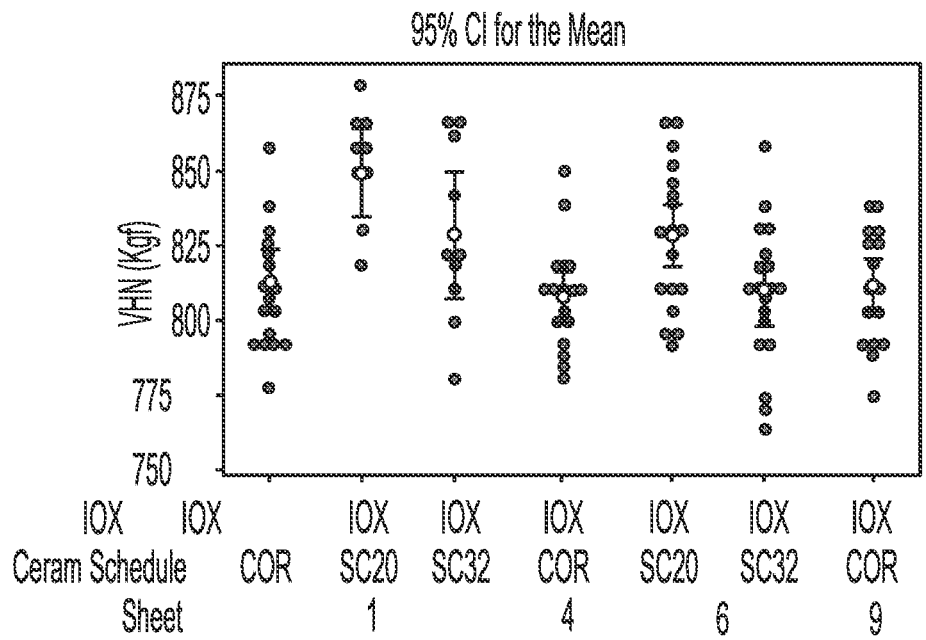
FIG. 82 graphically depicts hardness of glass sheets according to embodiments disclosed and described herein.
Figure 83:
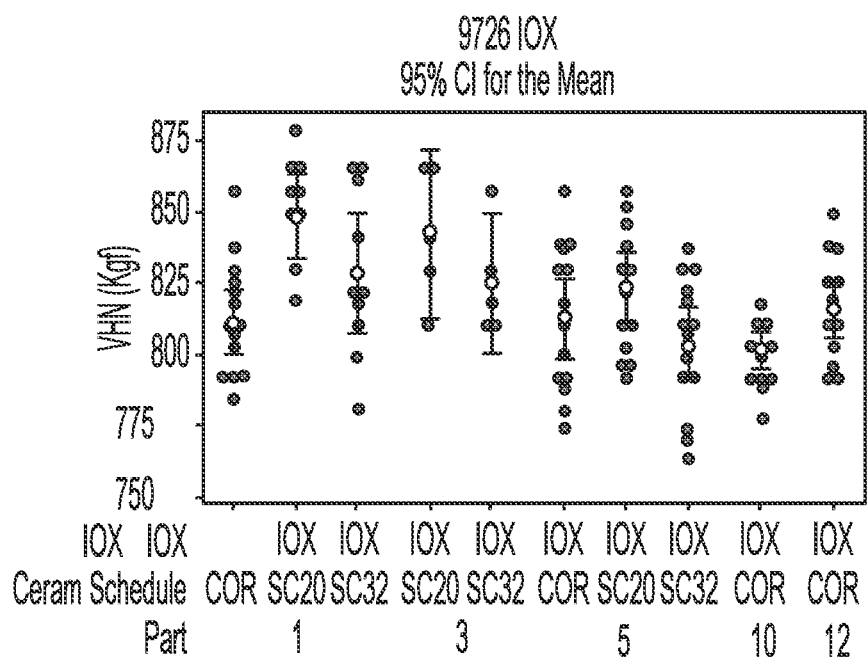
FIG. 83 graphically depicts hardness of glass sheets according to embodiments disclosed and described herein.
Figure 91:
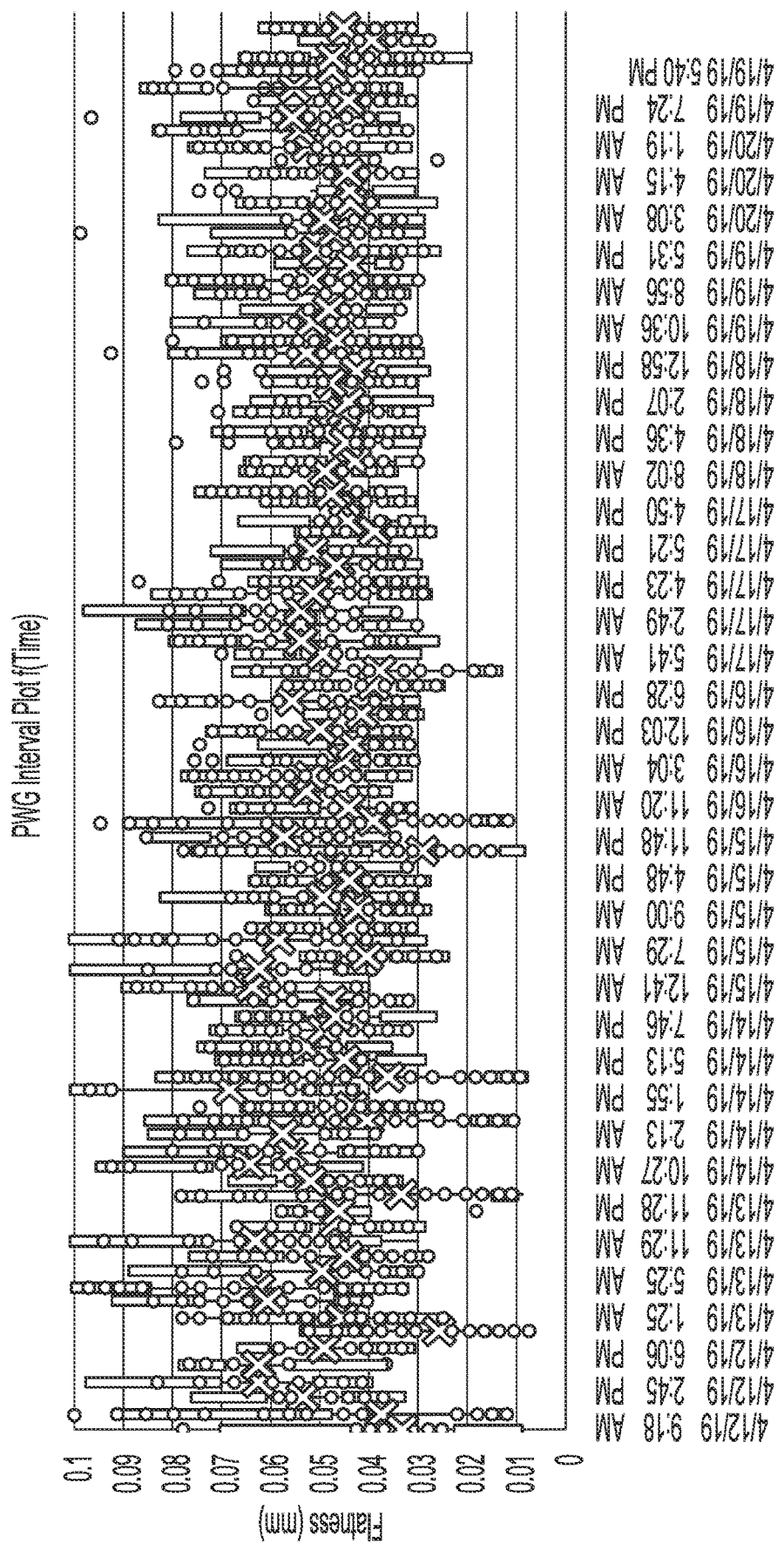
FIG. 91 graphically depicts flatness of glass sheets according to embodiments disclosed and described herein.
Figure 92A:
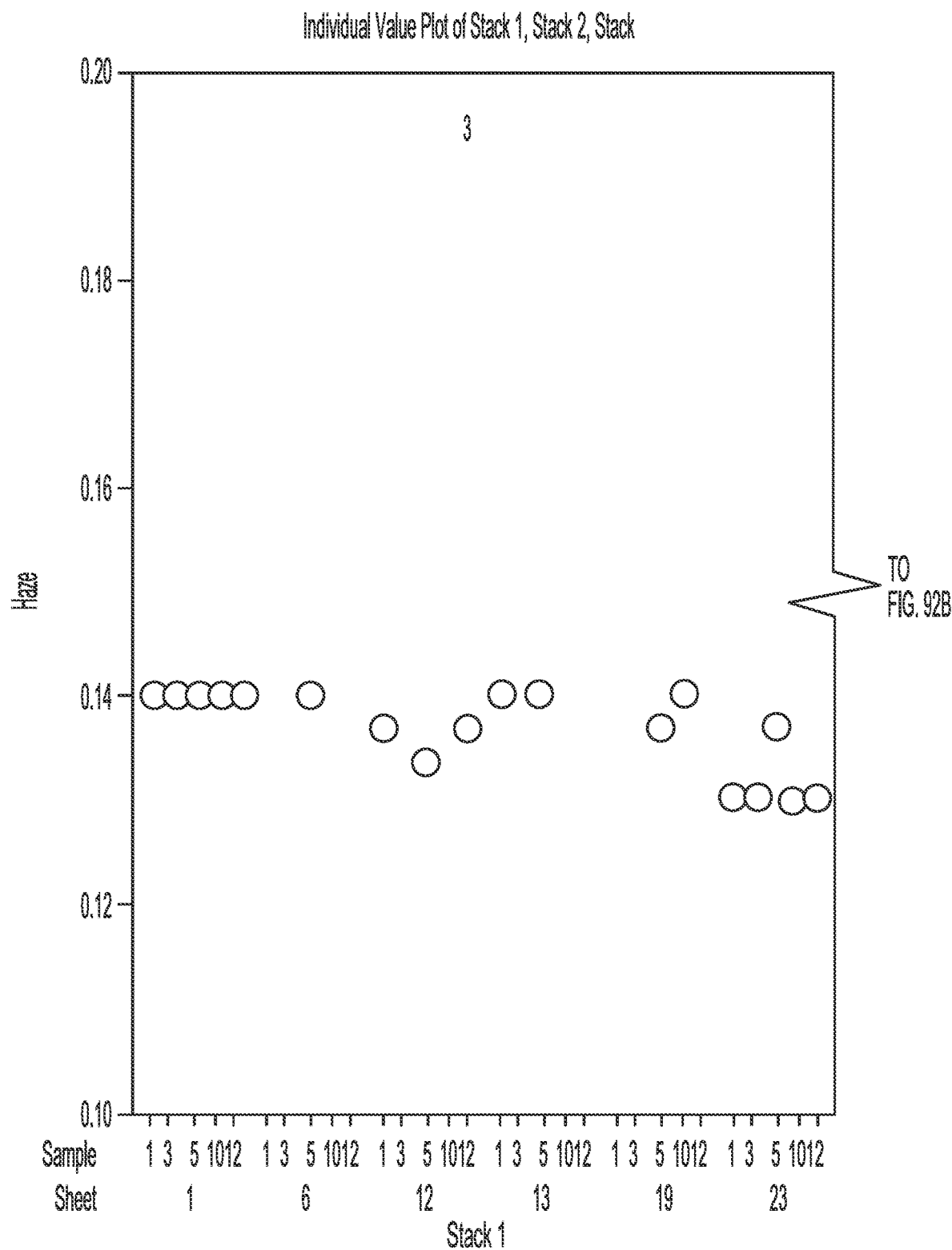
FIGS. 92A-92C graphically depict haze of glass sheets according to embodiments disclosed and described herein.
Figure 92B:
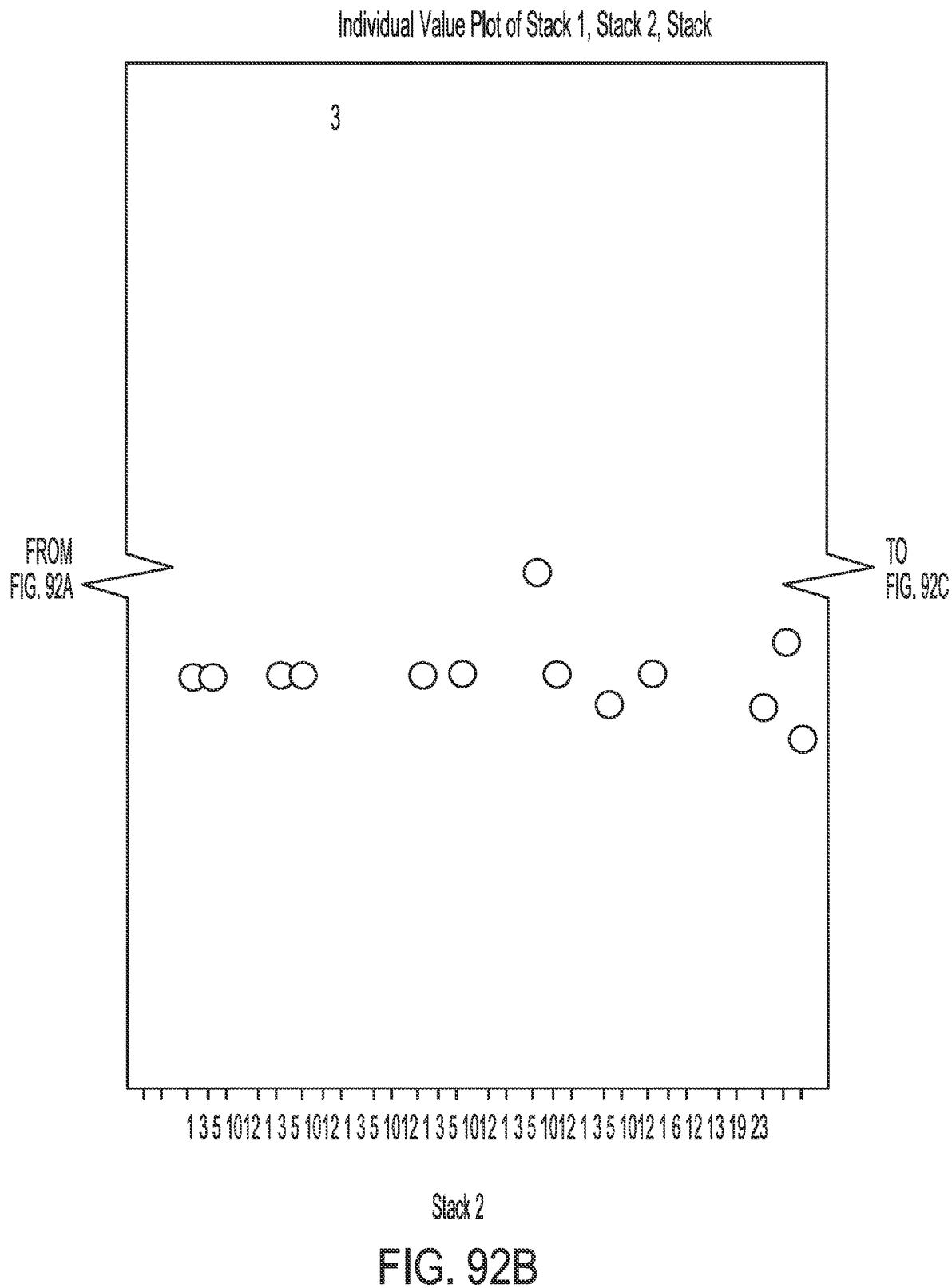
Figure 92C:
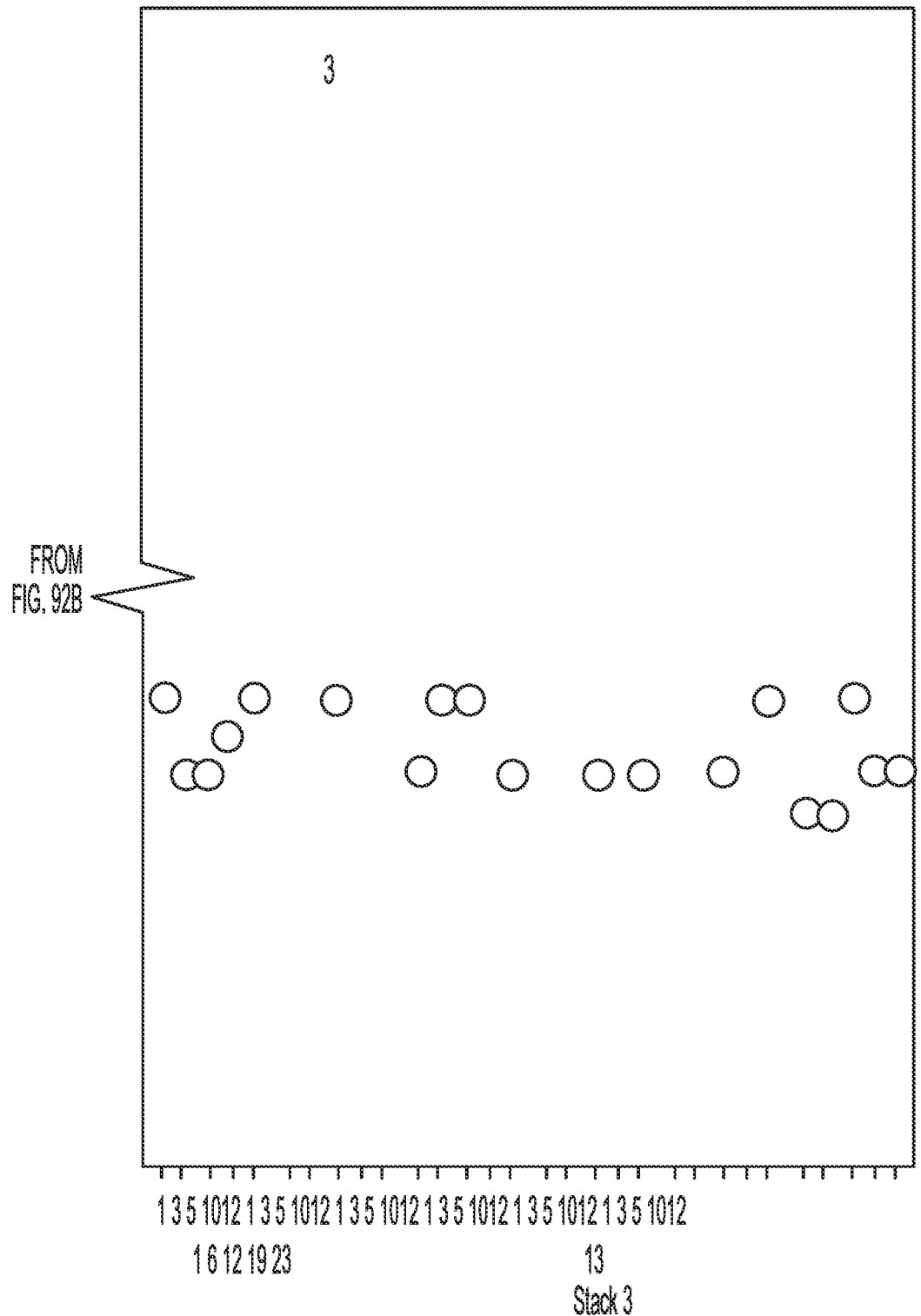
Figure 93:
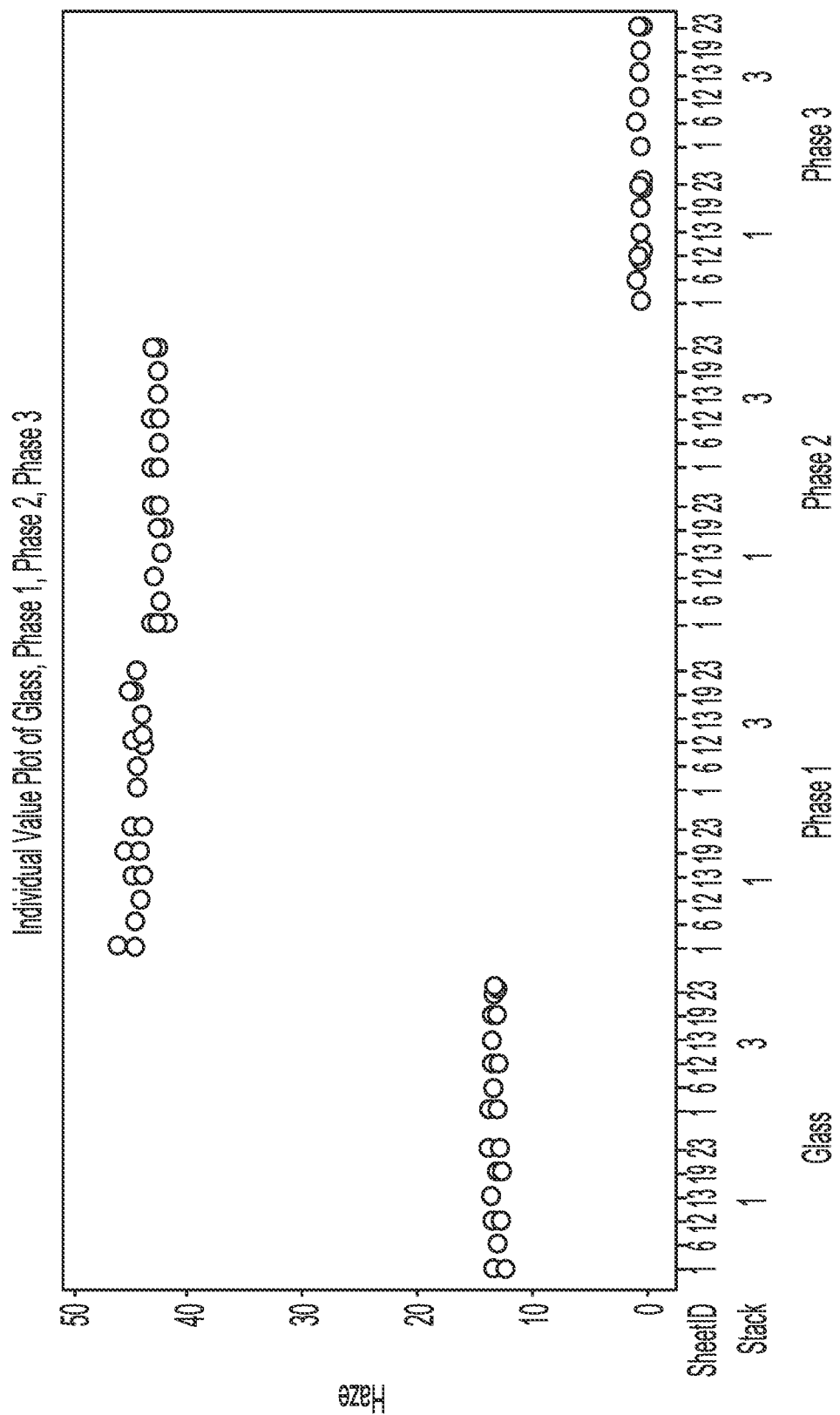
FIG. 93 graphically depicts crystalline and glass phases of glass sheets according to embodiments disclosed and described herein.

As further example, the part size flatness data for samples cerammed by stacking sheets of 1.11 mm thick in a stacking configuration 12+12 (bottom setter/12 sheets/interlayer setter/12 sheets/top setter) with cycle SC32 is shown in FIG. 76. Flatness remains below 100 μm (=0.1 mm) as shown in FIG. 91. The haze on 0.8 mm thick polished samples remain <0.2 at different locations in stacks (FIGS. 92A-92C), and the phase assemblage remains with a residual glass phase between 10 wt % and 20 wt %, >39 wt % of each of the Phase 1 and Phase 2 (lithium disilicate and petalite, respectively), and <3 wt % of any other phase, as measured by XRD (FIG. 93). Hardness data for samples cerammed with this cycle are shown in FIGS. 81-83.

Figure 94:
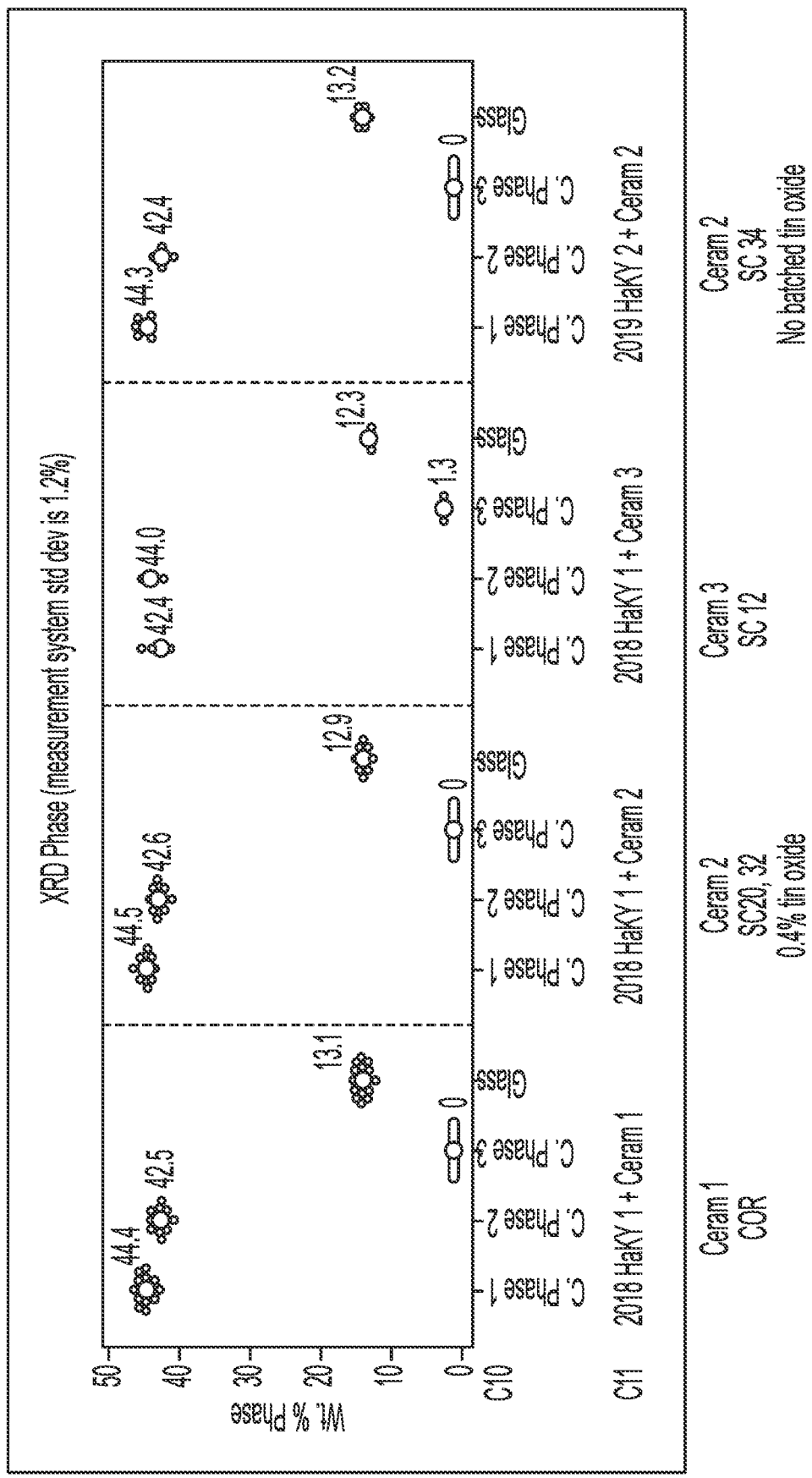
FIG. 94 graphically depicts crystalline and glass phases of glass sheets according to embodiments disclosed and described herein.

Other examples of XRD Rietveld results for different ceram cycles and glass composition variants with and without tin (composition a and b) are presented in FIG. 94. In all these cases, the petalite and lithium disilicate phases amount to >39 wt %, with the other crystalline phases being <3 wt %, the residual glass phase representing 10 to 20 wt % (measured on powdered samples).

Figure 95:
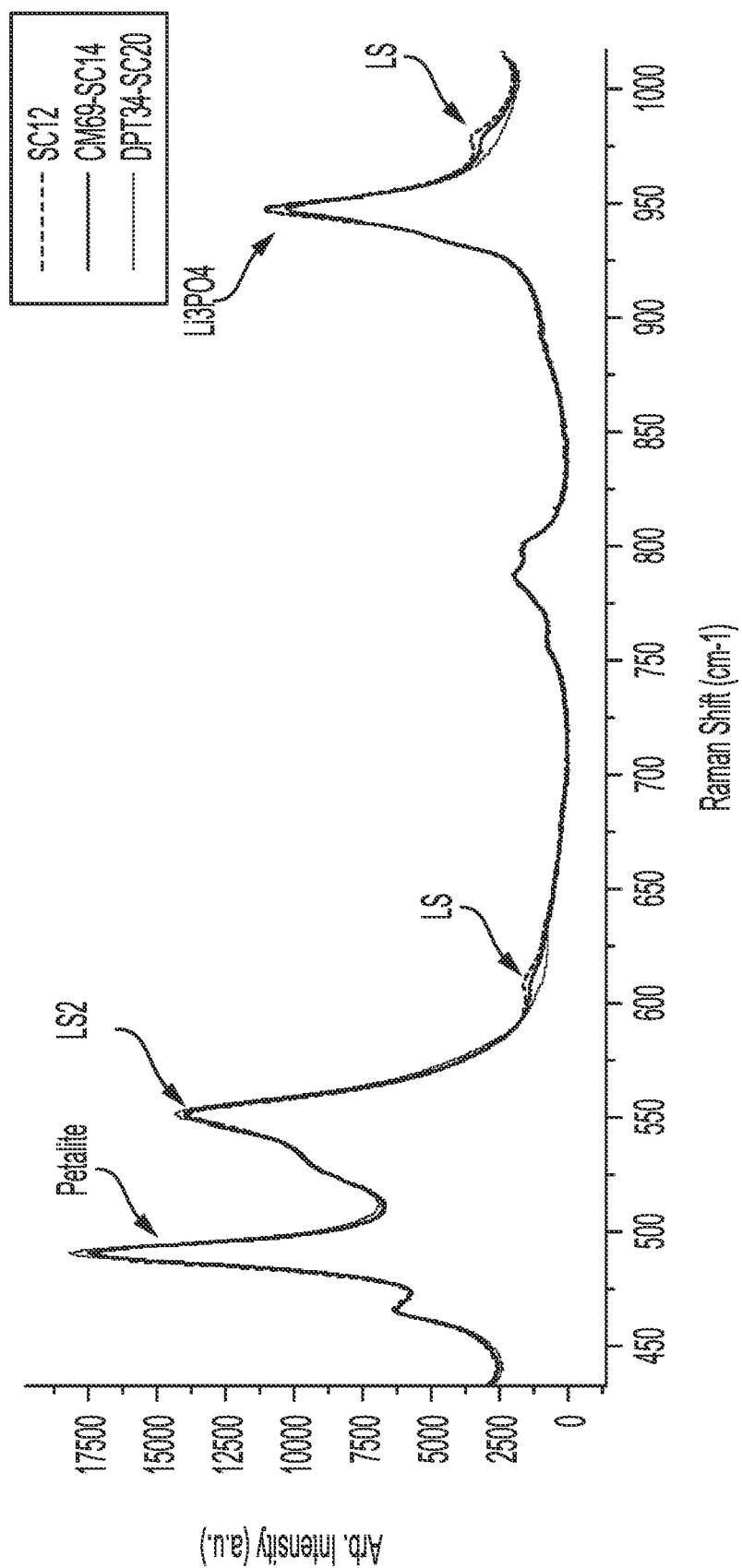
FIG. 95 graphically depicts arbitrary intensity versus Raman shift of glass sheets according to embodiments disclosed and described herein.
Figure 96:
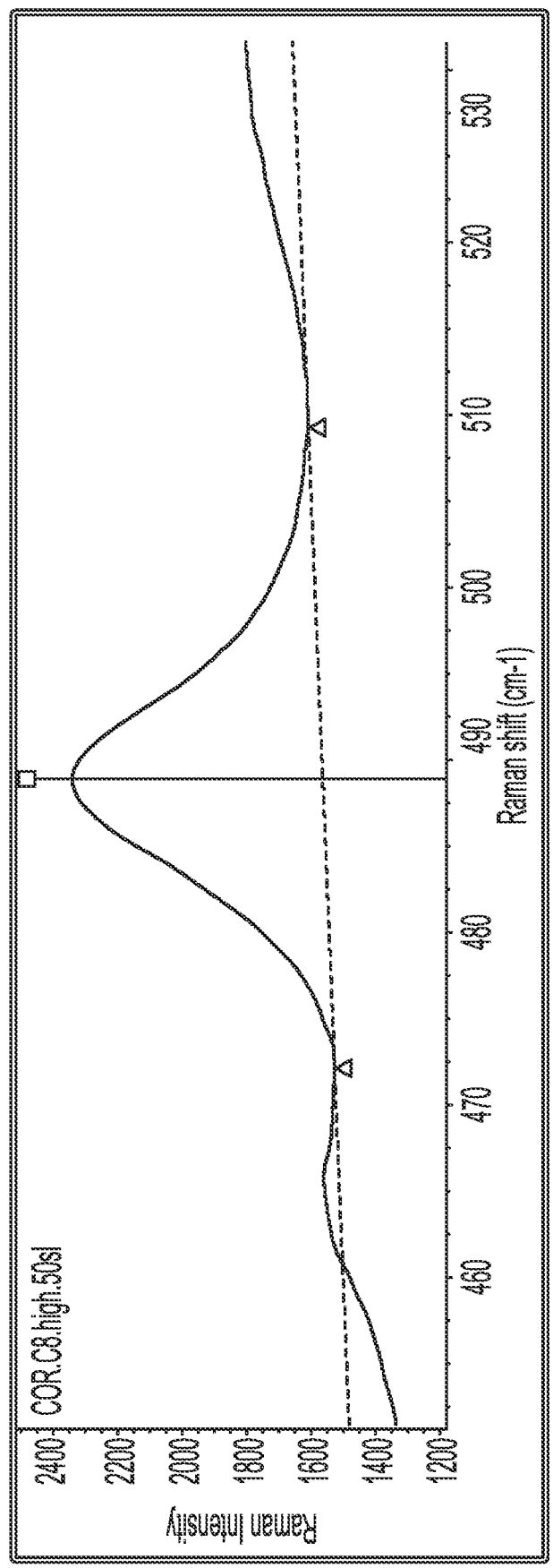
FIG. 96 graphically depicts Raman intensity versus Raman shift of glass sheets according to embodiments disclosed and described herein.
Figure 97:
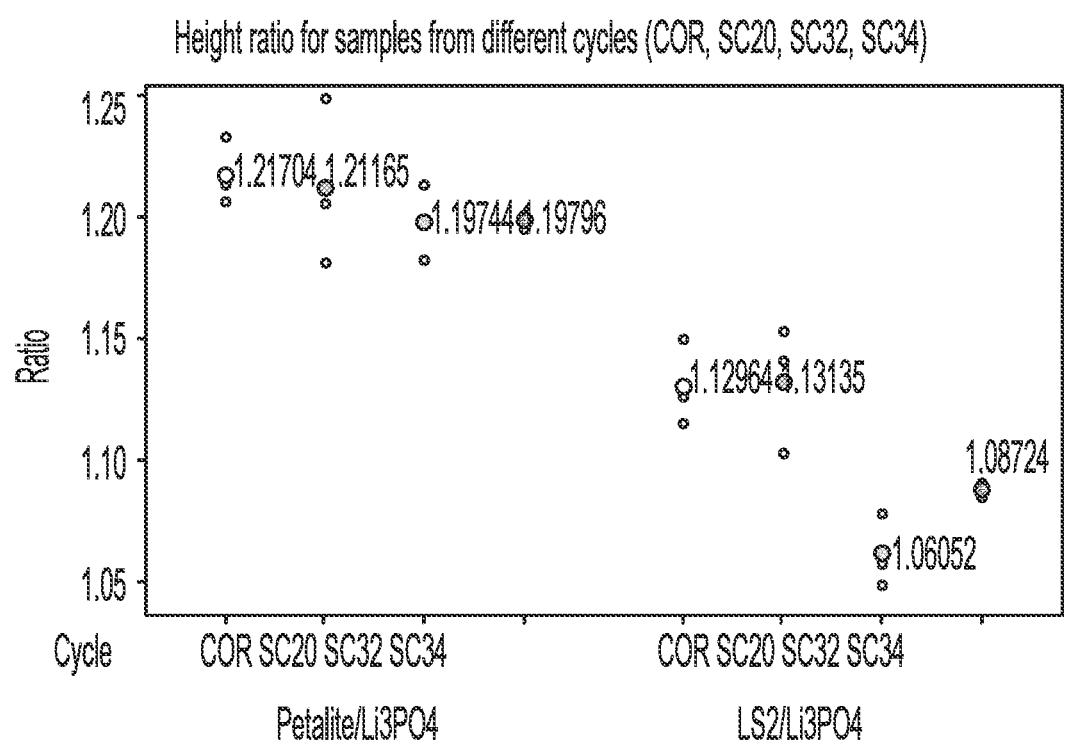
FIG. 97 graphically Raman data of glass sheets according to embodiments disclosed and described herein.

Raman spectroscopy was also used to characterize the phase assemblage in the glass-ceramics obtained. An example of spectra measured on glass-ceramics produced with different ceramming cycles and showing the characteristic peaks for the crystalline phases petalite, lithium disilicate (LS2), lithium silicate (LS) and lithium phosphate (Li$_3$PO$_4$) is shown in FIG. 95. The lithium phosphate phase is not detected by XRD method on these glass-ceramics, but is revealed by Raman. The Raman spectra can be used to quantify the different phases in the glass-ceramics prepared, using the peak height for the peaks characteristic of the crystalline phases obtained and their ratio. An example of a peak height measurement in shown in FIG. 96. The glass-ceramics prepared with the ceramming cycles shown in FIG. 97 have Raman peak height ratio for petalite to lithium phosphate between 1.1-1.3, and Raman peak height ratio of lithium disilicate to lithium phosphate between 1-1.2 (see FIG. 97).

Figure 98:
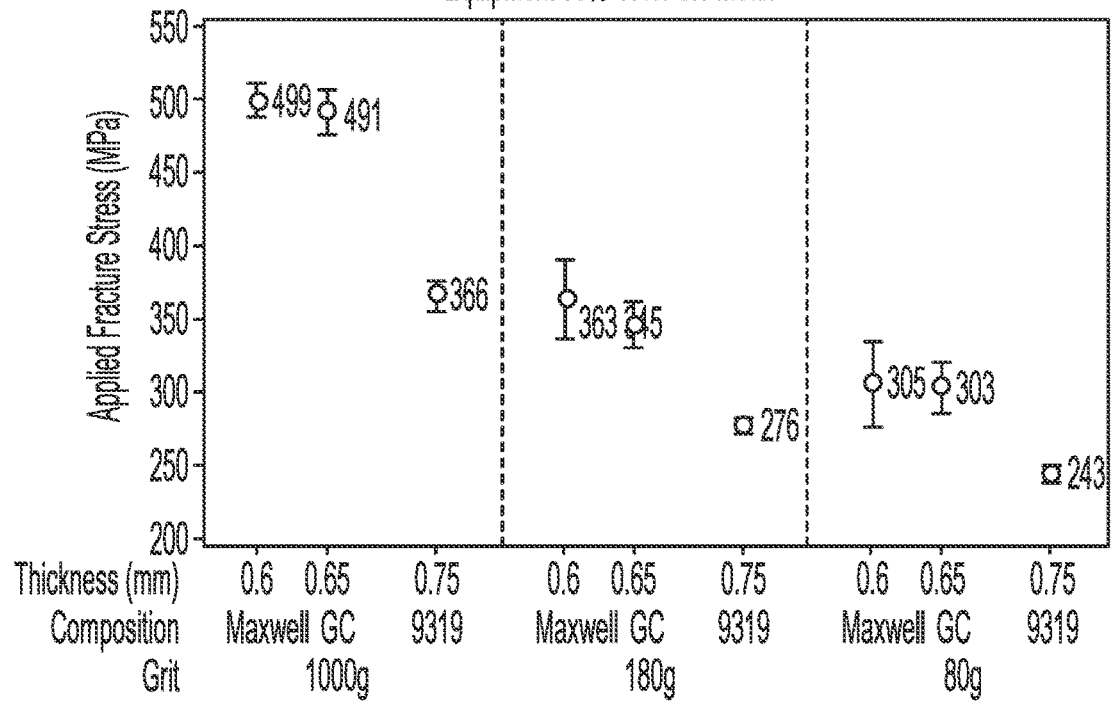
FIG. 98 graphically depicts applied fracture stress of glass sheets according to embodiments disclosed and described herein and comparative examples.
Figure 99:
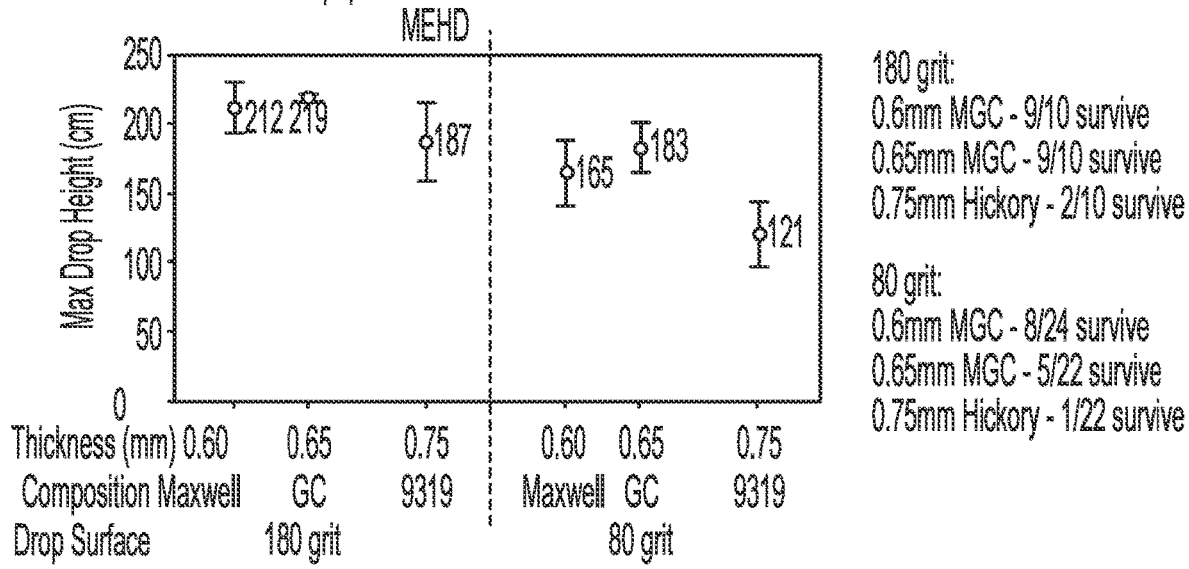
FIG. 99 graphically depicts max drop height of glass sheets according to embodiments disclosed and described herein and comparative examples.
Figure 100:
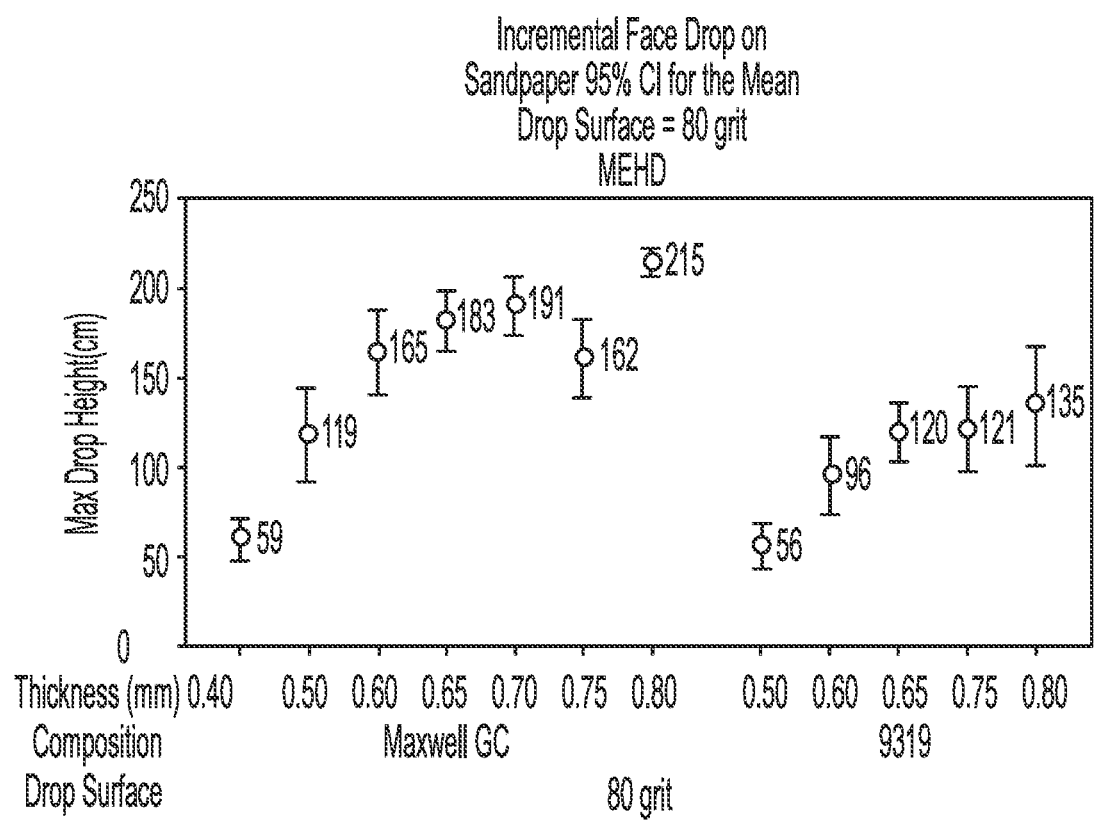
FIG. 100 graphically depicts max drop height of glass sheets according to embodiments disclosed and described herein and comparative examples.

The mechanical performance of the glass-ceramics described in this disclosure, are presented in FIGS. 98-100. The applied facture stress as determined by 4-point after damage introduction using surface impact equipment at 1000 grit, 180 grit and 80 grit, showed improved performance of these glass ceramics compared to comparative glass at a thickness of 0.75 mm (FIG. 98). The incremental flat face drop on 180 and 80 grit, FIG. 99, shows that the performance of these glass-ceramics at 0.6 mm and 0.65 mm thickness exceeds that of comparative examples performance at 0.75 mm on both 180 grit and 80 grit sandpaper using Corning ClubMehd drop test puck. The glass-ceramics produced show >50% improvement in drop performance using Corning ClubMehd puck compared to comparative glasses, which for lower thicknesses had higher CT than the present examples, on 80 grit sandpaper, as shown in FIG. 100.

The ion exchange conditions, stress profile characteristics and mechanical results comparing Maxwell GC to a glass with high fracture toughness and CT above 9726, demonstrating improved drop and slapper performance enabling thinner cover glass with high strength, are shown in Tables 14 and 15.

TABLE 14

Glass Ceramics According to Embodiments

| Thickness (mm) | KNO$_3$ (wt %) | NaNO$_3$ (wt %) | LiNO$_3$ (wt %) | Temp. (° C.) | Time (hrs) | Comp. Stress (MPa) | Centeral Tension (MPa) | Depth of Compression (μm) | 80 grit avg. drop height (cm) | 80 grit Slapper AppliedFracture Stress (MPa) |
|---|---|---|---|---|---|---|---|---|---|---|
| 0.5 | 60 | 40 | 0.1 | 500 | 5 | 284 | 115 | 104 | 119 | |
| 0.6 | 60 | 40 | 0.1 | 500 | 6 | 298 | 115 | 137 | 165 | 305 |
| 0.65 | 60 | 40 | 0.1 | 500 | 7 | 286 | 113 | 150 | 183 | 303 |
| 0.75 | 60 | 40 | 0.1 | 500 | 8 | 303 | 108 | 170 | 162 | |
| 0.8 | 60 | 40 | 0.1 | 500 | 8 | 342 | 112 | 181 | 215 | 330 |

TABLE 15

Glass Ceramics According to Comparative Samples

| Thickness (mm) | KNO$_3$ (wt %) | NaNO$_3$ (wt %) | LiNO$_3$ (wt %) | Temp. (° C.) | Time (hrs) | Comp. Stress (MPa) | Centeral Tension (MPa) | Depth of Compression (μm) | 80 grit avg. drop height (cm) | 80 grit Slapper AppliedFracture Stress (MPa) |
|---|---|---|---|---|---|---|---|---|---|---|
| 0.50 | 88.8 | 10 | 1.2 | 447 | 7 | 621 | 135 | 122 | 56 | |
| 0.60 | 88.6 | 10 | 1.4 | 447 | 7.33 | 630 | 123 | 140 | 96 | |
| 0.75 | 86.2 | 11.8 | 2 | 450 | 8.4 | 607 | 105 | 166 | 121 | 243 |
| 0.80 | 86.2 | 11.8 | 2 | 450 | 8.4 | 603 | 102 | 174 | 135 | 238 |

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A glass-ceramic article comprising:
   a first surface;
   a second surface opposing the first surface;
   one or more crystalline phases;
   a residual glass phase;
   a compressive stress layer extending from the first surface to a depth of compression (DOC);
   a maximum central tension greater than 90 MPa;
   a stored tensile energy greater than 22 J/m$^2$;
   Young's modulus greater than 95 GPa; and
   a haze less than 0.2.

2. The glass-ceramic article of claim 1, wherein the Young's modulus is in a range from greater than 95 GPa to 110 GPa.

3. The glass-ceramic article of claim 1, wherein a ratio of Li$_2$O (mol %)/R$_2$O (mol %) is greater than 0.85, wherein R$_2$O is a sum of alkali metal oxides.

4. The glass-ceramic article of claim 1, further comprising ZrO$_2$ in a range from 1.7 mol % to 4.5 mol %.

5. A glass-ceramic article comprising:
   a first surface;
   a second surface opposing the first surface;
   one or more crystalline phases;
   a residual glass phase;
   a compressive stress layer extending from the first surface to a depth of compression (DOC);
   a maximum central tension greater than 90 MPa;
   a stored tensile energy greater than 22 J/m$^2$;
   ZrO$_2$ in a range from 1.7 mol % to 4.5 mol %; and
   a ratio of LiO$_2$ (mol %)/R$_2$O (mol %) is greater than 0.85, wherein R$_2$O is a sum of alkali metal oxides.

6. The glass-ceramic article of claim 1, wherein the residual glass phase is less than or equal to 50 wt % of the glass-ceramic article.

7. The glass-ceramic article of claim 1, wherein the one or more crystalline phases comprises petalite.

8. The glass-ceramic article of claim 1, wherein the one or more crystalline phases comprises lithium disilicate.

9. The glass-ceramic article of claim 1, wherein a sum of crystalline phases other than lithium disilicate and petalite is less than 1 wt % of the glass-ceramic article.

10. The glass-ceramic article of claim 1, wherein the glass-ceramic article is transparent and has a transmittance of at least 85% for light in a wavelength range from 450 nm to 800 nm at a thickness of 1 mm.

11. The glass-ceramic article of claim 1, wherein the glass-ceramic article breaks into less than 5 fragments when subjected to the Fragment Test.

12. The glass-ceramic article of claim 1, wherein the maximum central tension is in a range from greater than 90 MPa to 180 MPa.

13. The glass-ceramic article of claim 1, wherein the stored tensile energy is in a range from greater than 22 J/m$^2$ to 60 J/m$^2$.

14. The glass-ceramic article of claim 1, further comprising grains having a longest dimension of 150 nm or less.

* * * * *